(12) United States Patent
Machida

(10) Patent No.: US 8,569,111 B2
(45) Date of Patent: *Oct. 29, 2013

(54) MANUFACTURING METHOD FOR SEMICONDUCTOR DEVICES

(75) Inventor: Yuichi Machida, Tokyo (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 107 days.

This patent is subject to a terminal disclaimer.

(21) Appl. No.: 13/220,763

(22) Filed: Aug. 30, 2011

(65) Prior Publication Data

US 2011/0312134 A1    Dec. 22, 2011

Related U.S. Application Data

(63) Continuation of application No. 12/898,820, filed on Oct. 6, 2010, now Pat. No. 8,017,440.

(30) Foreign Application Priority Data

Oct. 7, 2009    (JP) .................................. 2009-233125

(51) Int. Cl.
  *H01L 21/00* (2006.01)
  *H01L 21/44* (2006.01)
  *H01L 23/02* (2006.01)

(52) U.S. Cl.
  USPC ........... 438/123; 438/107; 438/109; 438/112; 438/124; 438/613; 257/686

(58) Field of Classification Search
  USPC ........... 257/E21.502, E21.506, 686; 438/123, 438/107, 109, 112, 124, 613, 611, 614
  See application file for complete search history.

(56) References Cited

U.S. PATENT DOCUMENTS

| | | | |
|---|---|---|---|
| 7,160,760 B2* | 1/2007 | Hirashima et al. | 438/123 |
| 8,017,440 B2* | 9/2011 | Machida | 438/109 |
| 2003/0197260 A1 | 10/2003 | Nishimura et al. | |
| 2005/0112798 A1 | 5/2005 | Bjorbell | |

FOREIGN PATENT DOCUMENTS

| | | |
|---|---|---|
| JP | 61-117858 A | 6/1986 |
| JP | 2003-188341 A | 7/2003 |

* cited by examiner

*Primary Examiner* — Ha Tran T Nguyen
*Assistant Examiner* — Thai T Vuong
(74) *Attorney, Agent, or Firm* — Miles & Stockbridge P.C.

(57) ABSTRACT

The reliability of a semiconductor device is enhanced. A first lead frame, a first semiconductor chip, a second lead frame, and a second semiconductor chip are stacked over an assembly jig in this order with solder in between and solder reflow processing is carried out to fabricate their assembly. Thereafter, this assembly is sandwiched between first and second molding dies to form an encapsulation resin portion. The upper surface of the second die is provided with steps. At a molding step, the second lead frame is clamped between the first and second dies at a position higher than the first lead frame; and a third lead frame is clamped between the first and second dies at a higher position. The assembly jig is provided with steps at the same positions as those of the steps in the upper surface of the second die in positions corresponding to those of the same.

11 Claims, 69 Drawing Sheets

MANUFACTURING METHOD FOR SEMICONDUCTOR DEVICES

CROSS-REFERENCE TO RELATED APPLICATIONS

This application is a continuation of application Ser. No. 12/898,820 filed Oct. 6, 2010 now U.S. Pat. No. 8,017,440. Also, the disclosure of Japanese Patent Application No. 2009-233125 filed on Oct. 7, 2009 including the specification, drawings and abstract is incorporated herein by reference in its entirety.

BACKGROUND OF THE INVENTION

The present invention relates to manufacturing methods for semiconductor devices and in particular to a technology effectively applicable to a manufacturing method for plastic molded semiconductor package-type semiconductor devices.

Various types of semiconductor packages are used and among them there is a plastic molded semiconductor package in which a semiconductor chip is sealed with an encapsulation resin portion. In plastic molded semiconductor packages, a semiconductor chip is sealed in an encapsulation resin portion; therefore, the reliability of the semiconductor chip can be enhanced. When a terminal is exposed in the back surface of the encapsulation resin portion, the plastic molded semiconductor package can be surface mounted.

Japanese Unexamined Patent Publication No. 2003-188341 (Patent Document 1) describes a technology for implementing the following: a first lead frame and a second lead frame are set in the vertical direction; a first semiconductor chip and a second semiconductor chip are placed over the respective lead frames; and these semiconductor chips are respectively sealed with first encapsulation resin and second encapsulation resin.

Japanese Unexamined Patent Publication No. Sho 61 (1986)-117858 (Patent Document 2) describes a technology related to a semiconductor device in which multiple semiconductor chips are provided in one and the same package in a stacked manner.

[Patent Document 1]
Japanese Unexamined Patent Publication No. 2003-188341
[Patent Document 2]
Japanese Unexamined Patent Publication No. Sho 61 (1986)-117858

SUMMARY OF THE INVENTION

The investigation by the present inventors has revealed the following:

The present inventors investigated a plastic molded semiconductor package-type semiconductor device. This semiconductor device was configured as follows: a drain terminal is soldered to a drain electrode in the back surface of a semiconductor chip; a source terminal and a gate terminal were respectively soldered to a source electrode and a gate electrode in the front surface of the semiconductor chip; and these elements were sealed with a plastic molding portion. To manufacture this semiconductor device, the following procedure can be taken: first, a lead frame having a drain terminal and a lead frame having a source terminal and a gate terminal are prepared; a semiconductor chip is placed over the drain terminal in one lead frame and then the other lead frame having the source terminal and the gate terminal is placed over this semiconductor chip; and solder reflow processing is carried out to fabricate an assembly of them. Then this assembly is sandwiched between molding dies and plastic molded and the outer lead portion of each terminal protruded from the encapsulation resin portion is separated from the lead frames and bent.

When a semiconductor chip is set between two lead frames to manufacture a semiconductor device as mentioned above, the two lead frames of the assembly are clamped between dies at a molding step. At this time, it is required to clamp the two lead frames at different height positions. When the assembly is fabricated and the spacing between the two lead frames in the assembly is as designed, no problem arises at this molding step. If this spacing is not as designed due to variation in the thickness of the semiconductor chip or variation in the thickness of solder joining together each electrode of the semiconductor chip and each terminal of the lead frames, the following problems can arise. The problems arise when the two lead frames of the assembly are clamped between dies.

If the spacing between the two lead frames of the assembly is excessively smaller than a design value, the following takes place when the two lead frames of the assembly are clamped between molding dies: force is exerted on the lead frames in such directions that the lead frames are stripped from the semiconductor chip. This degrades the reliability of solder joints between the drain terminal and the source terminal and gate terminal and the semiconductor chip, which can lead to the degraded reliability of the manufactured semiconductor device.

Conversely, if the spacing between the two lead frames of the assembly is excessively larger than the design value, a gap is produced between the dies and the lead frames when the two lead frames of the assembly are clamped between molding dies. As a result, when resin material is injected into the cavity in the dies to form an encapsulation resin portion, the resin can flow into this gap and resin leakage can occur. This degrades the fabrication yield of the semiconductor device.

These problems become more noticeable with increase in the number of stacked semiconductor chips and lead frames.

It is an object of the invention to provide a technology with which the reliability of a semiconductor device can be enhanced.

It is another object of the invention to provide a technology with which the fabrication yield of a semiconductor device can be enhanced.

The above and other objects and novel features of the invention will be apparent from the description in this specification and the accompanying drawings.

The following is a brief description of the gist of the typical elements of the invention laid open in this application:

In a manufacturing method for semiconductor devices in a typical embodiment, the following procedure is taken: a first frame having a chip placement portion is set over an assembly jig; a semiconductor chip is set over the chip placement portion of the first frame with first solder in between; a second frame having a first lead terminal portion is set over the assembly jig so that the first lead terminal portion is set over the semiconductor chip with second solder in between; and solder reflow processing is carried out with the first and second frames set over the assembly jig. Thereafter, using a lower die and an upper die, an encapsulation resin portion is formed to seal the first semiconductor chip, the chip placement portion of the first frame, and the first lead terminal portion of the second frame. The lower die includes a first face for setting the chip placement portion of the first frame and a second face for supporting the second frame in a position adjacent to the cavity formed by the lower die and the upper die so that it is protruded from the first face. At an encapsulation resin portion formation step, the chip placement portion of the first frame is set over the first face of the lower die and part of the second frame is sandwiched between the second face of the lower die and the upper die. The assembly jig has a first supporting face over which the chip placement portion of the first frame is set and a second supporting face that is protruded from the first supporting face and is for supporting the second frame set over the assembly jig. The portion of the second frame clamped between the second face of the lower die and the upper die at the encapsulation resin portion formation step is set over the second supporting face of the assembly jig when the second frame is set over the assembly jig. The height of the second face of the lower die relative to the first face and the height of the second supporting face of the assembly jig relative to the first supporting face are identical with each other.

The following is a brief description of the gist of the effect obtained by the typical elements of the invention laid open in this application:

According to a typical embodiment, the characteristics of a semiconductor device can be enhanced.

DETAILED DESCRIPTION OF THE PREFERRED EMBODIMENTS

Figure 1:
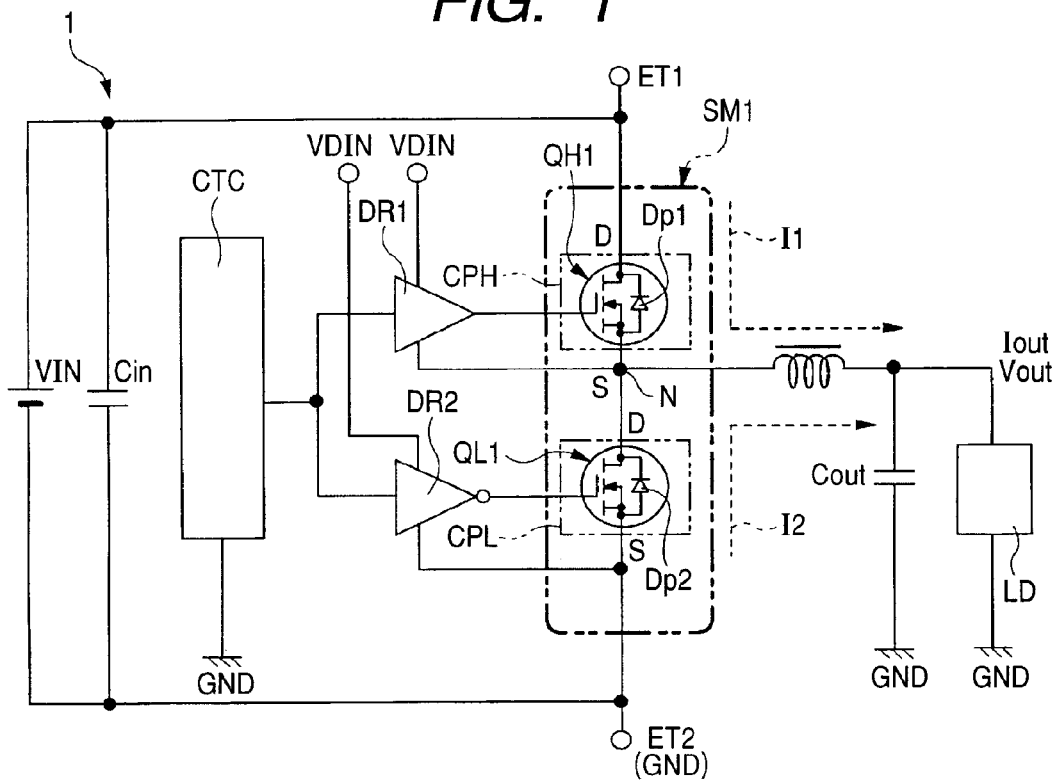
FIG. 1 is a circuit diagram illustrating an example of a DC-DC converter including a semiconductor device in an embodiment of the invention.

In the following description, each embodiment will be divided into multiple sections if necessary for the sake of convenience. Unless explicitly stated otherwise, they are not unrelated to one another and they are in such a relation that one is a modification, details, supplementary explanation, or the like of part or all of the other. When mention is made of any number of elements (including a number of pieces, a numeric value, a quantity, a range, and the like) in the following description of embodiments, the number is not limited to that specific number. Unless explicitly stated otherwise or the number is obviously limited to a specific number in principle, the foregoing applies and the number may be above or below that specific number. In the following description of embodiments, needless to add, their constituent elements (including elemental steps and the like) are not always indispensable unless explicitly stated otherwise or they are obviously indispensable in principle. Similarly, when mention is made of the shape, positional relation, or the like of a constituent element or the like in the following description of embodiments, it includes those substantially approximate or analogous to that shape or the like. This applies unless explicitly stated otherwise or it is apparent in principle that some shape or the like does not include those substantially approximate or analogous to that shape or the like. This is the same with the above-mentioned numeric values and ranges.

Hereafter, detailed description will be given to embodiments of the invention with reference to the drawings. In all the drawings for explaining embodiments, members having the same function will be marked with the same reference numerals and the repetitive description thereof will be omitted. With respect to the following embodiments, description will not be repeated about an identical or similar part unless necessary.

In every drawing used in the description of embodiments, hatching may be omitted to facilitate visualization even though it is a sectional view. Further, hatching may be provided to facilitate visualization even though it is a plan view.

In this application, field effect transistors will be referred to as MOSFET (Metal Oxide Semiconductor Field Effect Transistor) or simply as MOS. Non-oxide films are not excluded from gate insulating films.

First Embodiment

In the description of this embodiment, a case where the invention is applied to a semiconductor device used in a DC-DC converter will be taken as an example.

<Circuitry of DC-DC Converter>

Description will be given to a semiconductor device in an embodiment of the invention with reference to the drawings.

Figure 2:
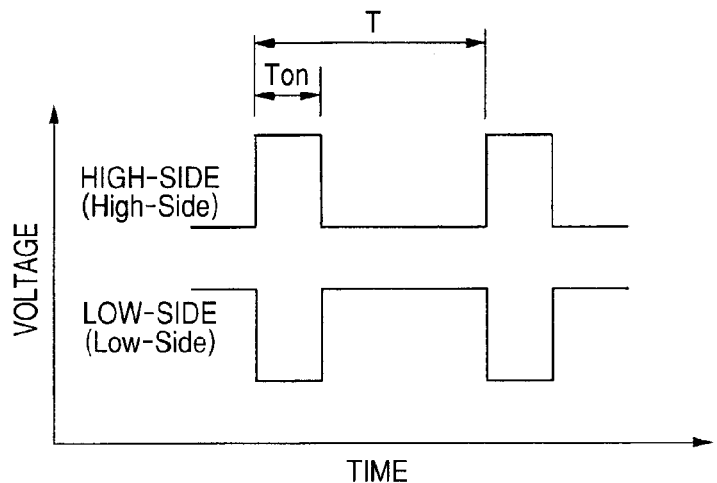
FIG. 2 is a basic operating waveform chart of the DC-DC converter in FIG. 1.

FIG. 1 is a circuit diagram illustrating an example of a DC-DC converter, non-isolated DC-DC converter (DC-DC converter) 1 in this example, having a semiconductor device (semiconductor package) SM1 in an embodiment of the invention; and FIG. 2 is a basic operating waveform chart of the non-isolated DC-DC converter 1 in FIG. 1.

This non-isolated DC-DC converter 1 is used in the power supply circuit of an electronic device, such as a desk top personal computer, a notebook personal computer, a server, a game machine, or the like. It includes the semiconductor device SM1, two driver circuits (drive circuits) DR1, DR2, a control circuit CTC, an input capacitor Cin, an output capacitor Cout, and a coil L. Reference code VIN denotes input power supply; GND denotes reference potential (for example, ground potential of 0 V); Iout denotes output current; and Vout denotes output voltage.

The semiconductor device SM1 includes two power MOS-FETs (Metal Oxide Semiconductor Field Effect Transistor: hereafter, simply abbreviated as power MOSS) QH1, QL1. These power MOSFETs QH1, QL1 are sealed (enclosed) in one semiconductor device SM1.

The driver circuits (drive circuits) DR1, DR2 respectively control the potential of the gate terminals of the power MOSs QH1, QL1 according to a pulse width modulation (PWM) signal supplied from the control circuit CTC. The driver circuits thereby control the operation of the power MOSs QH1, QL1. The output of one driver circuit DR1 is electrically coupled to the gate terminal of the power MOS QH1. The output of the other driver circuit DR2 is electrically coupled to the gate terminal of the power MOS QL1. Reference code VDIN denotes the input power supply of each of the driver circuits DR1, DR2.

The power MOSs QH1, QL1 are coupled in series between the following terminals of the input power supply VIN: the terminal (first power supply terminal) ET1 for supplying high potential (first power supply potential) and the terminal (second power supply terminal) ET2 for supplying reference potential (second power supply potential) GND. That is, the power MOS QH1 has its source-drain path coupled in series between the terminal ET1 for high potential supply of the input power supply VIN and an output node (output terminal) N; and the power MOS QL1 has its source-drain path coupled in series between the output node N and the terminal ET2 for reference potential GND supply. Reference code Dp1 denotes the parasitic diode (internal diode) of the power MOS QH1 and Dp2 denotes the parasitic diode (internal diode) of the power MOS QL1. Reference code D denotes the drain of each of the power MOSs QH1, QL1 and S denotes the source of each of the power MOSs QH1, QL1.

The power MOS (field effect transistor, power transistor) QH1 is a field effect transistor for high-side switch (high potential side: first operating voltage; hereafter, simply referred to as high side) and has a switch function for storing energy in the above coil L. The coil L is an element that supplies power to the output of the non-isolated DC-DC converter 1 (the input of a load LD).

This power MOS QH1 for high side is formed in a semiconductor chip (semiconductor chip for high side) CPH. This power MOS QH1 is formed of, for example, an n-channel field effect transistor. In this example, a channel of this field effect transistor is formed in the direction of the thickness of the semiconductor chip CPH. In this case, it is possible to increase the channel width per unit area and reduce on-resistance as compared with the following field effect transistors: field effect transistors whose channel is formed along the main surface of the semiconductor chip CPH (surface orthogonal to the direction of the thickness of the semiconductor chip CPH). Therefore, it is possible to reduce the size of each element and miniaturize the semiconductor device SM1.

Meanwhile, the power MOS (field effect transistor, power transistor) QL1 is a field effect transistor for low-side switch (low potential side: second operating voltage; hereafter, simply referred to as low side). It has a function of reducing the resistance of the transistor in synchronization with a frequency from the control circuit CTC to carry out rectification. That is, the power MOS QL1 is a transistor for rectification of the non-isolated DC-DC converter 1.

This power MOS QL1 for low side is formed in a semiconductor chip (semiconductor chip for low side) CPL different from the semiconductor chip CPH. The power MOS QL1 is formed of, for example, an n-channel power MOS and its channel is formed in the direction of the thickness of the semiconductor chip CPL similarly with the power MOS QH1. The reason why the power MOS whose channel is formed in the direction of the thickness of the semiconductor chip CPL is used is as follows: as indicated by the basic operating waveform of the non-isolated DC-DC converter 1 in FIG. 2, the on-time (time for which voltage is applied) of the power MOS QL1 for low side is longer than the on-time of the power MOS QH1 for high side; it seems that loss due to on-resistance is larger than switching loss. For this reason, the channel width per unit area can be made larger in cases where a field effect transistor whose channel is formed in the direction of the thickness of the semiconductor chip CPL is used than in the following cases: cases where a field effect transistor whose channel is formed along the main surface of the semiconductor chip CPL is used. That is, the on-resistance can be reduced by forming the power MOS QL1 for low side of a field effect transistor whose channel is formed in the direction of the thickness of the semiconductor chip CPL; therefore, the voltage conversion efficiency can be enhanced even though the current passed through the non-isolated DC-DC converter 1 is increased. In FIG. 2, reference code Ton denotes the pulse width of the power MOS QH1 for high side when it is on; and T denotes its pulse period.

The control circuit CTC is a circuit that controls the operation of the power MOSs QH1, QL1 and is comprised of, for example, a PWM (Pulse Width Modulation) circuit. This PWM circuit compares a command signal with the amplitude of a triangular wave and outputs a PWM signal (control signal). The output voltage of the power MOSs QH1, QL1 (that is, the width of the voltage switch on (on-time) of the power MOSs QH1, QL1) is controlled by this PWM signal. (That is, the output voltage of the non-isolated DC-DC converter 1 is controlled by the PWM signal.)

The output of this control circuit CTC is electrically coupled to the input of each of the driver circuits DR1, DR2. The respective outputs of the driver circuits DR1, DR2 are respectively electrically coupled to the gate terminal of the power MOS QH1 and the gate terminal of the power MOS QL1.

The above input capacitor Cin is a power supply that temporarily stores energy (electric charge) supplied from the input power supply VIN and supplies the stored energy to the main circuit of the non-isolated DC-DC converter 1. It is electrically coupled in parallel with the input power supply VIN. The above output capacitor Cout is electrically coupled between output wiring coupling the coil L and the LD and the terminal for supplying reference potential GND.

The wiring of the non-isolated DC-DC converter 1 coupling the source of the power MOS QH1 and the drain of the power MOS QL1 is provided with the above output node N that outputs power supply potential for output to the outside. This output node N is electrically coupled with the coil L through the output wiring and is further electrically coupled with the load LD through the output wiring. Examples of this load LD include hard disk drive HDD, ASIC (Application Specific Integrated Circuit), FPGA (Field Programmable Gate Array), expansion card (PCI CARD), memory (DDR memory, DRAM (Dynamic RAM), flash memory, and the like), CPU (Central Processing Unit), and the like.

In this non-isolated DC-DC converter 1, power supply voltage is converted by alternately turning on and off the power MOSS QH1, QL1 in synchronization with each other. More specific description will be given. When the power MOS QH1 for high side is on, a current (first current) I1 flows from the terminal ET1 to the output node N through the power MOS QH1. Meanwhile, when the power MOS QH1 for high side is off, a current I2 is passed by the back electromotive voltage of the coil L. Voltage drop can be reduced by turning on the power MOS QL1 for low side while this current I2 is flowing.

<Structure of Semiconductor Device>

Figure 3:
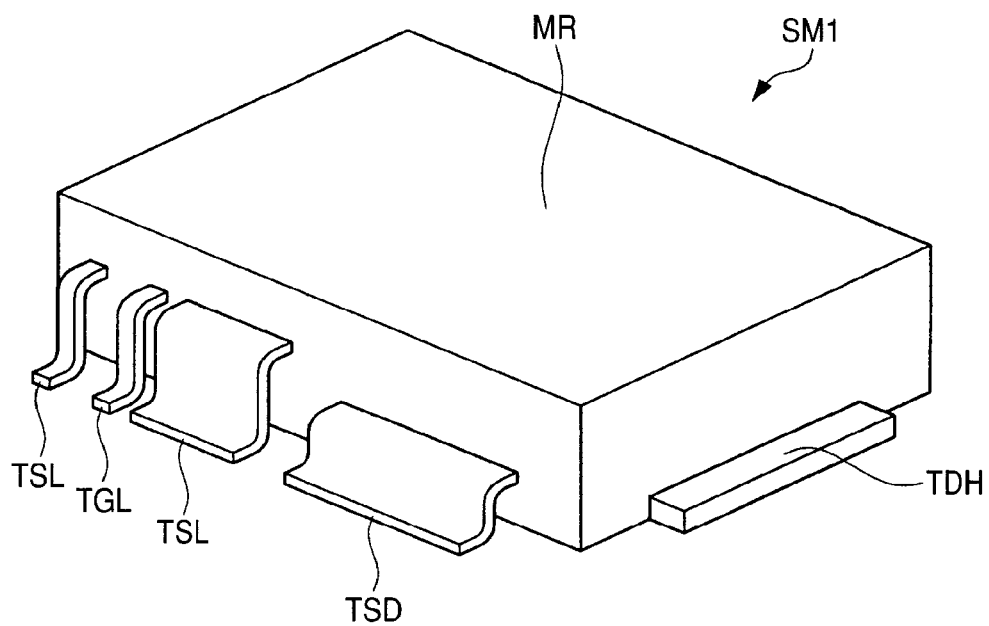
FIG. 3 is a perspective view of a semiconductor device in an embodiment of the invention.
Figure 4:
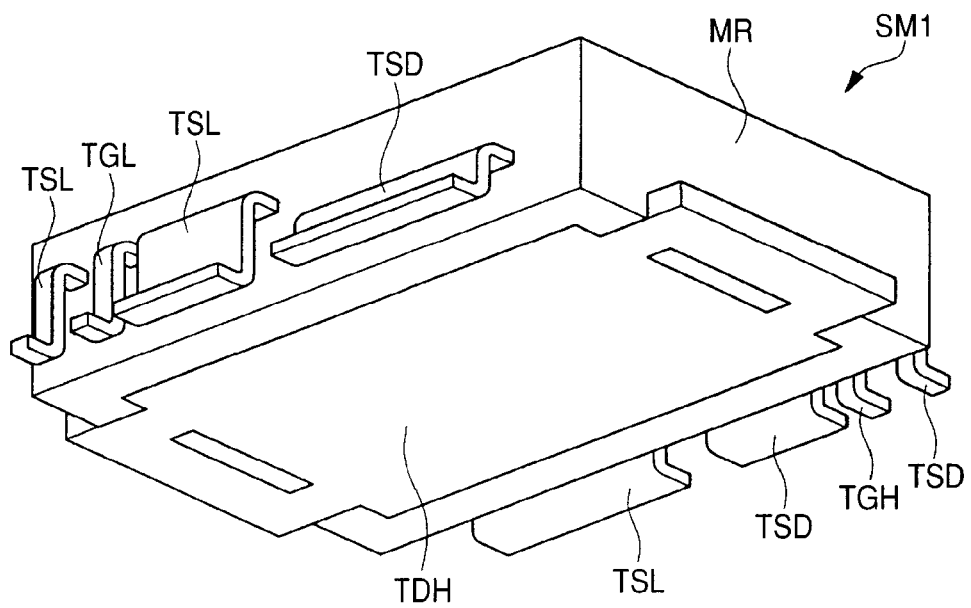
FIG. 4 is a perspective view of a semiconductor device in an embodiment of the invention.
Figure 5:
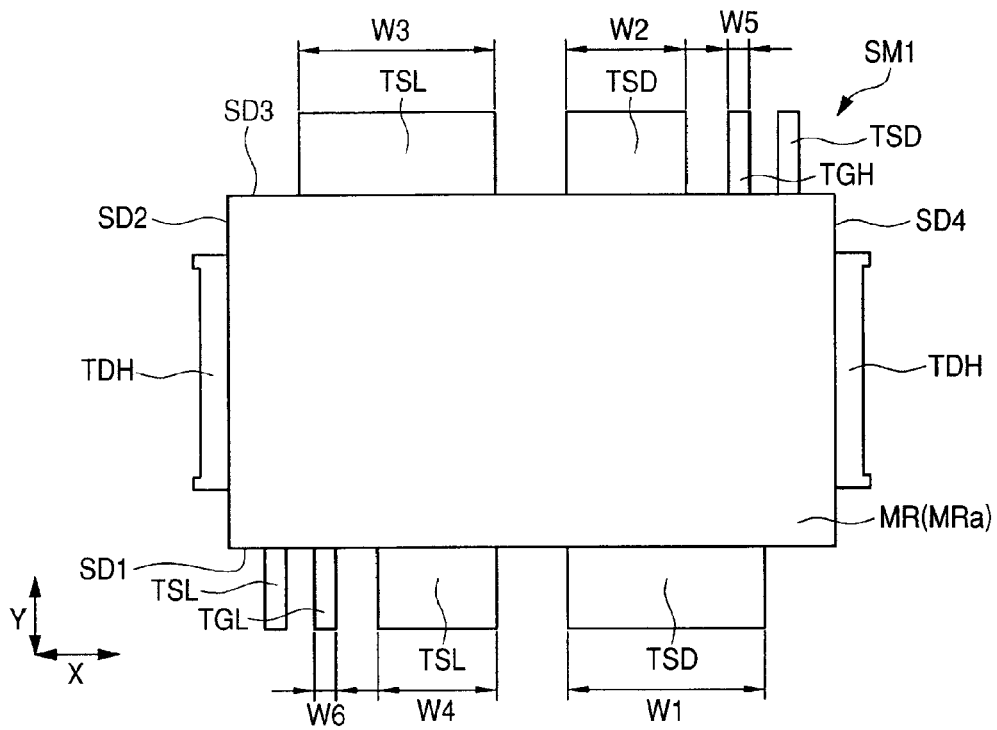
FIG. 5 is a top view of a semiconductor device in an embodiment of the invention.
Figure 6:
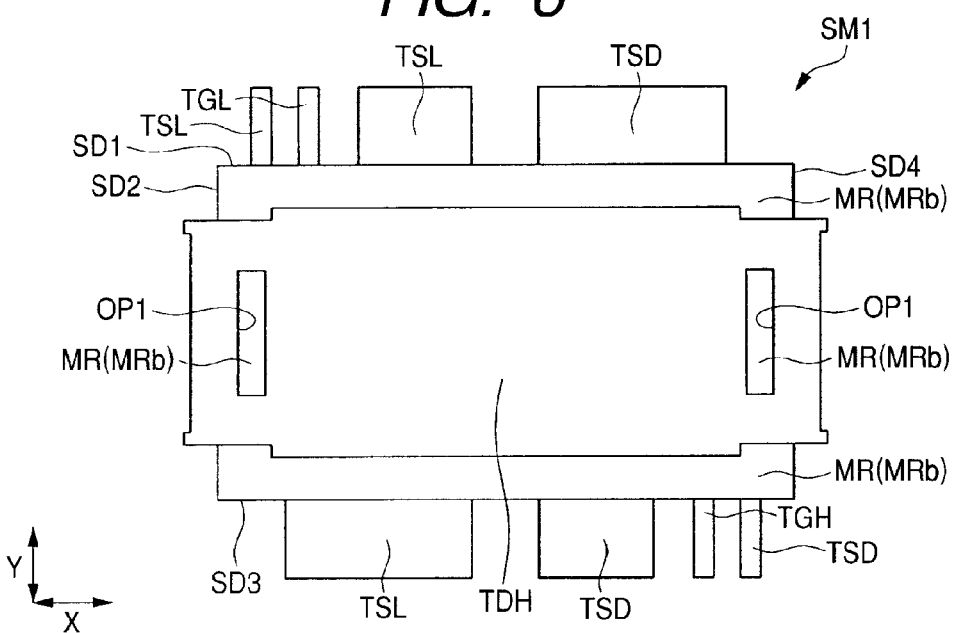
FIG. 6 is a bottom view (back side back view) of a semiconductor device in an embodiment of the invention.
Figure 7:
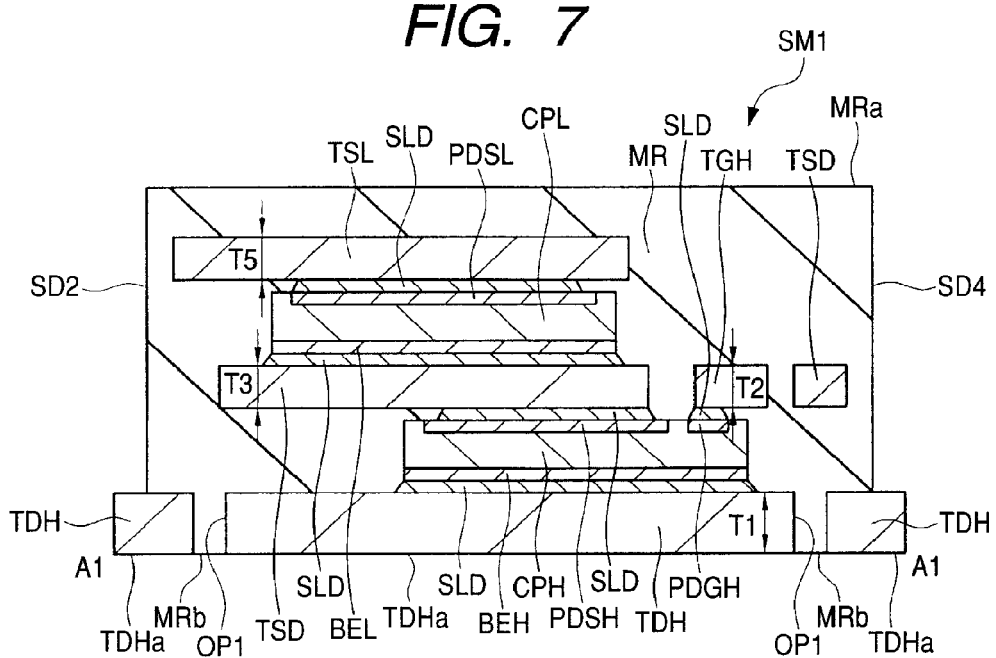
FIG. 7 is a sectional view of a semiconductor device in an embodiment of the invention.
Figure 8:
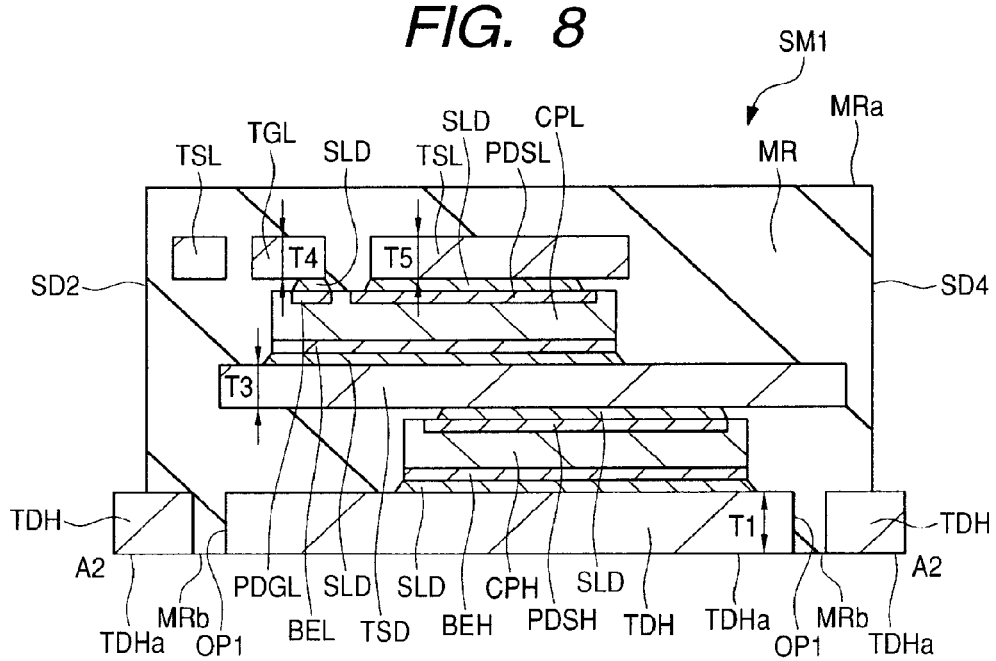
FIG. 8 is a sectional view of a semiconductor device in an embodiment of the invention.
Figure 9:
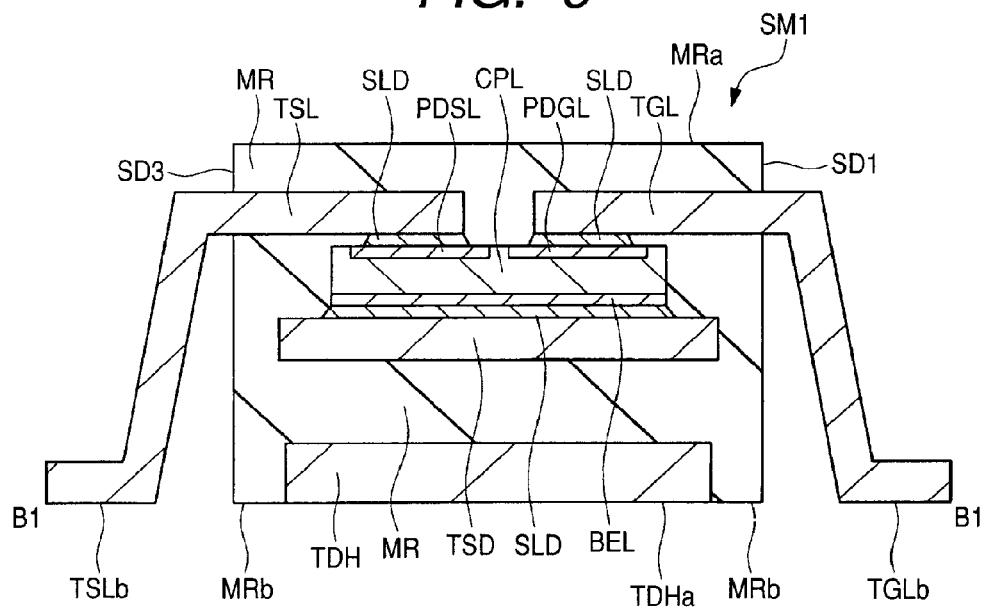
FIG. 9 is a sectional view of a semiconductor device in an embodiment of the invention.
Figure 10:
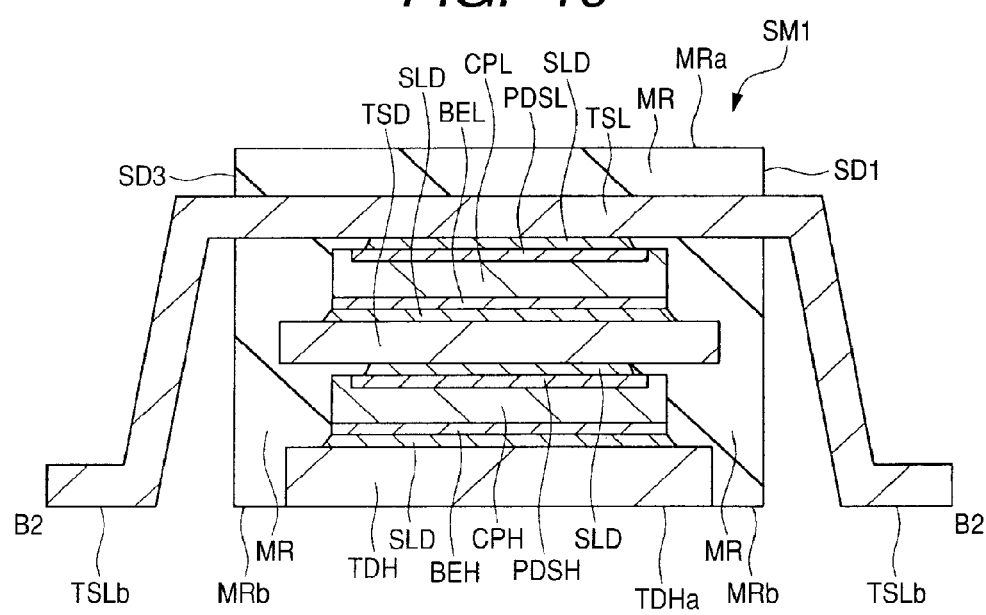
FIG. 10 is a sectional view of a semiconductor device in an embodiment of the invention.
Figure 11:
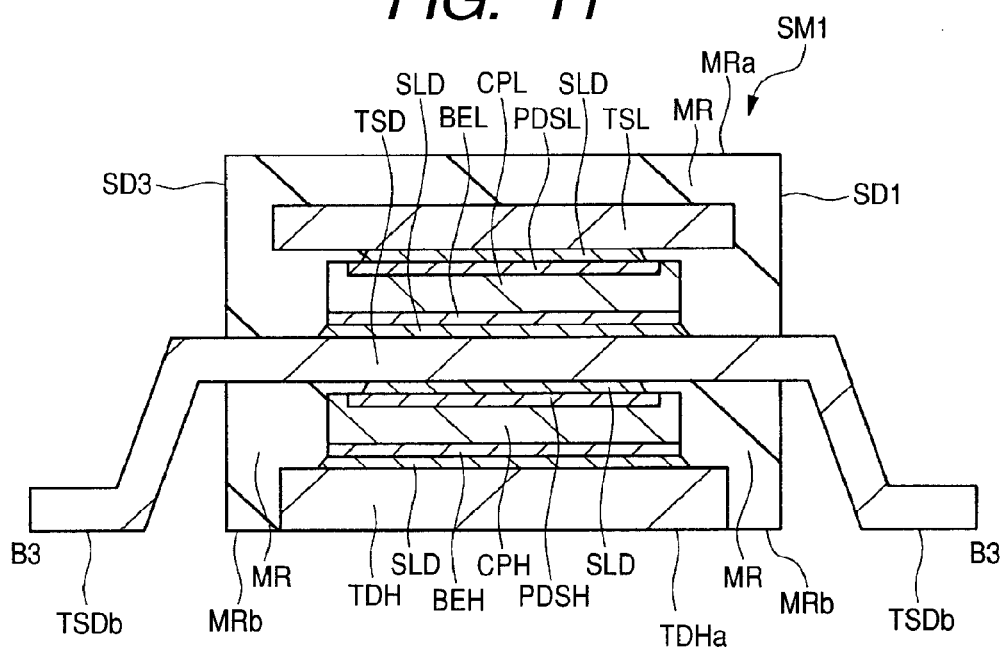
FIG. 11 is a sectional view of a semiconductor device in an embodiment of the invention.
Figure 12:
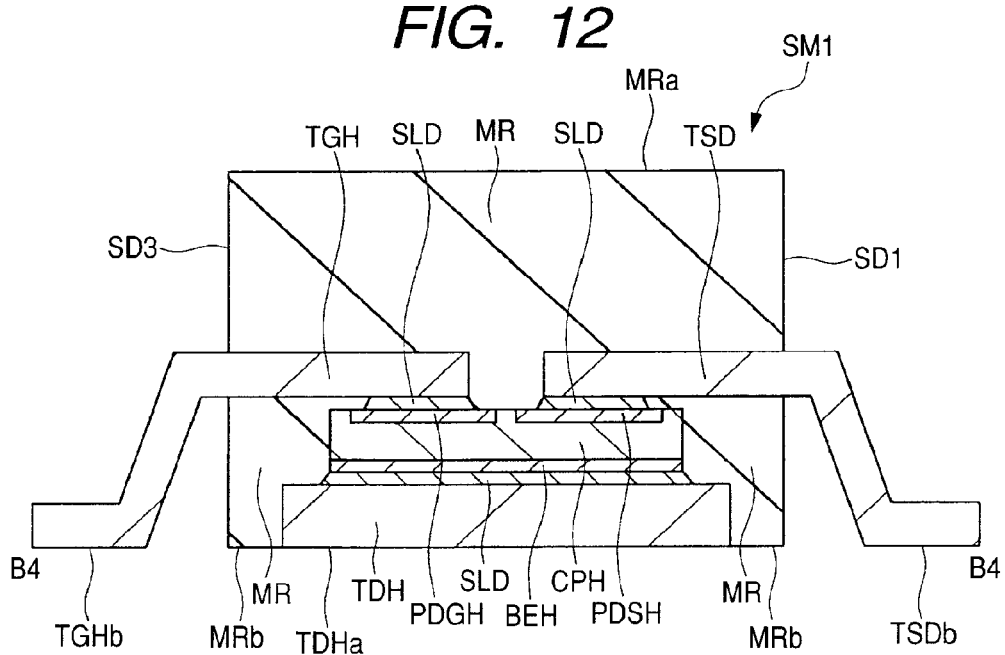
FIG. 12 is a sectional view of a semiconductor device in an embodiment of the invention.
Figure 13:
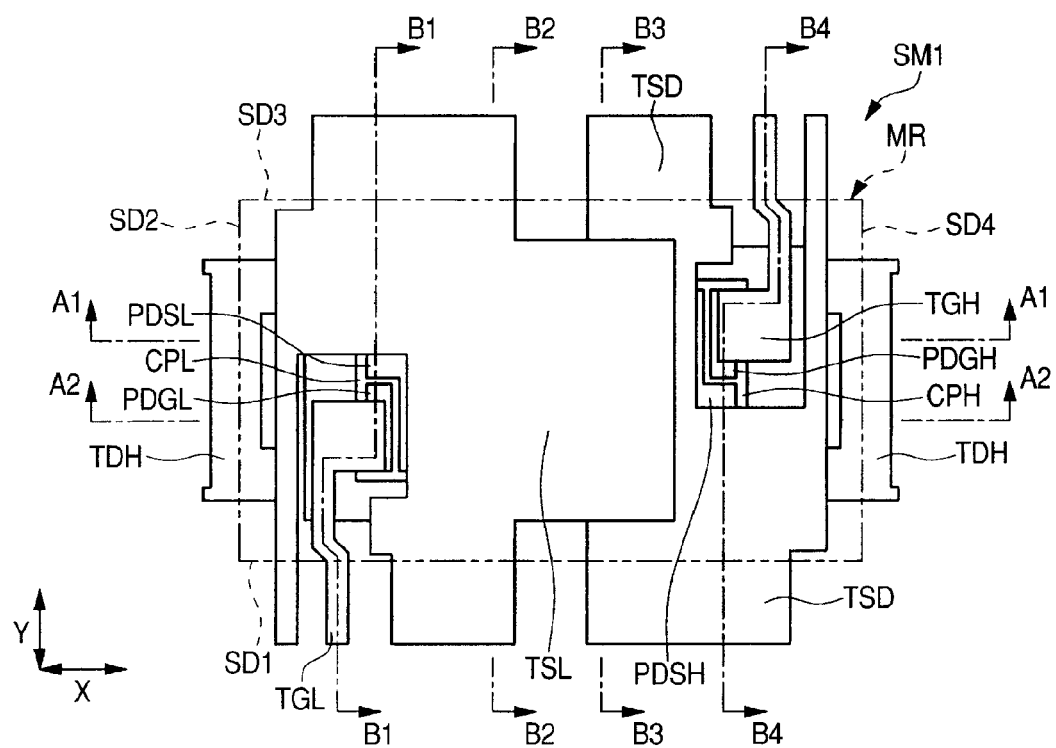
FIG. 13 is a planar transparent view of a semiconductor device in an embodiment of the invention.
Figure 14:
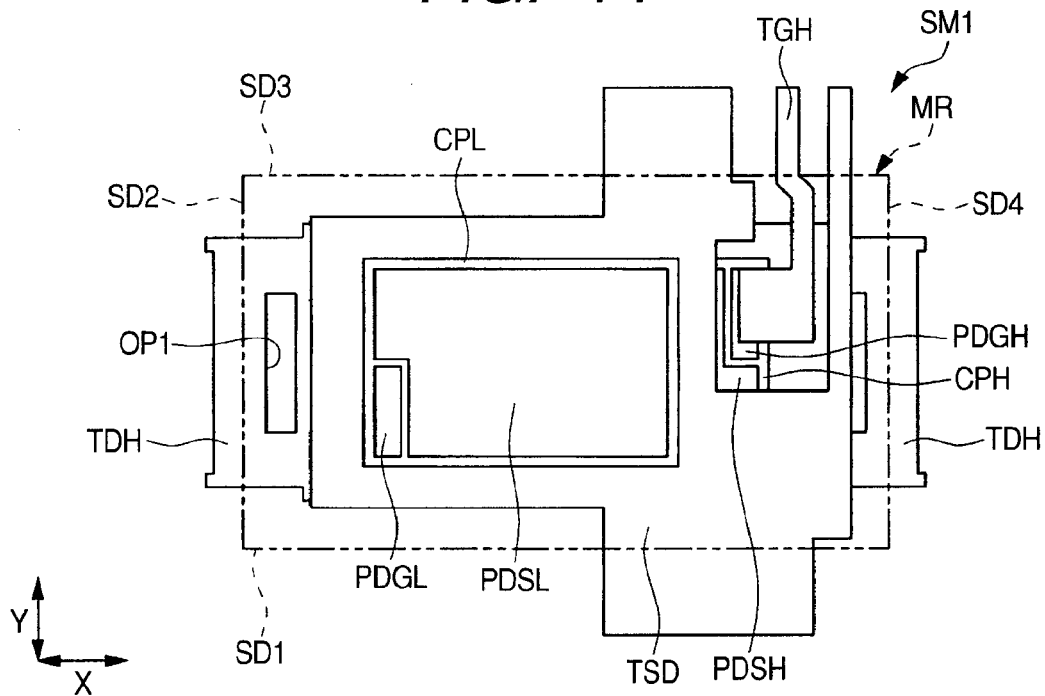
FIG. 14 is a planar transparent view of a semiconductor device in an embodiment of the invention.
Figure 15:
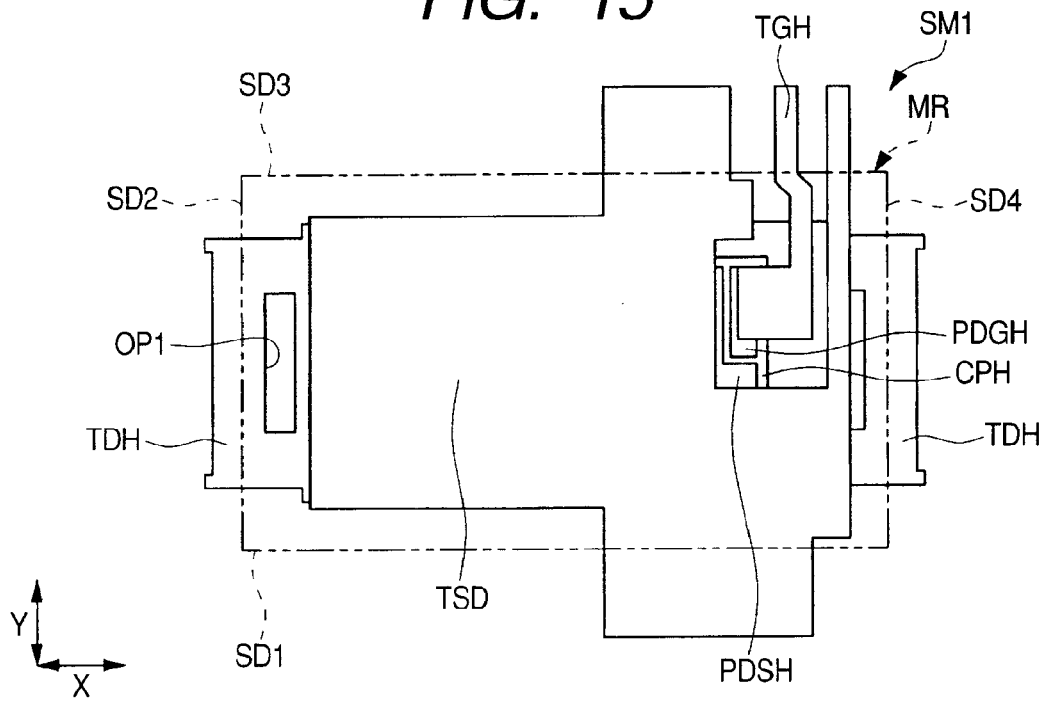
FIG. 15 is a planar transparent view of a semiconductor device in an embodiment of the invention.
Figure 16:
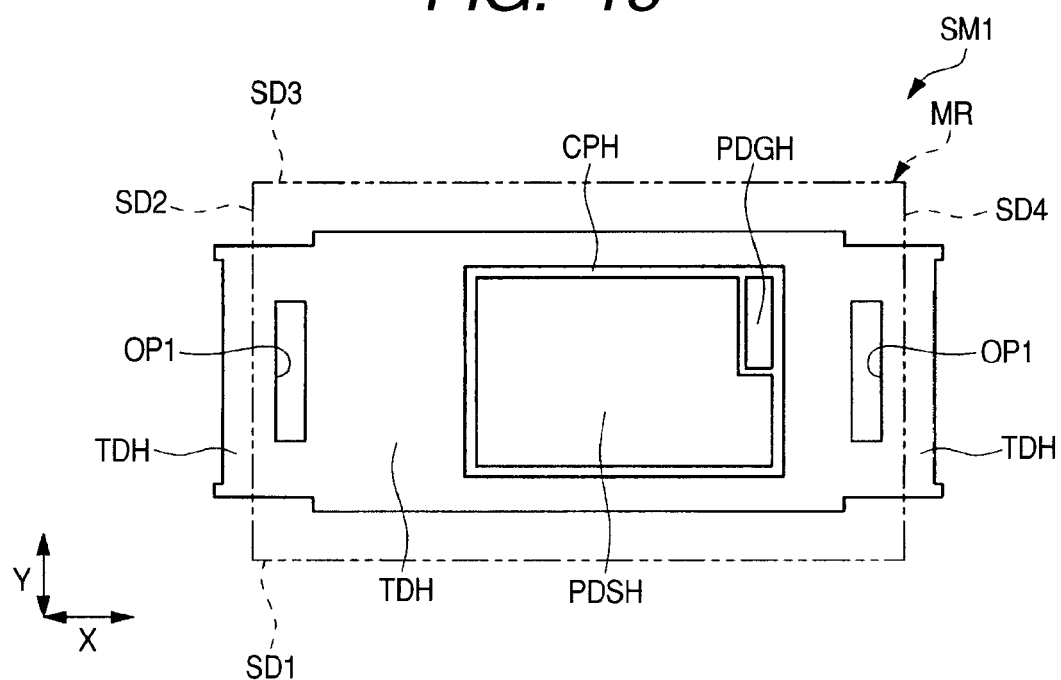
FIG. 16 is a planar transparent view of a semiconductor device in an embodiment of the invention.

FIG. 3 and FIG. 4 are perspective views of the semiconductor device SM1 in this embodiment; FIG. 5 is a top view (plan view) of the semiconductor device SM1; FIG. 6 is a bottom view (bottom plan view, back side back view, plan view) of the semiconductor device SM1; FIG. 7 to FIG. 12 are sectional views (lateral sectional views) of the semiconductor device SM1; and FIG. 13 to FIG. 16 are planar transparent views of the semiconductor device SM1. Among these drawings, FIG. 3 corresponds to a perspective view obtained when the semiconductor device SM1 is obliquely viewed from above; and FIG. 4 corresponds to a perspective view obtained when the semiconductor device SM1 is obliquely viewed from underneath. FIG. 7 substantially corresponds to the section taken along line A1-A1 of FIG. 13; FIG. 8 substantially corresponds to the section taken along line A2-A2 of FIG. 13; FIG. 9 substantially corresponds to the section taken along line B1-B1 of FIG. 13; FIG. 10 substantially corresponds to the section taken along line B2-B2 of FIG. 13; FIG. 11 substantially corresponds to the section taken along line B3-B3 of FIG. 13; and FIG. 12 substantially corresponds to the section taken along line B4-B4 of FIG. 13. FIG. 13 illustrates the semiconductor device SM1 with an encapsulation resin portion MR seen through; FIG. 14 illustrates the semiconductor device SM1 in FIG. 13 with a gate terminal TGL and a source terminal TSL further removed (seen through); FIG. 15 illustrates the semiconductor device SM1 in FIG. 14 with the semiconductor chip CPL further removed (seen through); FIG. 16 illustrates the semiconductor device SM1 in FIG. 15 with a gate terminal TGH and a source-drain terminal TSD further removed (seen through). In FIG. 13 to FIG. 16, the outline of the encapsulation resin portion MR is indicated by alternate long and two short dashes line to facilitate understanding. Code X shown in each plan view indicates a first direction and code Y indicates a second direction orthogonal to (intersecting with) the first direction X. In the following description, the first direction X will be designated as X-direction and the second direction Y will be designated as Y-direction sometimes.

The semiconductor device (semiconductor package) SM1 in this embodiment is a plastic molded semiconductor package. That is, the semiconductor device SM1 is a plastic molded semiconductor package-type semiconductor device.

In this embodiment, as mentioned above, the following chips are put together (packaged) in one semiconductor package to obtain one semiconductor device SM1: the semiconductor chip CPH in which the power MOS QH1 as a field effect transistor for high-side switch is formed; and the semiconductor chip CPL in which the power MOS QL1 as a field effect transistor for low-side switch is formed. This makes it possible to achieve miniaturization (area reduction) of the non-isolated DC-DC converter 1 and, in addition, reduce wiring parasitic inductance; therefore, it is also possible to achieve frequency enhancement and efficiency enhancement.

Concrete description will be given to the structure of the semiconductor device SM1 with reference to FIG. 3 to FIG. 16.

The semiconductor device SM1 in this embodiment illustrated in FIG. 3 to FIG. 16 includes: the semiconductor chips CPH, CPL; the drain terminal TDH, gate terminals TGL, TGH, source terminal TSL, and source-drain terminal TSD which are lead terminal portions formed of conductor; and the encapsulation resin portion (sealing portion, encapsulation resin) MR sealing them.

The encapsulation resin portion MR is composed of a resin material, such as thermosetting resin material, and the like and may contain filler or the like. For example, epoxy resin containing filler and the like can be used to form the encapsulation resin portion MR. The semiconductor chips CPH, CPL, gate terminals TGL, TGH, source terminal TSL, drain terminal TDH, and source-drain terminal TSD are sealed and protected by the encapsulation resin portion MR.

The encapsulation resin portion MR has two main surfaces MRa, MRb positioned opposite to each other. The main surface MRa of the encapsulation resin portion MR is the upper surface (front surface) of the encapsulation resin portion MR (Refer to FIG. 5); and the main surface MRb of the encapsulation resin portion MR is the back surface (bottom surface, lower surface) of the encapsulation resin portion MR. The main surface MRb of the encapsulation resin portion MR, that is, the back surface (bottom surface, lower surface) of the semiconductor device SM1 (Refer to FIG. 6) is the mounting surface of the semiconductor device SM1.

The planar shape of the encapsulation resin portion MR is rectangular (oblong). As illustrated in FIG. 5 and FIG. 6, it has the following sides as viewed in a plane (that is, as viewed in a plane parallel to the main surface MRb of the encapsulation resin portion MR): sides SD1, SD3 that are parallel to the first direction X and opposed to each other; and sides SD2, SD4 that are parallel to the second direction Y orthogonal to the first direction X and opposed to each other.

The semiconductor chips CPL, CPH are obtained by, for example: forming various semiconductor elements or semiconductor integrated circuits in a semiconductor substrate (semiconductor wafer) composed of single crystal silicon or the like; grinding the back surface of the semiconductor substrate as required; and then separating the semiconductor substrate into individual semiconductor chips CPL, CPH by dicing or the like. The semiconductor chip CPL and the semiconductor chip CPH are in rectangular planar shape. The semiconductor chips CPL, CPH are sealed in the encapsulation resin portion MR and neither of them is exposed from the encapsulation resin portion MR.

The semiconductor chip (first semiconductor chip) CPH has two main surfaces positioned opposite to each other: a front surface (main surface on the semiconductor element formation side) and a back surface (main surface on the opposite side to the front surface). The semiconductor chip CPH includes: a source pad electrode (front surface electrode) PDSH and a gate pad electrode (front surface electrode) PDGH formed in the front surface of the semiconductor chip CPH; and a back surface drain electrode (back surface electrode) BEH formed in the entire back surface of the semiconductor chip CPH. (Refer to FIG. 7 and the like.) The main surface of the semiconductor chip CPH on the side where the source pad electrode PDSH and the gate pad electrode PDGH are formed will be designated as the front surface of the semiconductor chip CPH; and the main surface of the semiconductor chip CPH on the back surface drain electrode BEH side will be designated as the back surface of the semiconductor chip CPH. The back surface (back surface drain electrode BEH) of the semiconductor chip CPH is opposed to the drain terminal TDH and the front surface of the semiconductor chip CPH is opposed to the gate terminal TGH and the source-drain terminal TSD.

The back surface drain electrode BEH in the back surface of the semiconductor chip CPH is electrically coupled to the drain D of the power MOS QH1 for high side formed in the semiconductor chip CPH. That is, the back surface drain electrode BEH of the semiconductor chip CPH corresponds to the drain electrode of the power MOS QH1 for high side.

The gate pad electrode (electrode for gate) PDGH in the front surface of the semiconductor chip CPH is electrically coupled to the gate electrode of the power MOS QH1 for high side formed in the semiconductor chip CPH. That is, the gate pad electrode PDGH of the semiconductor chip CPH corresponds to a pad (bonding pad, pad electrode) for the gate electrode of the power MOS QH1 for high side.

The source pad electrode (electrode for source) PDSH in the front surface of the semiconductor chip CPH is electrically coupled to the source S of the power MOS QH1 for high side formed in the semiconductor chip CPH. That is, the source pad electrode PDSH of the semiconductor chip CPH corresponds to a pad (bonding pad, pad electrode) for the source electrode of the power MOS QH1 for high side.

The configuration of the semiconductor chip (second semiconductor chip) CPL is substantially the same as the configuration of the semiconductor chip CPH. More specific description will be given. The semiconductor chip CPL has two main surfaces positioned opposite to each other: a front surface (main surface on the semiconductor element formation side) and a back surface (main surface on the opposite side to the front surface). The semiconductor chip CPL includes: a source pad electrode (front surface electrode) PDSL and a gate pad electrode (front surface electrode) PDGL formed in the front surface of the semiconductor chip CPL; and a back surface drain electrode (back surface electrode) BEL formed in the entire back surface of the semiconductor chip CPL. (Refer to FIG. 7 and the like.) The main surface of the semiconductor chip CPL on the side where the source pad electrode PDSL and the gate pad electrode PDGL are formed will be designated as the front surface of the semiconductor chip CPL; and the main surface of the semiconductor chip CPL on the back surface drain electrode BEL side will be designated as the back surface of the semiconductor chip CPL. The back surface (back surface drain electrode BEL) of the semiconductor chip CPL is opposed to the source-drain terminal TSD and the front surface of the semiconductor chip CPL is opposed to the source terminal TSL and the gate terminal TGL.

The back surface drain electrode BEL in the back surface of the semiconductor chip CPL is electrically coupled to the drain D of the power MOS QL1 for low side formed in the semiconductor chip CPL. That is, the back surface drain electrode BEL of the semiconductor chip CPL corresponds to the drain electrode of the power MOS QL1 for low side.

The gate pad electrode (electrode for gate) PDGL in the front surface of the semiconductor chip CPL is electrically coupled to the gate electrode of the power MOS QL1 for low side formed in the semiconductor chip CPL. That is, the gate pad electrode PDGL of the semiconductor chip CPL corresponds to a pad (bonding pad, pad electrode) for the gate electrode of the power MOS QL1 for low side.

The source pad electrode (electrode for source) PDSL in the front surface of the semiconductor chip CPL is electrically coupled to the source S of the power MOS QL1 for low side formed in the semiconductor chip CPL. That is, the source pad electrode PDSL of the semiconductor chip CPL corresponds to a pad (bonding pad, pad electrode) for the source electrode of the power MOS QL1 for low side.

The following terminals are composed of conductor, preferably, metal material such as copper (Cu) or copper alloy: the drain terminal (terminal for drain, conductor portion for drain joining, chip placement portion) TDH; gate terminals (terminals for gate, conductor portion for gate joining, lead terminal portions) TGL, TGH; the source terminal (terminal for source, conductor portion for source joining, lead terminal portion) TSL; and the source-drain terminal (terminal for source and drain, conductor portion for source and drain joining, lead terminal portion) TSD.

As seen from FIG. 7 to FIG. 12 as well, the semiconductor chip CPH is arranged between the drain terminal TDH positioned under the semiconductor chip CPH and the gate terminal TGH and source-drain terminal TSD positioned above the semiconductor chip CPH. The semiconductor chip CPH is placed so that the front surface side of the semiconductor chip CPH faces upward (toward the gate terminal TGH and the source-drain terminal TSD). The semiconductor chip CPL is positioned between the source-drain terminal TSD positioned under the semiconductor chip CPL and the gate terminal TGL and source terminal TSL positioned above the semiconductor chip CPL. The semiconductor chip CPL is placed so that the front surface of the semiconductor chip CPL faces upward (toward the gate terminal TGL and the source terminal TSL). That is, the semiconductor chip CPH is placed over the drain terminal TDH; the gate terminal TGH and the source-drain terminal TSD are placed over the semiconductor chip CPH; the semiconductor chip CPL is placed over the source-drain terminal TSD; and the gate terminal TGL and the source terminal TSL are placed over the semiconductor chip CPL.

(The upper surface of) the drain terminal TDH is joined (bonded, coupled) and electrically coupled with the back surface drain electrode BEH of the semiconductor chip CPH through solder SLD. (The lower surface of) the gate terminal TGH is joined (bonded, coupled) and electrically coupled with the gate pad electrode PDGH in the front surface of the semiconductor chip CPH through solder SLD; and (the lower surface of) the source-drain terminal TSD is joined (bonded, coupled) and electrically coupled with the source pad electrode PDSH in the front surface of the semiconductor chip CPH through solder SLD. (The upper surface of) the source-drain terminal TSD is joined (bonded, coupled) and electrically coupled with the back surface drain electrode BEL of the semiconductor chip CPL through solder SLD. (The lower surface of) the gate terminal TGL is joined (bonded, coupled) and electrically coupled with the gate pad electrode PDGL in the front surface of the semiconductor chip CPL through solder SLD; and (the lower surface of) the source terminal TSL is joined (bonded, coupled) and electrically coupled with the source pad electrode PDSL in the front surface of the semiconductor chip CPL through solder SLD. For this reason, the source-drain terminal TSD is electrically coupled to the source pad electrode PDSH of the semiconductor chip CPH through solder SLD and is also electrically coupled to the back surface drain electrode BEL of the semiconductor chip CPL through solder SLD.

The semiconductor chip CPH is placed over (die-bonded to) the drain terminal TDH through solder SLD; therefore, the drain terminal TDH can be considered as a chip placement portion (die pad portion). The gate terminals TGL, TGH, source terminal TSL, and source-drain terminal TSD function to draw each electrode of the semiconductor chips CPH, CPL in the encapsulation resin portion MR to outside the encapsulation resin portion MR; therefore, they can be considered as lead terminal portions (lead terminals, lead portions). The semiconductor chip CPL is placed over (die-bonded to) the source-drain terminal TSD through solder SLD; therefore, the source-drain terminal TSD can be considered as what functions both as a chip placement portion and as a lead terminal portion (lead terminal, lead portion).

The drain terminal TDH is not bent (not subjected to bending work) and is flat. The lower surface (main surface) TDHa of the drain terminal TDH is exposed from the main surface MRb of the encapsulation resin portion MR. The drain terminal TDH has two main surfaces positioned opposite to each other. Its main surface on the side where the semiconductor chip CPH is placed (that is, the side opposite to the back surface of the semiconductor chip CPH) will be designated as the upper surface of the drain terminal TDH; and its main surface on the opposite side to this upper surface will be designated as lower surface TDHa.

Parts of the drain terminal TDH (that is, its end portions on the side it is cut off from a lead frame LF1 at the Step S11 described later) are slightly protruded from the lateral surfaces of the encapsulation resin portion MR corresponding to the sides SD2, SD4. The other lateral surfaces of the drain terminal TDH are covered with and sealed in the encapsulation resin portion MR. Part of the upper surface of the drain terminal TDH is joined to the back surface drain electrode BEH of the semiconductor chip. CPH through solder SLD. The other part of the upper surface of the drain terminal TDH is covered with and sealed in the encapsulation resin portion MR. As illustrated in FIG. 6 to FIG. 8 and FIG. 12, the drain terminal TDH is provided in its areas other than the area directly under the semiconductor chip CPH with openings (hole portions, through holes) OP1. The openings are extended from the upper surface of the drain terminal TDH to its lower surface TDHa. The drain terminal TDH is made less prone to come off from the encapsulation resin portion MR by filling these openings OP1 with the encapsulation resin portion MR.

Part (outer lead portion) of each of the gate terminal TGH, source-drain terminal TSD, gate terminal TGL and source terminal TSL as lead terminals is protruded outward from lateral surfaces of the encapsulation resin portion MR and is bent outside the encapsulation resin portion MR. That is, each of the gate terminal TGH, source-drain terminal TSD, gate terminal TGL, and source terminal TSL is so formed that the following is implemented: its portion positioned in the encapsulation resin portion MR is flat; but it is bent at its portion protruded from a lateral surface of the encapsulation resin portion MR (its portion positioned outside the encapsulation resin portion MR, that is, an outer lead portion). (Refer to FIG. 9, FIG. 12, and the like.)

In each of the gate terminal TGH, source-drain terminal TSD, gate terminal TGL, and source terminal. TSL, a portion positioned outside the encapsulation resin portion MR will be designated as outer lead portion; and a portion positioned within the encapsulation resin portion MR will be designated as inner lead portion. In each of the gate terminal TGH, source-drain terminal TSD, gate terminal TGL, and source terminal TSL, the inner lead portion and the outer lead portion are integrally formed. It is the inner lead portion of the source-drain terminal TSD that is joined both to the source pad electrode PDSH of the semiconductor chip CPH and the back surface drain electrode BEL of the semiconductor chip CPL with solder SLD; and it is the inner lead portion of the gate terminal TGH that is joined to the gate pad electrode PDGH of the semiconductor chip CPH with solder SLD. It is the inner lead portion of the source terminal TSL that is joined to the source pad electrode PDSL of the semiconductor chip CPL with solder SLD; and it is the inner lead portion of the gate terminal TGL that is joined to the gate pad electrode PDGL of the semiconductor chip CPL with solder SLD.

The lower surfaces of the following outer lead portions formed by bending are formed substantially flush with the lower surface TDHa of the drain terminal TDH exposed in the main surface MRb of the encapsulation resin portion MR: the lower surface TGHb of the outer lead portion of the gate terminal TGH and the lower surface TSDb of the outer lead portion of the source-drain terminal TSD (Refer to FIG. 12); and the lower surface TGLb of the outer lead portion of the gate terminal TGL and the lower surface TSLb of the outer lead portion of the source terminal TSL (Refer to FIG. 9). These lower surfaces, listed below, located in the same plane become the terminals for external coupling (external terminals) of the semiconductor device SM1: the lower surface TGHb of the outer lead portion of the gate terminal TGH; the lower surface TSDb of the outer lead portion of the source-drain terminal TSD; the lower surface TGLb of the outer lead portion of the gate terminal TGL; the lower surface TSLb of the outer lead portion of the source terminal TSL; and the lower surface TDHa of the drain terminal TDH. For this reason, the semiconductor device SM1 can be surface mounted and the back surface of the semiconductor device SM1 (the main surface MRb of the encapsulation resin portion MR) is the mounting surface of the semiconductor device SM1.

In the semiconductor device SM1, the source-drain terminal TSD is joined and electrically coupled to both of the following through solder SLD: the source pad electrode PDSH of the semiconductor chip CPH positioned underneath and the back surface drain electrode BEL of the semiconductor chip CPL positioned above. For this reason, the source pad electrode PDSH of the semiconductor chip CPH positioned underneath and the back surface drain electrode BEL of the semiconductor chip CPL positioned above are electrically coupled together through the solder SLD and the source-drain terminal TSD. Therefore, the source-drain terminal TSD functions both as the source terminal of the semiconductor chip CPH positioned underneath and as the drain terminal of the semiconductor chip CPL positioned above. As a result, the source of the power MOS QH1 and the drain of the power MOS QL1 are electrically coupled together. This makes it possible to couple the power MOS QH1 formed in the semiconductor chip CPH positioned underneath and the power MOS QL1 formed in the semiconductor chip CPL positioned above in series.

When the terminals and semiconductor chips in the encapsulation resin portion MR of the semiconductor device SM1 are considered to be of laminar structure, they are placed as follows: the drain terminal TDH is placed in the first layer as the lowermost layer; the semiconductor chip CPH is placed in the second layer positioned thereabove; the gate terminal TGH and the source-drain terminal TSD are placed in the third layer positioned thereabove; the semiconductor chip CPL is placed in the fourth layer positioned thereabove; and the gate terminal TGL and the source terminal TSL are placed in the fifth layer positioned thereabove. The gate terminal TGL and source terminal TSL placed in the fifth layer are arranged in the same layer (the same height position). (Refer to FIG. 9.) However, they are separated so that they do not planarly overlap with each other and electrically isolated from each other by the encapsulation resin portion MR positioned in between. The gate terminal TGH and source-drain terminal TSD placed in the third layer are arranged in the same layer (the same height position). However, they are separated so that they do not planarly overlap with each other and electrically isolated from each other by the encapsulation resin portion MR positioned in between. (Refer to FIG. 12.)

"As viewed in a plane" cited in this specification means that something is viewed in a plane parallel to the lower surface of the drain terminal TDH. (This plane is also a plane parallel to the main surface MRb of the encapsulation resin portion MR and also corresponds to a plane substantially parallel to the front surfaces and back surfaces of the semiconductor chips CPH, CPL.)

The semiconductor chip CPH is placed (set) over the drain terminal TDH with solder SLD in between and the semiconductor chip CPH is planarly embraced in the drain terminal TDH. The gate terminal TGH and the source-drain terminal TSD are placed (set) over the semiconductor chip CPH with solder SLD in between. Part of the gate terminal TGH and part of the source-drain terminal TSD planarly overlap with the semiconductor chip CPH. More specific description will be given. Part of the gate terminal TGH planarly overlaps with the gate pad electrode PDGH of the semiconductor chip CPH. In this overlap area, the gate terminal TGH and the gate pad electrode PDGH of the semiconductor chip CPH are joined together with solder SLD. Part of the source-drain terminal TSD partly overlaps with the source pad electrode PDSH of the semiconductor chip CPH. In this overlap area, the source-drain terminal TSD and the source pad electrode PDSH of the semiconductor chip CPH are joined together with solder SLD.

The semiconductor chip CPL is placed (set) over the source-drain terminal TSD with solder SLD in between and the semiconductor chip CPL is planarly embraced in the source-drain terminal TSD. The gate terminal TGH does not planarly overlap with the semiconductor chip CPL. (Refer to FIG. 7 and the like.) Since the gate terminal TGH does not planarly overlap with the semiconductor chip CPL, the gate terminal TGH is not in contact with the semiconductor chip CPL (especially, the back surface drain electrode BEL). The back surface drain electrode BEL of the semiconductor chip CPL is electrically coupled to the source-drain terminal TSD through solder SLD but it is not electrically coupled with the gate terminal TGH.

The gate terminal TGL and the source terminal TSL are placed (set) over the semiconductor chip CPL with solder SLD in between. Part of the gate terminal TGL and part of the source terminal TSL planarly overlap with the semiconductor chip CPL. (Refer to FIG. 9 and the like.) More specific description will be given. Part of the gate terminal TGL is planarly overlaps with the gate pad electrode PDGL of the semiconductor chip CPL. In this overlap area, the gate terminal TGL and the gate pad electrode PDGL of the semiconductor chip CPL are joined together with solder SLD. Part of the source terminal TSL planarly overlaps with the source pad electrode PDSL of the semiconductor chip CPL. In this overlap area, the source terminal TSL and the source pad electrode PDSL of the semiconductor chip CPL are joined together with solder SLD.

The gate terminal TGL is drawn from the lateral surface of the encapsulation resin portion MR corresponding to the side SD1 to outside the encapsulation resin portion MR and is bent. The gate terminal TGH is drawn from the lateral surface of the encapsulation resin portion MR corresponding to the side SD3 to outside the encapsulation resin portion MR and is bent. The source terminal TSL is drawn from the lateral surface of the encapsulation resin portion MR corresponding to the side SD1 and the lateral surface thereof corresponding to the side SD3 to outside the encapsulation resin portion MR and is bent. The source-drain terminal TSD is drawn from the lateral surface of the encapsulation resin portion MR corresponding to the side SD1 and the lateral surface thereof corresponding to the side SD3 to outside the encapsulation resin portion MR and is bent. At the lateral surface of the encapsulation resin portion MR corresponding to the side SD1, the terminal TSL is drawn to outside the encapsulation resin portion MR at two points and is bent. Thus the outer lead portion of the gate terminal TGL is sandwiched between the two drawn parts of the source terminal TSL. At the lateral surface of the encapsulation resin portion MR corresponding to the side SD3, the source-drain terminal TSD is drawn to outside the encapsulation resin portion MR at two points and is bent. Thus the outer lead portion of the gate terminal TGH is sandwiched between the two drawn parts of the source-drain terminal TSD.

The gate terminal TGL and the source terminal TSL are drawn from lateral surfaces of the encapsulation resin portion MR to outside the encapsulation resin portion MR at the same height position. The gate terminal TGH and the source-drain terminal TSD are drawn from lateral surfaces of the encapsulation resin portion MR to outside the encapsulation resin portion MR at the same height position. However, the gate terminal TGL and the source terminal TSL are drawn from a lateral surface of the encapsulation resin portion MR to outside the encapsulation resin portion MR at a height position different from that of the gate terminal TGH and the source-drain terminal TSD. More specific description will be given. The gate terminal TGH and the source-drain terminal TSD are drawn from lateral surfaces of the encapsulation resin portion MR to outside the encapsulation resin portion MR at the following position: at a position lower than the height position at which the gate terminal TGL and the source terminal TSL are drawn to outside the encapsulation resin portion MR. The drain terminal TDH is located at a position lower than the height position at which the gate terminal TGH and the source-drain terminal TSD are drawn to outside the encapsulation resin portion MR.

In the encapsulation resin portion MR, the gate terminal TGL and source terminal TSL in the same layer (at the same height position) do not planarly overlap with each other; and the gate terminal TGH and source-drain terminal TSD in the same layer (at the same height position) do not planarly overlap with each other. This is intended to implement the following in the encapsulation resin portion MR: the gate terminal TGL and source terminal TSL in the same layer are electrically separated from each other and the gate terminal TGH and source-drain terminal TSD in the same layer are electrically separated from each other.

In the encapsulation resin portion MR, part of the source terminal TSL and the gate terminal TGL planarly overlaps with the source-drain terminal TSD positioned thereunder. The reason for this is as follows: to join the entire back surface drain electrode BEL of the semiconductor chip CPL to the source-drain terminal TSD with solder SLD, the semiconductor chip CPL is so arranged that it is planarly embraced in the source-drain terminal TSD; the source terminal TSL is so arranged that it planarly overlaps with the source pad electrode PDSL of the semiconductor chip CPL; and the gate terminal TGL is so arranged that it planarly overlaps with gate pad electrode PDGL of the semiconductor chip CPL. In the encapsulation resin portion MR, for this reason, the source terminal TSL and the gate terminal TGL are opposed to (that is, planarly overlap with) the source-drain terminal TSD with the semiconductor chip CPL in between.

Outside the encapsulation resin portion MR, meanwhile, the source terminal TSL, gate terminal TGL, source-drain terminal TSD, and gate terminal TGH do not planarly overlap with one another. (Refer to FIG. 6 and the like.) Short-circuiting between terminals can be easily prevented outside the encapsulation resin portion MR by ensuring that the source terminal TSL, gate terminal TGL, source-drain terminal TSD, and gate terminal TGH do not planarly overlap with one another outside the encapsulation resin portion MR. In addition, the encapsulation resin portion MR can be easily formed at the molding step described later, or Step S8.

In the semiconductor device SM1 in this embodiment, the semiconductor chip CPL and the semiconductor chip CPH are vertically stacked. Therefore, the plane area of the semiconductor device SM1 in this embodiment can be reduced as compared with cases where the semiconductor chip CPH and the semiconductor chip CPL are laterally arranged and packaged unlike this embodiment. For this reason, it is possible to reduce the mounting area (area required for mounting the semiconductor device SM1) in a mounting board for mounting the semiconductor device SM1. Thus an electronic device (the non-isolated DC-DC converter 1) using the semiconductor device SM1 can be reduced in size (area). In the semiconductor device SM1 in this embodiment, as mentioned above, the semiconductor chip CPL and the semiconductor chip CPH are vertically stacked. Further, the back surface drain electrode BEL of the semiconductor chip CPL and the source pad electrode PDSH of the semiconductor chip CPH are electrically coupled together though the source-drain terminal TSD located between the semiconductor chip CPL and the semiconductor chip CPH. This makes it possible to reduce the wiring parasitic inductance in the semiconductor device SM1. Therefore, it is possible to enhance the performance of the semiconductor device SM1 and an electronic device (the non-isolated DC-DC converter 1) using it and to achieve frequency enhancement and efficiency enhancement. Consequently, the characteristics of the semiconductor device SM1 can be enhanced.

In the semiconductor device SM1 in this embodiment, as mentioned above, two semiconductor chips CPH, CPL are vertically laminated. However, the semiconductor chip CPL and the semiconductor chip CPH are so set that the semiconductor chip CPL does not overlap with the area located directly above the gate pad electrode PDGH of the semiconductor chip CPH. (That is, the semiconductor chips are so set that the semiconductor chip CPL does not planarly overlap with the gate pad electrode PDGH of the semiconductor chip CPH.) In other words, the semiconductor chip CPL is prevented from being positioned directly above the gate pad electrode PDGH of the semiconductor chip CPH. (Refer to FIG. 7 and the like.) As a result, the gate terminal TGH can be set so that it planarly overlaps with the gate pad electrode PDGH of the semiconductor chip CPH but it does not planarly overlap with the semiconductor chip CPL. Therefore, it is possible to set the gate terminal TGH over the gate pad electrode PDGH of the semiconductor chip CPH so that it is not in contact with the semiconductor chip CPL (especially, the back surface drain electrode BEL). For this reason, it is possible to electrically couple the gate terminal TGH to the gate pad electrode PDGH of the semiconductor chip CPH but not to electrically couple it with the back surface drain electrode BEL of the semiconductor chip CPL.

As mentioned above, the semiconductor chip CPL is so arranged that it does not overlap with the area positioned directly above the gate pad electrode PDGH of the semiconductor chip CPH. (That is, the semiconductor chip CPL is so arranged that it does not exist directly above the gate pad electrode PDGH of the semiconductor chip CPH.) For this purpose, the semiconductor chip CPH and the semiconductor chip CPL are so arranged that their respective centers are displaced from each other. (Refer to FIG. 7, FIG. 8, and the like.)

As mentioned above, the semiconductor chip CPL is so arranged that it does not overlap with the area positioned directly above the gate pad electrode PDGH of the semiconductor chip CPH. However, it is desirable that the semiconductor chip CPL and the semiconductor chip CPH should partly planarly overlap with each other. As a result, the gate terminal TGH can be electrically coupled to the gate pad electrode PDGH of the semiconductor chip CPH without electrically coupling it to the back surface drain electrode BEL of the semiconductor chip CPL. At the same time, the plane area of the semiconductor device SM1 can be reduced by an amount equivalent to the overlap between the semiconductor chip CPH and the semiconductor chip CPL. Further, it is possible to electrically couple together the back surface drain electrode BEL of the semiconductor chip CPL and the source pad electrode PDSH of the semiconductor chip CPH using the shortest path through the source-drain terminal TSD sandwiched therebetween. For this reason, the wiring parasitic inductance in the semiconductor device SM1 can be further reduced. This is advantageous to the enhancement of the performance, for example, frequency enhancement and efficiency enhancement, of the semiconductor device SM1 and an electronic device (non-isolated DC-DC converter 1) using it.

It is desirable that the semiconductor chip CPL with the power MOS QL1 for low side formed therein and the semiconductor chip CPH with the power MOS QH1 for high side formed therein should be made identical in size (dimensions). When the semiconductor chip CPL and the semiconductor chip CPH are made identical in size, a configuration in which a larger semiconductor chip is set over a smaller semiconductor chip is avoided. As a result, the package structure of the semiconductor device SM1 is balanced and an assembly step (manufacturing process) for the semiconductor device SM1 becomes easy to carry out.

It is more desirable to make the following identical with each other in addition to making the semiconductor chip CPL and the semiconductor chip CPH identical in size (dimensions): the shapes and arrangement of the source pad electrode PDSH and the gate pad electrode PDGH in the semiconductor chip CPH; and the shapes and arrangement of the source pad electrode PDSL and the gate pad electrode PDGL in the semiconductor chip CPL. That is, it is more desirable to use semiconductor chips with the same configuration for the semiconductor chip CPL and the semiconductor chip CPH. This makes it possible to use common semiconductor chips both for the semiconductor chip CPL and for the semiconductor chip CPH and reduce the cost of the semiconductor device SM1. Because of circuitry, a larger current flows in the power MOS QL1 for low side than in the power MOS QH1 for high side. Therefore, it is desirable to take the following measure: a semiconductor chip in optimal size is prepared for the semiconductor chip CPL in which the power MOS QL1 for low side is formed and this semiconductor chip is used not only for the semiconductor chip CPL but also for the semiconductor chip CPH.

When the semiconductor chip CPL and the semiconductor chip CPH are identical in size, the following measure can be taken to prevent the semiconductor chip CPL from overlapping with the area positioned directly above the gate pad electrode PDGH of the semiconductor chip CPH: the semiconductor chip CPH and the semiconductor chip CPL are so arranged that their respective centers are displaced from each other as viewed in a plane. This makes it possible to prevent the semiconductor chip CPL from overlapping with the area positioned directly above the gate pad electrode PDGH of the semiconductor chip CPH. Therefore, it is possible to electrically couple the gate terminal TGH to the gate pad electrode PDGH of the semiconductor chip CPH and prevent it from being electrically coupled to the back surface drain electrode BEL of the semiconductor chip CPL. (Refer to FIG. 7 and the like.)

As mentioned above, the semiconductor chip CPL and the semiconductor chip CPH identical in chip size and the shapes and arrangement of the source pad electrode and the gate pad electrode are vertically arranged so that their respective centers are displaced from each other. In this case, as seen from the comparison of FIG. 14 and FIG. 16, it is desirable that the arrangement of the semiconductor chip CPL should correspond to the arrangement obtained by turning the semiconductor chip CPH 180°. That is, it is desirable that the orientation of the semiconductor chip CPL should be made identical with the orientation obtained by turning the semiconductor chip CPH 180°. (Specifically, this orientation is equivalent to the orientation obtained by turning the semiconductor chip CPH 180° in a plane parallel to the front surface or back surface thereof.) In other words, the following measure is taken when two semiconductor chips with the same configuration are used for the semiconductor chip CPL and the semiconductor chip CPH and vertically arranged with their respective centers displaced from each other: the two semiconductor chips are not set in the same orientation but one is set as the semiconductor chip CPH and the other is set as the semiconductor chip CPL in the orientation obtained by turning the one 180°. Thus the semiconductor chip CPH and the semiconductor chip CPL are set in orientations obtained by turning each other 180°. The semiconductor chip CPL and the semiconductor chip CPH are displaced so that the gate pad electrode PDGH of the semiconductor chip CPH and the gate pad electrode PDGL of the semiconductor chip CPL get away from each other unlike the following cases: cases where the center of the semiconductor chip CPH and the center of the semiconductor chip CPL agree with each other. This makes it possible to prevent the semiconductor chip CPL from overlapping with the area positioned directly above the gate pad electrode PDGH of the semiconductor chip CPH even though the displacement between the semiconductor chip CPL and the semiconductor chip CPH is small. (That is, the semiconductor chip CPL can be prevented from overlapping with the area positioned directly above the gate pad electrode PDGH of the semiconductor chip CPH even though the area of overlap between the semiconductor chips CPL, CPH is large.) Therefore, the plane area of the semiconductor device SM1 can be further reduced.

It is desirable that the thickness T1 of the drain terminal TDH should be larger than the following thicknesses: the thickness T2 of the gate terminal TGH, the thickness T3 of the source-drain terminal TSD, the thickness T4 of the gate terminal TGL, and the thickness T5 of the source terminal TSL (That is, T1>T2, T3, T4, T5). The reason for this will be described below. The thicknesses T1 to T5 are defined in FIG. 7 and FIG. 8.

Heat from the semiconductor chips CPH, CPL is radiated mainly from the drain terminal TDH, gate terminal TGH, source-drain terminal TSD, gate terminal TGL, and source terminal TSL to outside the semiconductor device SM1. (The heat is radiated to, for example, the mounting board over which the semiconductor device SM1 is mounted.) Of these terminals, the drain terminal TDH exposed in the main surface MRb of the encapsulation resin portion MR contributes most to heat radiation. For this reason, the heat radiation characteristics of the semiconductor device SM1 can be enhanced (that is, the thermal resistance of the semiconductor device SM1 can be reduced) by increasing the thickness T1 of the drain terminal TDH.

Meanwhile, the gate terminal TGH, source-drain terminal TSD, gate terminal TGL, and source terminal TSL are bent outside the encapsulation resin portion MR. If the thicknesses T2, T3, T4, T5 are too large, their moldability is degraded and it is difficult to bend them. If the drain terminal TDH, gate terminal TGH, source-drain terminal TSD, gate terminal TGL, and source terminal TSL are all thickened, increase in the size (thickness) of the semiconductor device is incurred.

For this reason, the following can be implemented by making the thickness T2, T3, T4, T5 of each of the gate terminal TGH, source-drain terminal TSD, gate terminal TGL, and source terminal TSL smaller than the thickness T1 of the drain terminal TDH: it can be made easier to mold (bend) the gate terminal TGH, source-drain terminal TSD, gate terminal TGL, and source terminal TSL. Since the drain terminal TDH is flat and is not bent, no processing problem arises even when it is thicker than the gate terminal TGH, source-drain terminal TSD, gate terminal TGL, and source terminal TSL. As mentioned above, the following can be implemented by making the drain terminal TDH thicker than the gate terminal TGH, source-drain terminal TSD, gate terminal TGL, and source terminal TSL: both enhancement of the heat radiation characteristics of the semiconductor device SM1 and ease of terminal processing can be achieved. In addition, the size (thickness) of the semiconductor device SM1 can be reduced.

In consideration of ease of processing of a lead frame (corresponding to the lead frames LF1, LF2, LF3 described later) for the manufacture of the semiconductor device SM1, it is desirable to take the following measure: the thickness T2 of the gate terminal TGH and the thickness T3 of the source-drain terminal TSD are made equal to each other (that is, T2=T3). Further, it is desirable that the thickness T4 of the gate terminal TGL and the thickness T5 of the source terminal TSL should be equal to each other (T4=T5). The thickness T1 of the drain terminal TDH is identical with the thickness of the lead frame LF1 described later; the respective thicknesses T2, T3 of the gate terminal TGH and the source-drain terminal TSD are identical with the thickness of the lead frame LF2 described later; and the respective thicknesses T4, T5 of the gate terminal TGL and the source terminal TSL are identical with the thickness of the lead frame LF3 described later. For the above-mentioned reason, therefore, it is desirable to make the thickness of the lead frame LF1 described later larger than the respective thicknesses of the lead frames LF2, LF3 described later.

As an example of the thickness T1 to T5 of each terminal, the following measure can be taken: the thickness T1 of the drain terminal TDH (that is, the thickness of the lead frame LF1 described later) is set to, for example, 0.4 mm or so; and the thickness T2, T3, T4, T5 of each of the gate terminal TGH, source-drain terminal TSD, gate terminal TGL, and source terminal TSL is set to, for example, 0.2 mm or so. (That is, the thickness of each of the lead frames LF2, LF3 described later is set to this value.)

In the encapsulation resin portion MR, the source terminal TSL is placed in a layer (height position) different from that of the gate terminal TGH and the source-drain terminal TSD. Therefore, the source terminal TSL could also be provided so that it planarly overlaps with the gate pad electrode PDGH of the semiconductor chip CPH; however, it is desirable that the source terminal TSL should not planarly overlap with the gate pad electrode PDGH of the semiconductor chip CPH. (Refer to FIG. 7, FIG. 13, and the like.) As a result, the following effect can be obtained. The gate terminal TGH is joined to the gate pad electrode PDGH of the semiconductor chip CPH with solder SLD by the solder reflow processing, described later, at Step S7. Until the stage prior to the formation of the encapsulation resin portion MR at the molding step, described later, or Step S8 after then, the source terminal TSL does not interfere; and the state of junction between the gate terminal TGH and the gate pad electrode PDGH of the semiconductor chip CPH through solder SLD can be observed (appearance inspection). In addition, the source terminal TSL does not interfere and the state of junction between the source-drain terminal TSD and the source pad electrode PDSH of the semiconductor chip CPH through solder SLD can be observed (appearance inspection). For this reason, the reliability of the semiconductor device SM1 can be enhanced.

To facilitate this observation (appearance inspection), it is more desirable that the following state should be established as illustrated in FIG. 13 to FIG. 15: part of each of the gate pad electrode PDGH and source pad electrode PDSH of the semiconductor chip CPH does not planarly overlap with the gate terminal TGH, source-drain terminal TSD, source terminal TSL, or gate terminal TGL. That is, it is more desirable that the following state should be established: part (most part) of the gate pad electrode PDGH of the semiconductor chip CPH planarly overlaps with the gate terminal TGH but the remaining part does not planarly overlap with the gate terminal TGH, source-drain terminal TSD, source terminal TSL, or gate terminal TGL. Further, it is more desirable that the following state should be established: part (most part) of the source pad electrode PDSH of the semiconductor chip CPH planarly overlaps with the source-drain terminal TSD but the remaining part does not planarly overlap with the gate terminal TGH, source-drain terminal TSD, source terminal TSL, or gate terminal TGL.

The following widths external to the encapsulation resin portion MR will be set as follows: the widths of the outer lead portions of the source-drain terminal TSD are W1 and W2; the widths of the outer lead portions of the source terminal TSL are W3 and W4; the width of the outer lead portion of the gate terminal TGH is W5; and the width of the outer lead portion of the gate terminal TGL is W6. At this time, it is desirable that the widths W1, W2, W3, W4 should be larger than the widths W5, W6 (that is, W1, W2, W3, W4>W5, W6). Each width W1 to W6 is defined in FIG. 5. As a result, it is possible to reduce the on-resistance of the power MOS QL1 for low side and power MOS QH1 for high side incorporated in the semiconductor device SM1. Further, it is possible to enhance the heat radiation characteristics of the semiconductor device SM1 (that is, reduce the thermal resistance of the semiconductor device SM1).

<Configuration of Semiconductor Chip>

Description will be given to an example of the configuration of the semiconductor chips CPH, CPL used in the semiconductor device SM1 in this embodiment.

The semiconductor chips CPH, CPL used in this embodiment are power MOSFET chips (semiconductor chips in which a power MOSFET is formed) and are specifically semiconductor chips in which a vertical MOSFET is formed. The vertical MOSFET cited here corresponds to MOSFET in which a source-drain current flows in the direction of the thickness of a semiconductor substrate (direction substantially perpendicular to the main surface of the semiconductor substrate). As mentioned above, a semiconductor chip in which a vertical MOSFET is formed is used for the semiconductor chips CPH, CPL. This is also intended to couple the semiconductor chip CPH (power MOS QH1) and the semiconductor chip CPL (power MOS QL1) in series so that the following is implemented: the semiconductor chip CPH is sandwiched between the drain terminal TDH and the source-drain terminal TSD and gate terminal TGH; and the semiconductor chip CPL is sandwiched between the source-drain terminal TSD and the source terminal TSL and gate terminal TGL.

Figure 17:
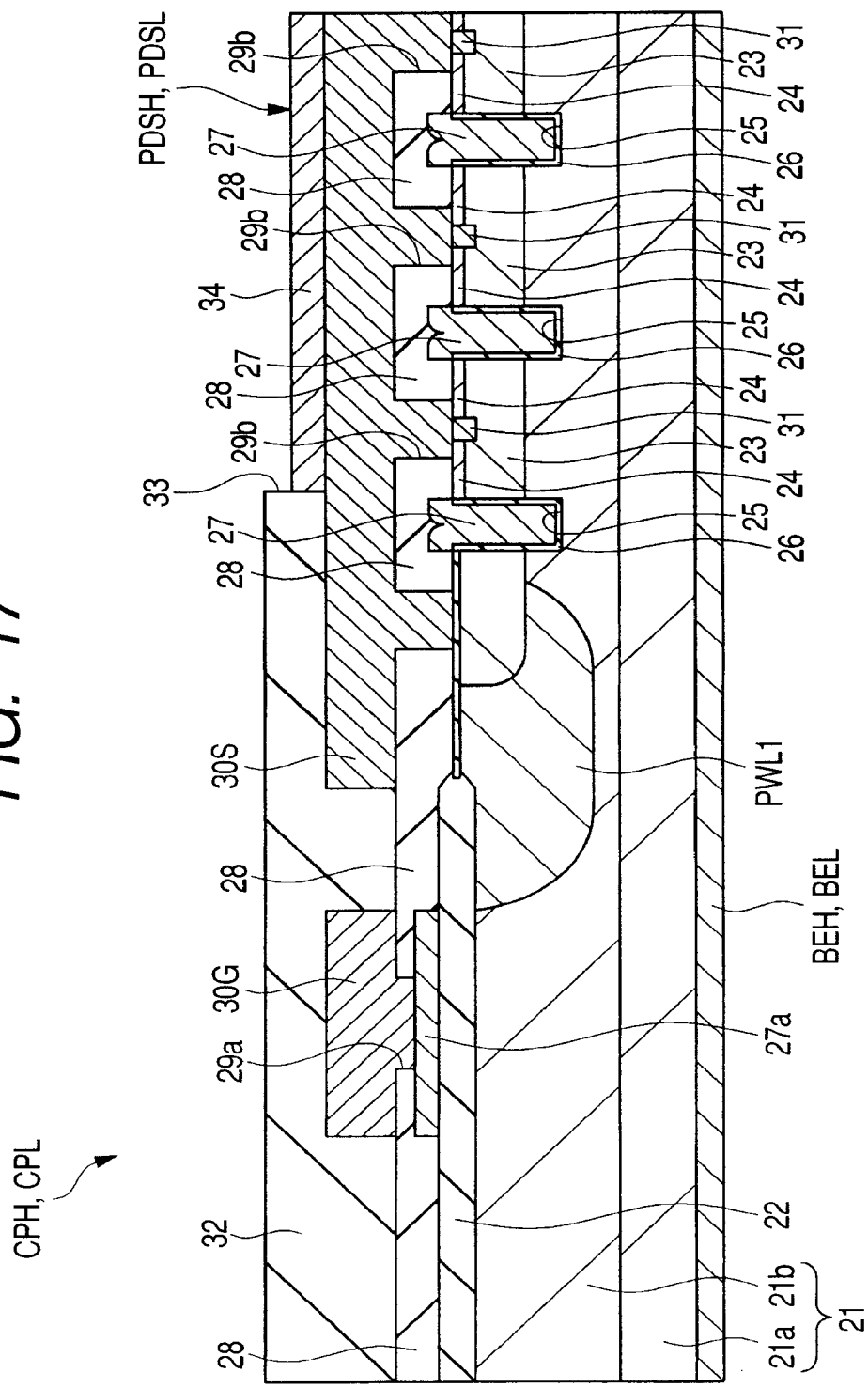
FIG. 17 is a substantial part sectional view of a semiconductor chip used in a semiconductor device in an embodiment of the invention.

Description will be given to an example of the configuration of the semiconductor chips CPH, CPL with reference to FIG. 17. FIG. 17 is a substantial part sectional view illustrating an example of the structure of the semiconductor chips CPH, CPL. The power MOS QH1 is formed in the main surface of the semiconductor substrate (hereafter, simply referred to as substrate) 21 comprising the semiconductor chip CPH; and the power MOS QL1 is formed in the main surface of the substrate 21 comprising the semiconductor chip CPL.

As illustrated in FIG. 17, the substrate 21 includes: a substrate body (semiconductor substrate, semiconductor wafer) 21a composed of $n^+$-type single crystal silicon or the like doped with, for example, arsenic (As); and an epitaxial layer (semiconductor layer) 21b composed of, for example, n⁻-type silicon single crystal formed over the main surface of the substrate body 21a. For this reason, the substrate 21 is a so-called epitaxial wafer. In the main surface of this epitaxial layer 21b, there is formed a field insulating film (element isolation region) 22 composed of, for example, silicon oxide or the like.

In cases where the semiconductor chip illustrated in FIG. 17 is the semiconductor chip CPH, multiple unit transistor cells comprising the power MOS QH1 are formed in the active region encircled with the field insulating film 22 and a p-type well PWL1 positioned thereunder. The power MOS QH1 is formed by coupling these unit transistor cells in parallel. In cases where the semiconductor chip illustrated in FIG. 17 is the semiconductor chip CPL, multiple unit transistor cells comprising the power MOS QL1 are formed in the active region encircled with the field insulating film 22 and the p-type well PWL1 positioned thereunder. The power MOS QL1 is formed by coupling these unit transistor cells in parallel. Each unit transistor cell is formed of an n-channel power MOSFET with, for example, a trench gate structure.

The substrate body 21a and the epitaxial layer 21b function as the drain region of the unit transistor cells.

In cases where the semiconductor chip illustrated in FIG. 17 is the semiconductor chip CPH, the back surface drain electrode BEH is formed in the back surface of the substrate 21 (semiconductor chip CPH). In cases where the semiconductor chip illustrated in FIG. 17 is the semiconductor chip CPL, the back surface drain electrode BEL is formed in the back surface of the substrate 21 (semiconductor chip CPL). The back surface drain electrodes BEH, BEL are formed by, for example, stacking a titanium (Ti) layer, a nickel (Ni) layer, and a gold (Au) layer over the back surface of the substrate 21 in this order.

A p-type semiconductor region 23 formed in the epitaxial layer 21b functions as the channel formation region of the unit transistor cells. A n⁺-type semiconductor region 24 formed at the upper part of the p-type semiconductor region 23 functions as the source region of the unit transistor cells. Therefore, the semiconductor region 24 is a semiconductor region for source.

In the substrate 21, further, there are formed trenches extended form its main surface in the direction of the thickness of the substrate 21. The trenches 25 are so formed that they are extended from the upper surface of the n⁺-type semiconductor region 24, penetrate the n⁺-type semiconductor region 24 and the p-type semiconductor region 23, and are terminated in the epitaxial layer 21b positioned thereunder. Over the bottom surface and lateral surface of each trench 25, there is formed a gate insulating film 26 composed of, for example, silicon oxide. Each trench 25 is filled with a gate electrode 27 with the gate insulating film 26 in between. The gate electrode 27 is comprised of, for example, a polycrystalline silicon film added with, for example, an n-type impurity (for example, phosphorus). The gate electrode 27 functions as the gate electrode of the unit transistor cells. Also over part of the field insulating film 22, there is formed a wiring portion 27a for gate extraction composed of a conductive film in the same layer as the gate electrode 27. The gate electrode 27 and the wiring portion 27a for gate extraction are integrally formed and electrically coupled to each other. In an area not shown in the sectional view in FIG. 17, the gate electrode 27 and the wiring portion 27a for gate extraction are integrally coupled together. The wiring portion 27a for gate extraction is electrically coupled with gate wiring 30G through a contact hole 29a formed in an insulating film 28 covering it.

Meanwhile, source wiring 30S is electrically coupled with the n⁺-type semiconductor region 24 for source through contact holes 29b formed in the insulating film 28. The source wiring 30S is electrically coupled to a p⁺-type semiconductor regions 31 formed between the n⁺-type semiconductor regions 24 at the upper part of the p-type semiconductor region 23 and electrically coupled with the p-type semiconductor region 23 for channel formation therethrough. The gate wiring 30G and the source wiring 30S can be formed by: forming a metal film, for example, an aluminum film (or an aluminum alloy film) over the insulating film 28 with the contact holes 29a, 29b formed therein so that the contact holes 29a, 29b are filled therewith; and patterning this metal film (aluminum film or aluminum alloy film). For this reason, the gate wiring 30G and the source wiring 30S are comprised of an aluminum film, an aluminum alloy film, or the like.

The gate wiring 30G and the source wiring 30S are covered with a protective film (insulating film) 32 composed of polyimide resin or the like. This protective film 32 is the film (insulating film) in the uppermost layer of the semiconductor chips CPH, CPL.

In part of the protective film 32, there is formed an opening 33 exposing part of the gate wiring 30G and source wiring 30S positioned thereunder. In case of the semiconductor chip CPH, the portion of the gate wiring 30G exposed from the opening 33 is the gate pad electrode PDGH and the portion of the source wiring 30S exposed from the opening 33 is the source pad electrode PDSH. In case of the semiconductor chip CPL, the portion of the gate wiring 30G exposed from the opening 33 is the gate pad electrode PDGL and the portion of the source wiring 30S exposed from the opening 33 is the source pad electrode PDSL.

A metal layer 34 may be formed over the front surfaces of the source pad electrodes PDSH, PDSL and gate pad electrodes PDGH, PDGL by planting or the like. (That is, a metal layer 34 may be formed over the portions of the gate wiring 30G and source wiring 30S exposed at the bottom of the opening 33). This metal layer 34 is formed of a laminated film of a copper (Cu) film, a nickel (Ni) film, and a gold (Au) film formed from bottom in this order. Or, it is formed of a laminated film of a titanium (Ti) film, a nickel (Ni) film, and a gold (Au) film formed from bottom in this order or the like.

In the thus configured semiconductor chips CPH, CPL, the operating current of each unit transistor of the power MOSs QH1, QL1 flows between the epitaxial layer 21b for drain and the n⁺-type semiconductor region 24 for source. At this time, it flows in the direction of the thickness of the substrate 21 along the lateral surface of each gate electrode 27 (that is, the lateral surface of each trench 25). That is, channels are formed along the direction of the thickness of the semiconductor chips CPH, CPL.

<Manufacturing Process for Semiconductor Device>

Figure 18:
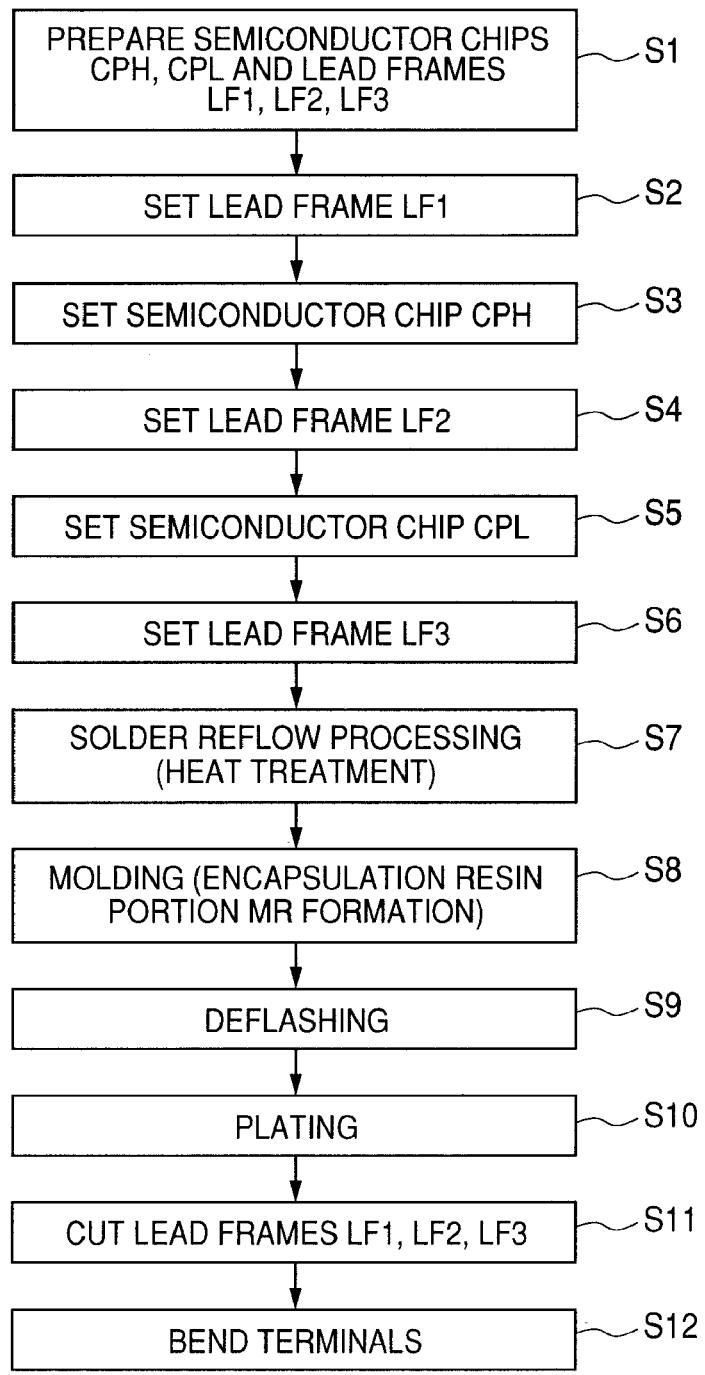
FIG. 18 is a manufacture process flow chart illustrating a manufacturing process for a semiconductor device in an embodiment of the invention.
Figure 19:
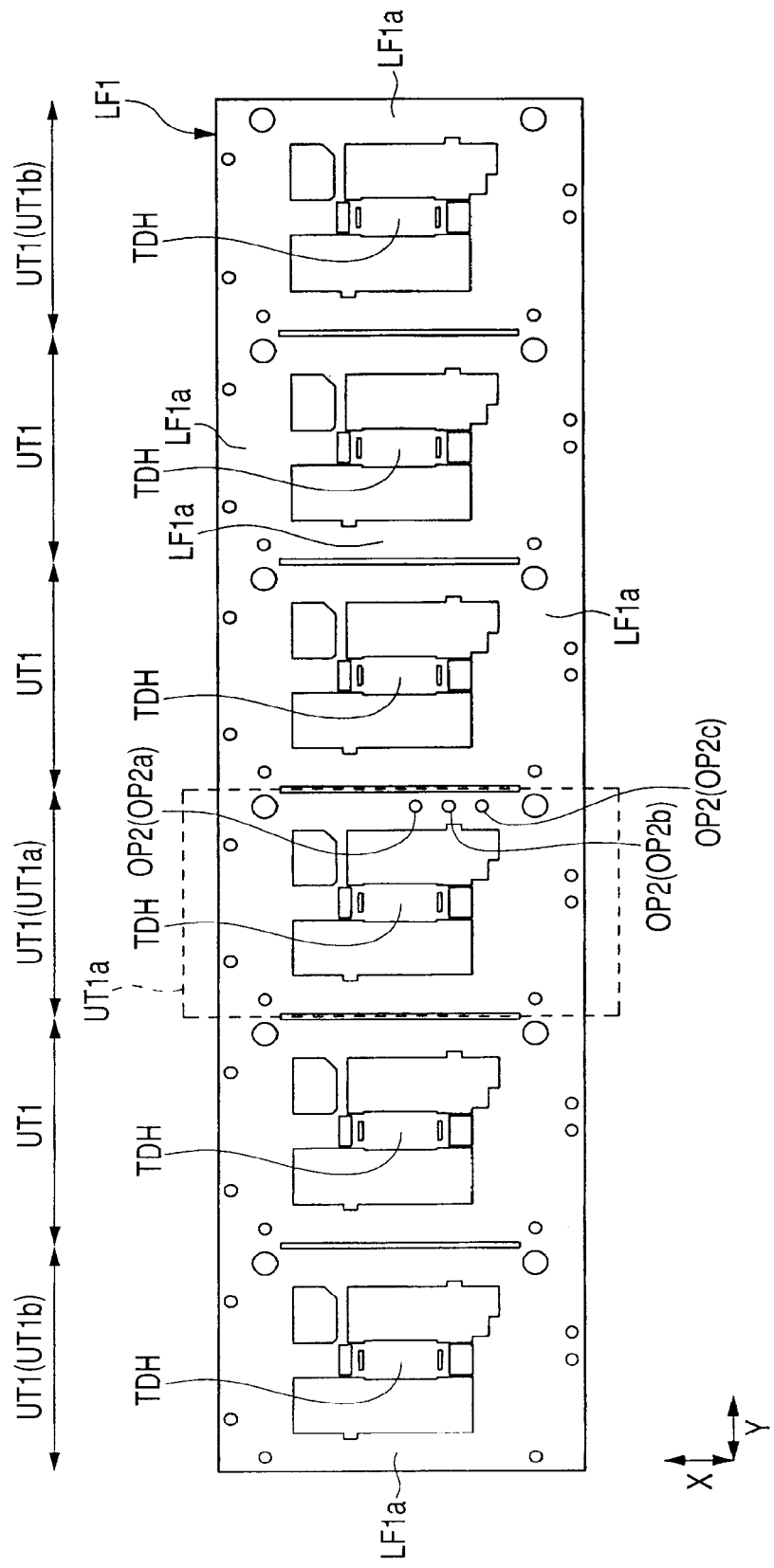
FIG. 19 is an overall plan view of a lead frame used in a manufacturing process for a semiconductor device in an embodiment of the invention.
Figure 20:
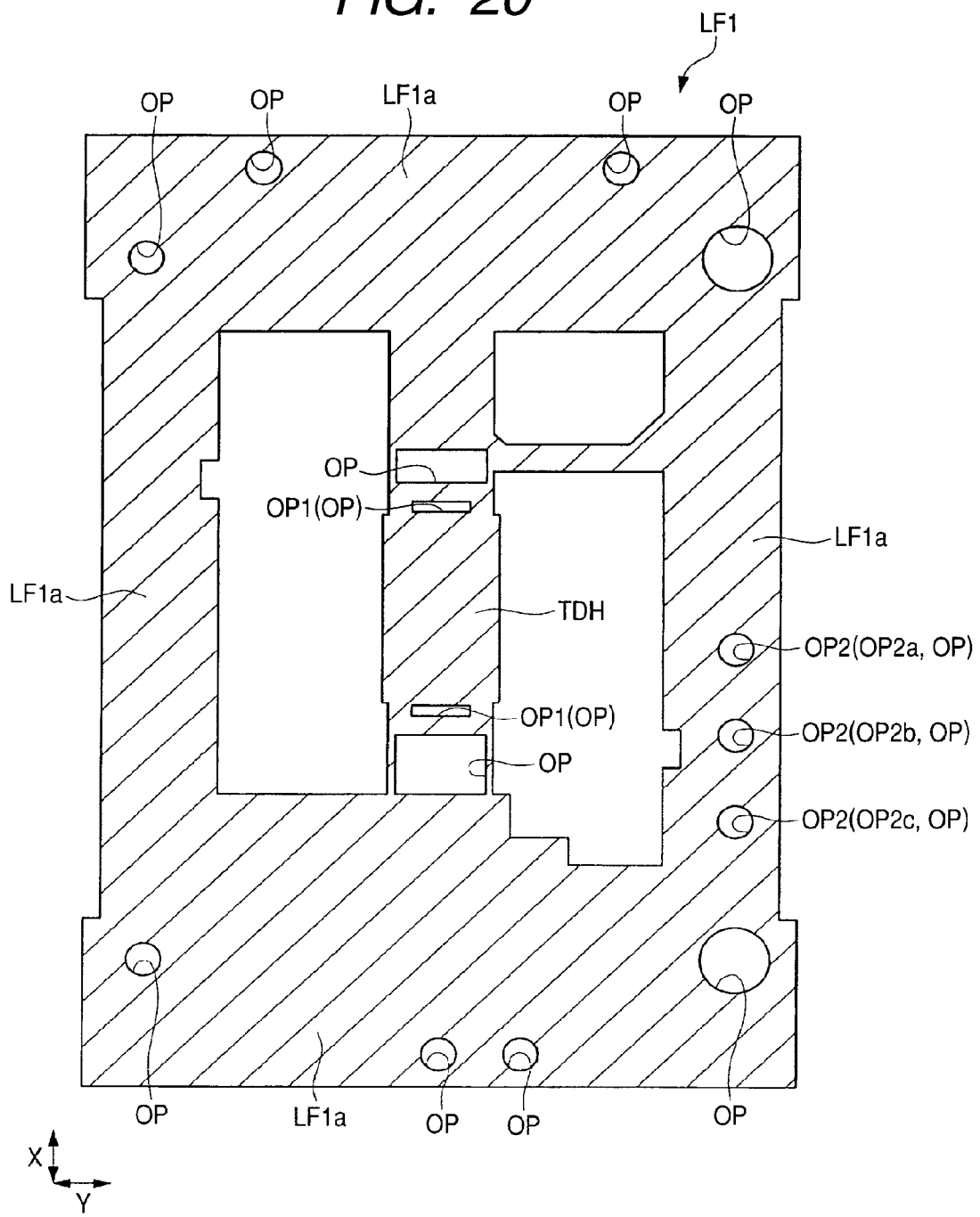
FIG. 20 is a substantial part plan view of the lead frame in FIG. 19.
Figure 21:
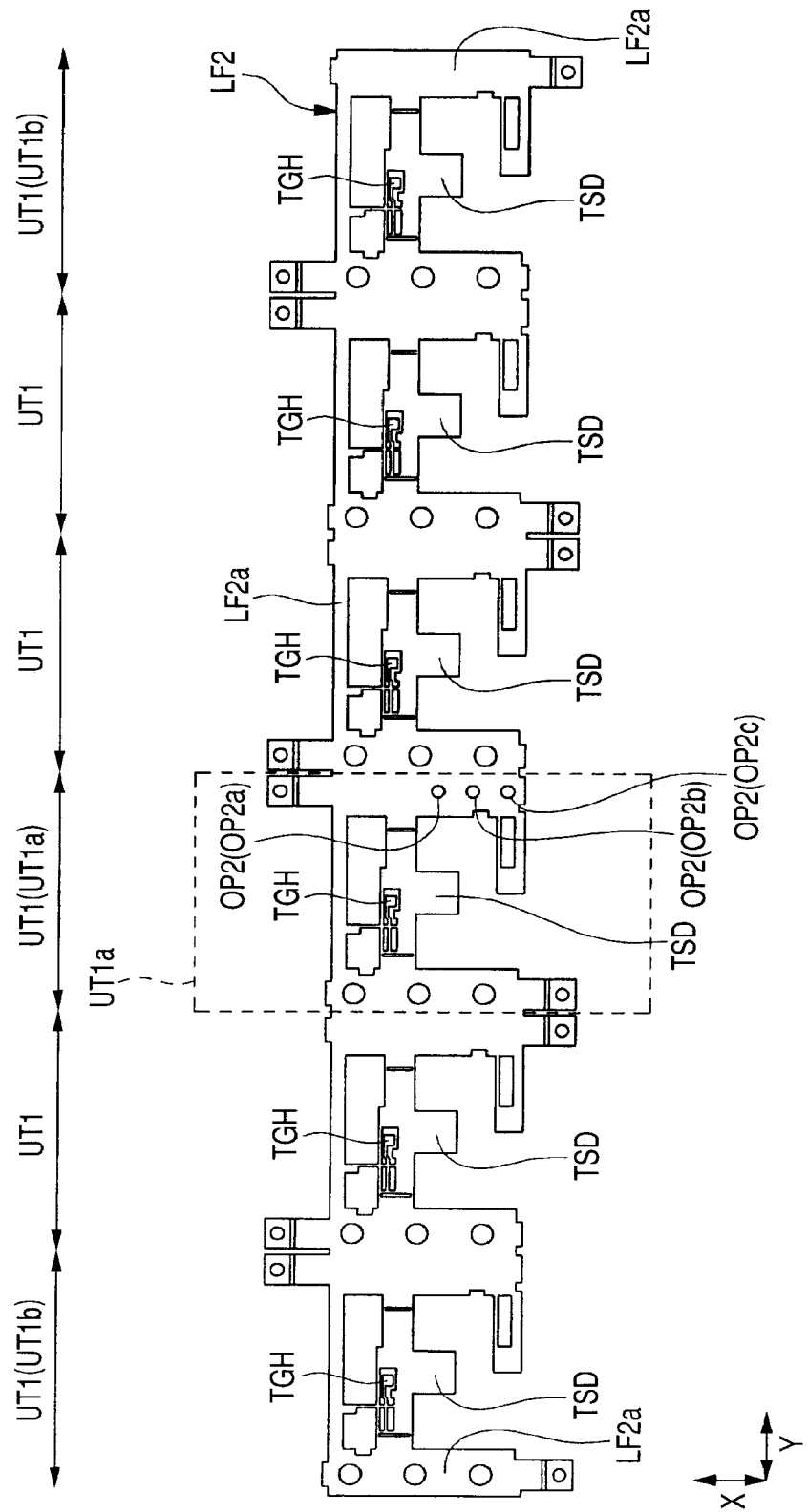
FIG. 21 is an overall plan view of a lead frame used in a manufacturing process for a semiconductor device in an embodiment of the invention.
Figure 22:
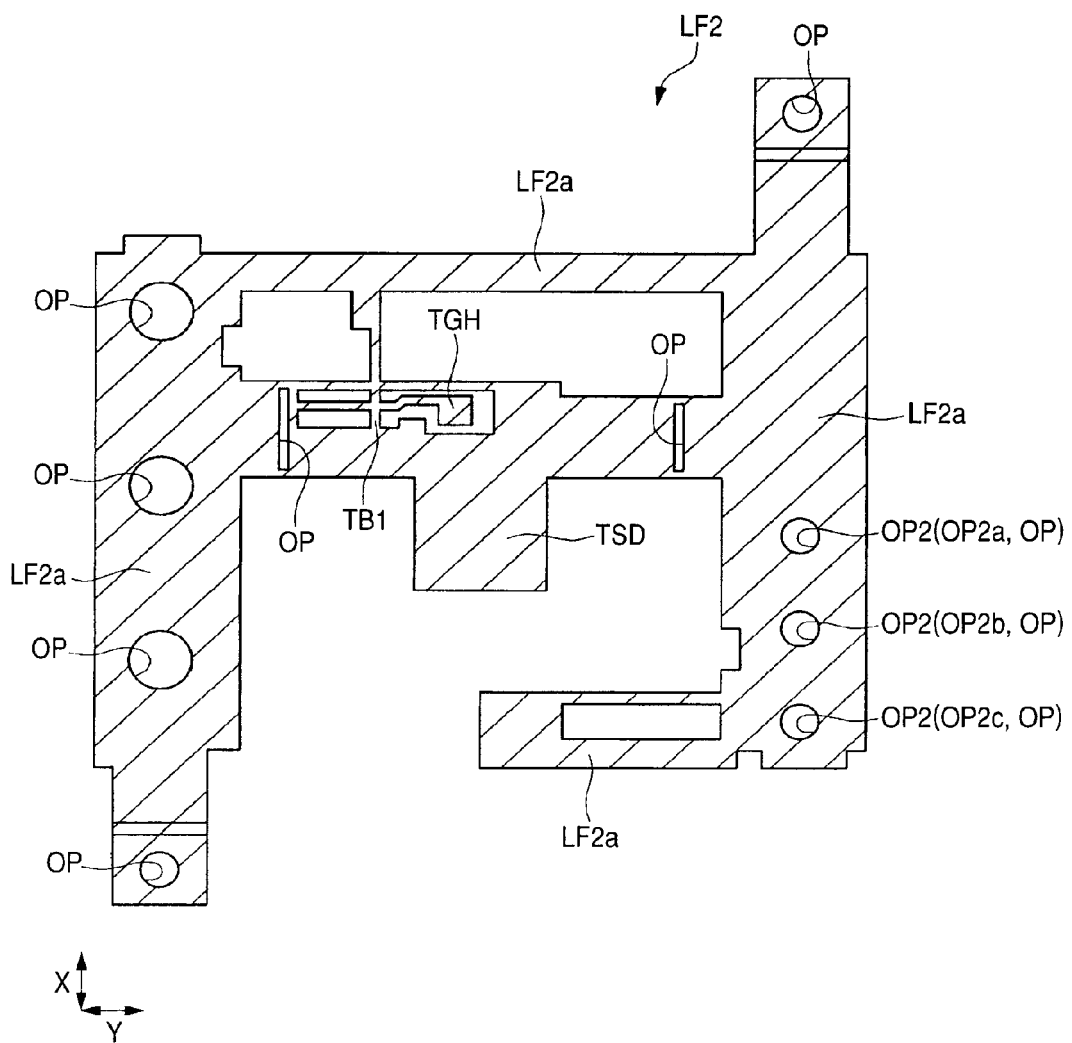
FIG. 22 is a substantial part plan view of the lead frame in FIG. 21.
Figure 23:
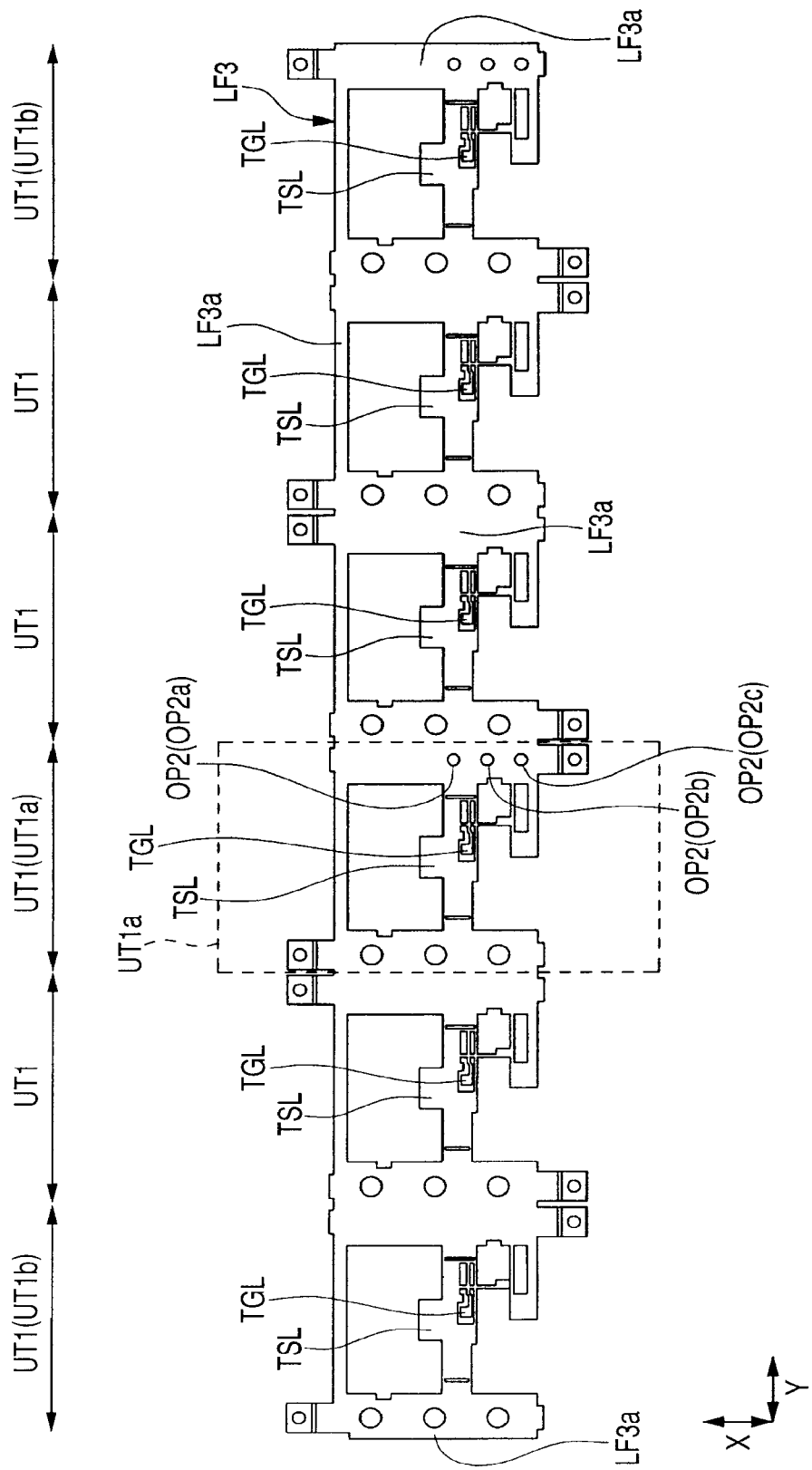
FIG. 23 is an overall plan view of a lead frame used in a manufacturing process for a semiconductor device in an embodiment of the invention.
Figure 24:
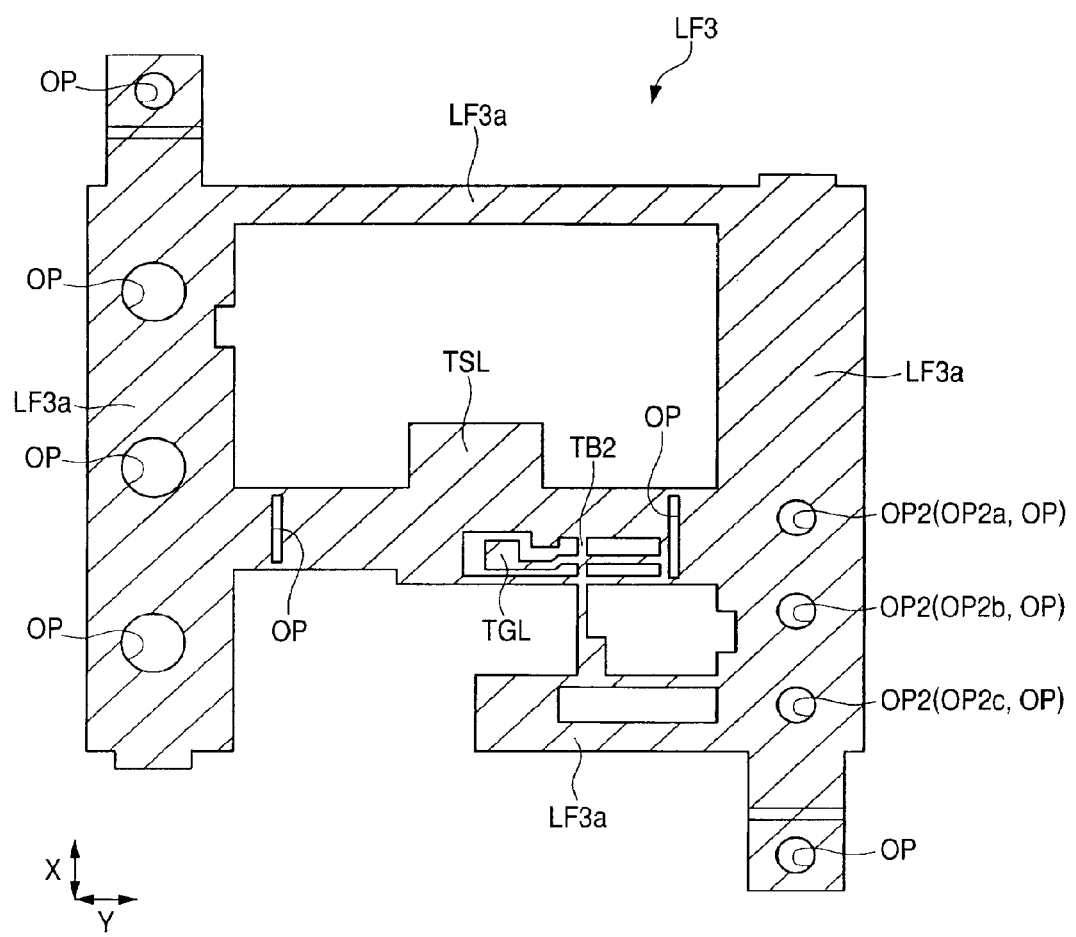
FIG. 24 is a substantial part plan view of the lead frame in FIG. 23.
Figure 25:
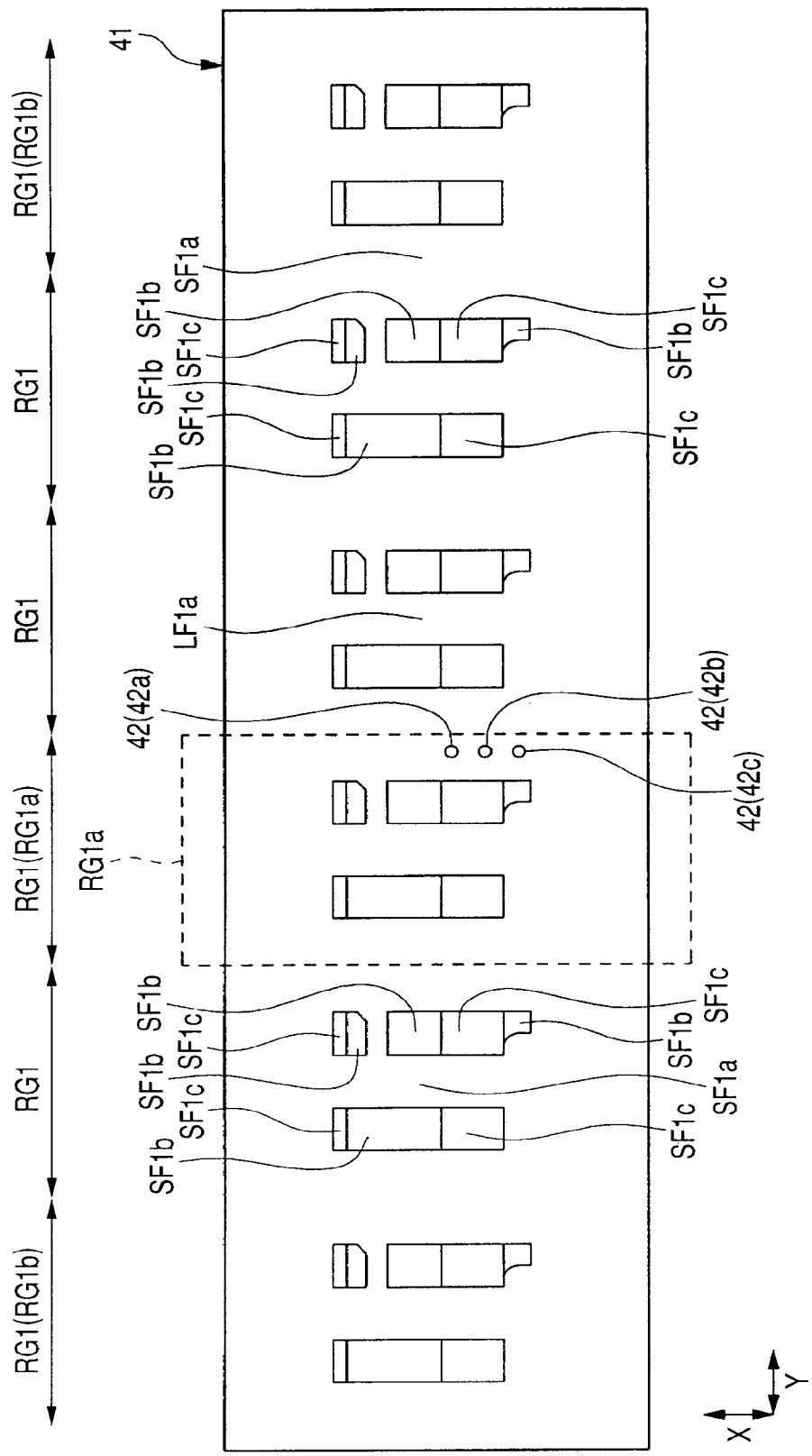
FIG. 25 is an overall plan view of an assembly jig used in a manufacturing process for a semiconductor device in an embodiment of the invention.
Figure 26:
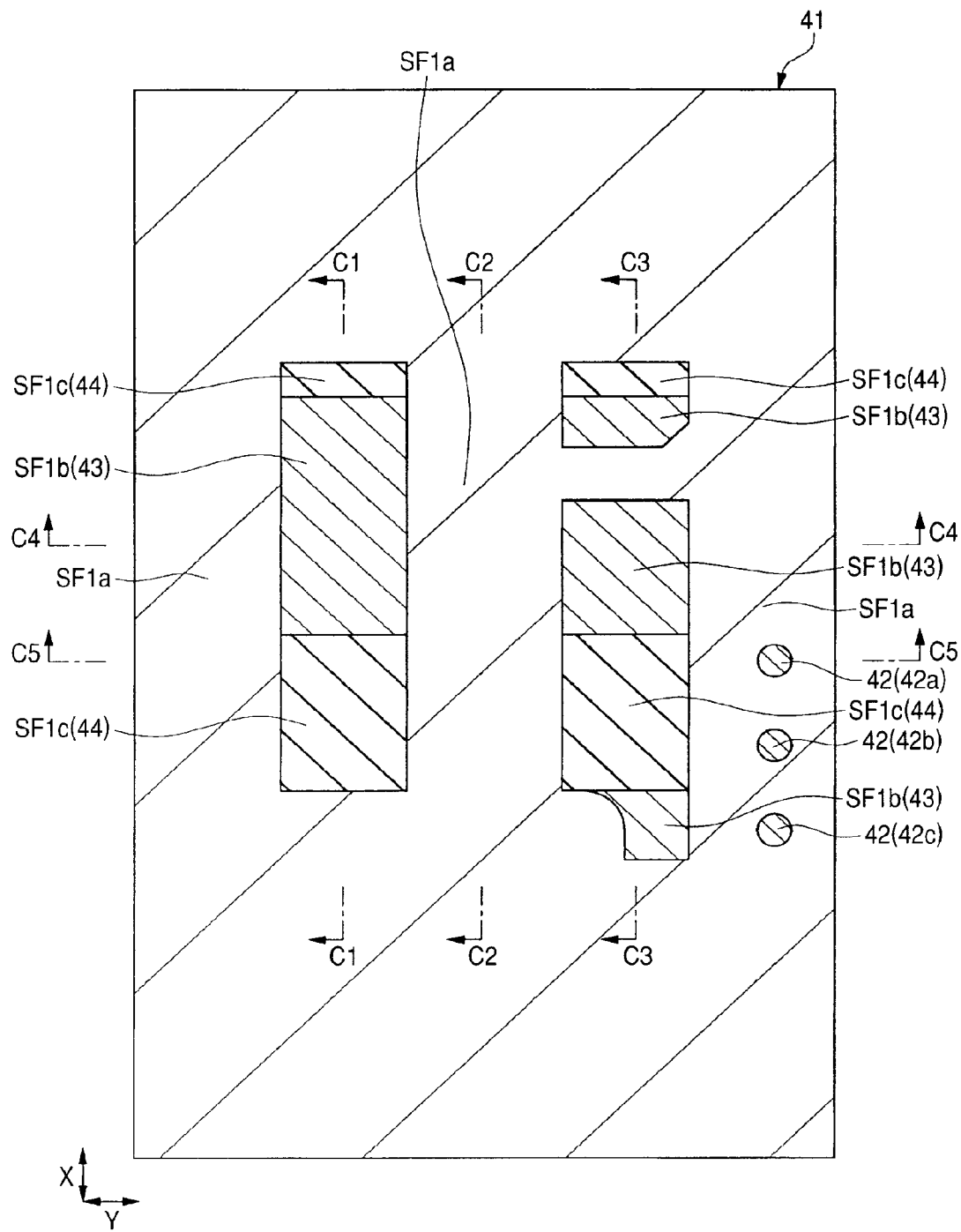
FIG. 26 is a substantial part plan view of the assembly jig in FIG. 25.

FIG. 18 is a manufacture process flow chart illustrating a manufacturing process (assembly step) for the semiconductor device SM1 in this embodiment. FIG. 19 is an overall plan view of the lead frame LF1 used in the manufacturing process (assembly step) for the semiconductor device SM1 in this embodiment; and FIG. 20 is a substantial part plan view of the lead frame LF1. FIG. 21 is an overall plan view of the lead frame LF2 used in the manufacturing process (assembly step) for the semiconductor device SM1 in this embodiment and FIG. 22 is a substantial part plan view of the lead frame LF2. FIG. 23 is an overall plan view of the lead frame LF3 used in the manufacturing process (assembly step) for the semiconductor device SM1 in this embodiment and FIG. 24 is a substantial part plan view of the lead frame LF3. Though FIG. 20, FIG. 22, and FIG. 24 are plan views, the lead frames LF1, LF2, LF3 are hatched to facilitate visualization (to make the shapes of the lead frames LF1, LF2, LF3 easily understandable). FIG. 25 is an overall plan view (top view) of an assembly jig 41 used in the manufacturing process (assembly step) for the semiconductor device SM1 in this embodiment; FIG. 26 is a substantial part plan view (partial enlarged plan view) of the assembly jig 41; and FIG. 27 to FIG. 31 are substantial part sectional views of the assembly jig 41. Though FIG. 26 is a plan view, supporting faces SF1a, SF1b, SF1c and pins 42 are hatched to facilitate visualization (to make the layout of the supporting faces SF1a, SF1b, SF1c and pins 42 easily understandable). FIG. 32 to FIG. 72 are plan views (overall plan views or substantial part plan views) or sectional views (substantial part sectional views) of the semiconductor device SM1 in this embodiment in manufacturing process.

To manufacture the semiconductor device SM1, first, the semiconductor chips CPH, CPL and the lead frames (frames) LF1, LF2, LF3 illustrated in FIG. 19 to FIG. 24 are prepared (Step S1 in FIG. 18).

In this embodiment, two semiconductor chips CPH, CPL and three lead frames LF1, LF2, LF3 are used to manufacture one semiconductor device SM1. As mentioned above, the semiconductor chip CPH has the source pad electrode PDSH and the gate pad electrode PDGH in its front surface and the back surface drain electrode BEH in its entire back surface; and the semiconductor chip CPL has the source pad electrode PDSL and the gate pad electrode PDGL in its front surface and the back surface drain electrode BEL in its entire back surface.

Each lead frame LF1, LF2, LF3 is a multiple lead frame (multiple pattern lead frame) in which multiple unit regions (hereafter, referred to as unit regions UT1) are arranged (repeated). One semiconductor device SM1 is formed from each unit region. FIG. 19, FIG. 21, and FIG. 23 illustrate cases where in each lead frame LF1, LF2, LF3, multiple unit regions UT1, from each of which one semiconductor device SM1 is formed, are arranged in one direction (Y-direction in these examples). As an example, these drawings illustrate cases where six unit regions UT1 are coupled to form each lead frame LF1, LF2, LF3. However, the number of repeated unit regions UT1 is not limited to six. As another embodiment, unit regions UT1 may be arranged in a matrix pattern (array pattern) in each lead frame LF1, LF2, LF3.

In the lead frames LF1, LF2, LF3 in FIG. 19, FIG. 21, and FIG. 23, unit regions UT1 are repeated in the Y-direction. FIG. 20, FIG. 22, and FIG. 24 are enlarged views of a unit region UT1a as one of these unit regions. (That is, FIG. 20, FIG. 22, and FIG. 24 are respectively enlarged views of the area encircled with a broken line in FIG. 19, FIG. 21, and FIG. 23).

The lead frame (first frame) LF1 illustrated in FIG. 19 and FIG. 20 integrally includes the drain terminal (chip placement portion) TDH in each unit region UT1. The lead frame (second frame) LF2 illustrated in FIG. 21 and FIG. 22 integrally includes the source-drain terminal (first lead terminal portion) TSD and the gate terminal (first lead terminal portion) TGH in each unit region UT1. The lead frame (third frame) LF3 illustrated in FIG. 23 and FIG. 24 integrally includes the source terminal (second lead terminal portion) TSL and the gate terminal (second lead terminal portion) TGL in each unit region UT1. In each lead frame LF1, LF2, LF3, each drain terminal TDH, source-drain terminal TSD, gate terminal TGH, source terminal TSL, and gate terminal TGL are flat and have not been bent yet. Of these terminals, each drain terminal TDH remains flat until each semiconductor device SM1 is completed. Meanwhile, each source-drain terminal TSD, gate terminal TGH, source terminal TSL, and gate terminal TGL remain flat until immediately before the bending step described later, or Step S12 is carried out but they are bent at the bending step described later, or Step S12.

As illustrated in FIG. 20, each drain terminal TDH is integrally connected (coupled) to the framework LF1a of the lead frame LF1. As illustrated in FIG. 22, each source-drain terminal TSD and each gate terminal TGH are integrally connected (coupled) to the framework LF2a of the lead frame LF2. As illustrated in FIG. 24, each source terminal TSL and each gate terminal TGL are integrally connected (coupled) to the framework LF3a of the lead frame LF3. In the lead frame LF2, as illustrated in FIG. 22, each gate terminal TGH is coupled with each source-drain terminal TSD through a tie bar TB1 at its outer lead portion external to the encapsulation resin portion MR to be formed later. In the lead frame LF3, as illustrated in FIG. 24, each gate terminal TGL is coupled with each source terminal TSL through a tie bar TB2 at its outer lead portion external to the encapsulation resin portion MR to be formed later.

The lead frames LF1, LF2, LF3 are formed of conductive material, preferably, metal material such as copper (Cu) or copper alloy. Each lead frame LF1, LF2, LF3 can be fabricated by, for example, processing a metal plate (copper plate or the like) into a predetermined shape by molding (press work), etching, or the like.

It is desirable that the thickness of the lead frame LF1 (equal to the thickness T1 of the drain terminal TDH) should be larger than the following thicknesses: the thickness of the lead frame LF2 (equal to the thickness T2 of the gate terminal TGH and the thickness T3 of the source-drain terminal TSD); and the thickness of the lead frame LF3 (equal to the thickness T4 of the gate terminal TGL and the thickness T5 of the source terminal TSL). The reason for this is as described with respect to the relation between the thicknesses T1 to T5.

As seen with reference to FIG. 20, FIG. 22, and FIG. 24, each lead frame LF1, LF2, LF3 is provided with various openings OP. Among these openings OP, aside from the openings OP1, there are the following, for example: those provided in planned cutting positions to make it easy to cut the lead frames LF1, LF2, LF3 after the formation of the encapsulation resin portion MR; those provided to make it easier to transport the lead frames LF1, LF2, LF3; those (corresponding to openings OP2) provided for the positioning of the lead frames LF1, LF2, LF3; and the like.

After the preparation of the semiconductor chips CPH, CPL and the lead frames LF1, LF2, LF3, the lead frame LF1 is set (placed, mounted) over the assembly jig (support, placement table, stage, mount, seat, jig) 41 (Step S2 in FIG. 18).

Figure 31:
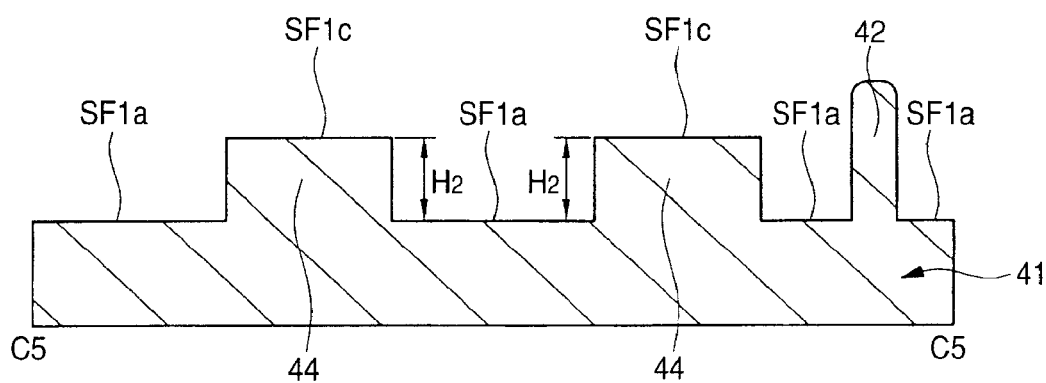
FIG. 31 is a sectional view of the assembly jig in FIG. 26 taken along line C5-C5.
Figure 32:
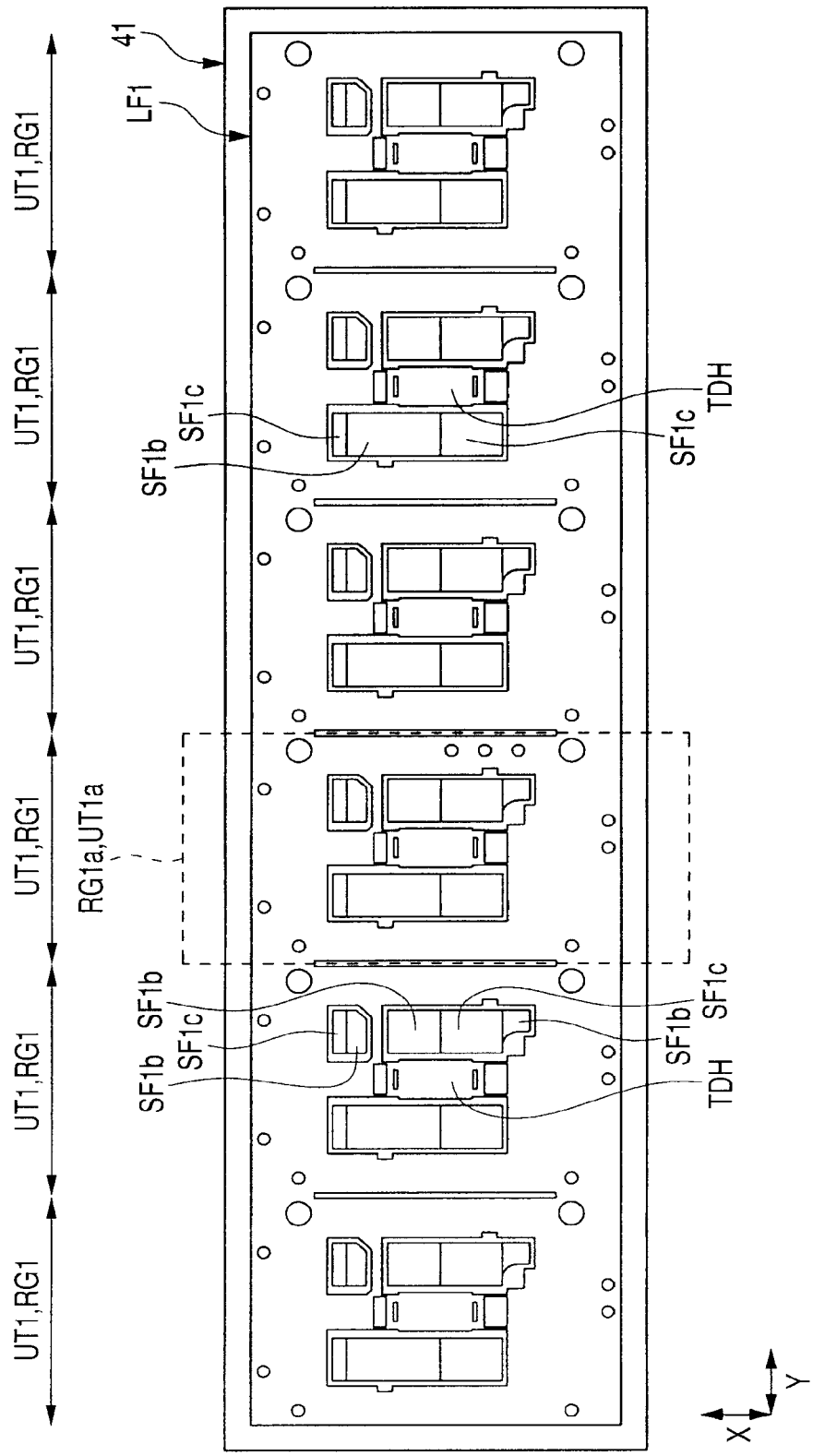
FIG. 32 is an overall plan view of a semiconductor device in an embodiment of the invention in manufacturing process.
Figure 33:
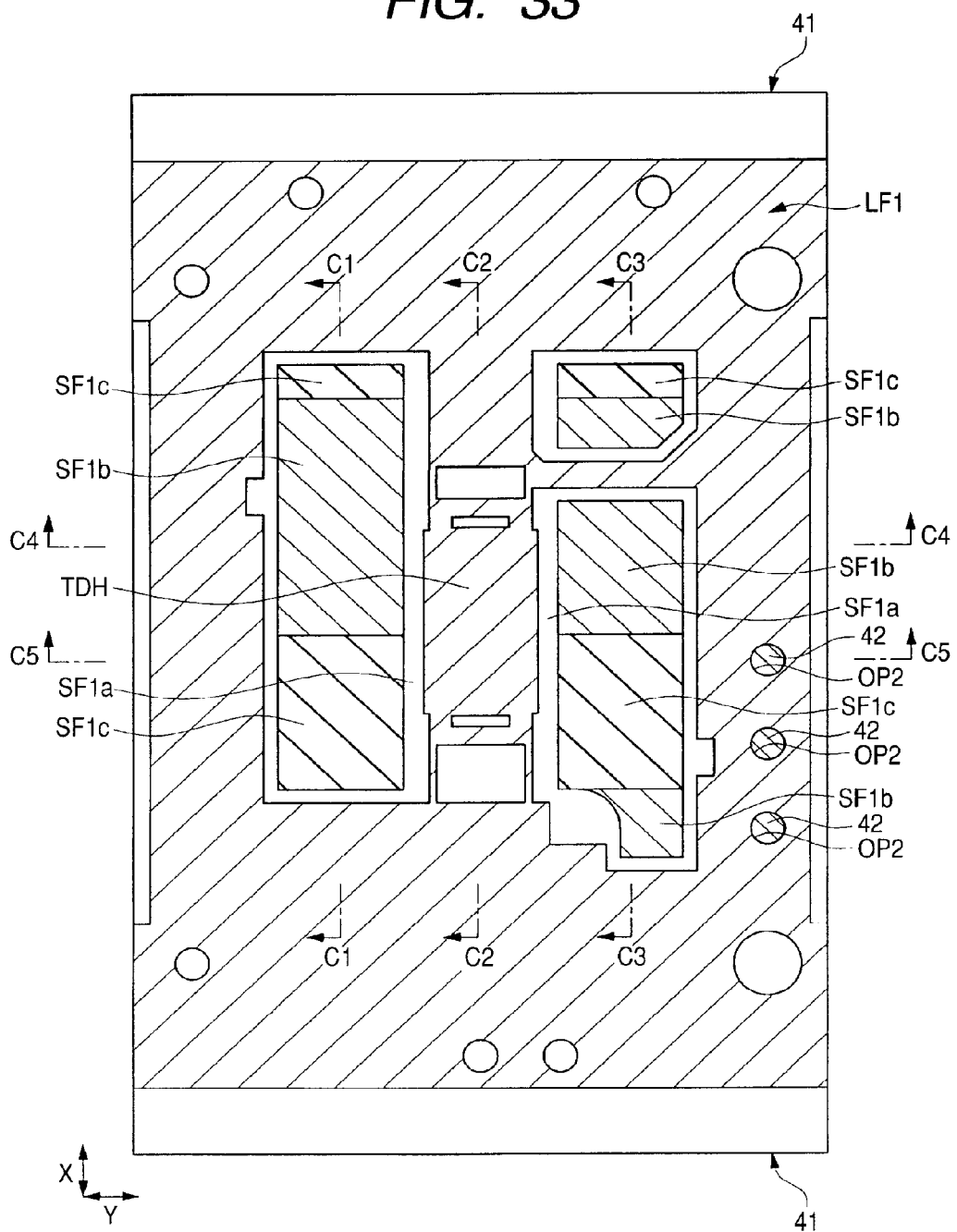
FIG. 33 is a substantial part plan view of the same semiconductor device as in FIG. 32 in manufacturing process.
Figure 34:
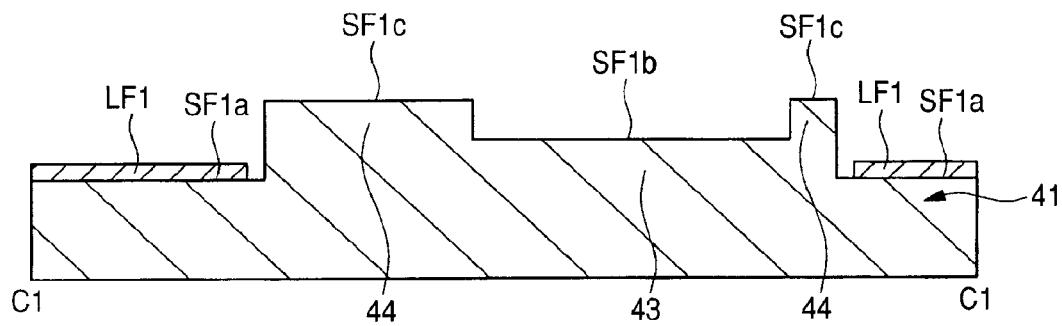
FIG. 34 is a sectional view taken along line C1-C1 of FIG. 33.
Figure 35:
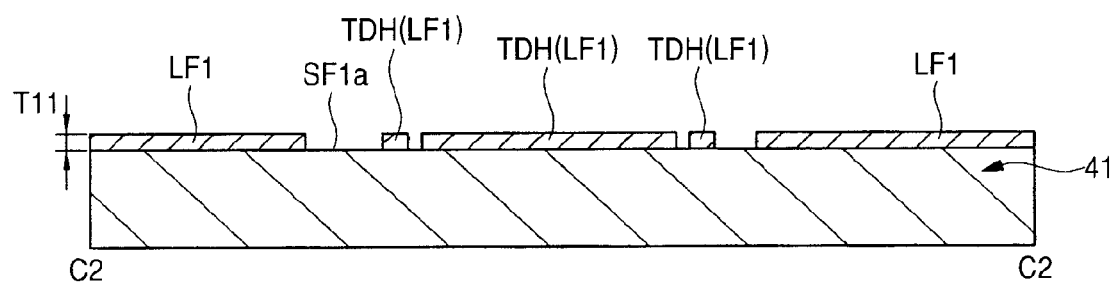
FIG. 35 is a sectional view taken along line C2-C2 of FIG. 33.
Figure 36:
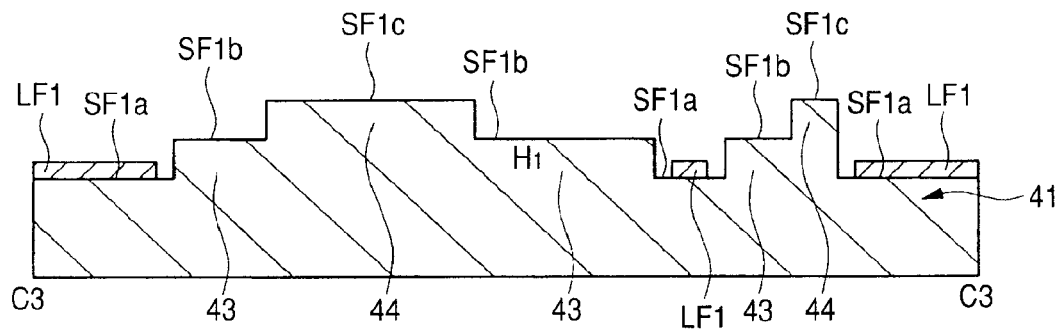
FIG. 36 is a sectional view taken along line C3-C3 of FIG. 33.
Figure 37:
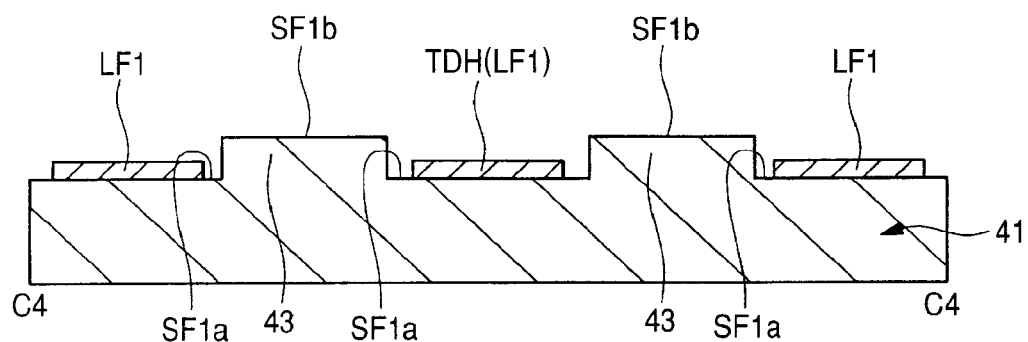
FIG. 37 is a sectional view taken along line C4-C4 of FIG. 33.
Figure 38:
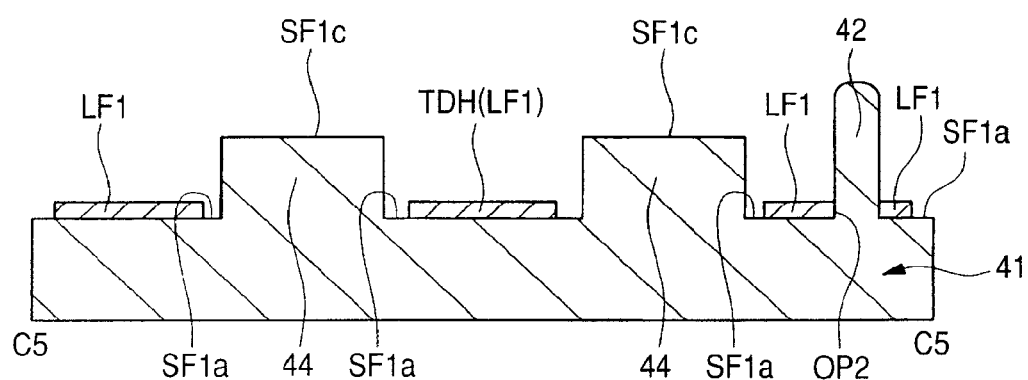
FIG. 38 is a sectional view taken along line C5-C5 of FIG. 33.

The plan view (top view) in FIG. 25 shows the entire assembly jig 41 with the lead frame LF1 not set yet; the substantial part plan view (partial enlarged plan view) in FIG. 26 is an enlarged view of the area (corresponding to the unit region RG1a) encircled with a broken line in FIG. 25; FIG. 27 to FIG. 30 are sectional views of the assembly jig 41 in FIG. 25. The section taken along line C1-C1 of FIG. 26 substantially corresponds to FIG. 27; the section taken along line C2-C2 of FIG. 26 substantially corresponds to FIG. 28; the section taken along line C3-C3 of FIG. 26 substantially corresponds to FIG. 29; the section taken along line C4-C4 of FIG. 26 substantially corresponds to FIG. 30; and the section taken along line C5-C5 of FIG. 26 substantially corresponds to FIG. 31. FIG. 32 is an overall plan view (top view) illustrating the lead frame LF1 as is set over the assembly jig 41 at Step S2; and FIG. 33 is a partial enlarged plan view (substantial part plan view) of FIG. 32, showing an enlarged view of the area (corresponding to the unit regions UT1a, RG1a) encircled with a broken line in FIG. 32. FIG. 34 is a sectional view taken along line C1-C1 of FIG. 33; FIG. 35 is a sectional view taken along line C2-C2 of FIG. 33; FIG. 36 is a sectional view taken along line C3-C3 of FIG. 33; FIG. 37 is a sectional view taken along line C4-C4 of FIG. 33; and FIG. 38 is a sectional view taken along line C5-C5 of FIG. 33. Though FIG. 33 is a plan view, the supporting faces SF1b, SF1c and pins 42 in the upper surface of the assembly jig 41 and the lead frame LF1 are hatched to facilitate visualization (to make the layout of each element easily understandable).

It is desirable that the assembly jig 41 illustrated in FIG. 25 to FIG. 31 should be formed of the following material: a material having heat resistance sufficient to prevent thermal deformation against the solder reflow processing, described later, at Step S7 with the processing temperature of approximately 300 to 400° C. Typical materials include carbon material. Since the carbon material is also difficult to process and handle, however, SUS material (stainless steel) may be substituted for it. The assembly jig 41 is so configured that the lead frames LF1, LF2, LF3 can be stacked and set on its upper surface (main surface on the side shown in FIG. 25 and FIG. 26) and is movable (portable).

The assembly jig 41 is so configured that multiple unit regions (hereafter, referred to as unit regions RG1) in each of which each unit region UT1 of the lead frames LF1, LF2, LF3 is set are arranged (repeated). How the unit regions RG1 are arranged in the assembly jig 41 is identical with how the unit regions UT1 are arranged in each lead frame LF1, LF2, LF3. More specific description will be given. When multiple unit regions UT1 are arranged in the Y-direction in each lead frame LF1, LF2, LF3 as illustrated in FIG. 19, FIG. 21, and FIG. 23, the following measure is taken: multiple unit regions RG1 are arranged in the Y-direction in the assembly jig 41 as illustrated in FIG. 25. The number of arranged unit regions UT1 in each lead frame LF1, LF2, LF3 and the number of arranged unit regions RG1 in the assembly jig 41 are identical with each other. However, the number is not limited to six (in the cases in FIG. 19, FIG. 21, FIG. 23, and FIG. 25). In the assembly jig 41 in FIG. 25, unit regions RG1 are repeated in the Y-direction. FIG. 26 is an enlarged view of a unit region RG1a as one of these unit regions. (That is, FIG. 26 is an enlarged view of the area encircled with a broken line in FIG. 25.)

The lead frame LF1 has two main surfaces positioned on the opposite side to each other. The main surface on the side where the semiconductor chip CPH is placed later will be designated as the upper surface of the lead frame LF1. (That is, this upper surface is the main surface on the side where the lead frame is opposed to the lead frame LF2 when the assembly WK described later is formed.) The main surface on the opposite side to this upper surface will be designated as the lower surface of the lead frame LF1. (That is, this lower surface is the main surface on the side where the lead frame is opposed to the assembly jig 41 or a die MD2 at Step S2 or S8, described later.) The lead frame LF2 has two main surfaces positioned on the opposite side to each other. The main surface on the side where the semiconductor chip CPL is placed later will be designated as the upper surface of the lead frame LF2. (That is, this upper surface is the main surface on the side where the lead frame is opposed to the lead frame LF3 when the assembly WK described later is formed). The main surface on the opposite side to this upper surface will be designated as the lower surface of the lead frame LF2. (That is, this lower surface is the main surface on the side where the lead frame is opposed to the lead frame LF1 when the assembly WK described later is formed.) The lead frame LF3 has two main surfaces positioned on the opposite side to each other. The main surface on the side where the lead frame is opposed to the lead frame LF2 (semiconductor chip CPL) when the assembly WK described later is formed will be designated as the lower surface of the lead frame LF3. The main surface on the opposite side to this lower surface will be designated as the upper surface of the lead frame LF3.

In each drain terminal TDH of the lead frame LF1, its main surface corresponding to the upper surface of the lead frame LF1 will be designated as the upper surface of the drain terminal TDH; and its main surface corresponding to the lower surface of the lead frame LF1 will be designated as the lower surface of the drain terminal TDH. The lower surface of the drain terminal TDH becomes the lower surface TDHa exposed from the encapsulation resin portion MR formed later. In each source-drain terminal TSD and gate terminal TGH of the lead frame LF2, the following designation will be used: their main surfaces corresponding to the upper surface of the lead frame LF2 will be designated as the upper surface of the source-drain terminal TSD and the upper surface of the gate terminal TGH; and their main surfaces corresponding to the lower surface of the lead frame LF2 will be designated as the lower surface of the source-drain terminal TSD and the lower surface of the gate terminal TGH. In each gate terminal TGL and source terminal TSL of the lead frame LF3, the following designation will be used: their main surfaces corresponding to the upper surface of the lead frame LF3 will be designated as the upper surface of the gate terminal TGL and the upper surface of the source terminal TSL; and their main surfaces corresponding to the lower surface of the lead frame LF3 will be designated as the lower surface of the gate terminal TGL and the lower surface of the source terminal TSL.

The assembly jig 41 illustrated in FIG. 25 to FIG. 31 has the following faces in its upper surface: a supporting face (first supporting face) SF1a for setting (supporting) the lead frame LF1; supporting faces (second supporting faces) SF1b for setting (supporting) the lead frame LF2, protruded to above the supporting face SF1a; and supporting faces (third supporting faces) SF1c for supporting (setting) the lead frame LF3, protruded to above the supporting faces SF1a, SF1b. That is, in the upper surface of the assembly jig 41, the supporting faces SF1b are higher than the supporting face SF1a and the supporting faces SF1c are higher than the supporting faces SF1b. This can be achieved by: providing the upper surface of the assembly jig 41 with two different kinds of salient (two-level) steps (mount portions, salient portions, protruded portions) 43, 44 different in height; taking the upper surfaces of the lower (lower-level) steps 43 as the supporting faces SF1b; and taking the upper surfaces of the higher (higher-level) steps 44 as the supporting faces SF1c. In the assembly jig 41, the supporting faces SF1b are identical in height. In the assembly jig 41, the supporting faces SF1c are identical in height.

The upper surface of the assembly jig 41 is also provided with positioning pins (first projections, protruded portions, salient portions, columnar portions) 42. The pins are projections for determining the planar positions of the lead frames LF1, LF2, LF3. The pins 42 are portions (projections) locally protruded upward in the upper surface of the assembly jig 41 and has such a shape that they can be inserted into the openings OP2 in the lead frames LF1, LF2, LF3. When the openings OP2 are circular in shape, it is desirable that the pins 42 should be columnar.

At Step S2, as illustrated in FIG. 32 to FIG. 38, the lead frame LF1 is set over the upper surface of the assembly jig 41. At this time, as seen from FIG. 33 and FIG. 38 as well, the lead frame LF1 is set over the upper surface of the assembly jig 41 so that the following is implemented: the pins 42 of the assembly jig 41 are inserted into the positioning openings (holes, through holes) OP2 provided in the lead frame LF1.

At Step S2, the lead frame LF1 is set over the upper surface of the assembly jig 41 so the following is implemented: the upper surface (main surface on the side where the semiconductor chip CPH is placed later) of the lead frame LF1 faces upward and the lower surface of the lead frame LF1 is opposed to the assembly jig 41.

As seen from FIG. 33 and the like as well, the planar shape of each of the lead frames LF1, LF2, LF3 and the plane configuration (layout) of the supporting faces SF1a, SF1b, SF1c are so designed that the following is implemented: the area of the upper surface of the assembly jig 41 that planarly overlaps with the lead frame LF1 when the lead frame LF1 is set at Step S2 is taken as the supporting face SF1a; and the supporting faces SF1b, SF1b are arranged in areas where they do not planarly overlap with the lead frame LF1. Further, the planar shape of each of the lead frames LF1, LF2, LF3 and the plane configuration (layout) of the supporting faces SF1a, SF1b, SF1c are so designed that the following is implemented: in the upper surface of the assembly jig 41, the supporting faces SF1c do not planarly overlap with the lead frame LF1 or LF2 when the lead frame LF2 is set at Step S4 described later.

At Step S2, for this reason, the lead frame LF1 can be set over the supporting face SF1a of the assembly jig 41 without the interference of the supporting faces SF1b or SF1c. At Step S4 described later, the lead frame LF2 can be set over the assembly jig 41 so that at least part of the lead frame LF2 is positioned and supported over the supporting faces SF1b without the interference of the supporting faces SF1c. At Step S6 described later, the lead frame LF3 can be set over the assembly jig 41 so that at least part of the lead frame LF3 is positioned and supported over the supporting faces SF1c.

Therefore, the lead frame LF1 set over the assembly jig 41 at Step S2 is set over the supporting face SF1a so that the lower surface of the lead frame LF1 is in contact with the supporting face SF1a. Thus the lead frame LF1 is supported by the supporting face SF1a. As mentioned above, the lower surface (especially, the lower surface of each drain terminal TDH) of the lead frame LF1 is set in contact with the supporting face SF1a of the assembly jig 41. As a result, the height position of the lower surface of the lead frame LF1 is controlled and made equal to that of the supporting face SF1a of the assembly jig 41.

Subsequently, as illustrated in FIG. 39 to FIG. 42, solder (solder material) SLDa is set (supplied) onto the upper surface of the drain terminal TDH in each unit region UT1 of the lead frame LF1. Thereafter, each semiconductor chip CPH is set (placed) over the upper surface of each drain terminal TDH with the solder SLDa set thereon (Step S3 in FIG. 18).

Figure 39:
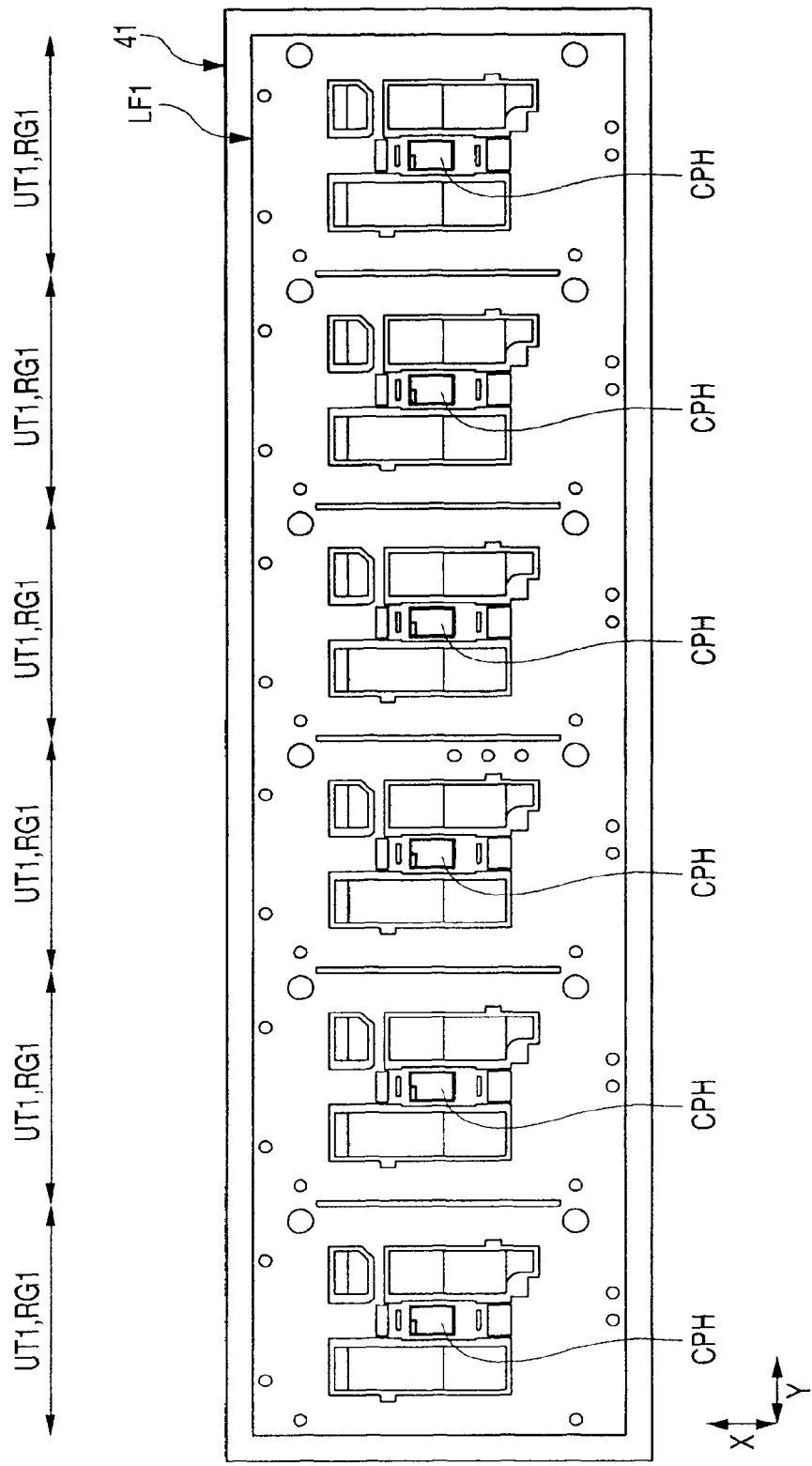
FIG. 39 is an overall plan view of the semiconductor device in manufacturing process, following FIG. 32.
Figure 40:
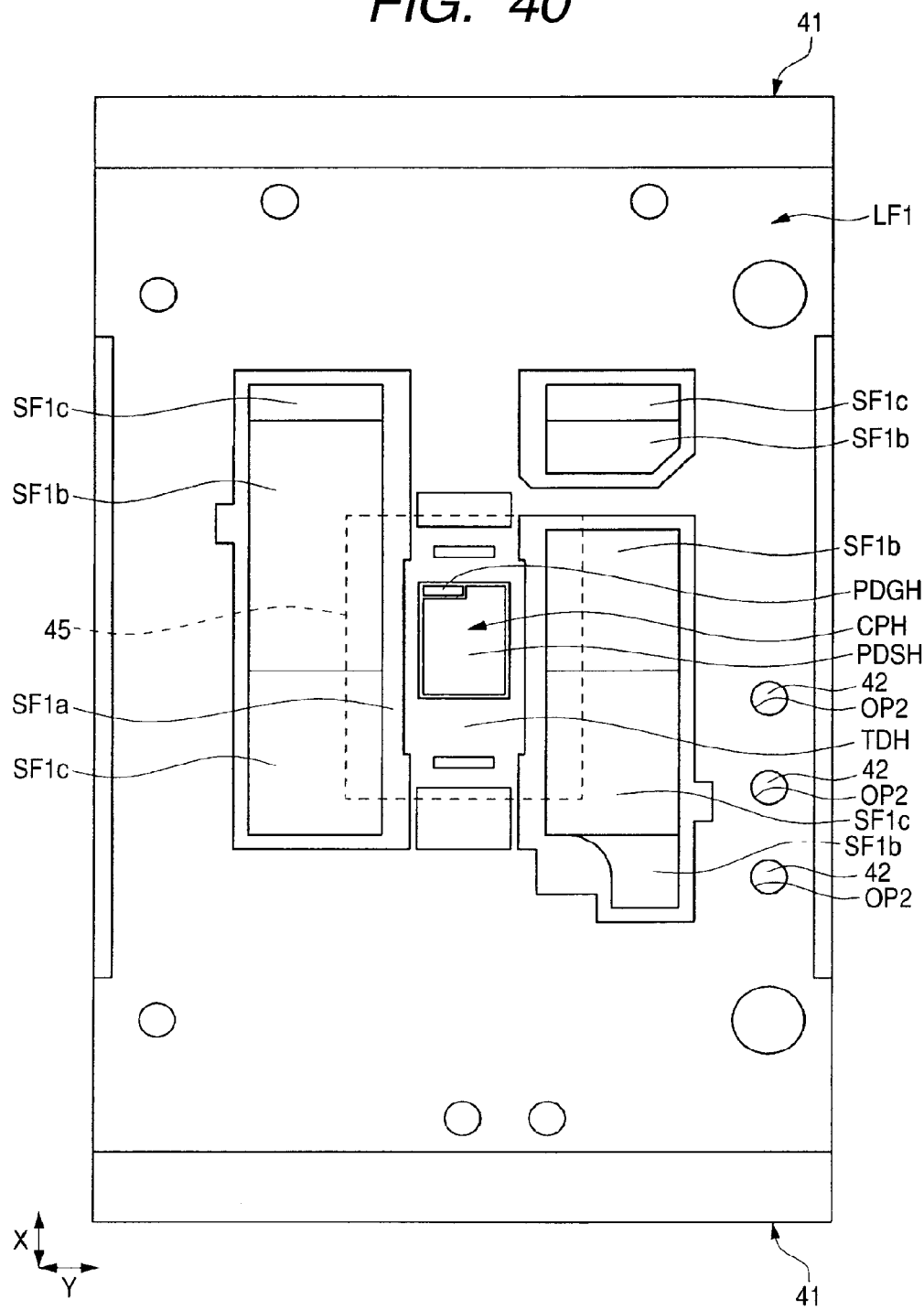
FIG. 40 is a substantial part plan view of the same semiconductor device as in FIG. 39 in manufacturing process.
Figure 41:
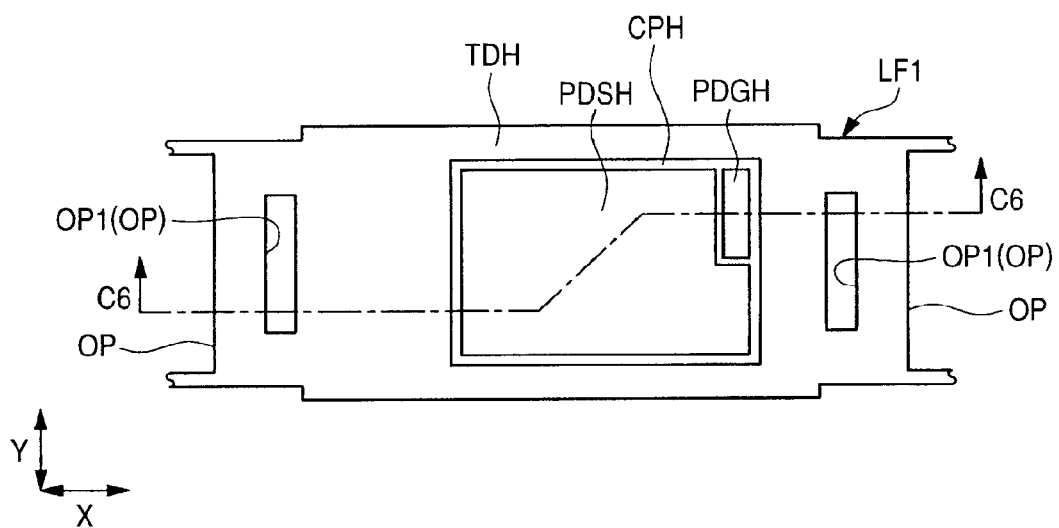
FIG. 41 is a substantial part plan view of the same semiconductor device as in FIG. 39 in manufacturing process.
Figure 42:
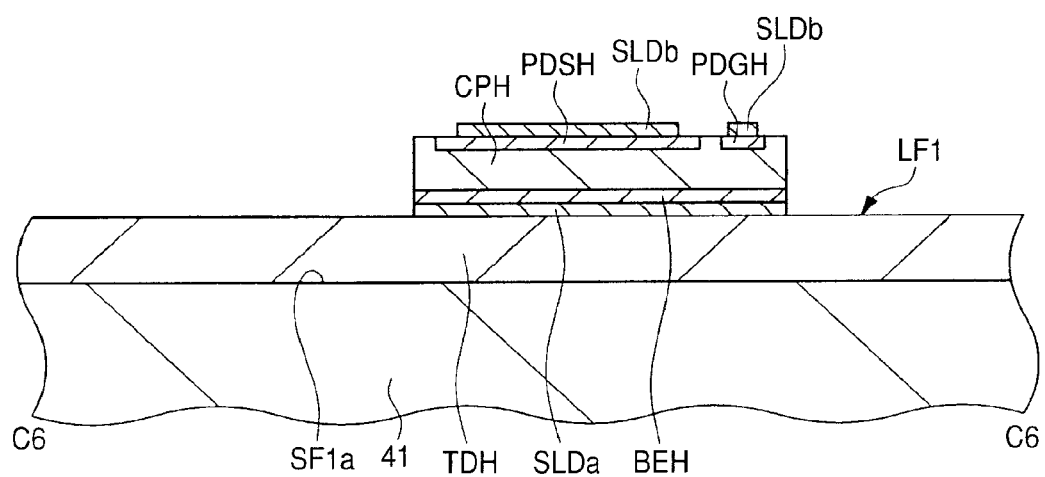
FIG. 42 is a sectional view taken along line C6-C6 of FIG. 41.

FIG. 39 is an overall plan view (top view) obtained when Step S3 (semiconductor chip CPH setting step) has been carried out and shows the same area as in FIG. 25 and FIG. 32. FIG. 40 is a substantial part plan view (partial enlarged plan view) obtained when Step S3 (semiconductor chip CPH setting step) has been carried out and shows the same area as in FIG. 26 and FIG. 33. FIG. 41 is a partial enlarged plan view of the area (that is, the drain terminal TDH and its surrounding area) 45 encircled with a broken line in FIG. 40. FIG. 41 shows what is obtained by turning the area 45 in FIG. 40 90° clockwise and in this drawing the assembly jig 41 is omitted. Though FIG. 42 is a sectional view taken along line C6-C6 of the FIG. 41, the openings OP1 in the lead frame LF1 are omitted in the sectional view in FIG. 42 to facilitate visualization.

Solder paste may be used as the solder SLDa used at Step S3 but use of solder pellets (solder foil) is more desirable. When solder pellets are used as the solder SLDa, it is easy to evenly control the amount of solder SLDa supplied to each drain terminal TDH. Therefore, it is possible to reduce variation in the thickness of the solder SLD joining each drain terminal TDH and each semiconductor chip CPH. When solder pellets are used as the solder SLDa, it is desirable to take the following procedure: flux (flux material) is applied to the upper surface of each drain terminal TDH of the lead frame LF1 and then solder pellets are set; and flux (flux material) is further applied to the solder pellets and each semiconductor chip CPH is placed thereover.

As the result of Step S3, each semiconductor chip CPH is set (placed) over the upper surface of each drain terminal TDH of the lead frame LF1 with the solder SLDa in between. At Step S3, each semiconductor chip CPH is placed so that its back surface drain electrode BEH is opposed to the upper surface of each drain terminal TDH of the lead frame LF1. When the solder SLDa is solder paste, each semiconductor chip CPH is temporarily fixed by the adhesion (adhesiveness) of the solder paste. When the solder SLDa is solder pellets, it is temporarily fixed by the adhesion (adhesiveness) of flux.

In this embodiment, the following procedure is taken before each semiconductor chip CPH is placed over each drain terminal TDH of the lead frame LF1: solder (solder material, solder layer) SLDb is supplied (formed) over the source pad electrode PDSH and gate pad electrode PDGH in the front surface of each semiconductor chip CPH. Specifically, the following procedure is taken: flux (flux material) is applied to the source pad electrode PDSH and the gate pad electrode PDGH of each semiconductor chip CPH before it is placed over each drain terminal TDH of the lead frame LF1 and solder pellets are set; flux (flux material) is further applied to these solder pellets and using a heat block (not shown) or the like, each semiconductor chip CPH is heated to melt and solidify the flux and the solder pellets. As a result, a solder layer (solder SLDb in this example) is formed over the source pad electrode PDSH and gate pad electrode PDGH of each semiconductor chip CPH. Then each semiconductor chip CPH in this state is placed over each drain terminal TDH of the lead frame LF1. As mentioned above, solder pellets are used to form a solder layer (solder SLDb in this example) over the source pad electrode PDSH and gate pad electrode PDGH of each semiconductor chip CPH. Thereafter, this semiconductor chip CPH is placed over each drain terminal TDH of the lead frame LF1. This makes it easier to evenly control the amount of solder SLDb over the source pad electrode PDSH and gate pad electrode PDGH of each semiconductor chip CPH. For this reason, it is possible to reduce variation in the thickness of the solder SLD joining together the source pad electrode PDSH and gate pad electrode PDGH of each semiconductor chip CPH and each source-drain terminal TSD and each gate terminal TGH.

As another embodiment, the following procedure may be taken without previously supplying solder SLDb to the source pad electrode PDSH or gate pad electrode PDGH in the front surface of each semiconductor chip CPH: this semiconductor chip CPH is placed over each drain terminal TDH of the lead frame LF1; and then solder SLDb is supplied (set) over the source pad electrode PDSH and gate pad electrode PDGH in the front surface of the semiconductor chip CPH. In this case, for example, solder pastes or the like can be used as the solder SLDb.

Substantially, as illustrated in FIG. 43 to FIG. 51, the lead frame LF2 is set (placed, mounted) over the assembly jig 41 with the lead frame LF1 set thereover (Step S4 in FIG. 18).

Figure 43:
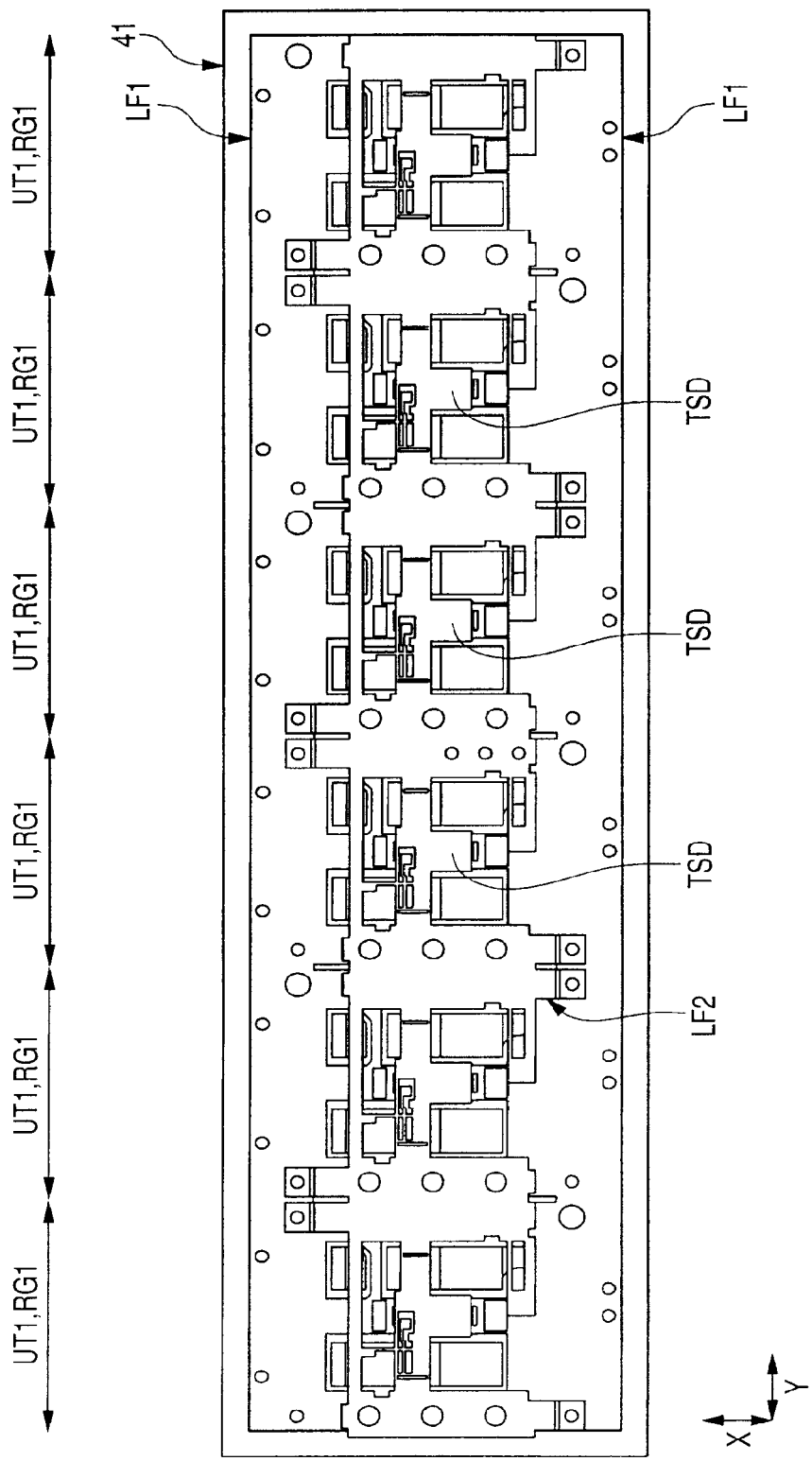
FIG. 43 is an overall plan view of the semiconductor device in manufacturing process, following FIG. 39.
Figure 44:
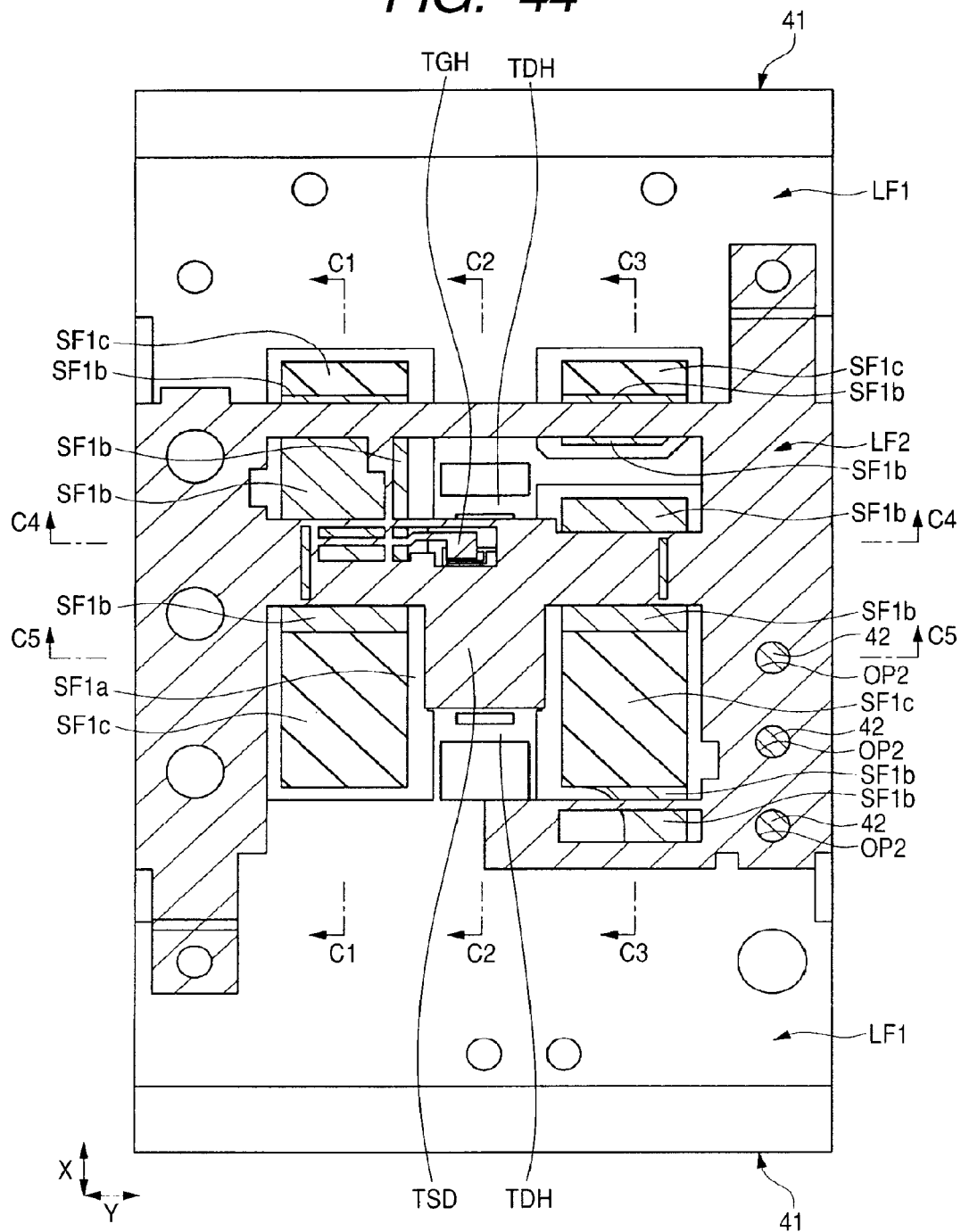
FIG. 44 is a substantial part plan view of the same semiconductor device as in FIG. 43 in manufacturing process.
Figure 45:
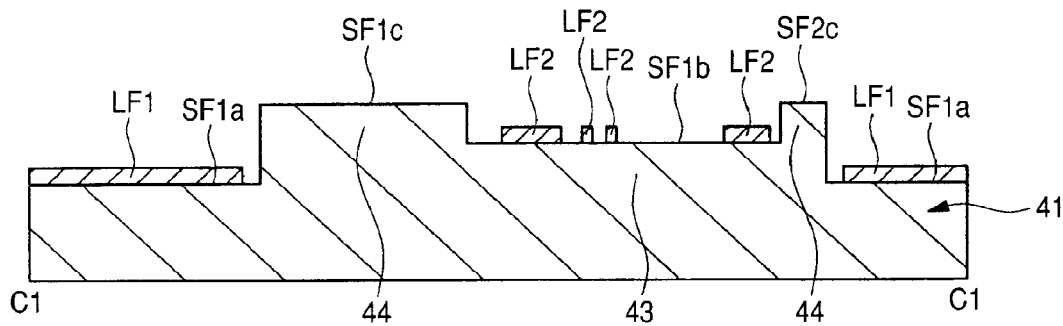
FIG. 45 is a sectional view taken along line C1-C1 of FIG. 44.
Figure 46:
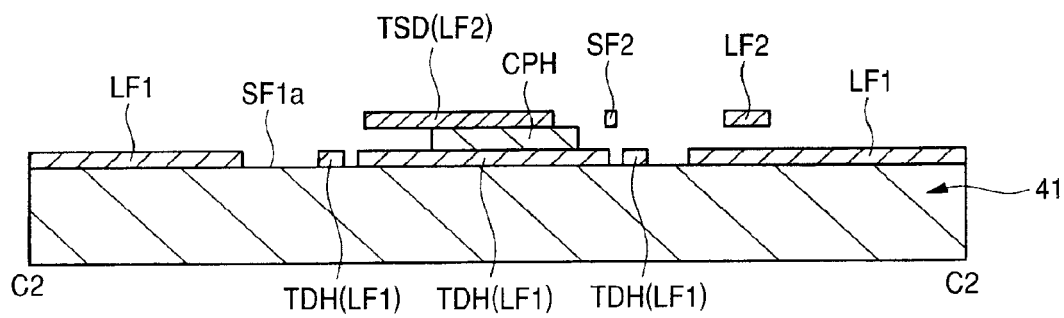
FIG. 46 is a sectional view taken along line C2-C2 of FIG. 44.
Figure 47:
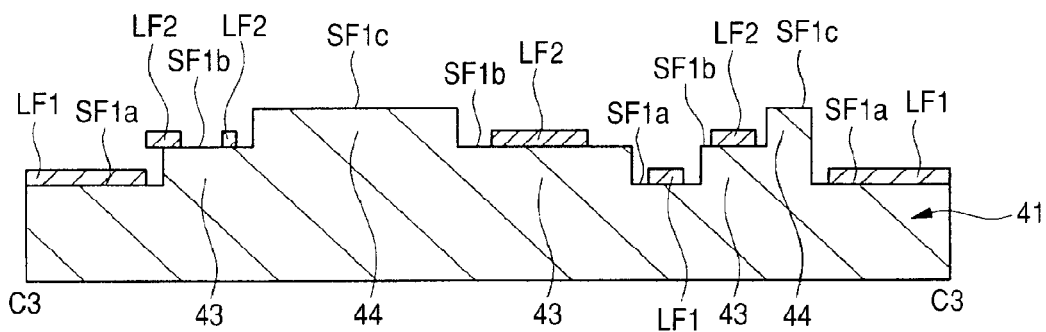
FIG. 47 is a sectional view taken along line C3-C3 of FIG. 44.
Figure 48:
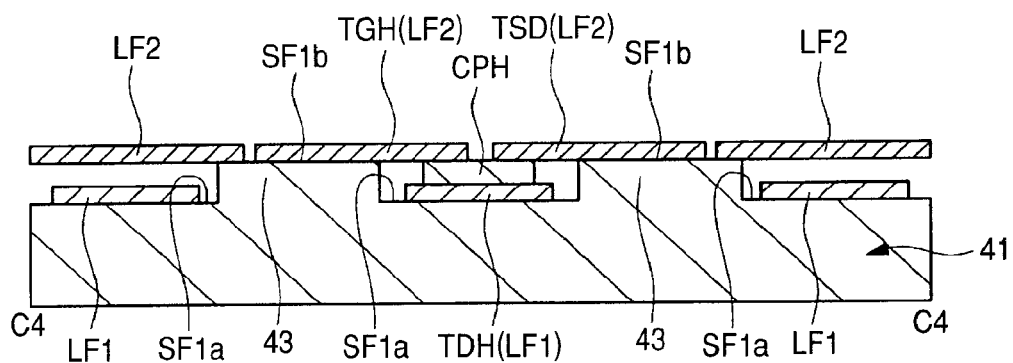
FIG. 48 is a sectional view taken along line C4-C4 of FIG. 44.
Figure 49:
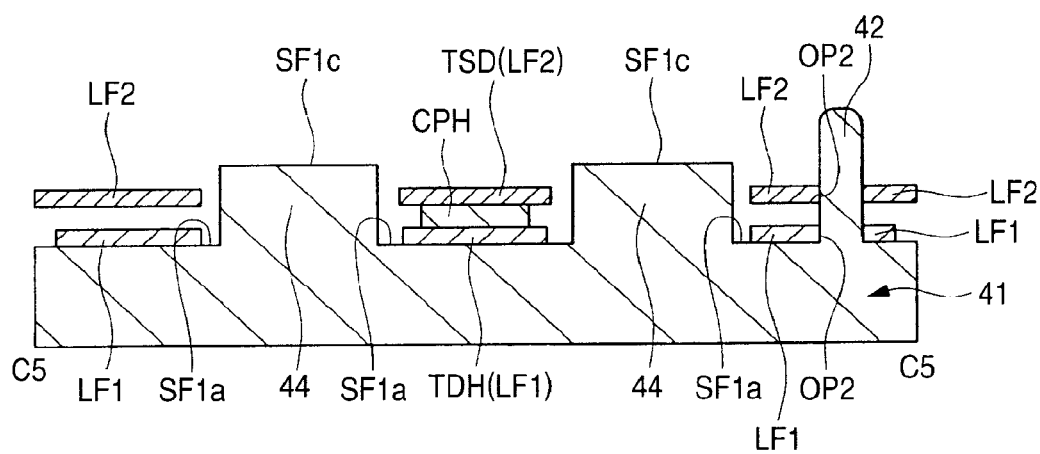
FIG. 49 is a sectional view taken along line C5-C5 of FIG. 44.
Figure 50:
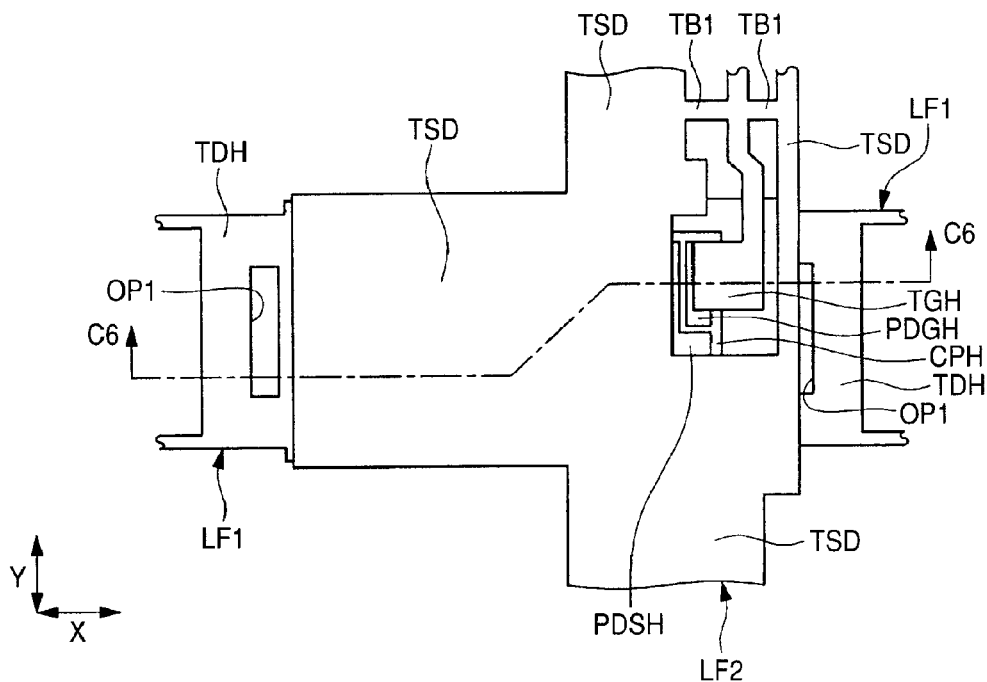
FIG. 50 is a substantial part plan view of the same semiconductor device as in FIG. 43 in manufacturing process.
Figure 51:
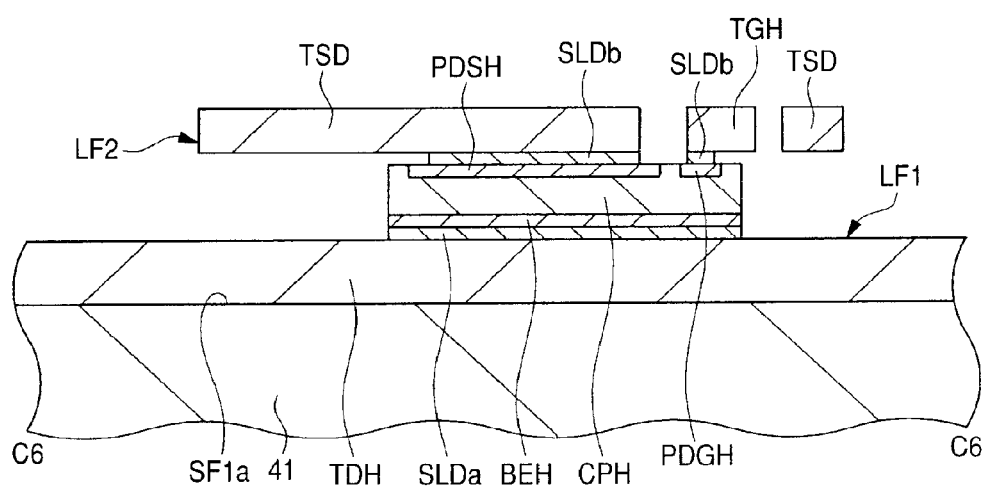
FIG. 51 is a sectional view taken along line C6-C6 of FIG. 50.

FIG. 43 is an overall plan view (top view) obtained when Step S4 (lead frame LF2 setting step) has been carried out and shows the same area as in FIG. 25, FIG. 32, and FIG. 39. FIG. 44 is a substantial part plan view (partial enlarged plan view) obtained when Step S4 (lead frame LF2 setting step) has been carried out and shows the same area as in FIG. 26, FIG. 33, and FIG. 40. FIG. 45 is a sectional view taken along line C1-C1 of FIG. 44; FIG. 46 is a sectional view taken along line C2-C2 of FIG. 44; FIG. 47 is a sectional view of line C3-C3 of FIG. 44; FIG. 48 is a sectional view taken along line C4-C4 of FIG. 44; and FIG. 49 is a sectional view taken along line C5-C5 of FIG. 44. FIG. 50 is a substantial part plan view (partial enlarged plan view) obtained when Step S4 (lead frame LF2 setting step) has been carried out and shows the same area as in FIG. 41 (equivalent to the area 45). Though FIG. 51 is a sectional view taken along line C6-C6 of FIG. 50, the openings OP1 in the lead frame LF1 are omitted in the sectional view in FIG. 51 to facilitate visualization. Though FIG. 44 is a plan view, the supporting faces SF1$b$, SF1$c$ and pins 42 in the upper surface of the assembly jig 41 and the lead frame LF2 are hatched to facilitate visualization (to make the layout of each element easily understandable).

At Step S4, the lead frame LF2 is set over the upper surface of the assembly jig 41 so that the following is implemented: the pins 42 of the assembly jig 41 are inserted into the positioning openings (holes, through holes) OP2 provided in the lead frame LF2. The relative positional relation (planar positional relation) between the assembly jig 41, lead frame LF1, and lead frame LF2 is defined (determined) by the following: the pins 42 of the assembly jig 41, the openings OP2 in the lead frame LF1, and the openings OP2 in the lead frame LF2.

Thus the lead frame LF2 is set over the lead frame LF1 and the semiconductor chip CPH so that the following is implemented: each source-drain terminal TSD of the lead frame LF2 is set over the source pad electrode PDSH of each semiconductor chip CPH; and each gate terminal TGH of the lead frame LF2 is set over the gate pad electrode PDGH of each semiconductor chip CPH. That is, each source-drain terminal TSD of the lead frame LF2 is set over the source pad electrode PDSH of each semiconductor chip CPH with solder SLDb in between; at the same time, each gate terminal TGH of the lead frame LF2 is set over the gate pad electrode PDGH of each semiconductor chip CPH with solder SLDb in between.

It is more desirable to take the following procedure prior to the step, or Step S4, for setting the lead frame LF2 over the assembly jig 41: flux (flux material) is applied to the lower surface of each source-drain terminal TSD and gate terminal TGH of the lead frame LF2. (That is, flux is applied to their surfaces on the side where they are opposed to the source pad electrode PDSH and gate pad electrode PDGH of each semiconductor chip CPH.) Thereafter, the lead frame LF2 setting step, or Step S4 is carried out.

Subsequently, as illustrated in FIG. 52 to FIG. 55, solder (solder material) SLDc is set (supplied) to the upper surface of the source-drain terminal TSD in each unit region UT1 of the lead frame LF2. Thereafter, each semiconductor chip CPL is set (placed) over the upper surface of each source-drain terminal TSD with the solder SLDc set thereon (Step S5 in FIG. 18).

Figure 52:
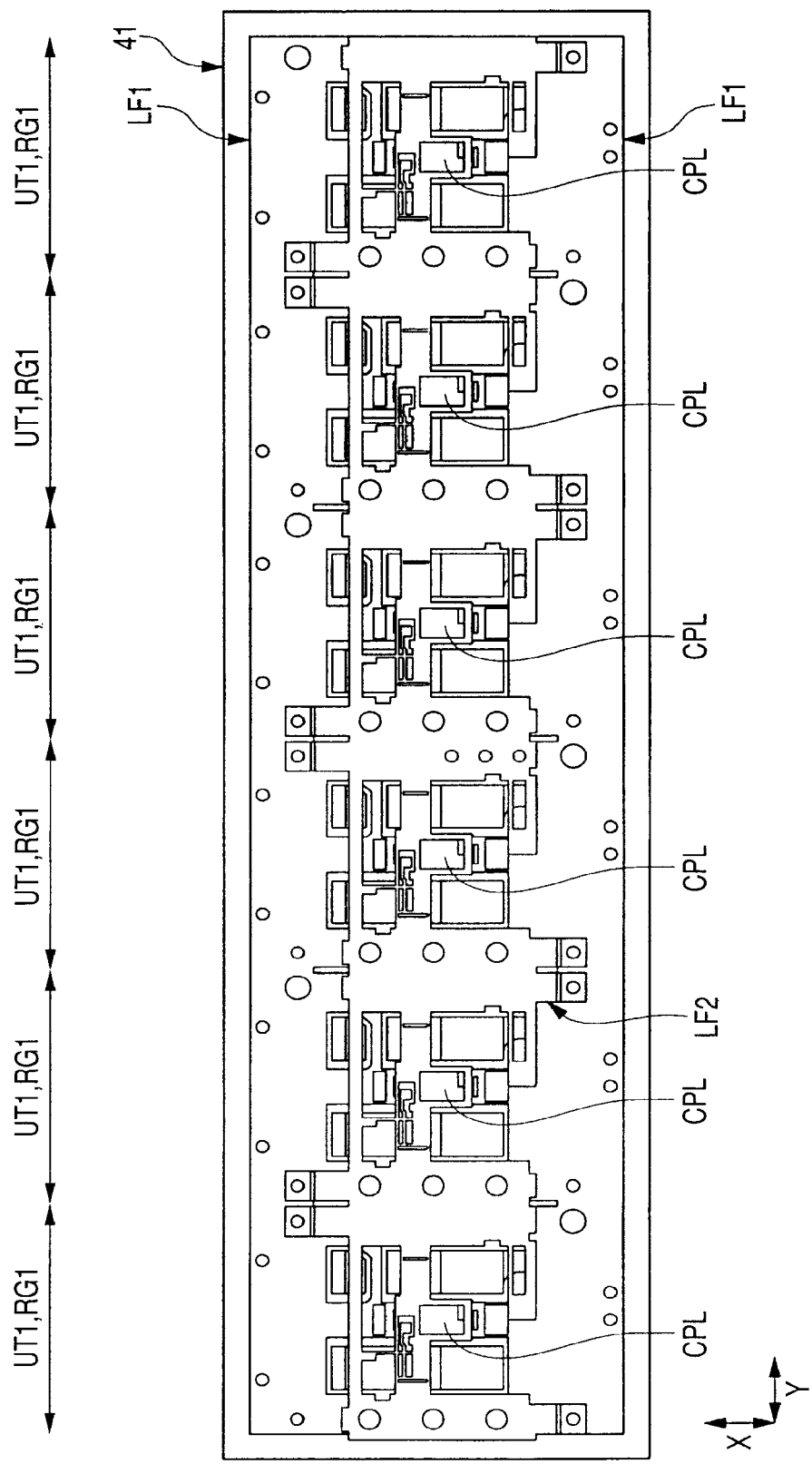
FIG. 52 is an overall plan view of the semiconductor device in manufacturing process, following FIG. 43.
Figure 53:
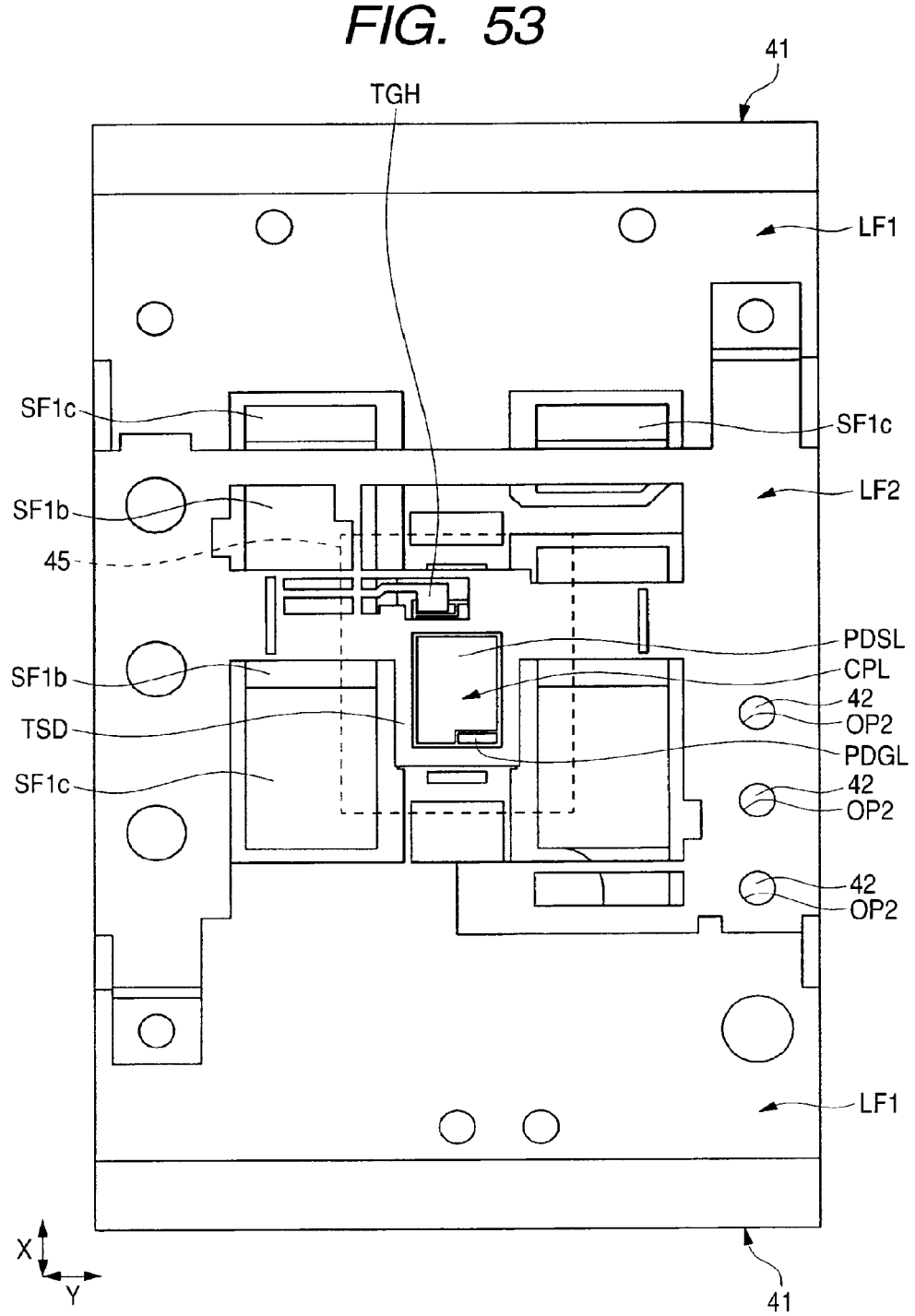
FIG. 53 is a substantial part plan view of the same semiconductor device as in FIG. 52 in manufacturing process.
Figure 54:
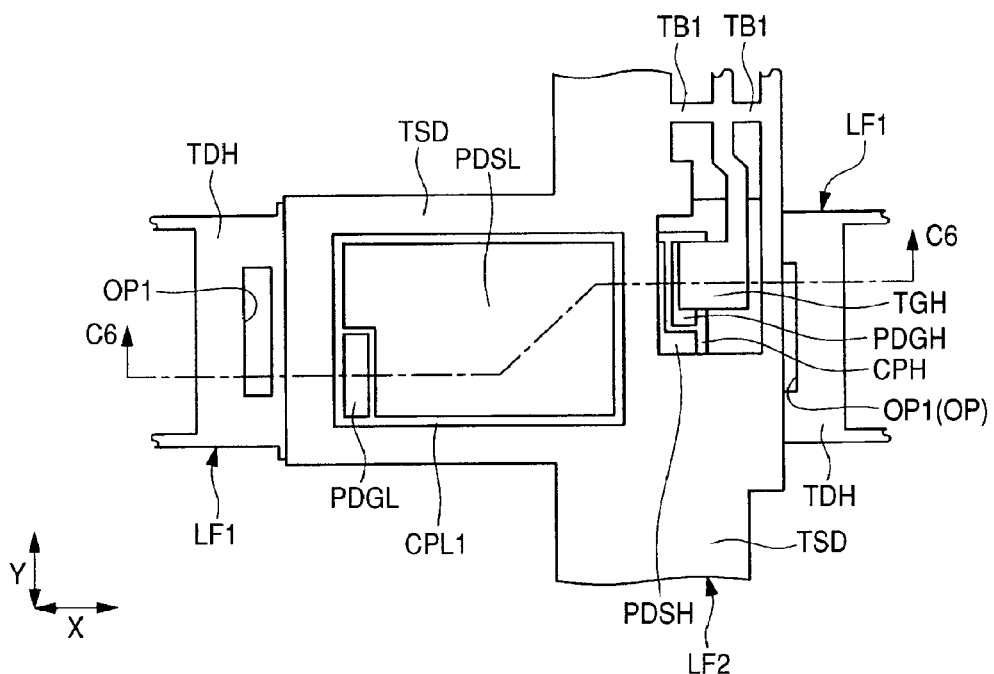
FIG. 54 is a substantial part plan view of the same semiconductor device as in FIG. 52 in manufacturing process.
Figure 55:
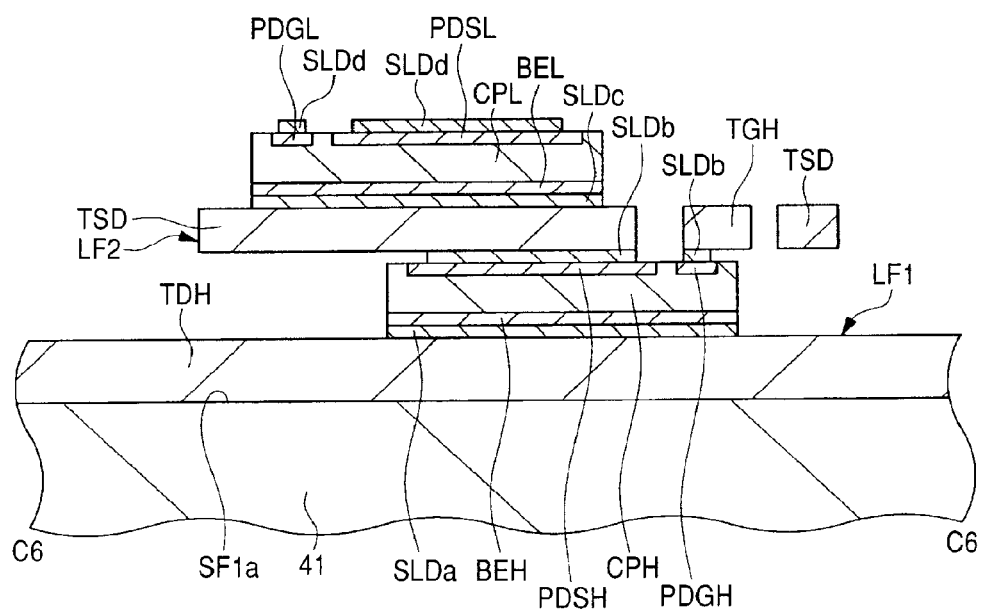
FIG. 55 is a sectional view taken along line C6-C6 of FIG. 54.

FIG. 52 is an overall plan view (top view) obtained when Step S5 (semiconductor chip CPL setting step) has been carried out and shows the same area as in FIG. 25, FIG. 32, FIG. 39, and FIG. 43. FIG. 53 is a substantial part plan view (partial enlarged plan view) obtained when Step S5 (semiconductor chip CPL setting step) has been carried out and shows the same area as in FIG. 26, FIG. 33, FIG. 40, and FIG. 44. FIG. 54 is a partial enlarged plan view of the area (that is, the drain terminal TDH and its surrounding area) 45 encircled with a broken line in FIG. 53. FIG. 54 shows what is obtained by turning the area 45 in FIG. 53 90° clockwise and in this drawing the assembly jig 41 is omitted. Though FIG. 55 is a sectional view taken along line C6-C6 of FIG. 54, the openings OP1 in the lead frame LF1 are omitted in the sectional view in FIG. 55 to facilitate visualization.

Solder paste may be used as the solder SLDc used at Step S5 but use of solder pellets (solder foil) is more desirable. When solder pellets are used as the solder SLDc, it is easy to evenly control the amount of solder SLDc supplied to the upper surface of each source-drain terminal TSD. Therefore, it is possible to reduce variation in the thickness of the solder SLD joining each source-drain terminal TSD and each semiconductor chip CPL. When solder pellets are used as the solder SLDc, it is desirable to take the following procedure: flux (flux material) is applied to the upper surface of each source-drain terminal TSD of the lead frame LF2 and then solder pellets are set; and flux (flux material) is further applied to the solder pellets and each semiconductor chip CPL is placed thereover.

As the result of Step S5, each semiconductor chip CPL is set (placed) over the upper surface of each source-drain terminal TSD of the lead frame LF2 with the solder SLDc in between. At Step S5, each semiconductor chip CPL is placed so that its back surface drain electrode BEL is opposed to the upper surface of each source-drain terminal TSD of the lead frame LF2. The upper surface of each source-drain terminal TSD of the lead frame LF2 is its main surface on the opposite side to the side where it is opposed to each semiconductor chip CPH. When the solder SLDc is solder paste, the semiconductor chip CPL is temporarily fixed by the adhesion (adhesiveness) of the solder paste. When the solder SLDc is solder pellets, it is temporarily fixed by the adhesion (adhesiveness) of flux.

As seen from FIG. 41, FIG. 42, FIG. 50, FIG. 51, FIG. 54, FIG. 55 as well, each source-drain terminal and each semiconductor chip CPL are set as follows: each source-drain terminal TSD of the lead frame LF2 is so set that it does not planarly overlap with the gate pad electrode PDGH of each semiconductor chip CPH; and each semiconductor chip CPL is set over each source-drain terminal TSD of the lead frame LF2. For this reason, each semiconductor chip CPL is set in a position displaced from each semiconductor chip CPH as viewed in a plane. Consequently, the back surface drain electrode BEL of each semiconductor chip CPL is not in contact with each gate terminal TGH of the lead frame LF2.

In this embodiment, the following procedure is taken before each semiconductor chip CPL is placed over each source-drain terminal TSD of the lead frame LF2: solder (solder material, solder layer) SLDd is supplied (formed) over the source pad electrode PDSL and gate pad electrode PDGL in the front surface of each semiconductor chip CPL. Specifically, the following procedure is taken: flux (flux material) is applied to the source pad electrode PDSL and gate pad electrode PDGL of each semiconductor chip CPL before it is placed over each source-drain terminal TSD of the lead frame LF2 and solder pellets are set; flux is further applied to these solder pellets and using a heat block (not shown) or the like, each semiconductor chip CPL is heated to melt and solidify the flux and the solder pellets. As a result, a solder layer (solder SLDd in this example) is formed over the source pad electrode PDSL and gate pad electrode PDGL of each semiconductor chip CPL. Then each semiconductor chip CPL in this state is placed over the upper surface of each source-drain terminal TSD of the lead frame LF2. As mentioned above, solder pellets are used to form a solder layer (solder SLDd in this example) over the source pad electrode PDSL and gate pad electrode PDGL of each semiconductor chip CPL. Thereafter, this semiconductor chip CPL is placed over each source-drain terminal TSD of the lead frame LF2. This makes it easier to evenly control the amount of solder SLDd over the source pad electrode PDSL and gate pad electrode PDGL of each semiconductor chip CPL. For this reason, it is possible to reduce variation in the thickness of the solder SLD joining together the source pad electrode PDSL and gate pad electrode PDGL of each semiconductor chip CPL and each source terminal TSL and gate terminal TGL.

As another embodiment, the following procedure may be taken without previously supplying solder SLDd to the source pad electrode PDSL or gate pad electrode PDGL in the front surface of each semiconductor chip CPL: this semiconductor chip CPL is placed over each source-drain terminal TSD of the lead frame LF2; and then solder SLDd is supplied (set) over the source pad electrode PDSL and gate pad electrode PDGL in the front surface of each semiconductor chip CPL. In this case, for example, solder pastes or the like can be used as the solder SLDd.

Subsequently, as illustrated in FIG. 56 to FIG. 66, the lead frame LF3 is set (placed, mounted) over the assembly jig 41 with the lead frames LF1, LF2 set thereover (Step S6 in FIG. 18).

Figure 56:
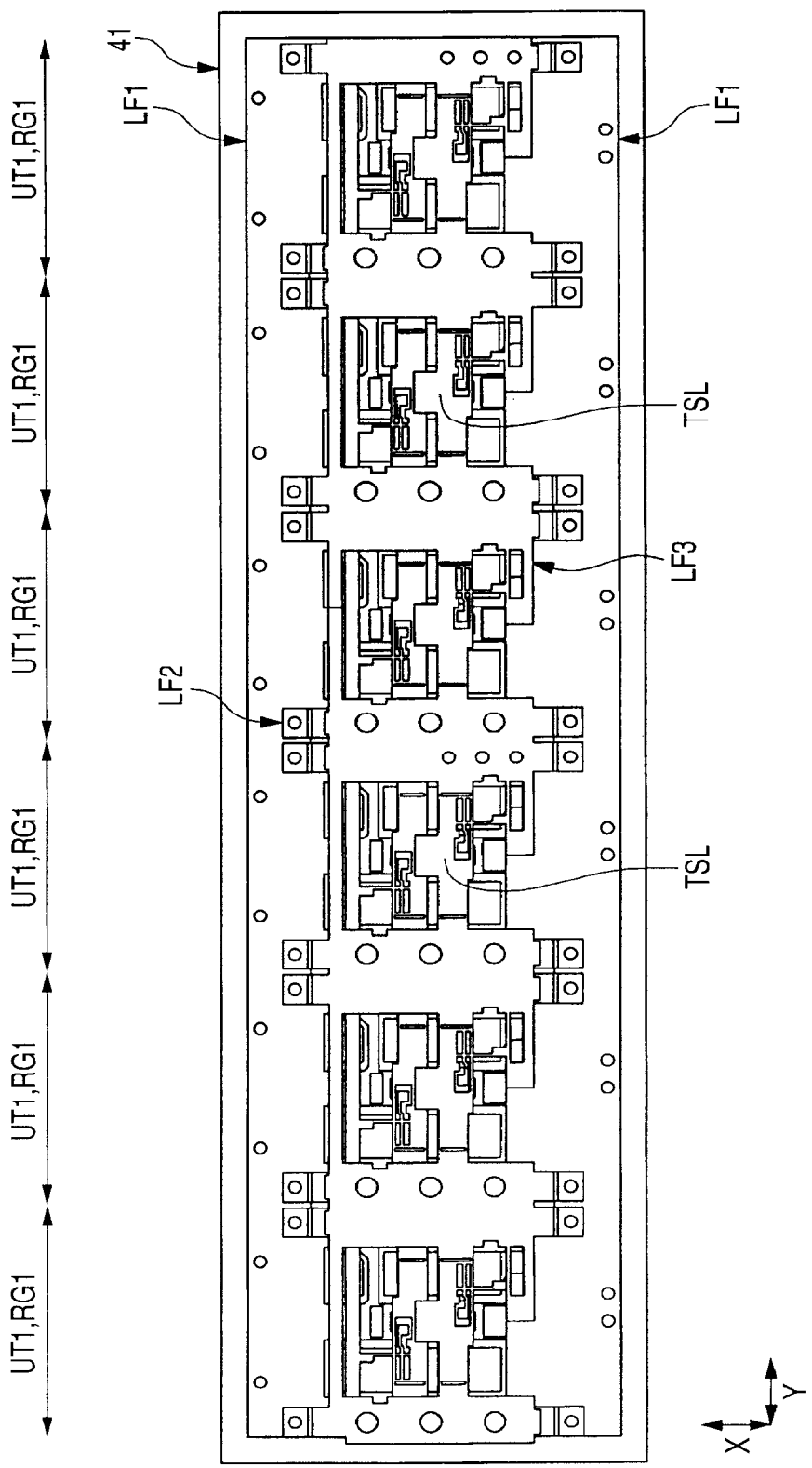
FIG. 56 is an overall plan view of the semiconductor device in manufacturing process, following FIG. 52.
Figure 57:
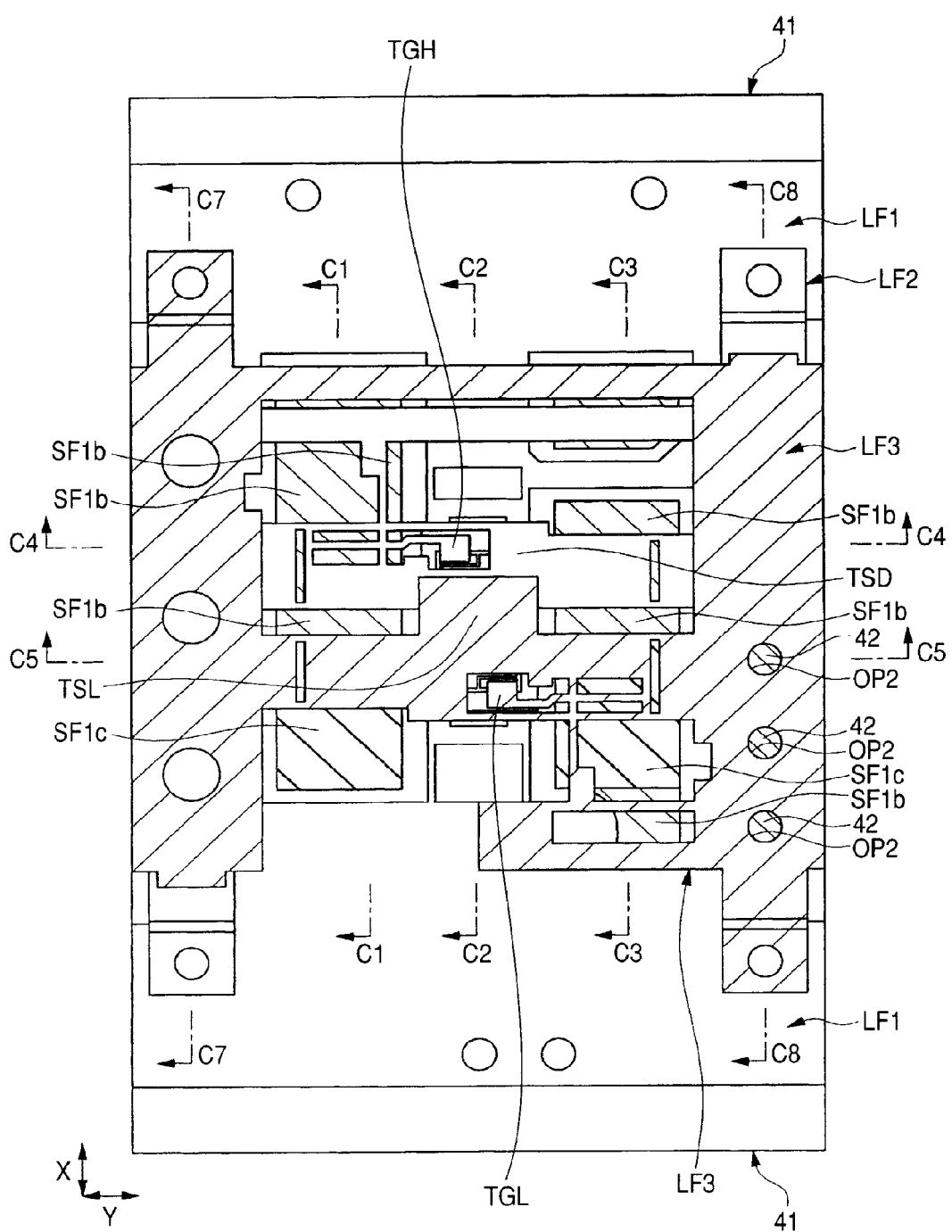
FIG. 57 is a substantial part plan view of the same semiconductor device as in FIG. 56 in manufacturing process.
Figure 58:
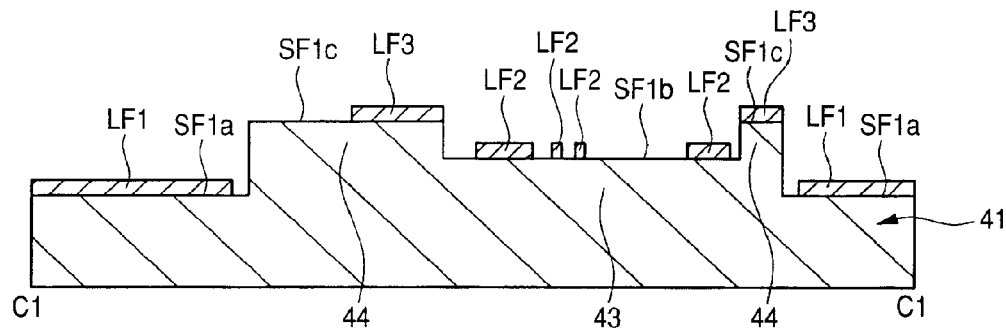
FIG. 58 is a sectional view taken along line C1-C1 of FIG. 57.
Figure 59:
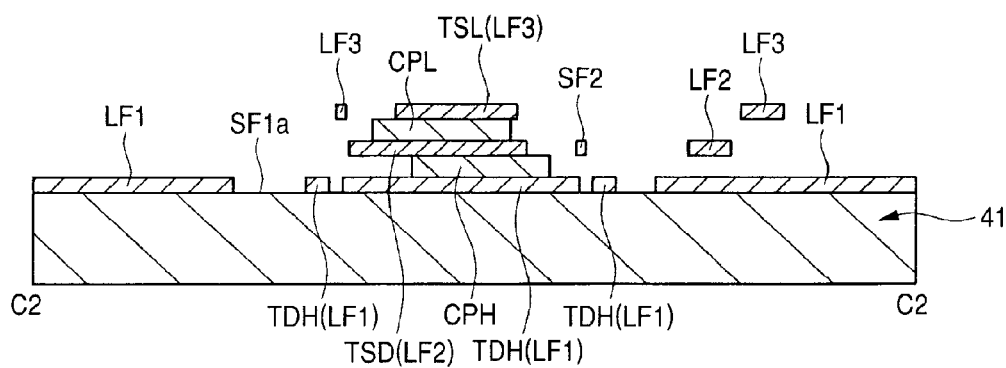
FIG. 59 is a sectional view taken along line C2-C2 of FIG. 57.
Figure 60:
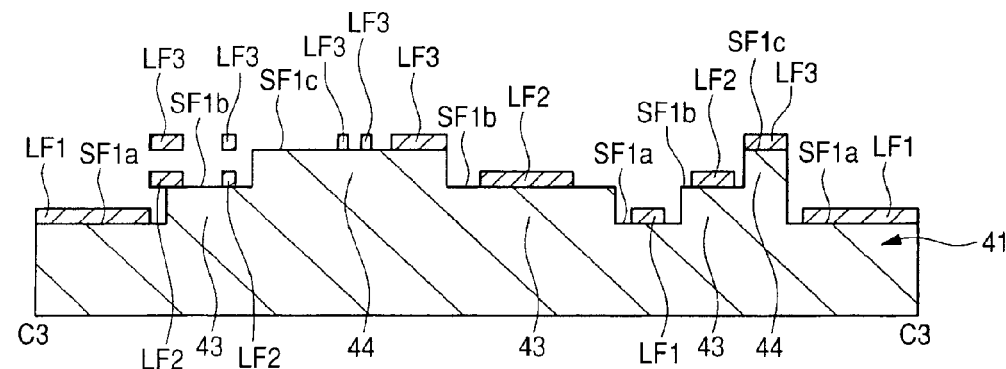
FIG. 60 is a sectional view taken along line C3-C3 of FIG. 57.
Figure 61:
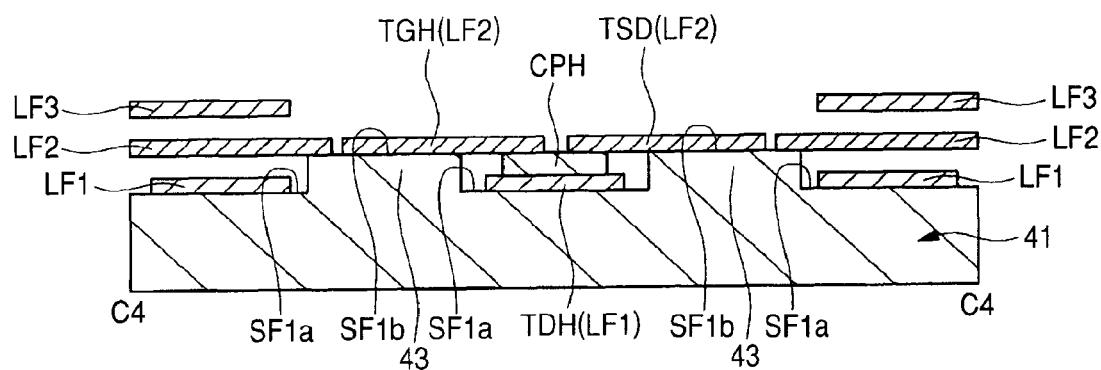
FIG. 61 is a sectional view taken along line C4-C4 of FIG. 57.
Figure 62:
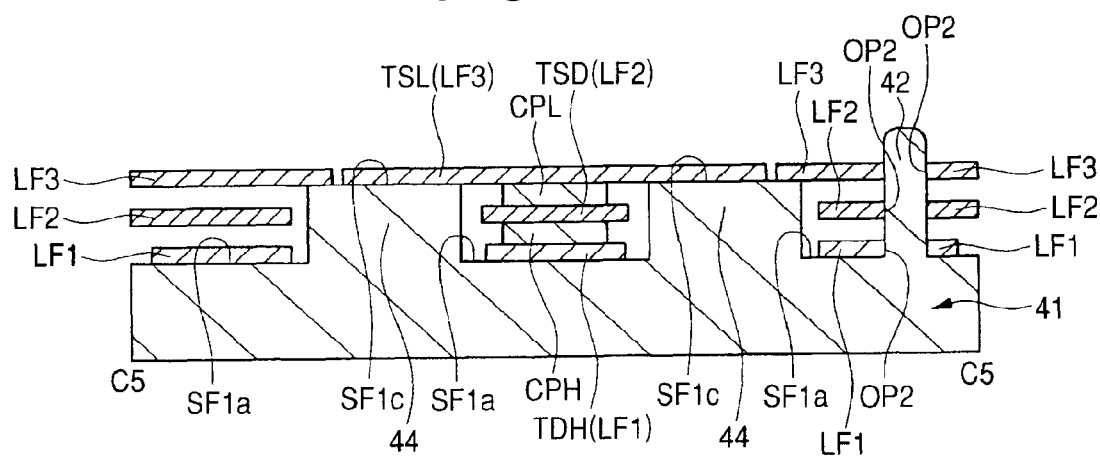
FIG. 62 is a sectional view taken along line C5-C5 of FIG. 57.
Figure 63:
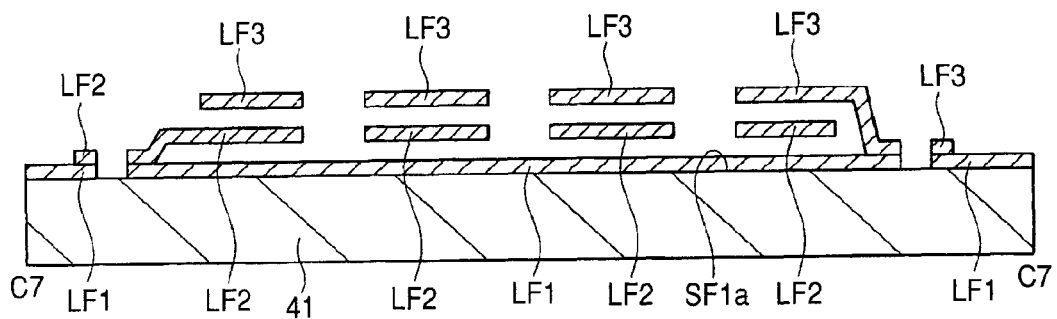
FIG. 63 is a sectional view taken along line C7-C7 of FIG. 57.
Figure 64:
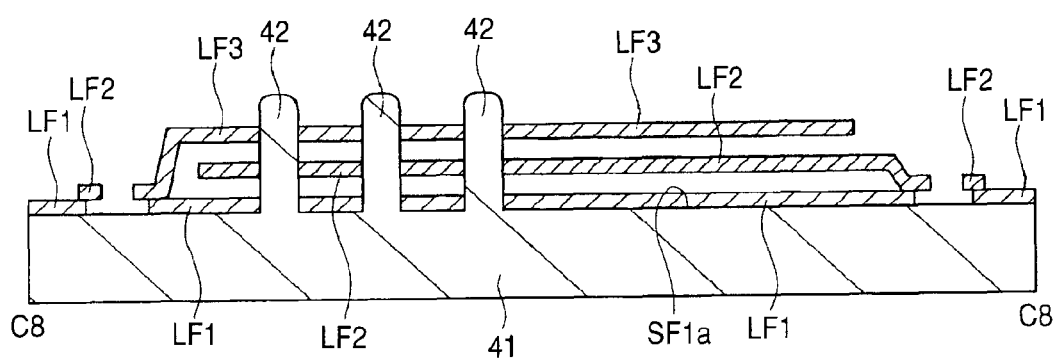
FIG. 64 is a sectional view taken along line C8-C8 of FIG. 57.
Figure 65:
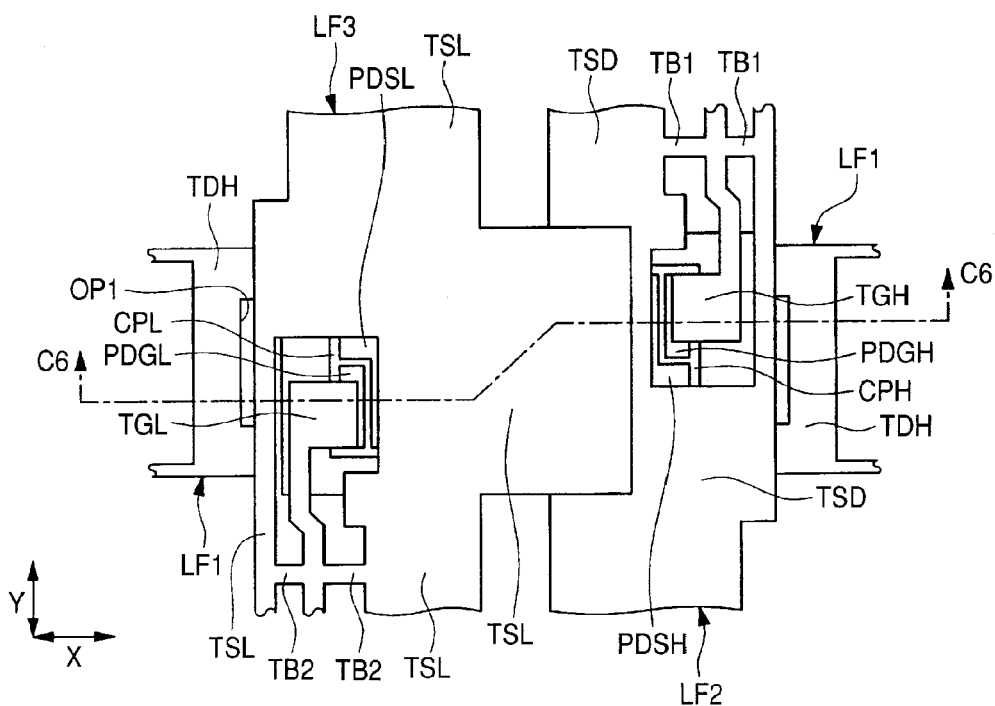
FIG. 65 is a substantial part plan view of the same semiconductor device as in FIG. 56 in manufacturing process.
Figure 66:
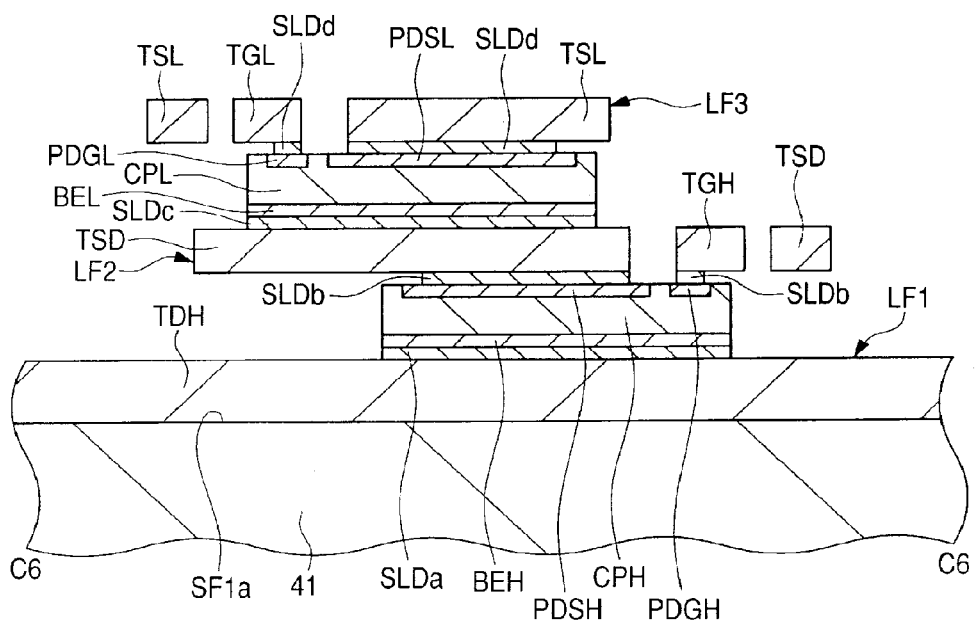
FIG. 66 is a sectional view taken along line C6-C6 of FIG. 65.

FIG. 56 is an overall plan view (top view) obtained when Step S6 (lead frame LF3 setting step) has been carried out and shows the same area as in FIG. 25, FIG. 32, FIG. 39, and FIG. 43. FIG. 57 is a substantial part plan view (partial enlarged plan view) obtained when Step S6 (lead frame LF3 setting step) has been carried out and shows the same area as in FIG. 26, FIG. 33, FIG. 40, and FIG. 44. FIG. 58 is a sectional view taken along line C1-C1 of FIG. 57; FIG. 59 is a sectional view taken along line C2-C2 of FIG. 57; FIG. 60 is a sectional view taken along line C3-C3 of FIG. 57; FIG. 61 is a sectional view taken along line C4-C4 of FIG. 57; FIG. 62 is a sectional view taken along line C5-C5 of FIG. 57; FIG. 63 is a sectional view taken along line C7-C7 of FIG. 57; and FIG. 64 is a sectional view taken along line C8-C8 of FIG. 57. FIG. 65 is a partial enlarged plan view of the area (that is, the drain terminal TDH and its surrounding area) 45 encircled with a broken line in FIG. 57. FIG. 65 shows what is obtained by turning the area 45 in FIG. 57 90° clockwise and in this drawing the assembly jig 41 is omitted. Though FIG. 66 is a sectional view taken along line C6-C6 of FIG. 65, the openings OP1 in the lead frame LF1 are omitted in the sectional view in FIG. 66 to facilitate visualization. Though FIG. 57 is a plan view, the supporting faces SF1$b$, SF1$c$ and the pins 42 in the upper surface of the assembly jig 41 and the lead frame LF3 are hatched to facilitate visualization (to make the layout of each element easily understandable).

At Step S6, the lead frame LF3 is set over the upper surface of the assembly jig 41 so that the following is implemented: the pins 42 of the assembly jig 41 are inserted into the positioning openings (holes, through holes) OP2 provided in the lead frame LF3. The relative positional relation (planar positional relation) between the assembly jig 41, lead frame LF1, lead frame LF2, and lead frame LF3 is defined (determined) by the following: the pin 42 of the assembly jig 41, the openings OP2 in the lead frame LF1, the openings OP2 in the lead frame LF2, and the openings OP2 in the lead frame LF3.

Thus the lead frame LF3 is set over the lead frames LF1, LF2 and the semiconductor chips CPH, CPL so that the following is implemented: each source terminal TSL of the lead frame LF3 is set over the source pad electrode PDSL of each semiconductor chip CPL; and each gate terminal TGL of the lead frame LF3 is set over the gate pad electrode PDGL of each semiconductor chip CPL. That is, each source terminal TSL of the lead frame LF3 is set over the source pad electrode PDSL of each semiconductor chip CPL with solder SLDd in between; at the same time, each gate terminal TGL of the lead frame LF3 is set over the gate pad electrode PDGL of each semiconductor chip CPL with solder SLDd in between.

It is more desirable to take the following procedure prior to the step, or Step S6, for setting the lead frame LF3 over the assembly jig 41: flux (flux material) is applied to the lower surface of each source terminal TSL and gate terminal TGL of the lead frame LF3. (That is, flux is applied to their surfaces on the side where they are opposed to the source pad electrode PDSL and gate pad electrode PDGL of each semiconductor chip CPL). Thereafter, the lead frame LF3 setting step, or Step S6 is carried out.

Figure 67:
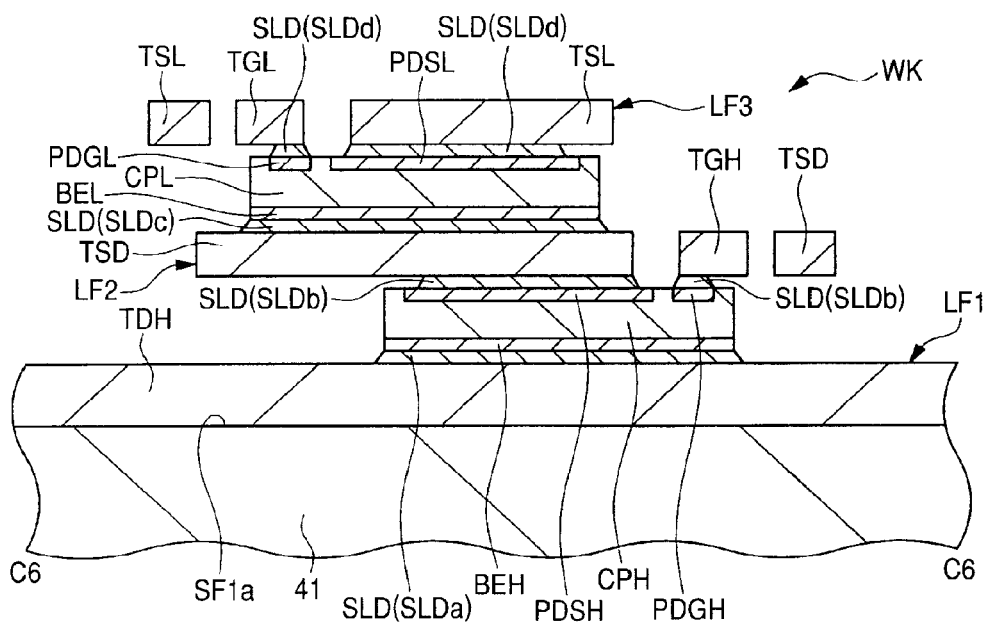
FIG. 67 is a substantial part sectional view of the semiconductor device in manufacturing process, following FIG. 56.

Subsequently, solder reflow processing (heat treatment, solder reflow heat treatment) is carried out (Step S7 in FIG. 18). FIG. 67 is a substantial part sectional view obtained when Step S7 (solder reflow processing) has been carried out and shows the same sectioned area (that is, the section taken along line C6-C6) in FIG. 66.

The solder reflow processing of Step S7 is carried out without removing the lead frame LF1, LF2, or LF3 from the assembly jig 41 in a state in which: the lead frames LF1, LF2, LF3 are set over the assembly jig 41 as illustrated in FIG. 56 to FIG. 66; and the semiconductor chips CPH, CPL are sandwiched between the lead frames LF1, LF2, LF3. That is, the solder reflow processing of Step S7 can be carried out by taking the following procedure to carry out heat treatment: the lead frames LF1, LF2, LF3 set over the assembly jig 41 and the semiconductor chips CPH, CPL sandwiched therebetween are passed through a reflow furnace together with the assembly jig (along with the assembly jig 41). As the result of the solder reflow processing of Step S9, the solder SLDa, SLDb, SLDc, SLDd is melt and solidified (re-solidified) and turned into the solder SLD.

The result illustrated in FIG. 67 is obtained by carrying out this solder reflow processing of Step S7, that is, solder reflow heat treatment. That is, the back surface drain electrode BEH of each semiconductor chip CPH and each drain terminal TDH of the lead frame LF1 are joined and electrically coupled together through solder SLD (obtained by melting and solidifying solder SLDa). The source pad electrode PDSH of each semiconductor chip CPH and each source-drain terminal TSD of the lead frame LF2 are joined and electrically coupled together through solder SLD (obtained by melting and solidifying solder SLDb). The gate pad electrode PDGH of each semiconductor chip CPH and each gate terminal TGH of the lead frame LF2 are joined and electrically coupled together through solder SLD (obtained by melting and solidifying solder SLDb). The back surface drain electrode BEL of each semiconductor chip CPL and each source-drain terminal TSD of the lead frame LF2 are joined and electrically coupled together through solder SLD (obtained by melting and solidifying solder SLDc). The source pad electrode PDSL of each semiconductor chip CPL and each source terminal TSL of the lead frame LF3 are joined and electrically coupled together through solder SLD (obtained by melting and solidifying solder SLDd). The gate pad electrode PDGL of each semiconductor chip CPL and each gate terminal TGL of the lead frame LF3 are joined and electrically coupled together through solder SLD (obtained by melting and solidifying solder SLDd). As a result, an assembly (work) WK comprised of the lead frames LF1, LF2, LF3 and the semiconductor chips CPH, CPL soldered therebetween is obtained. The plan views obtained when the solder reflow processing of Step S7 has been carried out to form the solder SLD (the same process step as in FIG. 67) are the same as FIG. 56, FIG. 57, and FIG. 65 and the drawings are omitted here.

Figure 68:
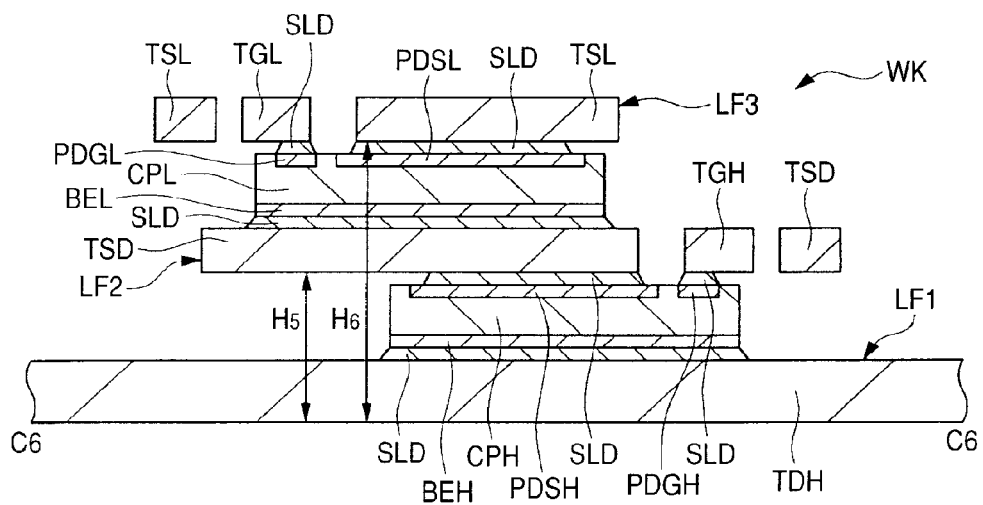
FIG. 68 is a substantial part sectional view of the semiconductor device in manufacturing process, following FIG. 67.

After the solder reflow processing of Step S7, the assembly WK can be removed from the assembly jig 41 as illustrated in FIG. 68. FIG. 68 is a substantial part sectional view obtained when the assembly WK is removed from the assembly jig 41 after the solder reflow processing of Step S7. It shows the same sectioned area (that is, the section taken along line C6-C6) as in FIG. 66 and FIG. 67. After the solder reflow processing of Step S7, the lead frames LF1, LF2, LF3 and the semiconductor chips CPH, CPL are fixed with solder SLD in the assembly WK. Even though the assembly WK is removed from the assembly jig 41, therefore, the relative positional relation can be prevented from being broken between the lead frame LF1, lead frame LF2, lead frame LF3, semiconductor chip CPH, and semiconductor chip CPL.

Subsequently, a molding step (resin sealing step, for example, transfer molding step) is carried out to form the encapsulation resin portion MR as illustrated in FIG. 69 to FIG. 72. The semiconductor chips CPH, CPL are thereby sealed with the encapsulation resin portion MR (Step S8 in FIG. 18).

Figure 69:
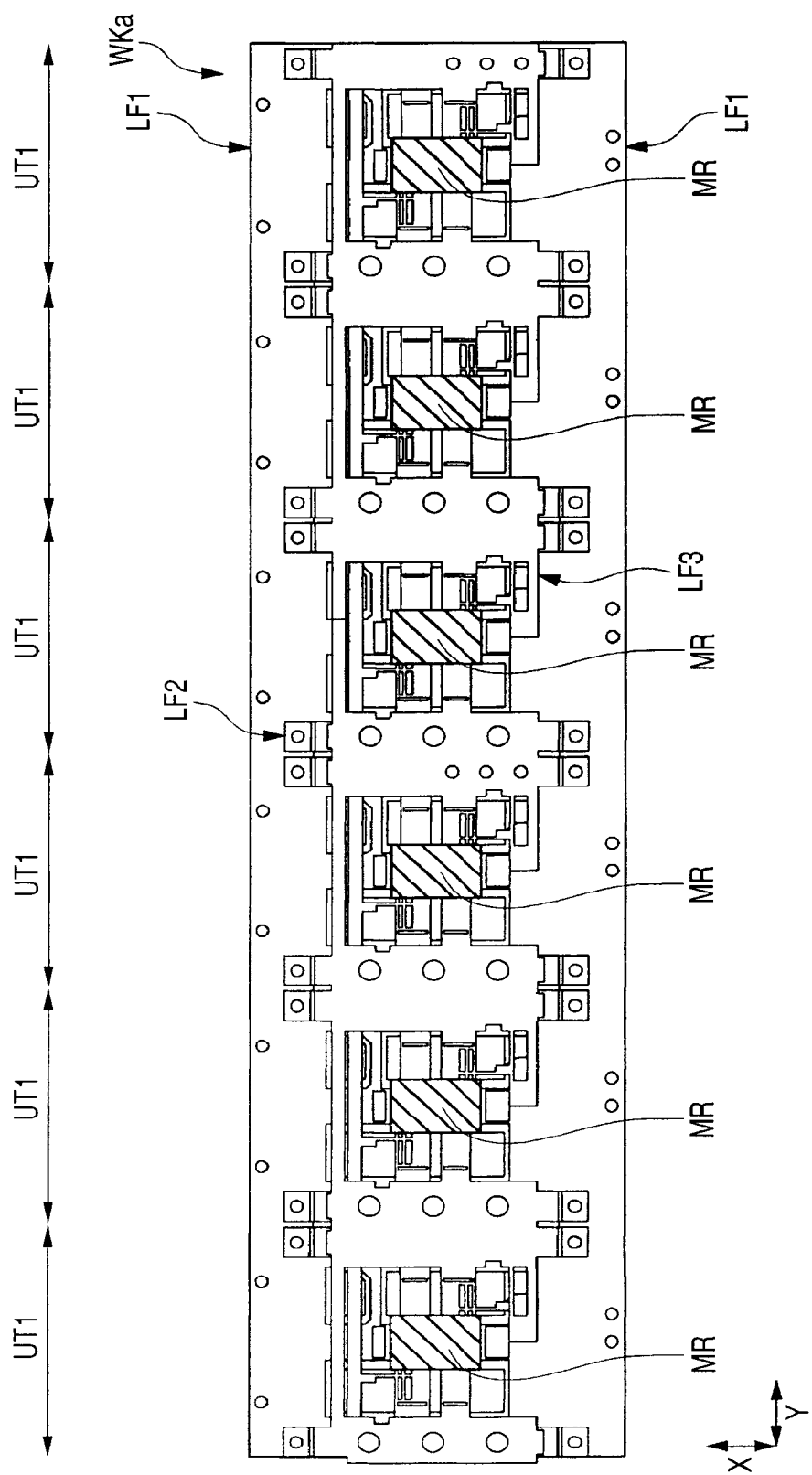
FIG. 69 is an overall plan view of the semiconductor device in manufacturing process, following FIG. 68.
Figure 70:
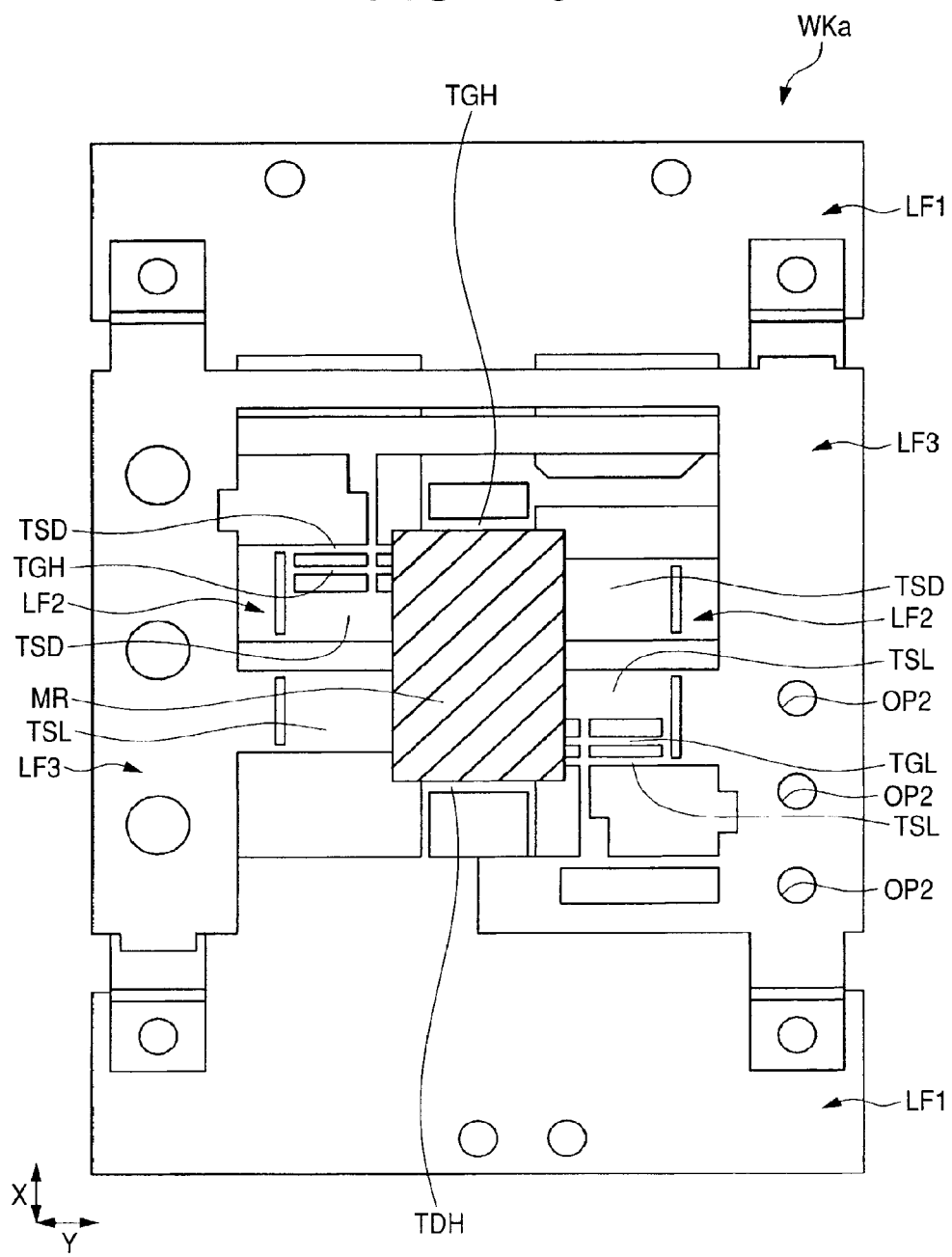
FIG. 70 is a substantial part plan view of the same semiconductor device as in FIG. 69 in manufacturing process.
Figure 71:
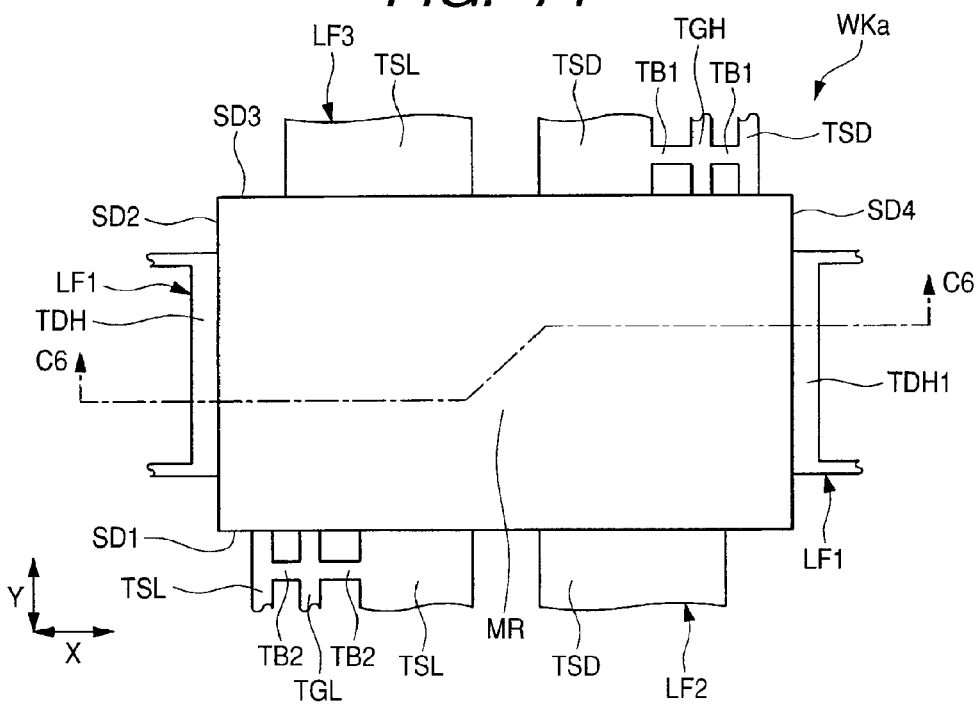
FIG. 71 is a substantial part plan view of the same semiconductor device as in FIG. 69 in manufacturing process.
Figure 72:
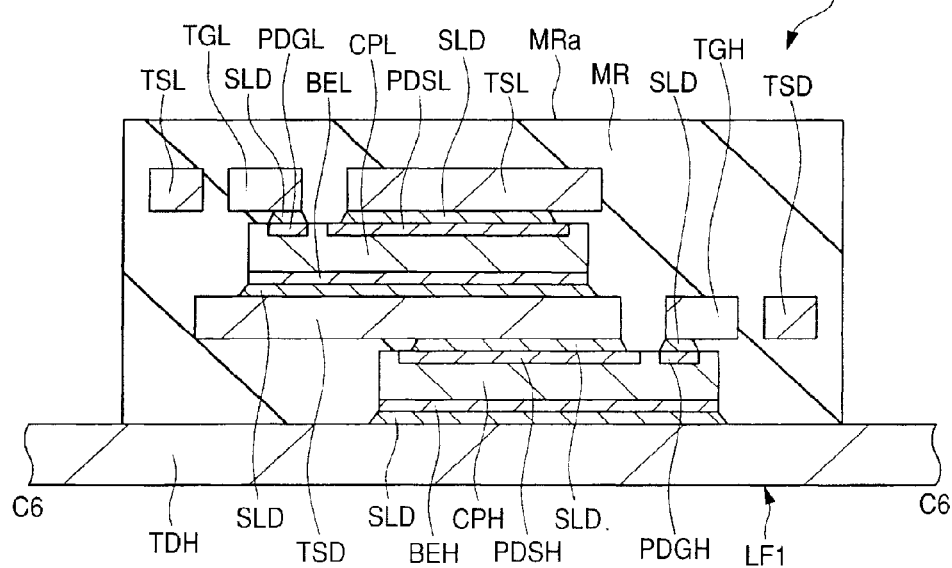
FIG. 72 is a sectional view taken along line C6-C6 of FIG. 71.

FIG. 69 is an overall plan view (top view) obtained when Step S8 (encapsulation resin portion MR formation step) has been carried out and shows the same area as in FIG. 25, FIG. 32, FIG. 39, FIG. 43, FIG. 52, and FIG. 56. FIG. 70 is a substantial part plan view (partial enlarged plan view) obtained when Step S8 (encapsulation resin portion MR formation step) has been carried out and shows the same area as in FIG. 26, FIG. 33, FIG. 40, FIG. 44, FIG. 53, and FIG. 57. FIG. 71 is a substantial part plan view (partial enlarged plan view) obtained when Step S8 (encapsulation resin portion MR formation step) has been carried out and shows the same area (equivalent to the area 45) as in FIG. 41, FIG. 50, FIG. 54, and FIG. 65. Though FIG. 72 is a sectional view taken along line C6-C6 of FIG. 71, the openings OP1 in the lead frame LF1 are omitted in the sectional view in FIG. 72 to facilitate visualization.

Description will be given to this molding step, or Step S8 with reference to FIG. 73 to FIG. 93.

Figure 73:
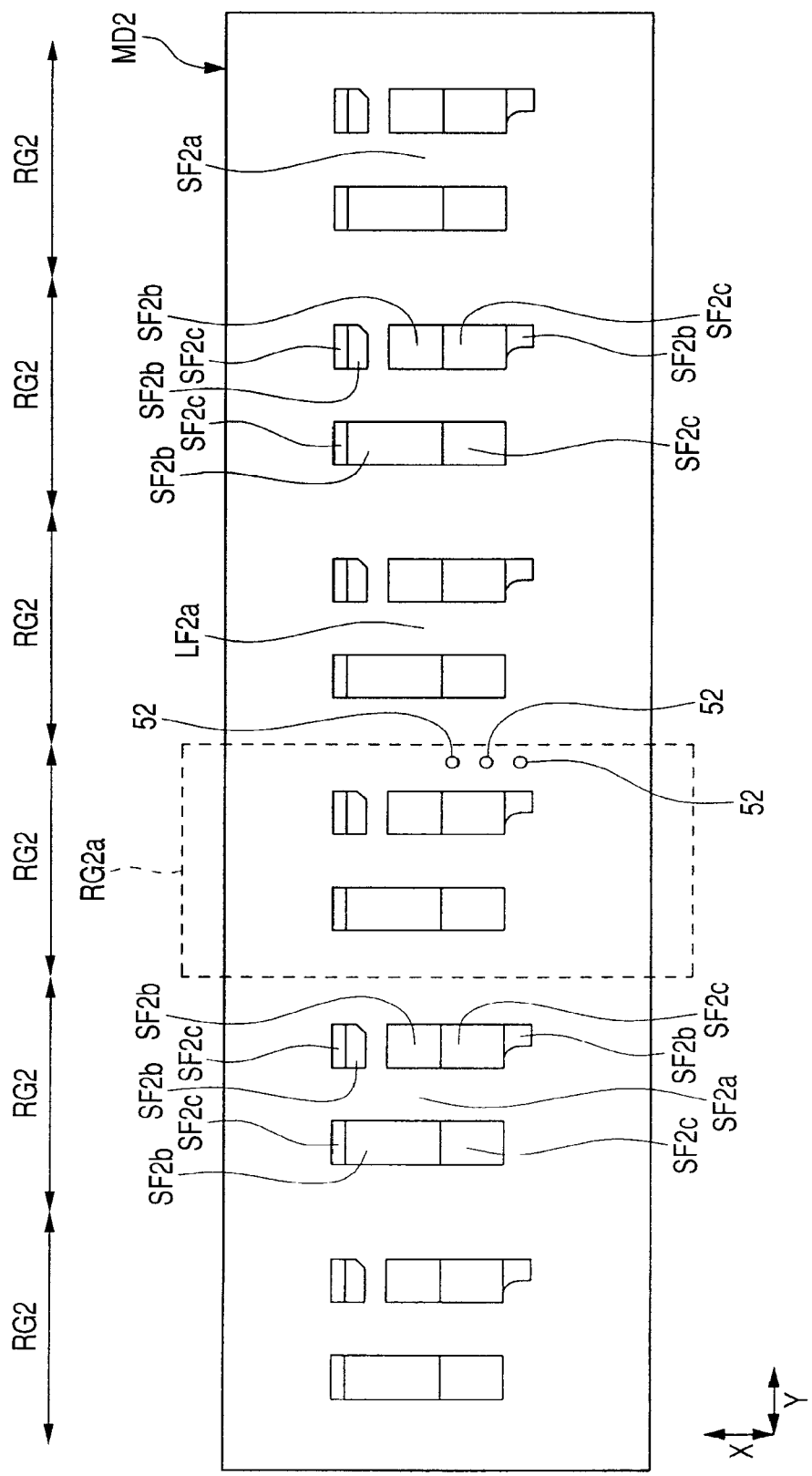
FIG. 73 is a plan view (top view) of a die (lower die) used in a manufacturing process for a semiconductor device in an embodiment of the invention.
Figure 74:
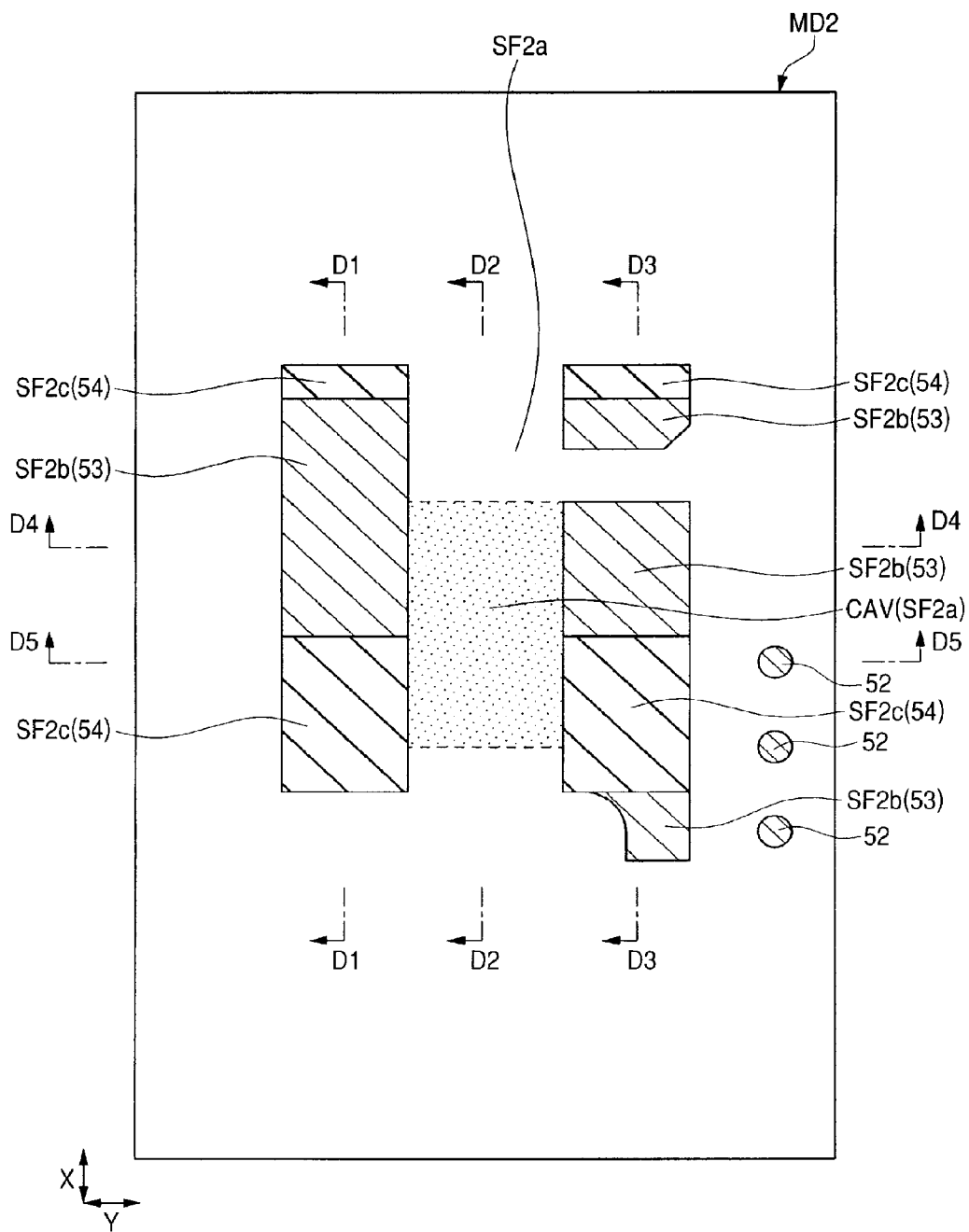
FIG. 74 is a substantial part plan view of the die in FIG. 73.
Figure 75:
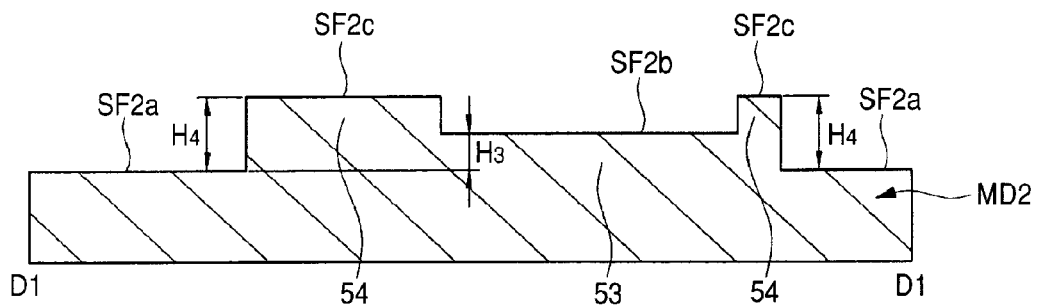
FIG. 75 is a sectional view of the die in FIG. 74 taken along line D1-D1.
Figure 76:
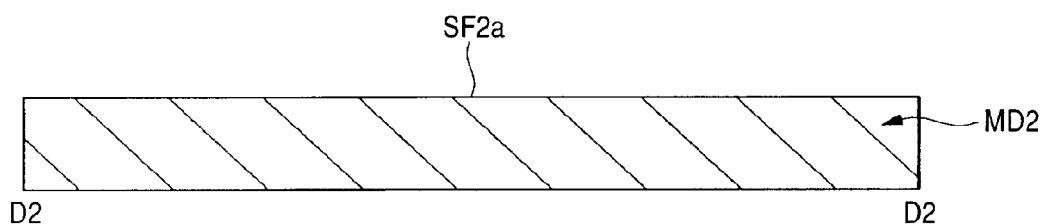
FIG. 76 is a sectional view of the die in FIG. 74 taken along line D2-D2.
Figure 77:
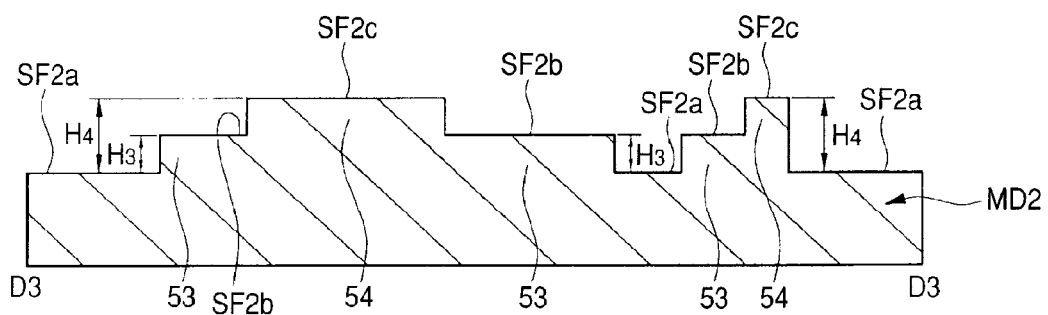
FIG. 77 is a sectional view of the die in FIG. 74 taken along line D3-D3.
Figure 78:
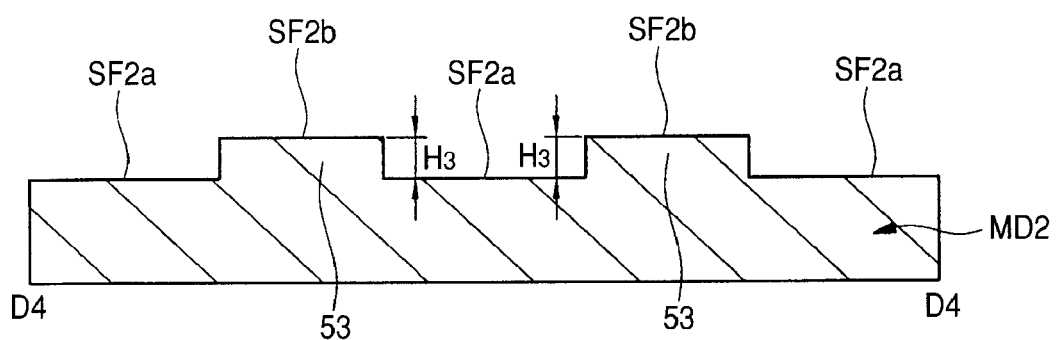
FIG. 78 is a sectional view of the die in FIG. 74 taken along line D4-D4.
Figure 79:
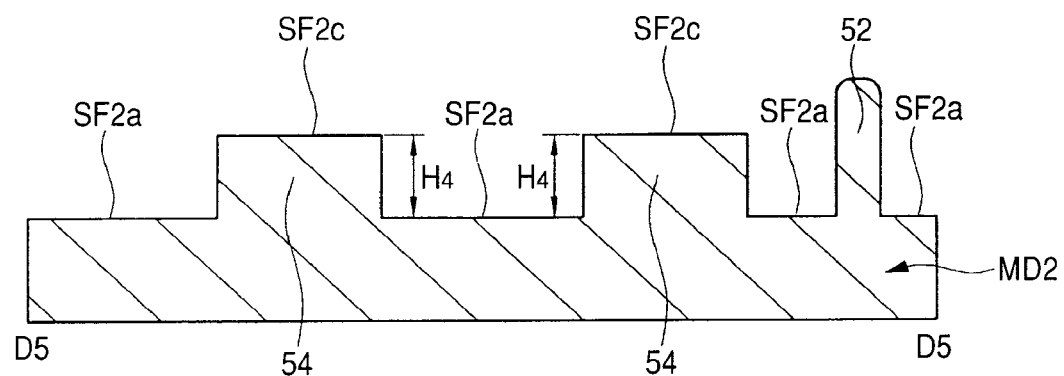
FIG. 79 is a sectional view of the die in FIG. 74 taken along line D5-D5.

The molding step, or Step S8 is carried out using molding dies MD1, MD2. Of these molding dies, the die MD1 is an upper die and the die MD2 is a lower die. FIG. 73 is an overall plan view (top view) of the die (lower die) MD2; FIG. 74 is a substantial part plan view (partial enlarged plan view) of the die MD2; and FIG. 75 to FIG. 79 are substantial part sectional views of the die MD2. The substantial part plan view (partial enlarged plan view) in FIG. 74 is an enlarged view of an area (corresponding to a unit region RG2*a*) encircled with a broken line in FIG. 73. The section taken along line D1-D1 of FIG. 74 substantially corresponds to FIG. 75; the section taken along line D2-D2 of FIG. 74 substantially corresponds to FIG. 76; the section taken along line D3-D3 of FIG. 74 substantially corresponds to FIG. 77; the section taken along line D4-D4 of FIG. 74 substantially corresponds to FIG. 78; and the section taken along line D5-D5 of FIG. 74 substantially corresponds to FIG. 79. Though FIG. 74 is a plan view, the supporting faces SF2*b*, SF2*c* and pins 52 in the upper surface of the die MD2 are hatched with oblique lines to facilitate visualization (to make the layout of each element easily understandable). The area where a cavity CAV is formed (that is, the area to be the bottom surface of the cavity CAV) is hatched with dots for the same purpose as mentioned above. The position of line D1-D1 corresponds to the position of line C1-C1; the position of line D2-D2 corresponds to the position of line C2-C2; the position of line D3-D3 corresponds to the position of line C3-C3; the position of line D4-D4 corresponds to the position of line C4-C4; and the position of line D5-D5 corresponds to the position of line C5-C5.

The die MD1 illustrated in FIG. 86 to FIG. 93 and the die MD2 illustrated in FIG. 73 to FIG. 93 are formed of a material having durability (heat resistance) against the molding step, or Step S8, with the processing temperature of approximately 180° C. For example, what is obtained by plating quenched and tempered steel with hard chromium or the like is desirable as the material. The material composing the dies MD1, MD2 is different from the material (carbon material or SUS material) composing the assembly jig 41. The assembly jig 41 is used in the solder reflow processing with the processing temperature of approximately 300 to 400° C., which is higher than the processing temperature of approximately 180° C. for the molding step. Deformation in the assembly jig 41 caused by heat leads to degradation in the accuracy of assembly (combination) of the lead frames LF1, LF2, LF3 and the semiconductor chips CPH, CPL sandwiched therebetween. For this reason, if the same material (obtained by plating quenched and tempered steel with hard chromium or the like) as that of the dies MD1 MD2 is used for the assembly jig 41, thermal deformation is caused by heat from solder reflow. To prevent this, a material (carbon material or SUS material) whose heat resistance is higher than that of the material composing the dies MD1, MD2 is used for the assembly jig 41. The die MD2 is so configured that the assembly WK can be set over its upper surface (main surface on the side shown in FIG. 73 and FIG. 74).

The die MD2 is so configured that multiple unit regions (hereafter, referred to as unit regions RG2), in each of which each unit region UT1 of the assembly WK is set, are arranged (repeated). How the unit regions RG2 are arranged in the die MD2 is identical with how the unit regions UT1 are arranged in each lead frame LF1, LF2, LF3. More specific description will be given. When multiple unit regions UT1 are arranged in the Y-direction in each lead frame LF1, LF2, LF3 as illustrated in FIG. 19, FIG. 21, and FIG. 23, multiple unit regions RG2 are arranged in the Y-direction in the die MD2 as illustrated in FIG. 73. The number of arranged unit regions UT1 in each lead frame LF1, LF2, LF3 and the number of arranged unit regions RG2 in the die MD2 are identical with each other. However, the number is not limited to six (in the cases in FIG. 19, FIG. 21, FIG. 23, and FIG. 73). FIG. 73 shows an overall plan view (top view) of the die MD2 and multiple unit regions RG2 are repeated in the Y-direction in the die MD2 in FIG. 73. FIG. 74 is an enlarged view of a unit region RG2*a* as one of these repeated regions. (That is, FIG. 74 is an enlarged view of the area encircled with a broken line in FIG. 73.)

The die MD2 illustrated in FIG. 73 to FIG. 79 is so configured that the assembly WK (lead frames LF1, LF2, LF3) can be set over its upper surface. For this purpose, the die MD2 has the following faces in its upper surface: a supporting face (first face) SF2*a* for setting (supporting) the lead frame LF1 in the assembly WK; supporting faces (second faces) SF2*b* for setting (supporting) the lead frame LF2, protruded to above the supporting face SF2*a*; and supporting faces (third faces) SF2*c* for setting (supporting) the lead frame LF3, protruded to above the supporting faces SF2*a*, SF2*b*. That is, in the upper surface of the die MD2, the supporting faces SF2*b* are higher than the supporting face SF2*a* and the supporting faces SF2*c* are higher than the supporting faces SF2*b*. This can be achieved by: providing the upper surface of the die MD2 with two different kinds of salient (two-level) steps (mount portions, salient portions, protruded portions) 53, 54 different in height; taking the upper surfaces of the lower (lower-level) steps 53 as the supporting faces SF2b; and taking the upper surfaces of the higher (higher-level) steps as the supporting faces SF2c. In the die MD2, the supporting faces SF2b are identical in height. In the die MD2, the supporting faces SF2c are identical in height. In the upper surface of the die MD2, positioning pins (pin portions, salient portions, projections) 52 for planarly positioning the assembly WK may be provided in the following positions: positions where the openings OP2 in the lead frames LF1, LF2, LF3 are positioned when the assembly WK is set. The pins 52 of the die MD2 need not be formed as long as there is no problem in the positioning of the assembly WK without the pins 52.

In this embodiment, the following heights (amounts of protrusion) are identical with each other: the height (amount of protrusion) $H_3$ of the supporting faces SF2b relative to the supporting face SF2a in the die MD2; and the height (amount of protrusion) $H_1$ of the supporting faces SF1b relative to the supporting face SF1a in the assembly jig 41 ($H_3=H_1$). Further, the following heights (amounts of protrusion) are identical with each other: the height (amount of protrusion) $H_4$ of the supporting faces SF2c relative to the supporting face SF2a in the die MD2; and the height (amount of protrusion) $H_2$ of the supporting faces SF1b relative to the supporting face SF1a in the assembly 41 ($H_4=H_2$).

At the molding step, or Step S8, the assembly WK is set over the die MD2 as illustrated in FIG. 80 to FIG. 85.

Figure 80:
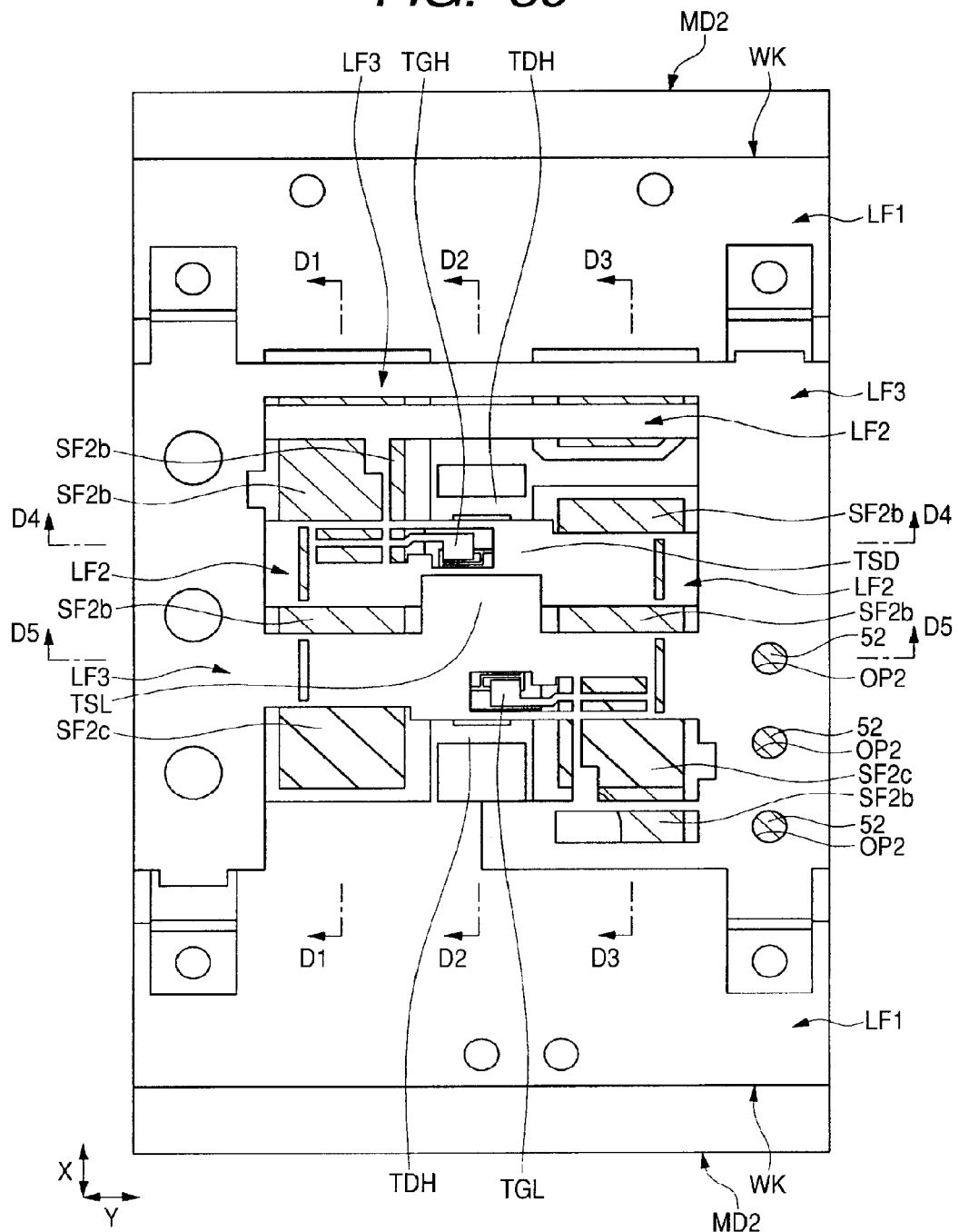
FIG. 80 is a substantial part plan view illustrating how an assembly is set in the die in FIG. 73 to FIG. 79.
Figure 81:
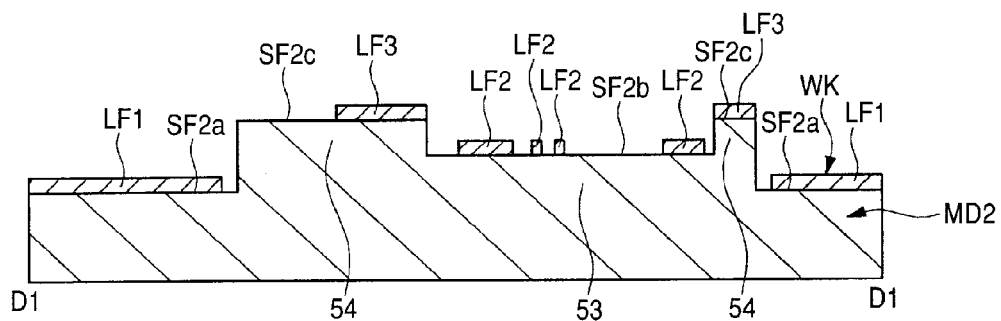
FIG. 81 is a sectional view taken along line D1-D1 of FIG. 80.
Figure 82:
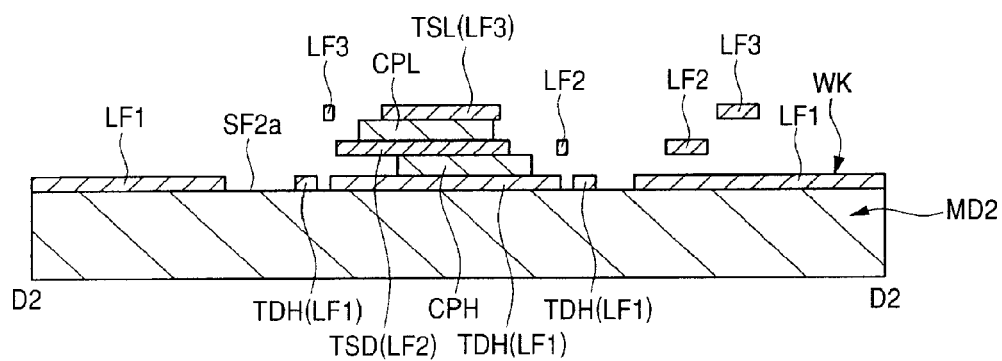
FIG. 82 is a sectional view taken along line D2-D2 of FIG. 80.
Figure 83:
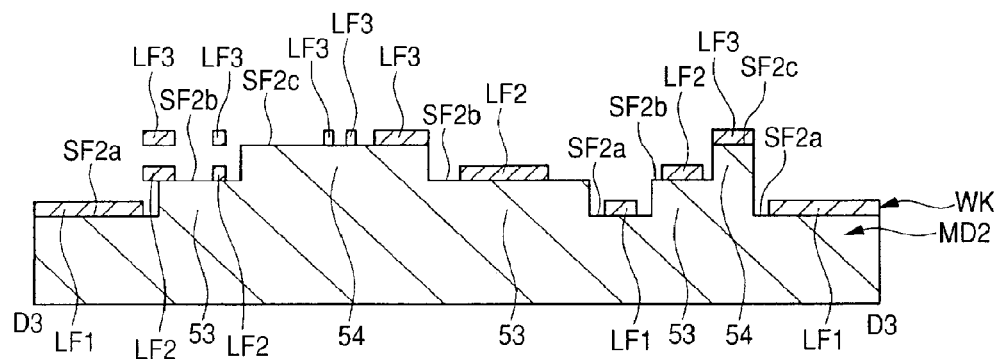
FIG. 83 is a sectional view taken along line D3-D3 of FIG. 80.
Figure 84:
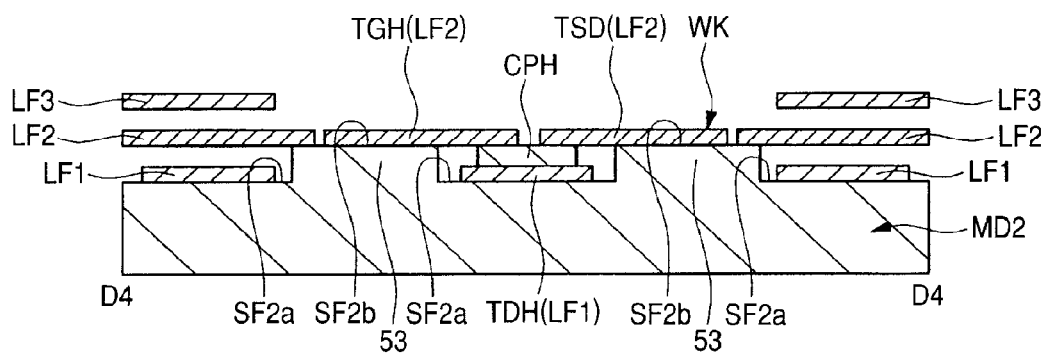
FIG. 84 is a sectional view taken along line D4-D4 of FIG. 80.
Figure 85:
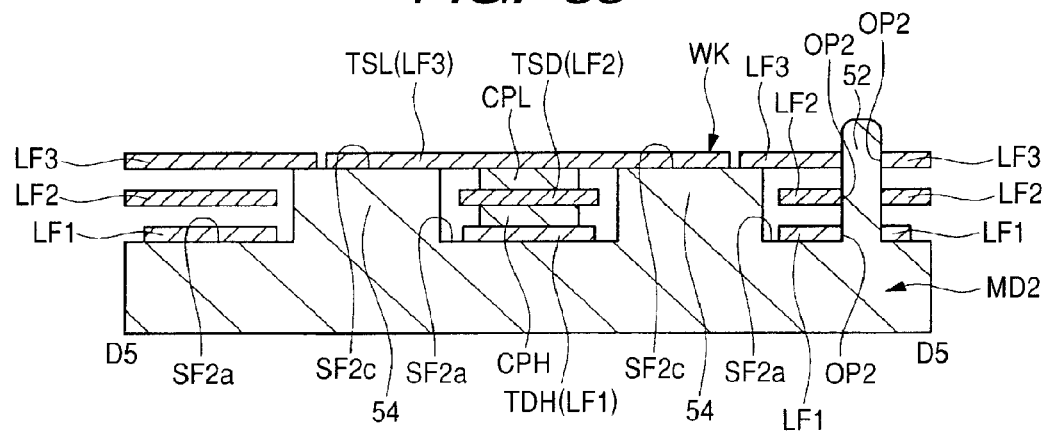
FIG. 85 is a sectional view taken along line D5-D5 of FIG. 80.

FIG. 80 is a substantial part plan view (partial enlarged plan view) of the assembly WK as is set over the die MD2 and shows the same area as in FIG. 70 and FIG. 74. FIG. 81 is a sectional view taken along line D1-D1 of FIG. 80; FIG. 82 is a sectional view taken along line D2-D2 of FIG. 80; FIG. 83 is a sectional view taken along line D3-D3 of FIG. 80; FIG. 84 is a sectional view taken along line D4-D4 of FIG. 80; and FIG. 85 is a sectional view taken along line D5-D5 of FIG. 80. Though FIG. 80 is a plan view, the supporting faces SF2b, SF2c and pins 52 in the upper surface of the die MD2 are hatched to facilitate visualization (to make the layout of each element easily understandable).

When the assembly WK is set over the die MD2, the assembly WK is set over the die MD2 so that the following is implemented: the lead frame LF1 in the assembly WK comes to the die MD2 side (that is, the lower side) and the lead frame LF3 in the assembly WK comes to the die MD1 side (that is, the upper side). As seen from FIG. 80 and FIG. 85 as well, at this time, the assembly WK can be set over the upper surface of the die MD2 so that the following is implemented: the positioning pins 52 provided in the upper surface of the die MD2 are inserted into the positioning openings OP2 provided in the lead frames LF1, LF2, LF3 in the assembly WK.

In the upper surface of the die MD2, the area that planarly overlaps with the lead frame LF1 when the assembly WK is set at the molding step, or Step S8 is taken as the supporting face SF2a. The planar shapes of the lead frames LF1, LF2, LF3 and the plane configuration of the supporting faces SF2a, SF2b, SF2c of the die MD2 are so designed that the following is implemented: the supporting faces SF2b, SF2b are set in areas where they do not planarly overlap with the lead frame LF1; and the supporting faces SF2c are set in areas where they do not planarly overlap with the lead frame LF1 or LF2. At the molding step, or Step S8, for this reason, the assembly WK including the lead frames LF1, LF2, LF3 can be set over the die MD2 without interference of the supporting faces SF2b or SF2c.

The lead frame LF1 in the assembly WK set over the die MD2 is set over the supporting face SF2a so that the lower surface of the lead frame LF1 is in contact with the supporting face SF2a. Thus the lead frame LF1 is supported by the supporting face SF2a. As mentioned above, the lower surface (especially, the lower surface of each drain terminal TDH) of the lead frame LF1 in the assembly WK is set in contact with the supporting face SF2a of the die MD2. As a result, the height position of the lower surface of the lead frame LF1 is controlled and made equal to that of the supporting face SF2a of the die MD2.

After the assembly WK is set over the die MD2, the die MD1 is moved (down) toward the die MD2 to sandwich and clamp (fix) the assembly WK between the dies MD1, MD2 from above and below.

Figure 86:
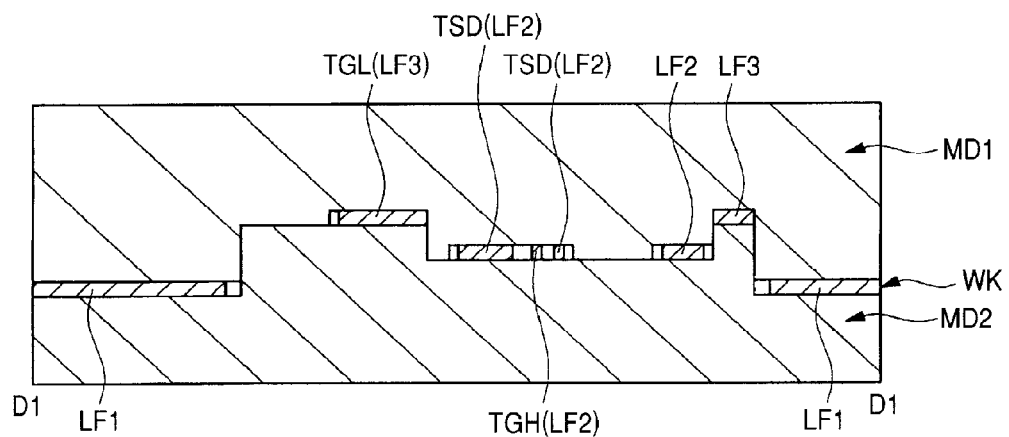
FIG. 86 is a substantial part sectional view illustrating an assembly as is fixed (clamped) between molding dies (an upper die and a lower die)
Figure 87:
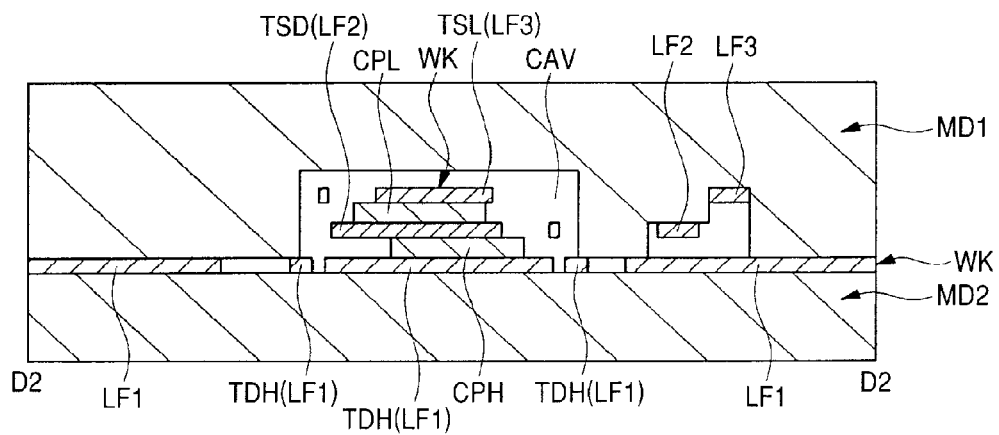
FIG. 87 is a substantial part sectional view illustrating an assembly as is fixed (clamped) between molding dies (an upper die and a lower die)
Figure 88:
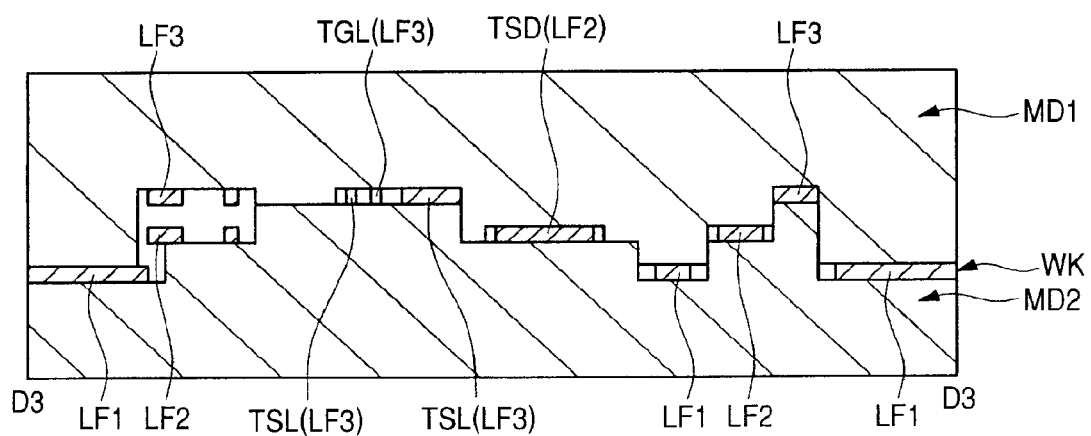
FIG. 88 is a substantial part sectional view illustrating an assembly as is fixed (clamped) between molding dies (an upper die and a lower die)
Figure 89:
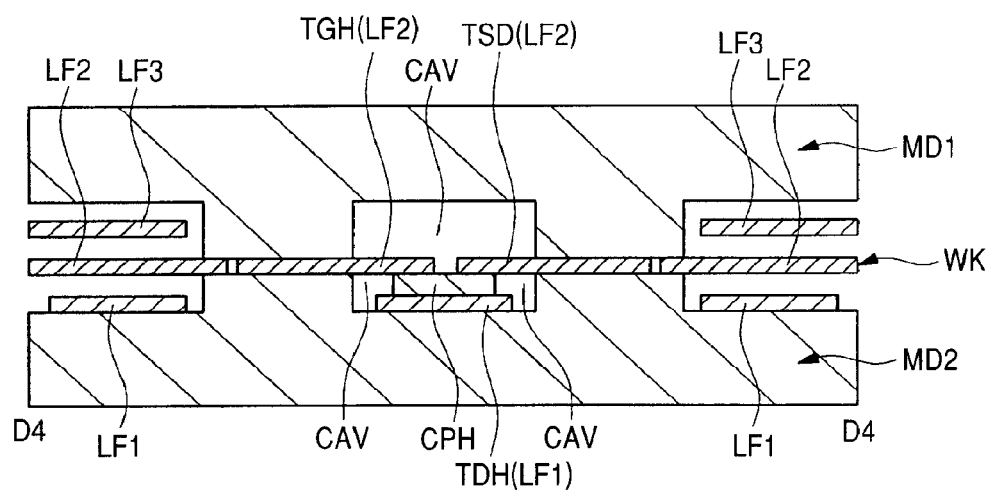
FIG. 89 is a substantial part sectional view illustrating an assembly as is fixed (clamped) between molding dies (an upper die and a lower die)
Figure 90:
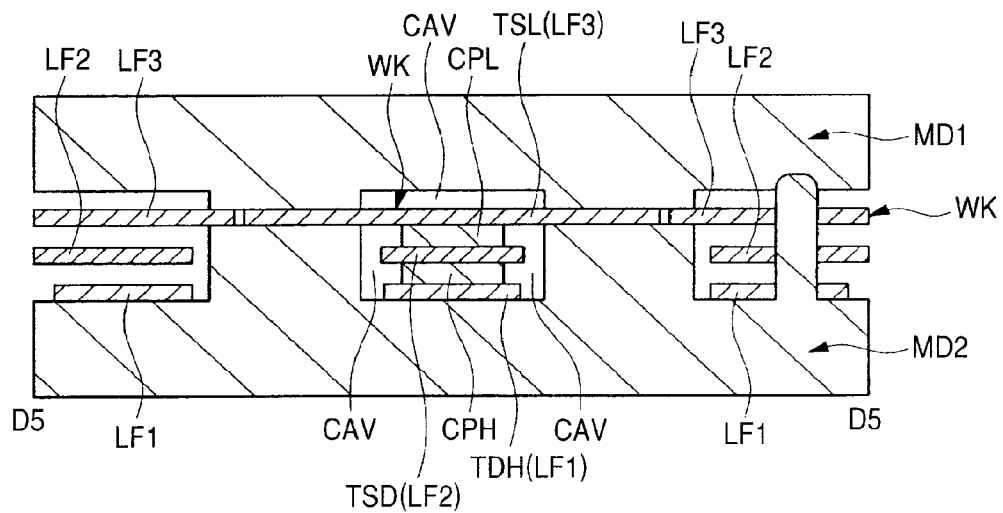
FIG. 90 is a substantial part sectional view illustrating an assembly as is fixed (clamped) between molding dies (an upper die and a lower die)

FIG. 86 to FIG. 90 are substantial part sectional views illustrating the assembly WK as is sandwiched and fixed (clamped) between the molding dies MD1, MD2 at the molding step, or Step S8. FIG. 86 shows the section in a position corresponding to line D1-D1 of FIG. 74 and FIG. 80 (that is, the section corresponding to FIG. 75 and FIG. 81). FIG. 87 shows the section in a position corresponding to line D2-D2 of FIG. 74 and FIG. 80 (that is, the section corresponding to FIG. 76 and FIG. 82). FIG. 88 shows the section in a position corresponding to line D3-D3 of FIG. 74 and FIG. 80 (that is, the section corresponding to FIG. 77 and FIG. 83). FIG. 89 shows the section in a position corresponding to line D4-D4 of FIG. 74 and FIG. 80 (that is, the section corresponding to FIG. 78 and FIG. 84). FIG. 90 shows the section in a position corresponding to line D5-D5 of FIG. 74 and FIG. 80 (that is, the section corresponding to FIG. 79 and FIG. 85).

When the dies MD1, MD2 are clamped, the assembly WK is fixed between the dies MD1, MD2. As a result, each semiconductor chip CPH, CPL sandwiched between the lead frames LF1, LF2, LF3 is set in each cavity CAV formed by (the lower surface of) the die MD1 and (the upper surface of) the die MD2. That is, the lead frames LF1, LF2, LF3 are sandwiched and clamped (fixed) between the dies MD1, MD2 so that each semiconductor chip CPH, CPL is set in each cavity CAV formed by the lower surface of the die MD1 and the upper surface of the die MD2.

Figure 91:
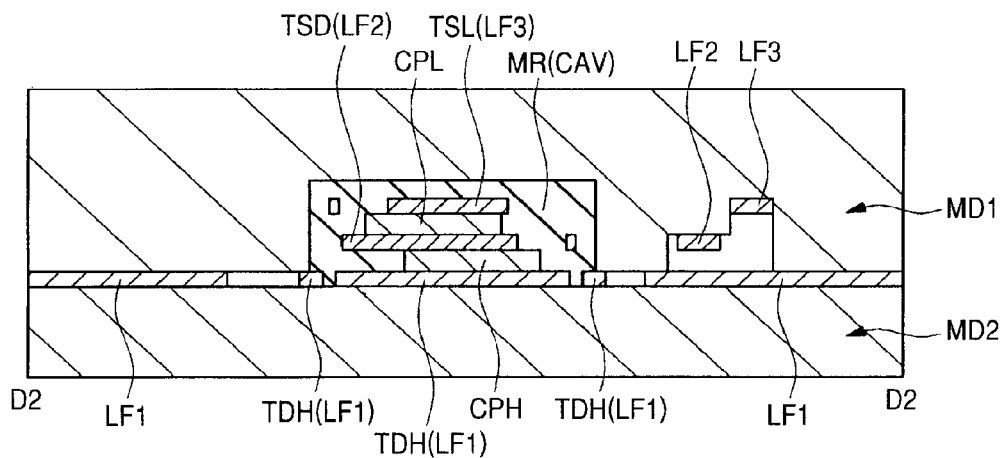
FIG. 91 is a substantial part sectional view illustrating an encapsulation resin portion formed by injecting encapsulation resin material into the cavity between dies.
Figure 92:
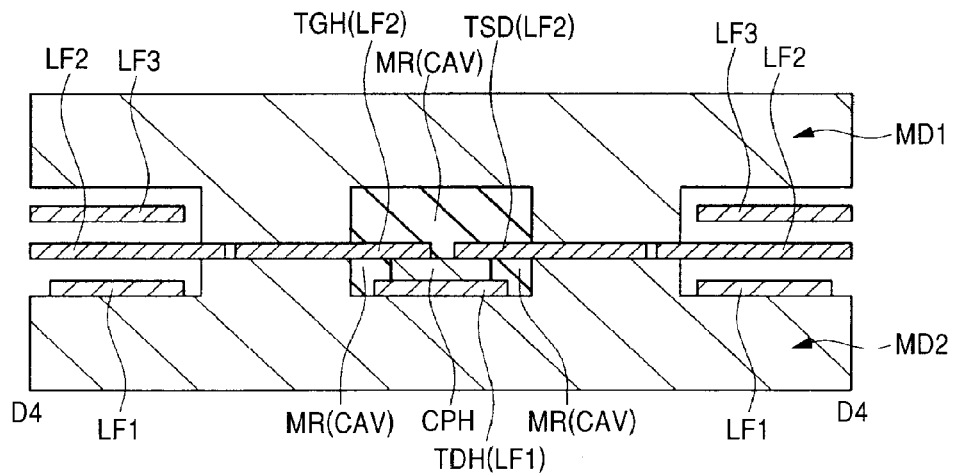
FIG. 92 is a substantial part sectional view illustrating an encapsulation resin portion formed by injecting encapsulation resin material into the cavity between dies.
Figure 93:
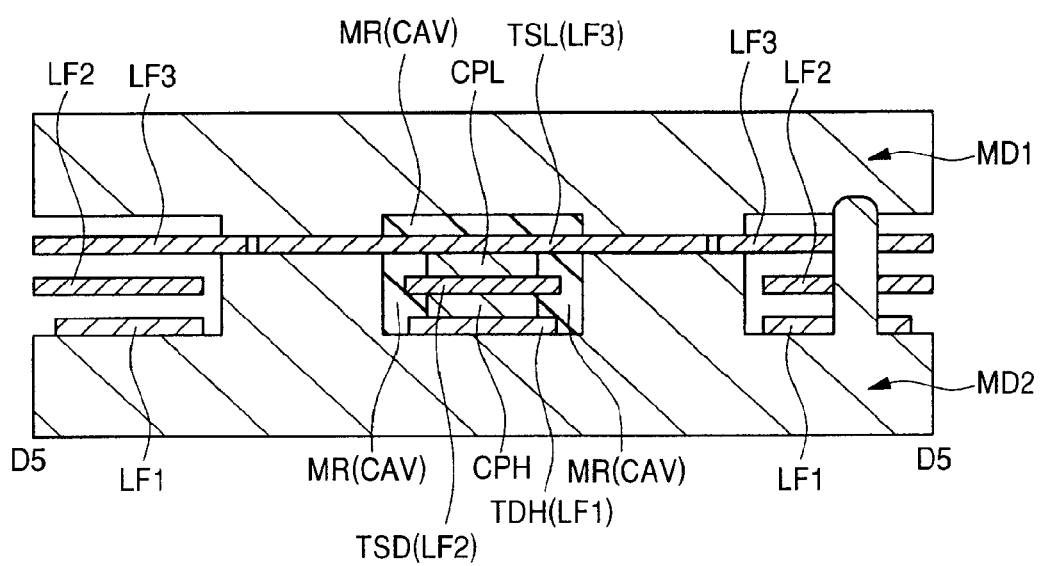
FIG. 93 is a substantial part sectional view illustrating an encapsulation resin portion formed by injecting encapsulation resin material into the cavity between dies.

After the assembly WK is fixed and clamped between the dies MD1, MD2 as illustrated in FIG. 86 to FIG. 90, the following processing is carried out as illustrated in FIG. 91 to FIG. 93: encapsulation resin material as the material for the formation of the encapsulation resin portion MR is injected (introduced, filled) in each cavity CAV in the dies MD1, MD2. Then the injected encapsulation resin material is cured to form the encapsulation resin portion MR.

FIG. 91 to FIG. 93 are substantial part sectional views illustrating the encapsulation resin portion MR formed by injecting the encapsulation resin material into each cavity CAV in the dies MD1, MD2 at the molding step, or Step S8. FIG. 91 shows the same sectioned area (that is, the section taken along line D2-D2) as in FIG. 87; FIG. 92 shows the same sectioned area (that is, the section taken along line D4-D4) as in FIG. 89; and FIG. 93 shows the same sectioned area (that is, the section taken along line D5-D5) as in FIG. 90.

The encapsulation resin material for the formation of the encapsulation resin portion MR is composed of resin material or the like, for example, thermosetting resin material or the like and may contain filler or the like. For example, epoxy resin or the like containing filler can be used. When the encapsulation resin material is composed of thermosetting resin material, the encapsulation resin material can be heated and cured (turned into the cured encapsulation resin portion MR) by taking the following procedure: after the injection of the encapsulation resin material into each cavity CAV formed by the dies MD1, MD2, the dies MD1, MD2 are heated up to a predetermined temperature. It is desirable to design this encapsulation resin material so that its temperature during curing is less than the melting point of the above solder SLD. This makes it possible to prevent the solder SLD from being melted while the encapsulation resin material is cured. Thus the encapsulation resin portion MR is formed.

Subsequently, the assembly WK (that is, assembly WKa) with the encapsulation resin portion MR formed thereon is released from the dies MD1, MD2 and any flash and the like are removed from the encapsulation resin portion MR (Step S9 in FIG. 18). Thus the assembly (work) WKa illustrated in FIG. 69 to FIG. 72 is obtained. The assembly WKa is obtained by forming the encapsulation resin portion MR on the assembly WK.

At the molding step, or Step S8, the encapsulation resin portion MR is formed with the lower surface of each drain terminal TDH of the lead frame LF1 in contact with the supporting face SF1a of the die MD2. Therefore, a gap is hardly produced between the lower surface of each drain terminal TDH of the lead frame LF1 and the upper surface of the die MD2. As a result, the encapsulation resin portion MR is hardly formed on the lower surface of each drain terminal TDH. For this reason, the following state is established in the assembly WKa: the lower surface (corresponding to the lower surface TDHa) of each drain terminal TDH of the lead frame LF1 is exposed from the back surface (corresponding to the main surface MRb) of the encapsulation resin portion MR. Even though any resin flash of the encapsulation resin portion MR is formed on the lower surface of each drain terminal TDH, it can be removed by the deflashing step subsequent to the molding step, or Step S8.

Subsequently, plating is carried out as required to form a plating layer (not shown) over the portions of the lead frames LF1, LF2, LF3 exposed from the encapsulation resin portion MR in the assembly WKa (Step S10 in FIG. 18). Solder plating can be carried out using, for example, lead-free solder.

Subsequently, the lead frames LF1, LF2, LF3 are cut in predetermined positions (Step S11 in FIG. 18). That is, the tie bars TB1 in the lead frame LF2 are cut to separate each gate terminal TGH and each source-drain terminal TSD; and the tie bars TB2 in the lead frame LF3 are cut to separate each gate terminal TGL and each source terminal TSL. Thereafter, each drain terminal TDH, source-drain terminal TSD, gate terminal TGH, source terminal TSL, and gate terminal TGL are cut off (separated) from (the frameworks LF1a, LF2a, LF3a of) the lead frames LF1, LF2, LF3.

Figure 94:
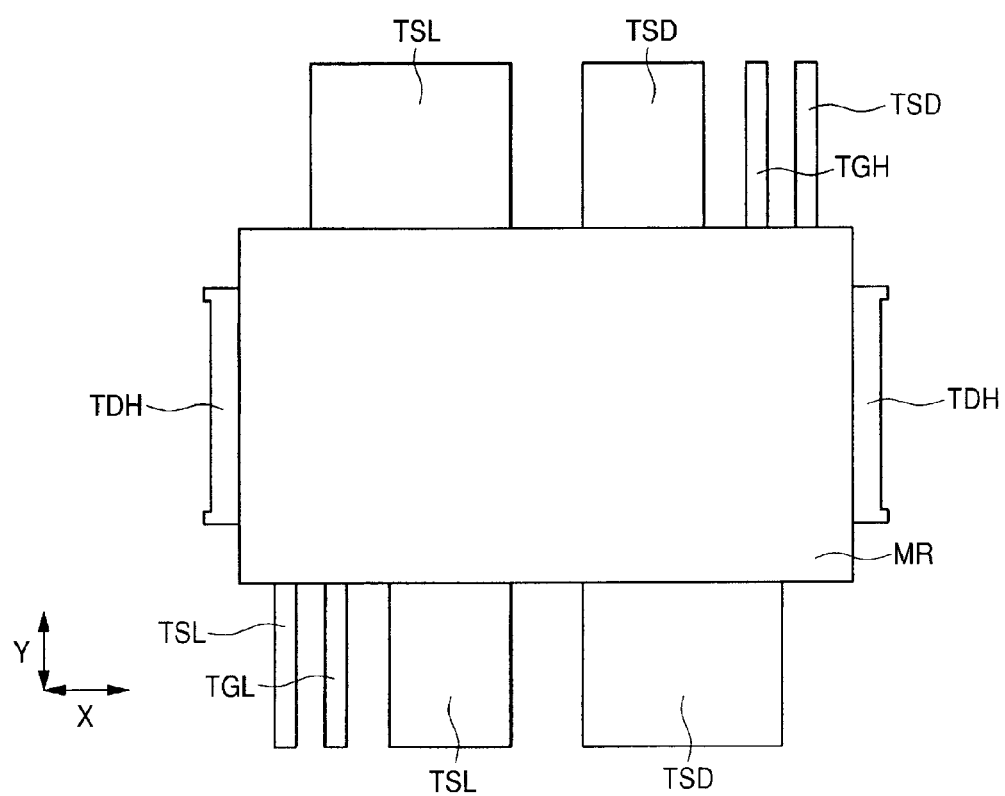
FIG. 94 is a substantial part plan view of the semiconductor device in manufacturing process, following FIG. 69.

FIG. 94 is a substantial part plan view obtained when Step S10 (lead frames LF1, LF2, LF3 cutting step) has been carried out and shows the area corresponding to FIG. 71. FIG. 94 illustrates the drain terminal TDH, source-drain terminal TSD, gate terminal TGH, source terminal TSL, and gate terminal TGL separated from the lead frames LF1, LF2, LF3. When the lead frames LF1, LF2, LF3 are cut at Step S10, each drain terminal TDH, source-drain terminal TSD, gate terminal TGH, source terminal TSL, and gate terminal TGL are flat. In addition, the respective outer lead portions of the source-drain terminal TSD, gate terminal TGH, source terminal TSL, and gate terminal TGL are laterally protruded from lateral surfaces of the encapsulation resin portion MR.

Subsequently, the following outer lead portions and terminal protruded outward (laterally) from (lateral surfaces of the encapsulation resin portion MR) are bent (Step S12 in FIG. 18): the outer lead portions of the source-drain terminal TSD; the outer lead portion of the gate terminal TGH; the outer lead portions of the source terminal TSL; and the gate terminal TGL. Thus the semiconductor device SM1 in this embodiment illustrated in FIG. 3 to FIG. 16 is manufactured.

<Mounting of Semiconductor Device>

Figure 95:
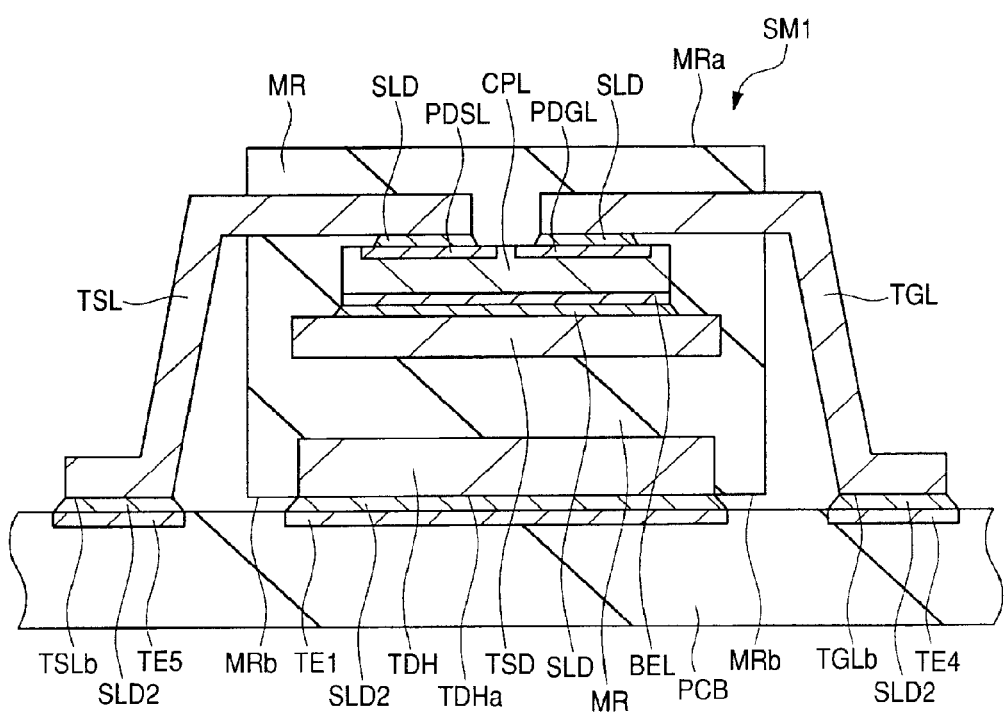
FIG. 95 is a substantial part sectional view illustrating a semiconductor device in an embodiment of the invention as is mounted over a mounting board (wiring board)
Figure 96:
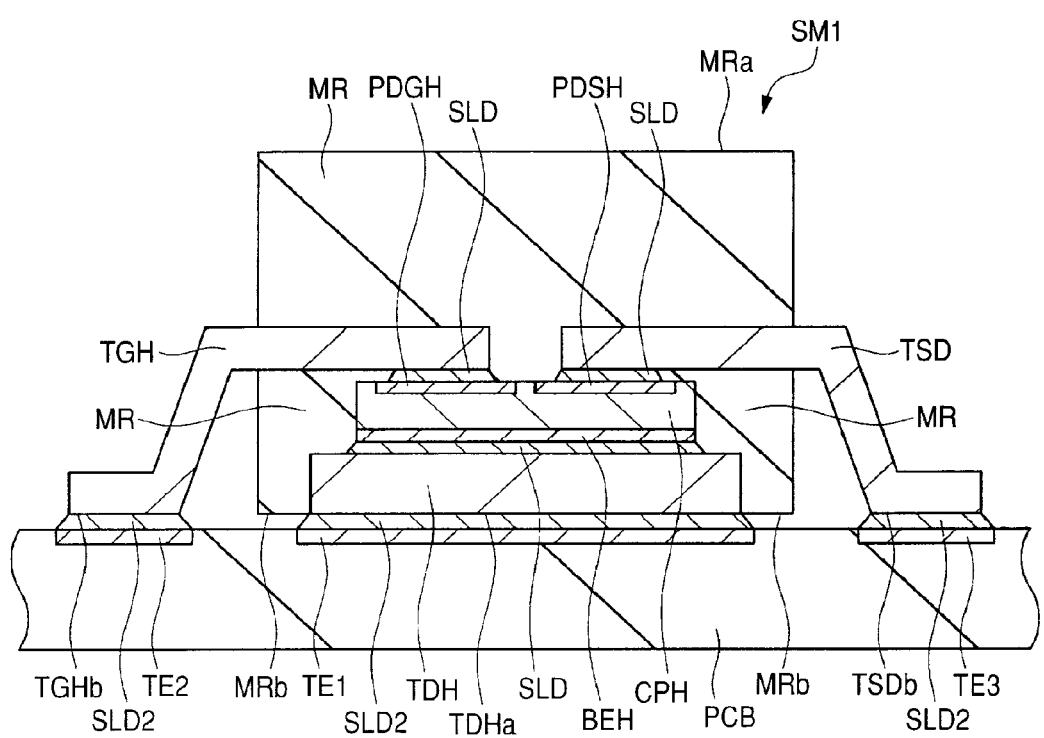
FIG. 96 is a substantial part sectional view illustrating a semiconductor device in an embodiment of the invention as is mounted over a mounting board (wiring board)

FIG. 95 and FIG. 96 are substantial part sectional views of the semiconductor device SM1 in this embodiment as is mounted over a mounting board (wiring board) PCB. FIG. 95 shows the section corresponding to FIG. 9 and FIG. 96 shows the section corresponding to FIG. 12.

As illustrated in FIG. 95 and FIG. 96, each semiconductor device SM1 is mounted over the mounting board (wiring board) PCB. The step for mounting the semiconductor device SM1 over the mounting board PCB can be carried out, for example, as described below. Solder paste (to be the solder SLD2 later) is supplied onto terminals TE1, TE2, TE3, TE4, TE5 of the mounting board PCB by print processes or the like and then the semiconductor device SM1 is set over the mounting board PCB. At this time, the semiconductor device SM1 is set so that the following is implemented: (the lower surface TDHa of) the drain terminal TDH of the semiconductor device SM1 is opposed to the terminal TE1 of the mounting board PCB; and (the lower surfaces of) the respective outer lead portions of the gate terminal TGH, source-drain terminal TSD, gate terminal TGL, and source terminal TSL are respectively opposed to the terminals TE2 to TE5 of the mounting board PCB. Thereafter, solder reflow processing (heat treatment) is carried out. As a result, (the lower surface TDHa of) the drain terminal TDH exposed in the main surface MRb of the encapsulation resin portion MR is joined and electrically coupled with the terminal TE1 of the mounting board PCB through solder SLD2. (The lower surface TGHb of) the outer lead portion of the gate terminal TGH is joined and electrically coupled with the terminal TE2 of the mounting board PCB through solder SLD2. (The lower surfaces TSDb of) the outer lead portions of the source-drain terminal TSD are joined and electrically coupled with the terminals TE3 of the mounting board PCB through solder SLD2. (The lower surface TGLb of) the outer lead portion of the gate terminal TGL is joined and electrically coupled with the terminal TE4 of the mounting board PCB through solder SLD2. (The lower surfaces TSLb of) the outer lead portions of the source terminal TSL are joined and electrically coupled with the terminals TE5 of the mounting board PCB through solder SLD2. The back surface side of the semiconductor device SM1 (that is, the main surface MRb side of the encapsulation resin portion MR) becomes the mounting surface to the mounting board PCB.

<Molding Step>

More detailed description will be given to the molding step, or Step S8 (that is, the encapsulation resin portion MR formation step).

In the semiconductor device SM1 in this embodiment, the lower surface TDHa of the drain terminal TDH is exposed from the encapsulation resin portion MR. To achieve this, the following measure is taken when the assembly WK is clamped between the dies MD1, MD2 as illustrated in FIG. 86 to FIG. 90 at the molding step, or Step S8: the lower surface of each drain terminal TDH of the lead frame LF1 is brought into contact with (the supporting faces SF2a in) the upper surface of the die MD2 (that is, the main surface of the drain terminal on the opposite side to the side where the semiconductor chip CPH is set is brought into contact with the upper surface of the die MD2); and in this state, the resin material is introduced in each cavity CAV to form the encapsulation resin portion MR.

At the molding step, or Step S8, the following measure is taken with respect to the lead frame LF1 in the assembly WK: each drain terminal TDH that should be positioned inside encapsulation resin portion MR is set in each cavity CAV (so that the lower surface of the drain terminal TDH is in contact with the upper surface of the die MD2); and its portion that should be positioned outside the encapsulation resin portion MR is positioned outside each cavity CAV and sandwiched between (the lower surface of) the die MD1 and (the supporting face SF2a of) the die MD2. The following measure is taken with respect to each source-drain terminal TSD and gate terminal TGH of the lead frame LF2 in the assembly WK1: their portions (inner lead portions) that should be positioned inside the encapsulation resin portion MR are set in each cavity CAV (so that they are not in contact with the die MD1 or MD2); and their portions (outer lead portions) that should be positioned outside the encapsulation resin portion MR are sandwiched between (the lower surface of) the die MD1 and (the supporting faces SF2b of) the die MD2. The following measure is taken with respect to each source terminal TSL and gate terminal TGL of the lead frame LF3 in the assembly WK: their portions that should be positioned inside the encapsulation resin portion MR (portions opposed to each semiconductor chip CPL, inner lead portions) are set in each cavity CAV (so that they are not in contact with the die MD1 or MD2); and their portions (outer lead portions) that should be positioned outside the encapsulation resin portion MR are sandwiched between (the lower surface of) the die MD1 and (the supporting faces SF2c of) the die MD2. This makes it possible to obtain a structure in which the following is implemented: each semiconductor chip CPH, CPL is sealed with the encapsulation resin portion MR; part of each drain terminal TDH, source-drain terminal TSD, gate terminals TGH, TGL, and source terminal TSL is sealed with the encapsulation resin portion MR and the other part thereof is exposed from the encapsulation resin portion MR.

In the assembly WK, the following portions do not planarly overlap with one another and they do not planarly overlap with the lead frame LF1, either: the outer lead portions of each source-drain terminal TSD, the outer lead portion of each gate terminal TGH, the outer lead portion of each gate terminal TGL, and the outer lead portions of each source terminal TSL. For this reason, the following procedure can be taken in positions adjacent to each cavity CAV when the assembly WK is clamped between the dies MD1, MD2: the outer lead portions of the source-drain terminal TSD and the outer lead portion of the gate terminal TGH are set over the supporting faces SF2b of the die MD2; at the same time, the outer lead portion of the gate terminal TGL and the outer lead portions of the source terminal TSL are set over the supporting faces SF2c of the die MD2. Then these outer lead portions can be sandwiched and clamped between the lower surface of the die MD1 and the supporting faces SF2b, SF2c of the die MD2 from above and below.

The assembly WK includes multiple (three in this example) lead frames LF1, LF2, LF3 and each drain terminal TDH, source-drain terminal TSD, gate terminals TGH, TGL, and source terminal TSL in the lead frames LF1, LF2, LF3 are flat. At the molding step, or Step S8, it is required to sandwich and clamp (fix) these (three in this example) lead frames LF1, LF2, LF3 between the die MD1 and the die MD2. However, the lead frames LF1, LF2, LF3 are different from one another in height position.

When height or height position is cited with respect to the assembly WK, it refers to height or height position relative to the lower surface of each drain terminal TDH of the lead frame LF1 and in the direction substantially perpendicular thereto. When height or height position is cited with respect to the die MD2, it refers to height or height position relative to the supporting face SF2a and in the direction substantially perpendicular thereto. When height or height position is cited with respect to the assembly jig 41, it refers to height or height position relative to the supporting face SF1a and in the direction substantially perpendicular thereto.

For this reason, it is required to change the height position among the following portions in the dies MD1, MD2: their portions that sandwich the lead frame LF1 (especially, each drain terminal TDH) from above and below; their portions that sandwich the lead frame LF2 (especially, the outer lead portions of each source-drain terminal TSD and gate terminal TGH) from above and below; and their portions that sandwich the lead frame LF3 (especially, the outer lead portions of each gate terminal TGL and source terminal TSL) from above and below.

Consequently, the following measure is taken in the upper surface of the die MD2 as the lower die: its area that planarly overlaps with the lead frame LF1 when the assembly WK is set over the die MD2 is taken as the flat supporting face SF2a in advance; and at the molding step, or Step S8, the lead frame LF1 is set over the supporting face SF2a of the die MD2.

When the assembly WK is clamped between the dies MD1, MD2, it is desirable that the entire lower surface of each drain terminal TDH of the lead frame LF1 should be in contact with the supporting face SF2a of the die MD2. For this reason, in the supporting face SF2a of the die MD2, at least the areas where each drain terminal TDH is set (that is, the areas that planarly overlaps with each drain terminal TDH) must be flat. Therefore, it is desirable that the portions of the supporting face SF2a of the die MD2 where the bottom surface of each cavity CAV is formed should be flat.

In the supporting face SF2a of the die MD2, meanwhile, the portions located outside each cavity CAV need not be wholly flat unless they interfere with the setting (flat setting) of the lead frame LF1. For example, a recess (depressed portion) may be partially provided in the portions of the supporting face SF2a of the die MD2 located outside each cavity CAV. Further, the above pins 52 or the like may be provided in areas that do not planarly overlap with the lead frame LF1. Even in such a case, the lower surface of the lead frame LF1 is brought into contact with the supporting face SF2a of the die MD1 and the lead frame LF1 can be set over the supporting face SF2a of the die MD2 without inclination.

At the molding step, or Step S8, the lead frame LF1 is sandwiched and clamped (fixed) between the lower surface of the die MD1 and the supporting face SF2a of the die MD2 from above and below in areas adjacent to each cavity CAV.

In the assembly WK, meanwhile, the lead frame LF2 is located in a position higher than the lead frame LF1. In the upper surface of the die MD2 as the lower die, for this reason, the following areas are taken as the flat supporting faces SF2b located in a position higher than the supporting face SF2a in advance: the areas where the lead frame LF2 is clamped (that is, the areas where the lead frame LF2 is sandwiched between the dies MD1, MD2 from above and below), especially, the areas where the outer lead portions of each source-drain terminal TSD and gate terminal TGH are set. At the molding step, or Step S8, for this reason, the assembly WK is set over the die MD2 so that the lower surface of part of the lead frame LF2 is in contact with the supporting faces SF2b of the die MD2. Thus the lead frame LF2 is supported (held) by the supporting faces SF2b of the die MD2. As a result, the lower surface of the lead frame LF2 becomes higher than the lower surface of the lead frame LF1 by an amount equivalent to the difference in height between the supporting faces SF2b and the supporting face SF2a of the die MD2. The supporting faces SF2b of the die MD2 are provided to make the lead frame LF2 higher than the lead frame LF1 and clamp the lead frame LF2 (especially, the outer lead portions of each source-drain terminal TSD and gate terminal TGH). At the molding step, or Step S8, for this reason, the following takes place in areas adjacent to each cavity CAV: the lead frame LF2 (especially, the outer lead portions of each source-drain terminal TSD and gate terminal TGH) is sandwiched and clamped (fixed) between the lower surface of the die MD1 and the supporting faces SF2b of the die MD2. Therefore, the supporting faces SF2b are provided in the upper surface of the die MD2 in positions adjacent to each cavity CAV.

In the assembly WK, the lead frame LF3 is located in a position higher than the lead frame LF2. In the upper surface of the die MD2 as the lower die, for this reason, the following areas are taken as the flat supporting faces SF2c located in a position higher than the supporting faces SF2a, SF2b in advance: the areas where the lead frame LF3 is clamped (that is, the areas where the lead frame LF3 is sandwiched between the dies MD1, MD2 from above and below), especially, the areas where the outer lead portions of each gate terminal TGL and source terminal TSL are set. At the molding step, or Step S8, for this reason, the assembly WK is set over the die MD2 so that the lower surface of part of the lead frame LF3 is in contact with the supporting faces SF2c of the die MD2. Thus the lead frame LF3 is supported (held) by the supporting faces SF2c of the die MD2. As a result, the lower surface of the lead frame LF3 becomes higher than the lower surface of the lead frame LF2 by an amount equivalent to the difference in height between the supporting faces SF2c and the supporting faces SF2b of the die MD2. The supporting faces SF2c of the die MD2 are provided to make the lead frame LF3 higher than the lead frames LF1, LF2 and clamp the lead frame LF3 (especially, the outer lead portions of each gate terminal TGL and source terminal TSL). At the molding step, or Step S8, for this reason, the following takes place in areas adjacent to each cavity CAV: the lead frame LF3 (especially, the outer lead portions of each gate terminal TGL and source terminal TSL) is sandwiched and clamped (fixed) between the lower surface of the die MD1 and the supporting faces SF2c of the die MD2 from above and below. Therefore, the supporting faces SF2c are provided in the upper surface of the die MD2 in positions adjacent to each cavity CAV.

In the upper surface of the die MD2, as mentioned above, the supporting faces SF2b are higher than the supporting face SF2a and the supporting faces SF2c are higher than the supporting faces SF2b. This can be achieved by: providing the upper surface of the die MD2 with two salient steps (steps different in height) 53, 54 in positions adjacent to each cavity CAV; taking the upper surfaces of the lower (lower-level) steps 53 as the supporting faces SF2b; and taking the upper surfaces of the higher (higher-level) steps 54 as the supporting faces SF2c. In this case, part of the lateral surface of each cavity CAV is formed of the lateral surfaces (lateral surfaces adjacent to each cavity CAV) of the steps 53, 54. This makes it possible to set the supporting faces SF2b, SF2c in positions adjacent to each cavity CAV. As a result, it is possible to: set the outer lead portions of each source-drain terminal TSD and gate terminal TGH of the lead frame LF2 over the supporting faces SF2b; set the outer lead portions of each gate terminal TGL and source terminal TSL of the lead frame LF3 Over the supporting faces SFc; and clamp these outer lead portions between the dies MD1, MD2.

The lower surface of the die MD1 as the upper die is in a shape corresponding to the upper surface of the die MD2 as the lower die. More specific description will be given. In the lower surface of the die MD1, the following takes place when the assembly WK is clamped between the dies MD1, MD2: its portions that clamp the lead frame LF2 opposite to the supporting faces SF2b of the die MD2 are located in positions higher than its portions that clamp the lead frame LF1 opposite to the supporting face SF2a of the die MD2. In the lower surface of the die MD1, the following takes place: its portions that clamp the lead frame LF3 opposite to the supporting faces SF2c of the die MD2 are located in positions higher than its portions that clamp the lead frame LF2 opposite to the supporting faces SF2b of the die MD2.

As mentioned above, the portions (SF1a) of the dies MD1, MD2 that sandwich the lead frame LF1 from above and below is positioned low; the portions (SF1b) of the dies MD1, MD2 that sandwich the lead frame LF2 from above and below is made higher; and the portions (SF1c) of the dies MD1, MD2 that sandwich the lead frame LF3 from above and below is made further higher. As a result, the encapsulation resin portion MR can be formed on the assembly WK so structured that the semiconductor chips CPH, CPL are sandwiched between the lead frames LF1, LF2, LF3.

<Assembly WK Fabrication Step>

More detailed description will be given to the assembly WK fabrication step.

As mentioned above, the assembly WK is fabricated by carrying out Steps S1 to S7. At this time, the assembly jig 41 is used. The assembly jig 41 has: a function of supporting (holding) the lead frames LF1, LF2, LF3 until the solder reflow processing of Step S7 is carried out to finish the assembly WK fixed with solder SLD; and a function of fixing or determining the positional relation between the lead frames LF1, LF2, LF3 as well.

More specific description will be given. The planar positions of the lead frames LF1, LF2, LF3 are defined by each opening OP2 in the lead frames LF1, LF2, LF3 and the pins 42 of the assembly jig 41. Meanwhile, the vertical positions (height positions) of the lead frames LF1, LF2, LF3 are defined by the supporting faces SF1a, SF1b, SF1c of the assembly jig 41.

More specific description will be given. When the lead frame LF1 is set over the assembly jig 41 at Step S2, the lead frame LF1 is set over the supporting face SF1a and does not planarly overlap with the supporting faces SF1b or SF1c. The lower surface (especially, the lower surface of each drain terminal TDH) of the lead frame LF1 is set in contact with the supporting face SF1a of the assembly jig 41. As a result, the height position of the lower surface of the lead frame LF1 (especially, each drain terminal TDH) is defined and it is made equal to the height of the supporting face SF1a of the assembly jig 41.

When the lead frame LF2 is set over the assembly jig 41 at Step S4, the following takes place: part (especially, the outer lead portions of each source-drain terminal TSD and gate terminal TGH) of the lead frame LF2 is positioned over the supporting faces SF1b and brought into contact with the supporting faces SF1b. As a result, the lead frame LF2 is supported by the supporting faces SF1b. For this reason, the height position of the lower surface of the lead frame LF2 (especially, the outer lead portions of each source-drain terminal TSD and gate terminal TGH) is defined; and it is made equal to the height of the supporting faces SF1b of the assembly jig 41.

When the lead frame LF3 is set over the assembly jig 41 at Step S6, the following takes place: part (especially, the outer lead portions of each gate terminal TGL and source terminal TSL) of the lead frame LF3 is positioned over the supporting faces SF1c and brought into contact with the supporting faces SF1c. As a result, the lead frame LF3 is supported by the supporting faces SF1c. For this reason, the height position of the lower surface of the lead frame LF3 (especially, the outer lead portions of each gate terminal TGL and source terminal TSL) is defined; and it is made equal to the height of the supporting faces SF1c of the assembly jig 41.

The solder reflow step, or Step S7 is carried out with the lead frames LF1, LF2, LF3 set over the assembly jig 41 and their planar positions and vertical height positions defined as mentioned above. That is, the solder reflow step, or Step S7 is carried out with the lead frames LF1, LF2, LF3 remaining set over the assembly jig 41. For this reason, in the assembly WK formed by the solder reflow processing of Step S7, the following takes place: the lead frames LF1, LF2, LF3 are set over the assembly jig 41 and their planar positions and vertical height positions are defined; and in this state, the solder SLDa, SLDb, SLDc, SLDd is melted and solidified and the solidified solder SLD is formed. Therefore, the relative position between the lead frames LF1, LF2, LF3 is maintained before the solder reflow processing of Step S7, during heat treatment in the solder reflow processing of Step S7, and after the solder reflow processing of Step S7.

Especially, even when the solder SLDa, SLDb, SLDc, SLDd is melted at the solder reflow step, or Step S7, the following is implemented: the lower surface of part (especially, the outer lead portions of each source-drain terminal TSD and gate terminal TGH) of the lead frame LF2 is supported by the supporting faces SF1b in contact therewith; and the lower surface of part (especially, the outer lead portions of each gate terminal TGL and source terminal TSL) of the lead frame LF3 is supported by the supporting faces SF1c in contact therewith. Even when the solder SLDa, SLDb, SLDc, SLDd is melted, the lower surface of the lead frame LF1 (especially, each drain terminal TDH) is supported by the supporting face SF1a in contact therewith. For this reason, the following is implemented when the solder SLDa, SLDb, SLDc, SLDd is solidified and turned into the solder SLD: the height position of the lower surface of the lead frame LF2 (especially, the outer lead portions of each source-drain terminal TSD and gate terminal TGH) becomes equal to that of each supporting face SF1b; and the height position of the lower surface of the lead frame LF3 (especially, the outer lead portions of each gate terminal TGL and source terminal TSL) becomes equal to that of each supporting face SF1c. The following is implemented when the solder SLDa, SLDb, SLDc, SLDd is solidified and turned into the solder SLD: the height position of the lower surface of the lead frame LF1 (especially, each drain terminal TDH) becomes equal to that of the supporting face SF1a. Therefore, the height positions of the lead frames LF1, LF2, LF3 in the assembly WK are kept at the height of the supporting faces SF1a, SF1b, SF1c in the assembly jig 41.

That is, the following heights are identical with each other: the height $H_5$ from the lower surface of the lead frame LF1 (especially, each drain terminal TDH) in the assembly WK to the lower surface of the lead frame LF2 (especially, the outer lead portions of each source-drain terminal TSD and gate terminal TGH); and the height $H_1$ from the supporting face SF1a to the supporting faces SF1b in the assembly jig 41 (that is, $H_5=H_1$). (The height $H_5$ is indicated in FIG. 68.) Further, the following heights are identical with each other: the height $H_6$ from the lower surface of the lead frame LF1 (especially, each drain terminal TDH) in the assembly WK to the lower surface of the lead frame LF3 (especially, the outer lead portions of each gate terminal TGL and source terminal TSL); and the height $H_2$ from the supporting face SF1a to the supporting faces SF1c in the assembly jig 41 (that is, $H_6=H_2$). (The height $H_6$ is indicated in FIG. 68.)

Figure 97:
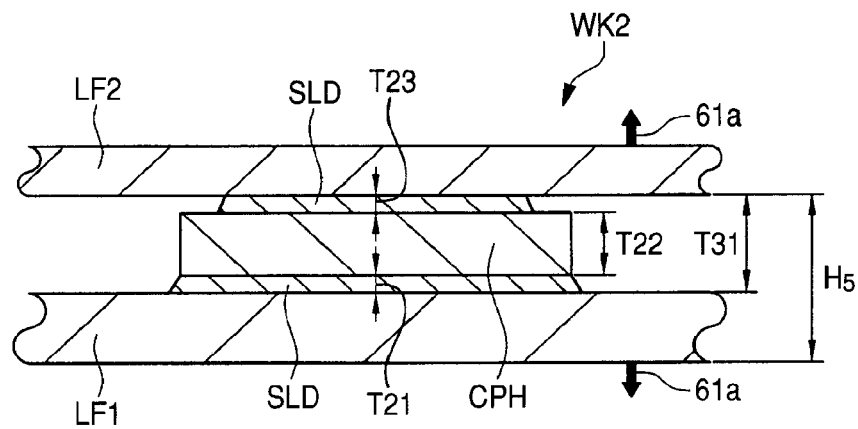
FIG. 97 is an explanatory drawing explaining a problem to be solved.
Figure 98:
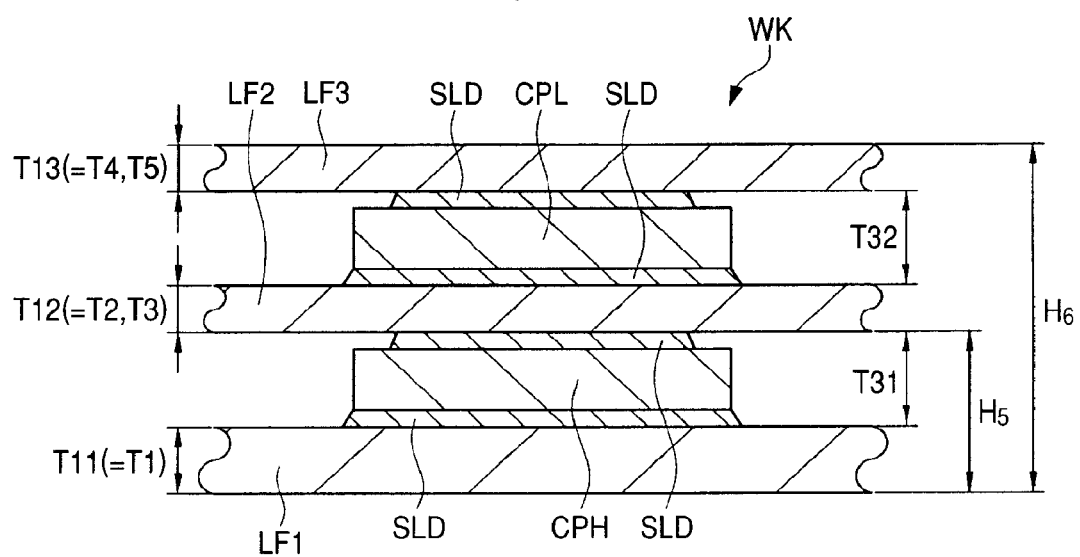
FIG. 98 is an explanatory drawing explaining a problem to be solved.

Description will be given to problems that can be solved by in this embodiment. FIG. 97 and FIG. 98 are explanatory drawings explaining these problems.

FIG. 97 is a sectional view with the semiconductor chip CPL and the lead frame LF3 omitted, obtained by carrying out Steps S1 to S4 and then carrying out the solder reflow processing of Step S7 without carrying out Step S5 or S6 to fabricate the assembly WK2. The assembly WK2 illustrated in FIG. 97 has the same configuration as the assembly WK except there is not the semiconductor chip CPL or the solder SLD on the upper surface side of the lead frame LF3 or the lead frame LF2. FIG. 97 is a schematic sectional view and depicts each lead frame LF1, LF2 like a flat plate to facilitate understanding but in reality each lead frame LF1, LF2 has such a structure as illustrated in FIG. 19 to FIG. 22. In FIG. 97, the back surface drain electrode BEH, source pad electrode PDSH, and gate pad electrode PDGH of the semiconductor chip CPH are omitted to facilitate understanding.

To clamp the assembly WK2 between the molding lower die and upper die to form the encapsulation resin portion MR, it is required to clamp the lead frame LF1 and lead frame LF2 in the assembly WK2 at different height positions. The positions (height positions) where the lead frame LF1 and the lead frame LF2 are clamped between the lower die and the upper die are determined relative to the following design value: the design value of the spacing between the lead frame LF1 and lead frame LF2 in the assembly WK2. For this reason, in cases where the spacing T31 between the lead frame LF1 and lead frame LF2 in the assembly WK2 is in accordance with the design value when the assembly WK2 is fabricated, the following results: no problem arises when the encapsulation resin portion MR is formed on the assembly WK2. In cases where this spacing T31 is different from the design value, the following problems can arise when the assembly WK2 is clamped between the molding lower die and upper die:

If the spacing T31 between the lead frame LF1 and lead frame LF2 in the assembly WK2 is excessively smaller than the design value, the following takes place when the assembly WK2 is clamped between the molding lower die and upper die: force in the directions indicated by arrows 61a, that is, force in such directions that the lead frames LF1, LF2 are stripped from the semiconductor chip CPH is exerted on the lead frames LF1, LF2. This acts to weaken (degrade, disjoin) the following solder joint: the solder joint (joint by solder SLD) between the lead frame LF1 and each semiconductor chip CPH; and the solder joint (joint by solder SLD) between the lead frame LF2 and each semiconductor chip CPH. Therefore, there is a possibility that the reliability of the solder joint between the lead frames LF1, LF2 and each semiconductor chip CPH is degraded and the reliability of each manufactured semiconductor device is degraded.

Conversely, if the spacing T31 between the lead frame LF1 and lead frame LF2 in the assembly WK2 is excessively larger than the design value, the following takes place when the assembly WK2 is clamped between the molding lower die and upper die: a gap is produced between the dies and the lead frames. As a result, when resin material is injected into the cavity in the dies to form the encapsulation resin portion MR, the resin can flow into this gap and resin leakage can occur. This degrades the fabrication yield of the semiconductor device.

FIG. 98 is a sectional view obtained when the assembly WK is fabricated by carrying out Steps S1 to S7. FIG. 98 is a schematic sectional view and depicts each lead frame LF1, LF2, LF3 as a flat plate to facilitate understanding but in reality each lead frame LF1, LF2, LF3 has such a structure as illustrated in FIG. 19 to FIG. 24. In FIG. 98, the back surface drain electrodes BEH, BEL, source pad electrodes PDSH, PDSL, and gate pad electrodes PDGH, PDGL of the semiconductor chips CPH, CPL are omitted to facilitate understanding.

Also in case of the assembly WK with such a structure that the semiconductor chips CPH, CPL are sandwiched between the lead frames LF1, LF2, LF3, the same problems as described with respect to the assembly WK2 can arise.

More specific description will be given. To clamp the assembly WK between the molding lower die and upper die to form the encapsulation resin portion MR, it is required to clamp the lead frame LF1, lead frame LF2, and lead frame LF3 in the assembly WK at different height positions. The positions (height positions) where the lead frame LF1, lead frame LF2, and lead frame LF3 are clamped between the lower die and the upper die are determined relative to the following design values: the design values of the spacing T31 between the lead frames LF1, LF2 in the assembly WK and the design value of the spacing T32 between the lead frames LF2, LF3. For this reason, in cases where the spacing T31 between the lead frames LF1, LF2 in the assembly WK and the spacing T32 between the lead frames LF2, LF3 are in accordance with the design values when the assembly WK is fabricated, the following results: no problem arises when the encapsulation resin portion MR is formed on the assembly WK. In cases where the spacing T31 or T32 is different from its design value, the following problems can arise when the assembly WK is clamped between the molding lower die and upper die:

If the spacing T31 between the lead frames LF1, LF2 in the assembly WK or the spacing T32 between the lead frames LF2, LF3 is excessively smaller than the relevant design value, the following takes place when the assembly WK is clamped between the molding lower die and upper die: force in such directions that the lead frames LF1, LF2, LF3 are stripped from the semiconductor chip CPH or the semiconductor chip CPL is exerted on the lead frames LF1, LF2, LF3. This can degrade the reliability of the solder joint (joint by solder SLD) between the lead frames LF1, LF2, LF3 and the semiconductor chips CPH, CPL and the reliability of each manufactured semiconductor device can be degraded.

Conversely, if the spacing T31 between the lead frames LF1, LF2 in the assembly WK or the spacing T32 between the lead frames LF2, LF3 is excessively larger than the relevant design value, the following takes place: when the assembly WK is clamped between the molding lower die and upper die, a gap is produced between the dies and the lead frames. As a result, when resin material is injected into the cavity in the dies to form the encapsulation resin portion MR, the resin can flow into this gap and resin leakage can occur. This degrades the fabrication yield of the semiconductor device.

For this reason, to enhance the reliability of solder joint to enhance the reliability of the manufactured semiconductor device and prevent resin leakage during the molding step to enhance the fabrication yield of the semiconductor device, it is important to take the following measure: the spacing T31 between the lead frames LF1, LF2 and the spacing T32 between the lead frames LF2, LF3 are controlled to predetermined values in the assembly WK, WK2 to prevent the above problems from arising during the molding step.

If the assembly jig 41 is not provided with the supporting faces SF1*b* or SF1*c* unlike this embodiment, the lead frames LF2, LF3 are not supported by the supporting faces SF1*b* or SF1*c*. Therefore, when the solder SLDa, SLDb, SLDc, SLDd is melted at the solder reflow step, or Step S7, the lead frames LF2, LF3 are sunk by their own weight and the solder is solidified and the solder SLD is formed in this state. In this case, the amount of sinking of each lead frame LF2, LF3 fluctuates from assembly WK (WK2) to assembly WK (WK2). For this reason, the thickness of the solder SLD joining together (each electrode of) the semiconductor chips CPH, CPL and (each terminal of) the lead frames LF1, LF2, LF3 fluctuates (varies) from assembly WK (WK2) to assembly WK (WK2). This incurs fluctuation (variation) in the spacing T31 between the lead frames LF1, LF2 or the spacing T32 between the lead frames LF2, LF3 in the assembly WK (WK2).

In this embodiment, to cope with this, the assembly jig 41 is provided with the supporting faces SF1*b*, SF1*c* as well as the supporting face SF1*a*; and some thought is put in the layout (arrangement positions) and heights of the supporting faces SF1*a*, SF1*b*, SF1*c* in the assembly jig 41. Then with the lead frames LF1, LF2, LF3 set over this assembly jig 41, the solder reflow processing of Step S7 is carried out.

More specific description will be given. As one of major features of this embodiment, the measures described below are taken. The following heights are made equal to each other: the height $H_1$ (shown in FIG. 29 and FIG. 30) of the supporting faces SF1*b* relative to the supporting face SF1*a* in the assembly jig 41; and the height $H_3$ (shown in FIG. 77 and FIG. 78) of the supporting faces SF2*b* relative to the supporting face SF2*a* in the die MD2. (That is, $H_1=H_3$.) Further, the following heights are made equal to each other: the height $H_2$ (shown in FIG. 27, FIG. 29, and FIG. 31) of the supporting faces SF1*c* relative to the supporting face SF1*a* in the assembly jig 41; and the height $H_4$ (shown in FIG. 75, FIG. 77, and FIG. 79) of the supporting faces SF2*c* relative to the supporting face SF2*a* in the die MD2. (That is, $H_2=H_4$.)

Figure 27:
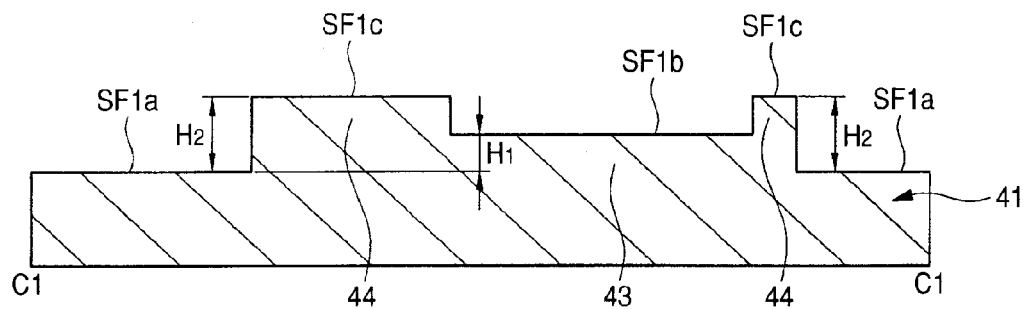
FIG. 27 is a sectional view of the assembly jig in FIG. 26 taken along line C1-C1.
Figure 28:
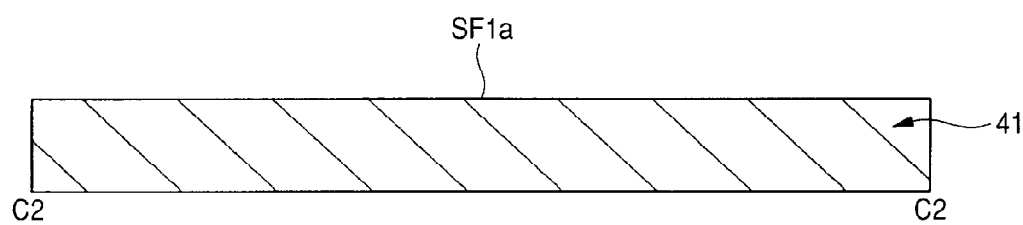
FIG. 28 is a sectional view of the assembly jig in FIG. 26 taken along line C2-C2.
Figure 29:
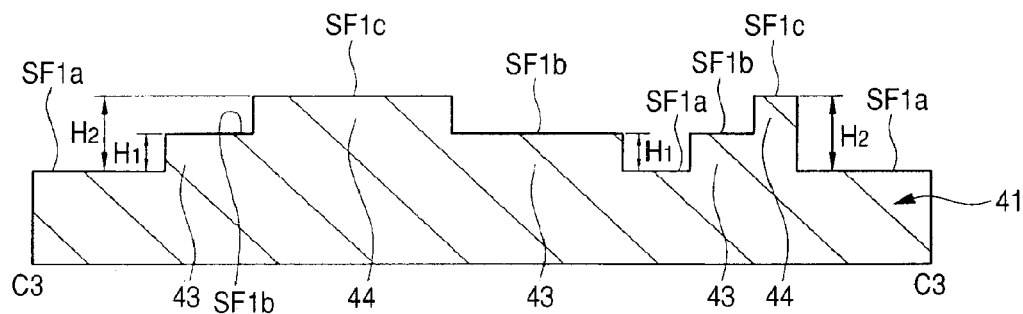
FIG. 29 is a sectional view of the assembly jig in FIG. 26 taken along line C3-C3.
Figure 30:
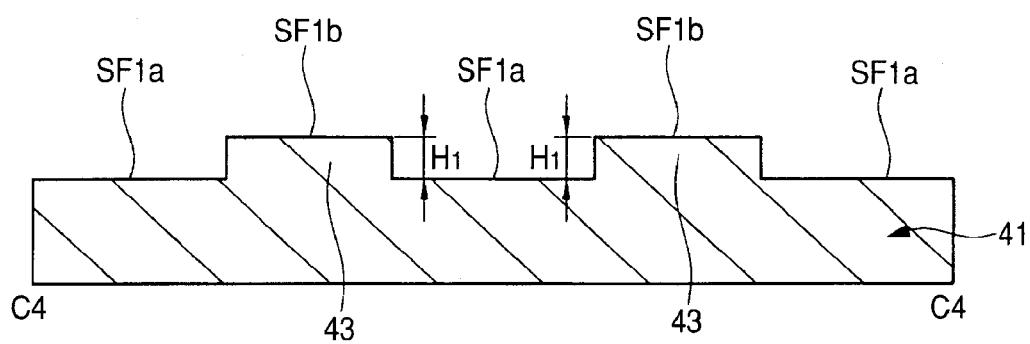
FIG. 30 is a sectional view of the assembly jig in FIG. 26 taken along line C4-C4.

In this embodiment, the lead frame LF1 is set over the supporting face SF1*a* of the assembly jig 41; the lead frame LF2 is supported by the supporting faces SF1*b* of the assembly jig 41; and the lead frame LF3 is supported by the supporting faces SF1*c* of the assembly jig 41. In this state, the solder reflow processing of Step S7 is carried out. In the fabricated assembly WK, for this reason, the following can be implemented. The following heights can be made equal to each other: the height $H_5$ from the lower surface of the lead frame LF1 to the lower surface of the lead frame LF2 (the height $H_5$ is indicated in FIG. 68, FIG. 97, and FIG. 98); and the height $H_1$ from the supporting face SF1*a* to the supporting faces SF1*b* in the assembly jig 41 (the height $H_1$ is indicated in FIG. 27, FIG. 29, and FIG. 30). Further, the following heights can be made equal to each other: the height $H_6$ from the lower surface of the lead frame LF1 to the lower surface of the lead frame LF3 in the assembly WK (the height $H_6$ is indicated in FIG. 68, FIG. 97, and FIG. 98); and the height $H_2$ from the supporting face SF1*a* to the supporting faces SF1*c* in the assembly jig 41 (the height $H_2$ is indicated in FIG. 27, FIG. 29, and FIG. 31). As mentioned above, the heights $H_1$, $H_2$ of the supporting faces SF1*b*, SF1*c* of the assembly jig 41 are respectively equal to the heights $H_3$, $H_4$ of the supporting faces SF2*b*, SF2*c* of the die MD2 (that is, $H_1=H_3$, $H_2=H_4$) In this case, the following can be implemented when the assembly WK is set over the die MD2: the height positions of the respective lower surfaces of the lead frames LF1, LF2, LF3 of the assembly WK can be respectively made equal to the height positions of the supporting faces SF2*a*, SF2*b*, SF2*c* of the die MD2. Even though the assembly WK is clamped between the dies MD1, MD2, for this reason, the occurrence of the problems described with reference to FIG. 97 or FIG. 98 can be suppressed or prevented. That is, force in such directions that the lead frames LF1, LF2, LF3 are stripped off from the semiconductor chip CPH or the semiconductor chip CPL can be suppressed or prevented from acting on the lead frames LF1, LF2, LF3. Further, a gap can be suppressed or prevented from being produced between the supporting faces SF2b, SF2c of the die MD2 and the lower surfaces of the lead frames LF2, LF3. Therefore, it is possible to enhance the reliability of joint by solder SLD (solder joint) to enhance the reliability of the manufactured semiconductor device SM1. Further, it is possible to prevent resin leakage at the molding step, or Step S8 to enhance the fabrication yield of the semiconductor device SM1.

In this application, the heights $H_1$, $H_2$ of the supporting faces SF1b, SF1c in the assembly jig 41 are respectively made equal to the heights $H_3$, $H_4$ of the supporting faces SF2b, SF2c in the die MD2. (That is, $H_1=H_3$, $H_2=H_4$.) It is most desirable that "equal" cited here should refer to complete agreement; however, the heights need not completely agree with each other and a difference to the extent that it is inevitable because of processing accuracy is permitted. Specifically, the result of examination by the present inventors revealed the following. A difference of up to 50 μm is permissible between the height $H_1$ of the supporting faces SF1b in the assembly jig 41 and the height $H_3$ of the supporting faces SF2b in the die MD2. (This difference is equivalent to the absolute value of the difference between the height $H_1$ and the height $H_3$, $|H_1-H_3|$.) However, it is desirable that the difference should be 10 μm or less. (That is, it is indispensable that $|H_1-H_3|\leq 50$ μm; however, it is desirable that $|H_1-H_3|\leq 10$ μm.) Further, a difference of up to 50 μm is permissible between the height $H_2$ of the supporting faces SF1c in the assembly jig 41 and the height $H_4$ of the supporting faces SF2c in the die MD2. (This difference is equivalent to the absolute value of the difference between the height $H_2$ and the height $H_4$, $|H_2-H_4|$.) However, it is desirable that the difference should be 10 μm or less. (That is, it is indispensable that $|H_2-H_4|\leq 50$ μm; however, it is desirable that $|H_2-H_4|\leq 10$ μm.) This makes it possible to enjoy the above-mentioned effect of making the heights $H_1$, $H_2$ of the supporting faces SF1b, SF1c equal to the heights $H_3$, $H_4$ of the supporting faces SF2b, SF2c ($H_1=H_3$, $H_2=H_4$).

In this embodiment, as mentioned above, the heights $H_1$, $H_2$ of the supporting faces SF1b, SF1c in the assembly 41 are respectively made equal to the heights $H_3$, $H_4$ of the supporting faces SF2b, SF2c in the die MD2 ($H_1=H_3$, $H_2=H_4$). As another of major features of this embodiment, some thought is put in the layout of the supporting faces SF1a, SF1b, SF1c in the assembly 41 and the layout of the supporting faces SF2a, SF2b, SF2c in the die MD2. More specific description will be given. The arrangement positions and shapes of the supporting faces SF1b in the assembly jig 41 are made equal to the arrangement positions and shapes of the supporting faces SF2b in the die MD2; and the arrangement positions and shapes of the supporting faces SF1c in the assembly jig 41 are made equal to the arrangement positions and shapes of the supporting faces SF2c in the die MD2. In other words, the assembly jig 41 is so designed that the upper surface of the assembly jig 41 is basically identical in structure with the upper surface of the die MD2. The reason for this will be described below:

When the assembly WK is fabricated, the height of the portions of the lead frame LF2 set over the supporting faces SF1b of the assembly jig 41 becomes equal to the height $H_1$ of the supporting faces SF1b; and the height of the portions of the lead frame LF2 set over the supporting faces SF1c of the assembly jig 41 becomes equal to the height $H_2$ of the supporting faces SF1c. However, the following can occur because of inclination, deformation, warp, or the like in the lead frame LF2 or LF3: the height of a portion of the lead frame LF2 or LF3 that is not supported by a supporting face SF1b or SF1c of the assembly jig 41 can deviate from the height $H_1$ or $H_2$ of the supporting face SF1b or SF1c.

When the heights $H_1$, $H_2$ of the supporting faces SF1b, SF1c are made equal to the heights $H_3$, $H_4$ of the supporting faces SF2b, SF2c, the following can be implemented: the height of the portions of the lead frames LF2, LF3 set and supported over the supporting faces SF1b, SF1c of the assembly jig 41 can be made identical with the heights $H_3$, $H_4$ of the supporting faces SF2b, SF2c of the die MD2. If the positions of the supporting faces SF1b, SF1c in the assembly jig 41 deviate from the positions of the supporting faces SF2b, SF2c in the die MD2 unlike this embodiment, the following portions differ from each other: the portions of the lead frames LF2, LF3 set and supported over the supporting faces SF1b, SF1c of the assembly jig 41; and the portions thereof sandwiched and clamped between the lower surface of the die MD1 and the supporting faces SF2b, SF2c of the die MD2. In this case, there is a possibility that the following can be caused by the above-mentioned inclination, deformation, warp, or the like in the lead frame LF1, LF2, or LF3: the height of a portion of the lead frame LF2 or LF3 that is sandwiched and clamped between the lower surface of the die MD1 and a supporting face SF2b or SF2c of the die MD2 can deviate from the following heights: the heights $H_3$, $H_4$ of the supporting faces SF2b, SF2c of the die MD2. In this case, the problems described with reference to FIG. 97 or FIG. 98 can arise.

In this embodiment, as mentioned above, the arrangement positions and shapes of the supporting faces SF1b, SF1c in the assembly jig 41 are respectively equal to the arrangement positions and shapes of the supporting faces SF2b, SF2c in the die MD2. For this reason, the following portions can be made identical (their positions can be made identical: the portions of the lead frames LF2, LF3 set and supported over the supporting faces SF1b, SF1c of the assembly jig 41; and the portions thereof sandwiched and clamped between the lower surface of the die MD1 and the supporting faces SF2b, SF2c of the die MD2. Therefore, the following heights can be made identical with each other: the heights of the portions of the lead frames LF2, LF3 sandwiched and clamped between the lower surface of the die MD1 and the supporting faces SF2b, SF2c of the die MD2; and the heights $H_3$, $H_4$ of the supporting faces SF2b, SF2c of the die MD2. This makes it possible to appropriately prevent the problems described with reference to FIG. 97 or FIG. 98. As a result, it is possible to further enhance the reliability of joint by solder SLD (solder joint) to more appropriately enhance the reliability of the manufactured semiconductor device SM1. Further, it is possible to more appropriately prevent resin leakage during the molding step, or Step S8 to more appropriately enhance the fabrication yield of the semiconductor device SM1.

It is most desirable that the following measure should be taken: the assembly jig 41 is so designed that the upper surface of the assembly jig 41 is basically identical in structure with the upper surface of the die MD2; and the arrangement positions and shapes of the supporting faces SF1b, SF1c in the assembly jig 41 and the arrangement positions and shapes of the supporting faces SF2b, SF2c in the die MD2 are made identical with each other. However, the effect of this embodiment can be obtained even though the arrangement positions and shapes of the supporting faces SF1b, SF1c in the assembly jig 41 and the arrangement positions and shapes of the supporting faces SF2b, SF2c of the die MD2 are not completely equal to each other. This can be done by designing the arrangement positions and shapes of the supporting faces SF1b, SF1c so that the following conditions are met:

In the die MD2, the area where each drain terminal TDH of the lead frame LF1 is to be set is the supporting face SF1a.

Therefore, the bottom surface of each cavity CAV is formed by the supporting face SF2a. The supporting faces SF2b are arranged in positions adjacent to each cavity CAV. This is because it is required to: set part of the lead frame LF2, more specifically, the outer lead portions of each source-drain terminal TSD and gate terminal TGH over the supporting faces SF2b adjacent to each cavity CAV; and inject resin material into each cavity CAV formed by the dies MD1, MD2 with it sandwiched between the supporting faces SF2b of the die MD2 and the die MD1 to form the encapsulation resin portion MR. The supporting faces SF2c are also arranged in positions adjacent to each cavity CAV. This is because it is required to: set part of the lead frame LF3, more specifically, the outer lead portions of each gate terminal TGL and source terminal TSL over the supporting faces SF2c adjacent to each cavity CAV; and inject resin material into each cavity CAV formed by the dies MD1, MD2 with it sandwiched between the supporting faces SF2c of the die MD2 and the die MD1 to form the encapsulation resin portion MR.

In the assembly jig 41, meanwhile, the area where each drain terminal TDH of the lead frame LF1 is to be set is the supporting face SF1a. Then the arrangement positions and shapes (layout) of the supporting faces SF1b in the assembly jig 41 are so designed that the following portions are set over the supporting faces SF1b of the assembly jig 41 at Steps S4 to S7: the portions of the lead frame LF2 sandwiched between the supporting faces SF2b of the die M2 and the die MD1 at Step S8 (more specifically, the outer lead portions of each source-drain terminal TSD and gate terminal TGH). That is, the layout of the supporting faces SF1b of the assembly jig 41 may be made different from the layout of the supporting faces SF2b in the die MD2 as long as the following is implemented: the portions of the lead frame LF2 sandwiched between the supporting faces SF2b of the die M2 and the die MD1 at Step S8 are set over the supporting faces SF1b of the assembly jig 41 at Steps S4 to S7 (more specifically, the outer lead portions of each source-drain terminal TSD and gate terminal TGH are set over the supporting faces SF1b of the assembly jig 41 at Steps S4 to S7). Further, the arrangement positions and shapes (layout) of the supporting faces SF1c of the assembly jig 41 are so designed that the following portions are set over the supporting faces SF1c of the assembly jig 41 at Steps S4 to S7: the portions of the lead frame LF3 sandwiched between the supporting faces SF2c of the die M2 and the die MD1 at Step S8 (more specifically, the outer lead portions of each gate terminal TGL and source terminal TSL). That is, the layout of the supporting faces SF1c of the assembly jig 41 may be made different from the layout of the supporting faces SF2c in the die MD2 as long as the following is implemented: the portions of the lead frame LF3 sandwiched between the supporting faces SF2c of the die M2 and the die MD1 at Step S8 are set over the supporting faces SF1c of the assembly jig 41 at Steps S4 to S7 (more specifically, the outer lead portions of each gate terminal TGL and source terminal TSL are set over the supporting faces SF1c of the assembly jig 41 at Steps S4 to S7). It is required that the heights $H_1$, $H_2$ of the supporting faces SF1b, SF1c in the assembly jig 41 should be respectively made equal to the heights $H_3$, $H_4$ of the supporting faces SF2b, SF2c in the die MD2 (that is, $H_1=H_3$, $H_2=H_4$). However, complete agreement is not required and the difference to the above-mentioned extent is permissible. (That is, it is indispensable that the difference between $H_1$ and $H_3$ and the difference between $H_2$ and $H_4$ should be respectively 50 μm or less and a difference of 10 μm or less is more desirable.)

Even in this case, the following heights can be made substantially equal to each other in the assembly WK fabricated by Steps S1 to S7: the heights of the portions (the outer lead portions of each terminal) sandwiched and clamped between the supporting faces SF2b, SF2c of the die MD2 and the die MD1 in positions adjacent to each cavity CAV at Step S8; and the heights $H_3$, $H_4$ of the supporting faces SF2b, SF2c of the die MD2. This makes it possible to prevent the problems described with reference to FIG. 97 or FIG. 98. As a result, it is possible to enhance the reliability of joint by solder SLD (solder joint) to enhance the reliability of the manufactured semiconductor device SM1. Further, it is possible to prevent resin leakage during the molding step, or Step S8 to enhance the fabrication yield of the semiconductor device SM1.

In this embodiment, as mentioned above, the lead frames LF1, LF2, LF3 are set over the assembly jig 41 so that the positioning pins 42 of the assembly jig 41 are inserted into the openings OP2 in the lead frames LF1, LF2, LF3. In each lead frame LF1, LF2, LF3, it is desirable that these openings OP2 should be arranged as illustrated in FIG. 19, FIG. 21, and FIG. 23. That is, they should be arranged in proximity to the center in the Y-direction, or the direction of the length of each lead frame LF1, LF2, LF3. The openings OP2 are provided to determine the planar position of each lead frame LF1, LF2, LF3. Therefore, the following can be implemented by arranging them in proximity to the center in the Y-direction, or the direction of length: the overall position of each lead frame LF1, LF2, LF3 can be more accurately determined than in cases where they are arranged in proximity to the ends of the lead frames LF1, LF2, LF3. When each lead frame LF1, LF2, LF3 is a multiple lead frame in which multiple unit regions UT1 are arranged as illustrated in FIG. 19, FIG. 21, and FIG. 23, the following can be implemented: in each lead frame LF1, LF2, LF3, the openings OP2 have to be provided only in the unit region UT1a positioned in proximity to the center in the Y-direction, or the direction of length and the openings OP2 need not be provided in the other unit regions UT1.

The lead frames LF1, LF2, LF3 can elongate in the direction of length (Y-direction) during heating in the solder reflow processing of Step S7. The following advantage is obtained by providing the openings OP2 only in proximity to the center in the Y-direction, or the direction of length in each lead frame LF1, LF2, LF3: even though a lead frame LF1, LF2, LF3 elongates in the direction of length (Y-direction) during heating in the solder reflow processing of Step S7, this elongation is not limited by the pins 42. This makes it possible to prevent the lead frames LF1, LF2, LF3 from warping and enhance the degree of parallelization between the lead frames LF1, LF2, LF3.

The number of pins 42 provided in the assembly jig 41 and the number of openings OP2 in each lead frame LF1, LF2, LF3 into which they are inserted are equal to each other. The required number of pins 42 provided in the assembly jig 41 (that is, the required number of openings OP2 provided in each lead frame LF1, LF2, LF3) is at least one but may be more than one. Even in cases where more than one are provided, it is desirable that the multiple openings OP2 should be arranged in proximity to the center in the Y-direction, or the direction of length in each lead frame LF1, LF2, LF3 as illustrated in FIG. 19, FIG. 21, and FIG. 23. It is desirable that these openings OP2 should be set (arranged) in line in the X-direction orthogonal to the Y-direction.

The number of pins 42 provided in the assembly jig 41 (that is, the number of openings OP2 provided in each lead frame LF1, LF2, LF3) may be made equal to the following number: the total number of the lead frames LF1, LF2, LF3 set over the assembly jig 41, that is, three. Thus the three pins 42 (that is, the pins 42a, 42b, 42c shown in FIG. 25 and FIG. 26) of the assembly jig 41 can be used as follows: the lead frame LF1 is positioned by the pin 42a, the lead frame LF2 is positioned by the pin 42b, and the lead frame LF3 is positioned by the pin 42c. That is, different pins 42 are used as the pin 42a for positioning the lead frame LF1, the pin 42b for positioning the lead frame LF2, and the pin 42c for positioning the lead frame LF3. This can be implemented as follows:

In the lead frame LF1, the following measure is taken with respect to the three openings OP2 (that is, the openings OP2a, OP2b, OP2c shown in FIG. 19 and FIG. 20) into which the pins 42a, 42b, 42c of the assembly jig 41 are inserted. The size (diameter) of the opening OP2a into which the pin 42a is inserted is substantially matched with the size (diameter) of the pin 42a. In the lead frame LF1, the size (diameter) of the opening OP2b into which the pin 42b is inserted is made slightly larger than the size (diameter) of the pin 42b; and the size (diameter) of the opening OP2c into which the pin 42c is inserted is made slightly larger than the size (diameter) of the pin 42c. That is, in the lead frame LF1, the following differences are made larger than the size difference (diameter difference) between the opening OP2a and the pin 42a inserted thereinto: the size difference (diameter difference) between the opening OP2b and the pin 42b inserted thereinto; and the size difference (diameter difference) between the opening OP2c and the pin 42c inserted thereinto. As a result, when the pin 42a of the assembly jig 41 is inserted into the opening OP2a in the lead frame LF1, the position of the lead frame LF1 can be defined and determined by the pin 42a of the assembly jig 41. At this time, the pins 42b, 42c of the assembly jig 41 are respectively inserted into the openings OP2b, OP2c in the lead frame LF1. Since there is an allowance (gap) between the pins 42b, 42c and the openings OP2b, OP2c in the lead frame LF1, however, the lead frame LF1 is substantially positioned by the following: the pin 42a of the assembly jig 41 and the opening OP2a in the lead frame LF1.

In the lead frame LF2, the following measure is taken with respect to the three openings OP2 (that is, the openings OP2a, OP2b, OP2c shown in FIG. 21 and FIG. 22) into which the pins 42a, 42b, 42c of the assembly jig 41 are inserted. The size (diameter) of the opening OP2b into which the pin 42b is inserted is substantially matched with the size (diameter) of the pin 42b. In the lead frame LF2, the size (diameter) of the opening OP2a into which the pin 42a is inserted is made slightly larger than the size (diameter) of the pin 42a; and the size (diameter) of the opening OP2c into which the pin 42c is inserted is made slightly larger than the size (diameter) of the pin 42c. That is, in the lead frame LF2, the following differences are made larger than the size difference (diameter difference) between the opening OP2b and the pin 42b inserted thereinto: the size difference (diameter difference) between the opening OP2a and the pin 42a inserted thereinto; and the size difference (diameter difference) between the opening OP2c and the pin 42c inserted thereinto. As a result, when the pin 42b of the assembly jig 41 is inserted into the opening OP2b in the lead frame LF2, the position of the lead frame LF2 can be defined and determined by the pin 42b of the assembly jig 41. At this time, the pins 42a, 42c of the assembly jig 41 are respectively inserted into the openings OP2a, OP2c in the lead frame LF2. Since there is an allowance (gap) between the pins 42a, 42c and the openings OP2a, OP2c in the lead frame LF2, however, the lead frame LF2 is substantially positioned by the following: the pin 42b of the assembly jig 41 and the opening OP2b in the lead frame LF2.

In the lead frame LF3, the following measure is taken with respect to the three openings OP2 (that is, the openings OP2a, OP2b, OP2c shown in FIG. 23 and FIG. 24) into which the pins 42a, 42b, 42c of the assembly jig 41 are inserted. The size (diameter) of the opening OP2c into which the pin 42c is inserted is substantially matched with the size (diameter) of the pin 42c. In the lead frame LF3, the size (diameter) of the opening OP2a into which the pin 42a is inserted is made slightly larger than the size (diameter) of the pin 42a; and the size (diameter) of the opening OP2b into which the pin 42b is inserted is made slightly larger than the size (diameter) of the pin 42b. That is, in the lead frame LF3, the following differences are made larger than the size difference (diameter difference) between the opening OP2c and the pin 42c inserted thereinto: the size difference (diameter difference) between the opening OP2a and the pin 42a inserted thereinto; and the size difference (diameter difference) between the opening OP2b and the pin 42b inserted thereinto. As a result, when the pin 42c of the assembly jig 41 is inserted into the opening OP2c in the lead frame LF3, the position of the lead frame LF3 can be defined and determined by the pin 42c of the assembly jig 41. At this time, the pins 42a, 42b of the assembly jig 41 are respectively inserted into the openings OP2a, OP2b in the lead frame LF3. Since there is an allowance (gap) between the pins 42a, 42b and the openings OP2a, OP2b in the lead frame LF3, however, the lead frame LF3 is substantially positioned by the following: the pin 42c of the assembly jig 41 and the opening OP2c in the lead frame LF3.

The processing accuracy of the openings OP2 in the lead frames LF1, LF2, LF3 can differ from lead frame LF1, LF2, LF3 to lead frame LF1, LF2, LF3 because of the thickness or the like of each lead frame LF1, LF2, LF3. For this reason, the pins and the openings are differently brought into correspondence with each other. That is, with respect to the lead frame LF1, the positioning pin 42a and the opening PO2a are brought into correspondence with each other; with respect to the lead frame LF2, the positioning pin 42b and the opening OP2b are brought into correspondence with each other; and with respect to the lead frame LF3, the positioning pin 42c and the opening OP2c are brought into correspondence with each other. This makes it possible to form the positioning openings OP2a, OP2b, OP2c and the pins 42a, 42b, 42c in accordance with the processing accuracy of each lead frame LF1, LF2, LF3. As a result, it is possible to enhance the overall positioning accuracy of the lead frames LF1, LF2, LF3 set over the assembly jig 41.

As mentioned above, it is desirable that the openings OP2a, OP2b, OP2c should be set (arranged) as described below in proximity to the center of the direction of the length (Y-direction) of each lead frame LF1, LF2, LF3: they should be set (arranged) in line along the X-direction intersecting with (orthogonal to) the direction of length (Y-direction).

<Modifications>

Figure 99:
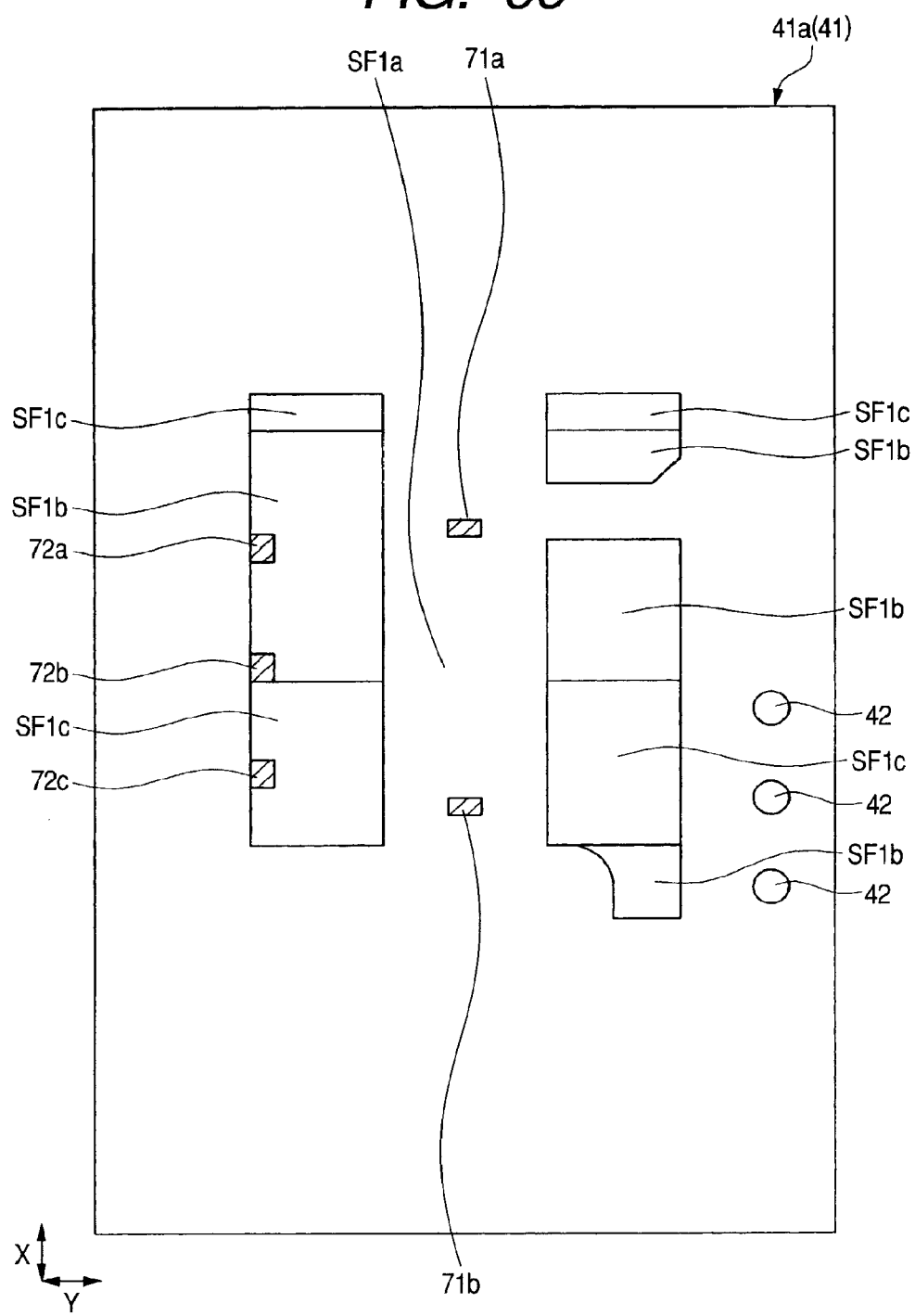
FIG. 99 is a substantial part plan view illustrating a modification to an assembly jig.
Figure 100:
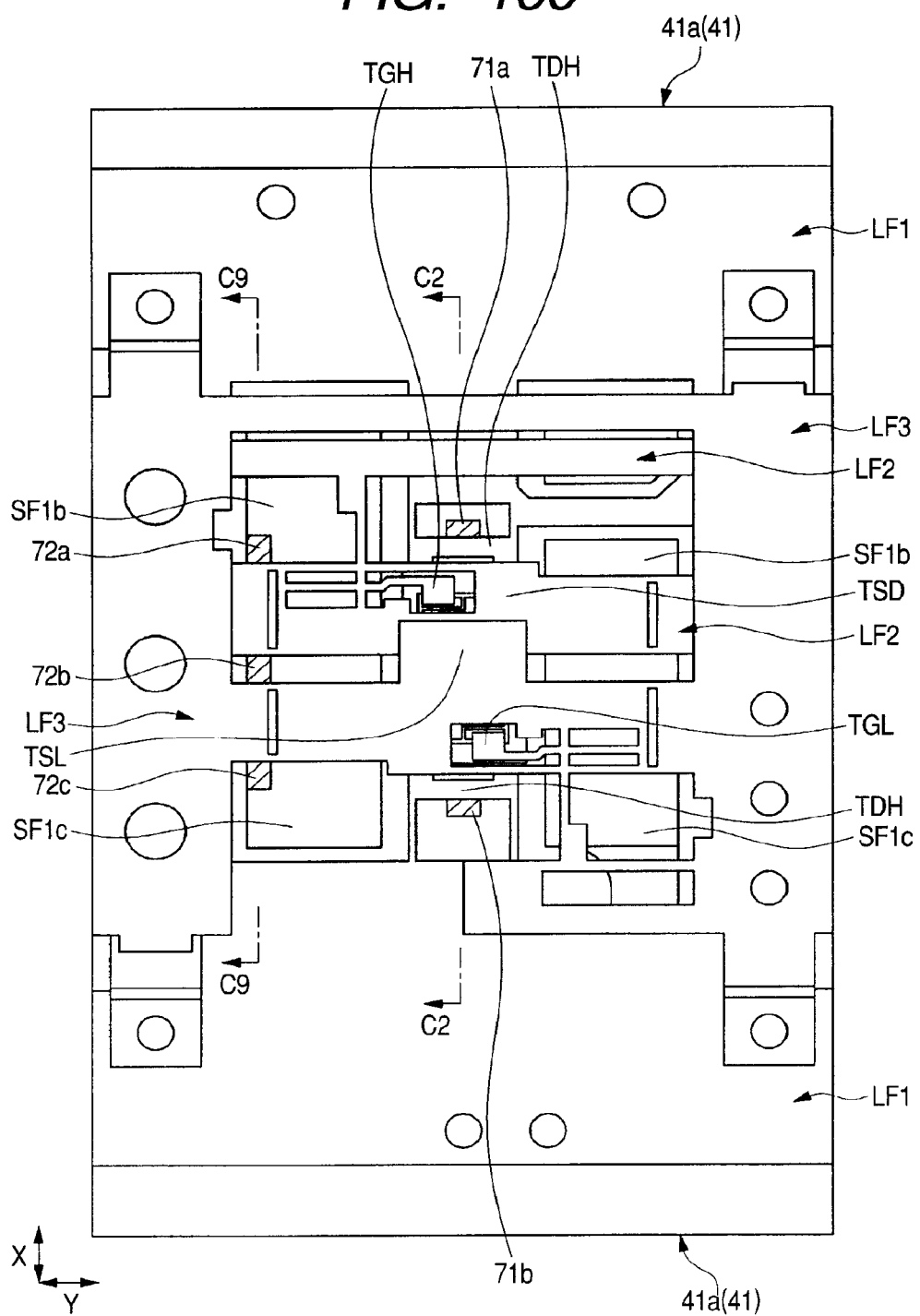
FIG. 100 is a substantial part plan view illustrating lead frames set over the assembly jig in FIG. 99.
Figure 101:
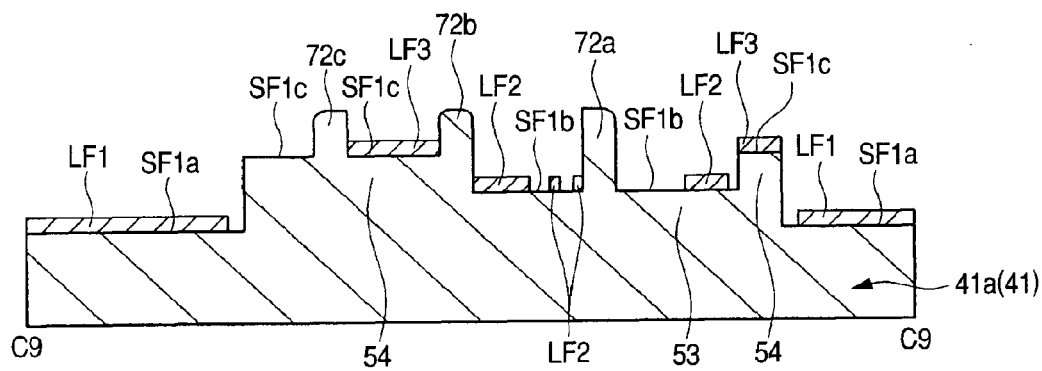
FIG. 101 is a sectional view taken along line C9-C9 of FIG. 100.
Figure 102:
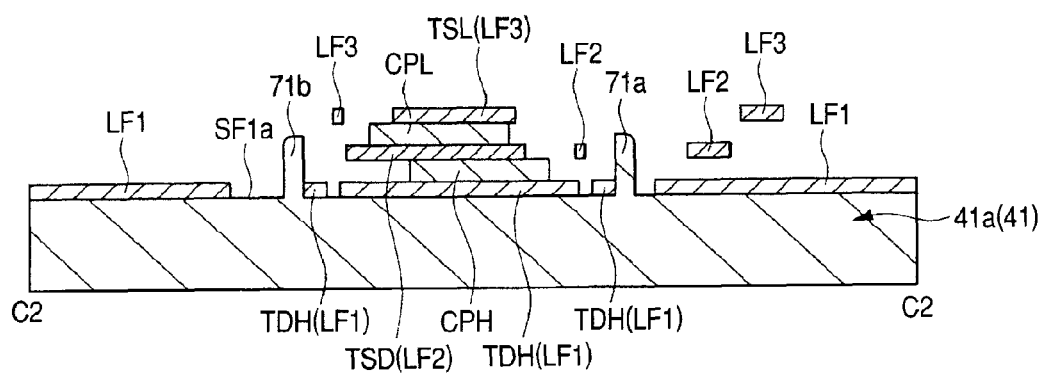
FIG. 102 is a sectional view taken along line C2-C2 of FIG. 100.

FIG. 99 is a plan view (substantial part plan view) illustrating a modification to the assembly jig 41 and corresponds to FIG. 26. FIG. 100 is a plan view (substantial part plan view) illustrating the lead frames LF1, LF2, LF3 set over the assembly jig 41 in FIG. 99 (which underwent up to Step S6) and corresponds to FIG. 57. FIG. 101 is a sectional view taken along line C9-C9 of FIG. 100 and FIG. 102 is a sectional view taken along line C2-C2 of FIG. 100 (that is, a sectional view corresponding to FIG. 59). Though FIG. 99 and FIG. 100 are plan views, protruded portions 71a, 71b, 72a, 72b, 72c are hatched to facilitate visualization (to make the layout of the protruded portions 71a, 71b, 72a, 72b, 72c more understandable).

The assembly jig 41 illustrated in FIG. 99 to FIG. 102 has protruded portions in the upper surface of the assembly jig 41. The protruded portions (second projections, projections, salient portions, tab portions) 71a, 71b are for positioning the lead frame LF1 in the X-direction and limiting its movement in the X-direction. The protruded portions (second projections, projections, salient portions, tab portions) 72a, 72b, 72c are for positioning the lead frames LF2, LF3 in the X-direction and limiting their movement in the X-direction. The protruded portions 71a, 71b, 72a, 72b, 72c are locally protruded upward in the upper surface of the assembly jig 41. That is, they are projections. It is desirable that the protruded portions 71a, 71b should be set in the supporting face SF1a of the assembly jig 41 and the protruded portions 72a, 72b, 72c should be set in the supporting faces SF1b, SF1c of the assembly jig 41. The configuration of the assembly jig 41 (41a) in FIG. 99 to FIG. 102 is the same as the assembly jig 41 illustrated in FIG. 25 to FIG. 31 except that the protruded portions 71a, 71b, 72a, 72b, 72c are provided. In the following description, the assembly jig 41 provided with the protruded portions 71a, 71b, 72a, 72b, 72c, illustrated in FIG. 99 to FIG. 102 will be designated as assembly jig 41a.

The protruded portions 71a, 71b, 72a, 72b, 72c provided on the assembly jig 41a are positioned in proximity to both ends of each of the lead frames LF1, LF2, LF3 set over the assembly jig 41a in the Y-direction. They functions to arrest (limit) the movement of the lead frames LF1, LF2, LF3 in the direction (more specifically, the X-direction) intersecting with the Y-direction.

More specific description will be given. As illustrated in FIG. 100 to FIG. 102, the protruded portions 71a, 71b of the assembly jig 41a are provided in positions where they do not planarly overlap with the lead frame LF1, LF2, or LF3 in the supporting face SF1a. At the same time, they are arranged away from each other in the X-direction and protruded upward from the upper surface of the assembly jig 41a (more specifically, the supporting face SF1a of the assembly jig 41a). When the lead frames LF1, LF2, LF3 are set over the assembly jig 41a, as illustrated in FIG. 100 and FIG. 102, the following is implemented: at least part (the drain terminal TDH in the example in FIG. 100 and FIG. 102) of the lead frame LF1 is sandwiched between the protruded portion 71a and the protruded portion 71b arranged away from each other in the X-direction; and the movement of the lead frame LF1 in the X-direction can be limited (arrested) by the protruded portions 71a, 71b. However, since at least part of the lead frame LF1 is sandwiched between the protruded portions 71a, 71b arranged away from each other in the X-direction, the following results: the movement of the lead frame LF1 in the Y-direction is not limited (arrested) by the protruded portion 71a or 71b. For this reason, the lead frame LF1 is positioned by the protruded portions 71a, 71b in the X-direction but they are not positioned and are free in the Y-direction.

As illustrated in FIG. 100 to FIG. 102, the protruded portions 72a, 72b, 72c of the assembly jig 41a are provided in positions where they do not planarly overlap with the lead frame LF1, LF2, or LF3 in the upper surface of the assembly jig 41a. At the same time, they are arranged away from one another in the X-direction and protruded upward from the upper surface of the assembly jig 41a (more specifically, the supporting faces SF1b, SF1c of the assembly jig 41a). When the lead frames LF1, LF2, LF3 are set over the assembly jig 41a, as illustrated in FIG. 100 and FIG. 101, the following is implemented: at least part of the lead frame LF2 is sandwiched between the protruded portion 72a and the protruded portion 72b arranged away from each other in the X-direction; and at least part of the lead frame LF3 is sandwiched between the protruded portion 72b and the protruded portion 72c arranged away from each other in the X-direction. This makes it possible to limit (arrest) the movement of the lead frame LF2 in the X-direction by the protruded portions 72a, 72b and limit (arrest) the movement of the lead frame LF3 in the X-direction by the protruded portions 72b, 72c.

However, since at least part of the lead frame LF2 is sandwiched between the protruded portions 72a, 72b arranged away from each other in the X-direction, the following results: the movement of the lead frame LF2 in the Y-direction is not limited (arrested) by the protruded portions 72a or 72b. Further, since at least part of the lead frame LF3 is sandwiched between the protruded portions 72b, 72c arranged away from each other in the X-direction, the following results: the movement of the lead frame LF3 in the Y-direction is not limited (arrested) by the protruded portion 72b or 72c. For this reason, the lead frames LF2, LF3 are positioned by the protruded portions 72a, 72b, 72c in the X-direction but they are not positioned and are free in the Y-direction.

As mentioned above, the protruded portions 71a, 71b, 72a, 72b, 72c are provided to position the lead frames LF2, LF3 in the X-direction. It is unnecessary to provide the protruded portions 71a, 71b, 72a, 72b, 72c in all the unit regions UT1 in each multiple lead frame LF1, LF2, LF3 in which multiple unit regions UT1 are arranged. However, it is desirable to take the following measure in each multiple lead frame LF1, LF2, LF3 in which multiple unit regions UT1 are arranged in the Y-direction: the protruded portions 71a, 71b, 72a, 72b, 72c are provided in the unit regions UT positioned at both ends in the Y-direction, or the direction of length. (These unit regions correspond to the unit regions UT1 marked with reference numeral UT1b in FIG. 19, FIG. 21, and FIG. 23.) More specific description will be given. The assembly jig 41 illustrated in FIG. 25 is so configured that multiple unit regions RG1, in each of which each unit region UT1 of the lead frames LF1, LF2, LF3 is set, are arranged in the Y-direction. The unit regions RG1 positioned at both ends in the Y-direction (corresponding to the unit regions RG1 marked with reference code RG1b in FIG. 25) only have to be so configured that the protruded portions 71a, 71b, 72a, 72b, 72c are provided as illustrated in FIG. 99.

The protruded portions 71a, 71b, 72a, 72b, 72c are provided in the unit regions UT at both ends in the direction of the length of each multiple lead frame LF1, LF2, LF3 (Y-direction). The lead frames LF1, LF2, LF3 are positioned in the X-direction and their movement in the X-direction is limited by the protruded portions 71a, 71b, 72a, 72b, 72c. As a result, each lead frame LF1, LF2, LF3 can be prevented from rotating around a pin 42 of the assembly jig 42. This makes it possible to suppress or prevent change in the relative position between the assembly jig 41, lead frame LF1, lead frame LF2, and lead frame LF3 during heating in the solder reflow processing of Step S7 or on other like occasions.

The multiple lead frames LF1, LF2, LF3 are formed of metal material, such as copper or copper alloy; therefore, there is a possibility that they elongate in the direction of length (Y-direction) during heating in the solder reflow processing of Step S7. The protruded portions 71a, 71b, 72a, 72b, 72c position the lead frames LF1, LF2, LF3 in the X-direction but they do not position the lead frames and keeps them free in the Y-direction. Therefore, even though a lead frame LF1, LF2, LF3 elongates in the direction of length (Y-direction) during heating in the solder reflow processing of Step S7, this elongation is not limited by the protruded portion 71a, 71b, 72a, 72b, or 72c. That is, the protruded portion 71a, 71b, 72a, 72b, or 72c does not arrest (limit) the elongation or contraction of the lead frames LF1, LF2, LF3 in the direction of length (Y-direction). This makes it possible to prevent the lead frames LF1, LF2, LF3 from warping and enhance the degree of parallelization between the lead frames LF1, LF2, LF3.

Figure 103:
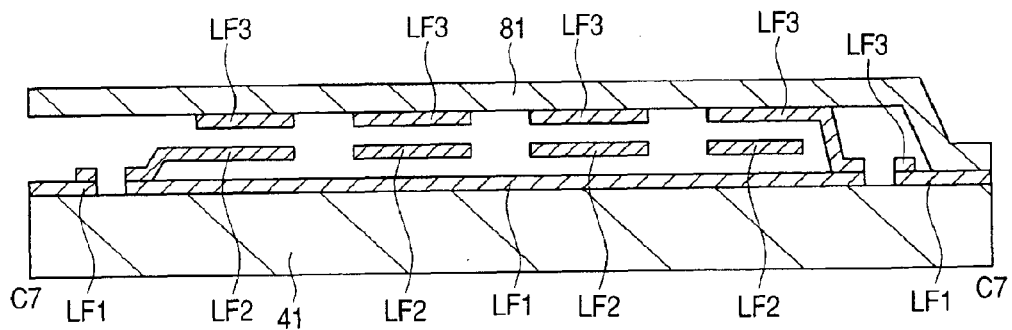
FIG. 103 is an explanatory drawing illustrating an example of how to hold lead frames set over an assembly jig.

After the lead frame LF3 is set over the assembly jig 41 at Step S6, the solder reflow processing (solder reflow heat treatment) of Step S7 may be carried out while the lead frame LF3 set over the assembly jig 41 is retained. FIG. 103 is an explanatory drawing (sectional view) illustrating an example of how to retain the lead frame LF3 and this sectional view corresponds to FIG. 63.

After the steps up to Step S6 are carried out to set the lead frames LF1, LF2, LF3 over the assembly jig 41, the lead frame LF3 can be retained from above by a retaining member 81 as illustrated in FIG. 103. At this time, the following measure is taken: the retaining member 81 is not set over the areas where the encapsulation resin portion MR is to be formed later or over the supporting faces SF1b or SF1c so that the lead frame LF3 is not retained by the retaining member 81; and the retaining member 81 is set over the other areas (especially, the portions of the framework LF3a positioned in boundaries between adjacent unit regions UT1 in the lead frame LF3) to retain the lead frame LF3. The reason why the lead frame LF1, LF2, or LF3 is not retained over the areas where the encapsulation resin portion MR is to be formed later or over the supporting faces SF1b or SF1c is to prevent deformation in a product portion (an area to be the semiconductor device SM1 later).

While the lead frame LF3 is retained by the retaining member 81 or the like, the solder reflow processing of Step S7 is carried out. This makes it possible to prevent the lead frame LF2 or LF3 from lifting during the solder reflow processing of Step S7. Therefore, it is possible to more appropriately fabricate the assembly WK in which the heights $H_5$, $H_6$ agree with the heights $H_1$, $H_2$ of the supporting faces SF1b, SF1c in the assembly jig 41. The retaining member 81 can be formed of, for example, the same carbon material or SUS material as the material of the assembly jig 41.

Figure 104:
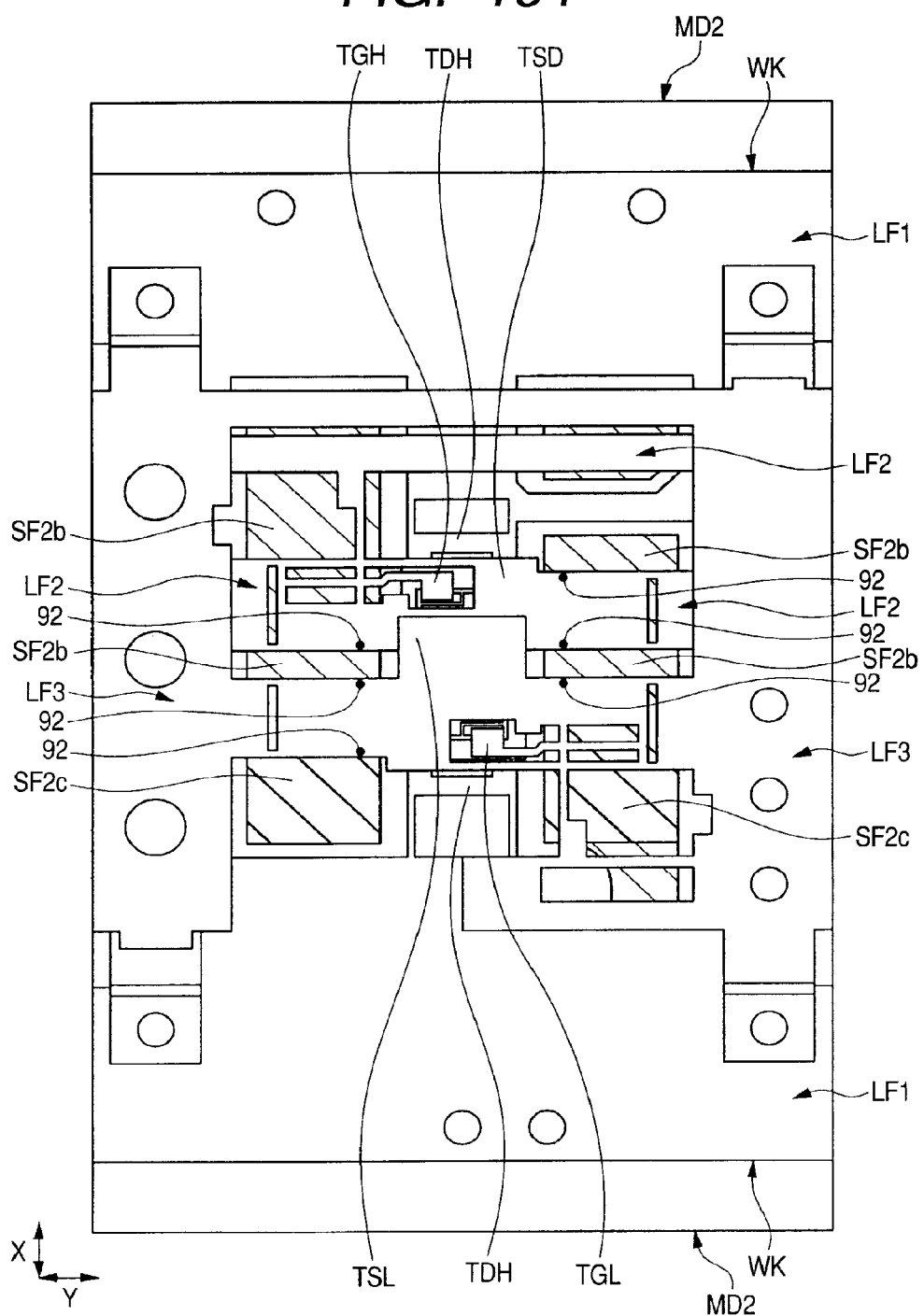
FIG. 104 is an explanatory drawing illustrating a modification to a molding step.
Figure 105:
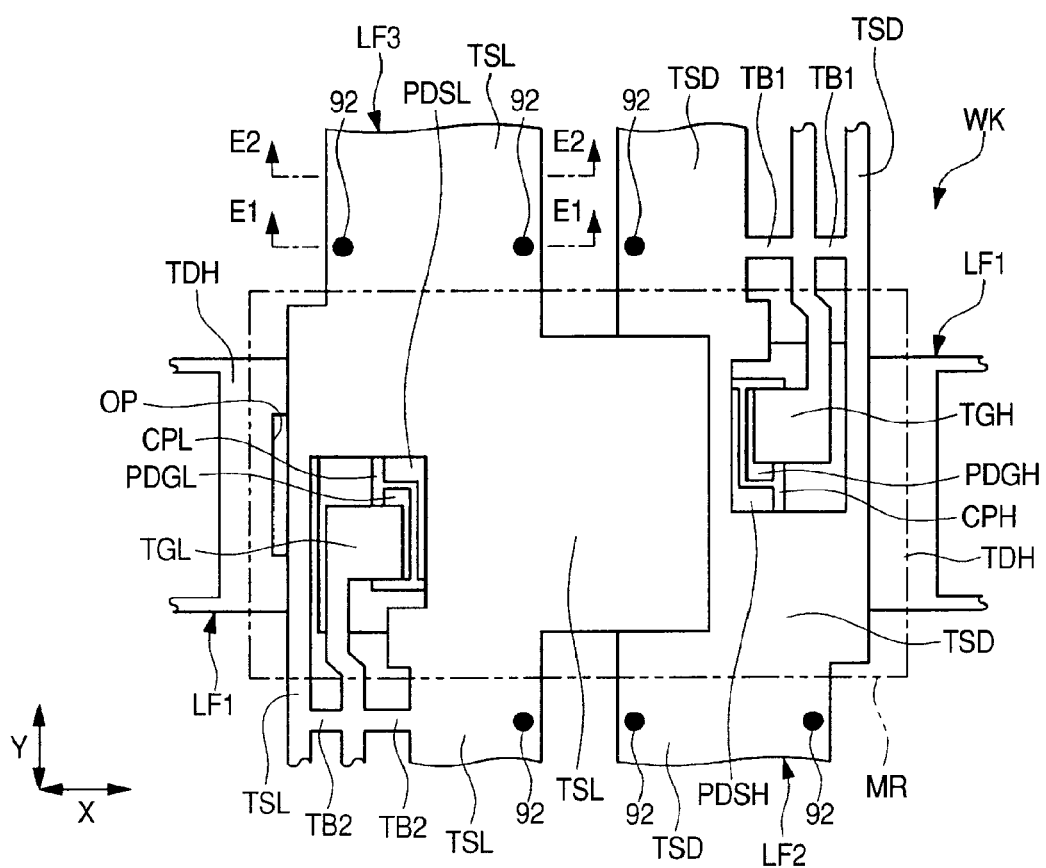
FIG. 105 is an explanatory drawing illustrating a modification to a molding step.
Figure 106:
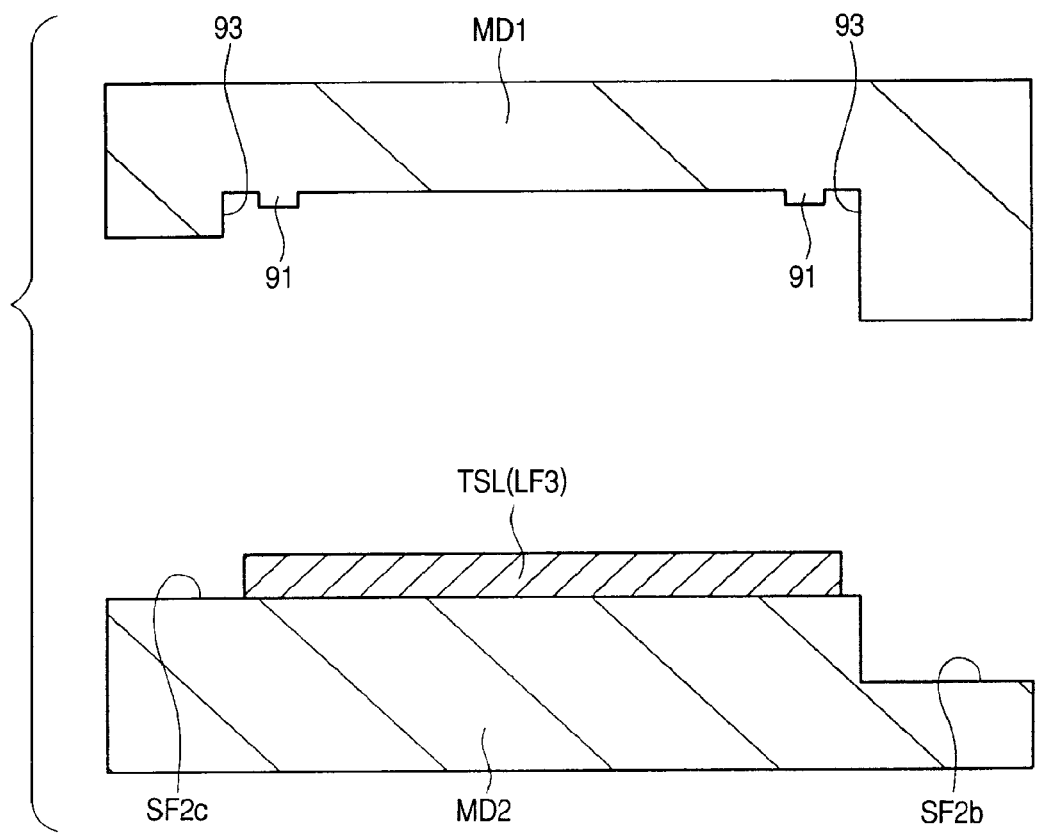
FIG. 106 is an explanatory drawing illustrating a modification to a molding step.
Figure 107:
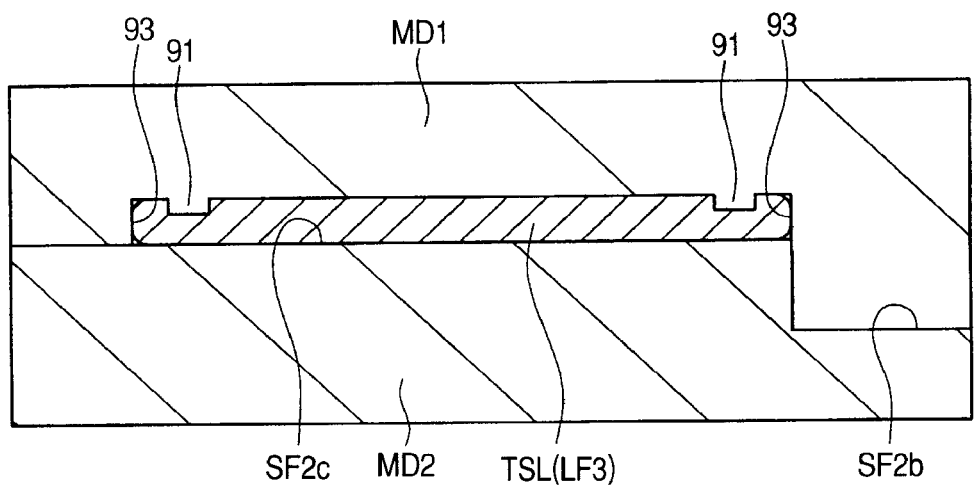
FIG. 107 is an explanatory drawing illustrating a modification to a molding step.
Figure 108:
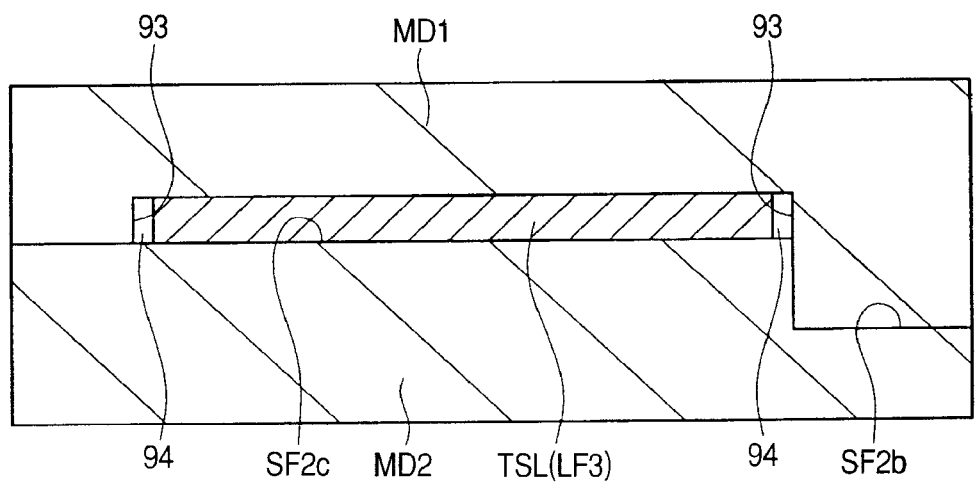
FIG. 108 is an explanatory drawing illustrating a modification to a molding step.

FIG. 104 to FIG. 108 are explanatory drawings illustrating a modification to the molding step, or Step S8. In the following description, the modification to the molding step, or Step S8, described with reference to FIG. 104 to FIG. 108 will be designated as molding step, or Step S8a. FIG. 104 and FIG. 105 correspond to substantial part plan views illustrating the assembly WK set over the die MD2 at the molding step, or Step S8a. FIG. 104 shows the area (planar area) corresponding to FIG. 80 and FIG. 105 shows the area (planar area) substantially corresponding to FIG. 65. In FIG. 104 and FIG. 105, the positions (areas) where the outer lead portions of the source-drain terminal TSD and the source terminal TSL are pressed and crushed by projections 91 of the die MD1 are indicated by reference numeral 92. FIG. 106 and FIG. 107 substantially correspond to sectional views at the position of line E1-E1 of FIG. 105 and FIG. 108 substantially corresponds to a sectional view at the position of line E2-E2 of FIG. 105. FIG. 106 illustrates the molding step, or Step S8a after the assembly WK is set over the die MD2 and before the dies MD1, MD2 are clamped. FIG. 107 and FIG. 108 illustrate the molding step, or Step S8a with the die MD1 moved down toward the die MD2 and the assembly WK sandwiched and clamped between the dies MD1, MD2.

To carry out the molding step, or Step S8a, the projections (third projections) 91 are provided in advance on the die MD1 in positions where it is opposed to the supporting faces S2b, SF2c of the die MD2. At the molding step, Step S8a, the outer lead portions of each source-drain terminal TSD and source terminal TSL of the lead frames LF2, LF3 are sandwiched and clamped between the following: the supporting faces SF2b, SF2c of the die MD2 and (the lower surface of) the die MD1. At this time, part of the outer lead portions of each source-drain terminal TSD and source terminal TSL is crushed by a projection 91 of the die MD1.

More specific description will be given. At the molding step, or Step S8a, the following parts are locally crushed by the projections 91 provided on the lower surface of the die MD1 as the upper die when the assembly WK is clamped between the dies MD1, MD2: part of the outer lead portions of each source-drain terminal TSD of the lead frame LF2 set over the supporting faces SF2b; and part of the outer lead portions of each source terminal TSL of the lead frame LF3 set over the supporting faces SF2c. The height of each projection 91 of the die MD1 is smaller (lower) than the thickness of each of the lead frames LF2, LF3.

The outer lead portions of each source-drain terminal TSD of the lead frame LF2 are set over the supporting faces SF2b of the die MD2. In the upper surfaces of these outer lead portions, the positions (areas) 92 where they are crushed by projections 91 of the die MD1 are in proximity to ends in the X-direction as illustrated in FIG. 104 and FIG. 105. The outer lead portions of each source terminal TSL of the lead frame LF3 are set over the supporting faces SF2c of the die MD2. In the upper surfaces of these outer lead portions, the positions (areas) 92 where they are crushed by projections 91 of the die MD1 are in proximity to ends in the X-direction as illustrated in FIG. 104 and FIG. 105.

However, it is desirable to take the following measure in the upper surfaces of the outer lead portions of each source-drain terminal TSD of the lead frame LF2: the vicinity of the end on the side where it adjoins to a gate terminal TGH (that is, the end on the side where the tie bar TB1 is formed) is prevented from being crushed by a projection 91 of the die MD1; and the vicinity of the end on the side where it does not adjoin to a gate terminal TGH (that is, the end on the side where the tie bar TB1 is not formed) is crushed by a projection 91 of the die MD1. Similarly, it is desirable to take the following measure in the upper surfaces of the outer lead portions of each source terminal TSL of the lead frame LF3: the vicinity of the end on the side where it adjoins to a gate terminal TGL (that is, the end on the side where the tie bar TB2 is formed) is prevented from being crushed by a projection 91 of the die MD1; and the vicinity of the end on the side where it does not adjoin to a gate terminal TGL (that is, the end on the side where the tie bar TB2 is not formed) is crushed by a projection 91 of the die MD1.

As mentioned above, the outer lead portions of each source-drain terminal TSD and source terminal TSL of the lead frames LF2, LF3 are locally crushed by projections 91 of the die MD1 in proximity to ends of the upper surfaces of the outer lead portions. The reason for this is to: spread the outer lead portions in the lateral direction (X-direction in this case); and thereby fill the gap in the lateral direction (X-direction) between the outer lead portions and the lateral surfaces of the dies MD1, MD2 (corresponding to the lateral surfaces 93 illustrated in FIG. 106 to FIG. 108).

In areas distant from the positions (areas) 92 where outer lead portions are crushed by projections 91 of the die MD1, a little gap 94 is produced as illustrated in FIG. 108 as well. These gaps are produced between the outer lead portions of each source-drain terminal TSD and source terminal TSL and the lateral surfaces (the lateral surfaces 93 illustrated in FIG. 106 to FIG. 108 and the like) of the dies MD1, MD2. In consideration of the processing accuracy of the lead frames LF1, LF2, LF3, the assembling accuracy of the assembly WK, and the like, these gaps 94 are required as margins. However, when resin material is injected into each cavity CAV in the dies MD1, MD2 to form the encapsulation resin portion MR, there is a possibility that resin leakage from these gaps 94 occurs.

At the molding step, or Step S8a, as mentioned above, the projections 91 are provided on the lower surface of the die MD1 and the outer lead portions of each source-drain terminal TSD and source terminal TSL are crushed at the above-mentioned positions 92. As illustrated in FIG. 107, as a result, the outer lead portions of each source terminal TSL are locally crushed by projections 91 of the die MD1 in proximity to ends of their upper surfaces and they are spread in the lateral direction (X-direction). This makes it possible to fill the gaps in the lateral direction (X-direction) (equivalent to the gaps 94) between the outer lead portions of the source terminal TSL and the lateral surfaces 93 of the die MD2. Similarly, the outer lead portions of each source-drain terminal TSD are locally crushed by projections 91 of the die MD1 in proximity to ends of their upper surfaces and they are spread in the lateral direction (X-direction). This makes it possible to fill the gaps in the lateral direction (X-direction) (equivalent to the gaps 94) between the outer lead portions of the source-drain terminal TSD and the lateral surfaces of the die MD2 (or the die MD1). As a result, it is possible to suppress or prevent resin leakage when resin material is injected into each cavity CAV in the dies MD1, MD2 to form the encapsulation resin portion MR.

The outer lead portions of the gate terminals TGH, TGL have a source-drain terminal TSD or a source terminal TSL arranged on both adjacent sides and resin leakage can be prevented by the tie bars TB1, TB2. Therefore, it is unnecessary to crush these outer lead portions with projections 91 of the die MD1.

Up to this point, concrete description has been given to the invention made by the present inventors based on an embodiment thereof. However, the invention is not limited to this embodiment and can be variously modified without departing from the subject matter thereof, needless to add.

In the description of the above embodiment, a case where the semiconductor device SM1 so structured that the semiconductor chips CPH, CPL are sandwiched between the three lead frames LF1, LF2, LF3 is manufactured has been taken as an example. The invention is also applicable to cases where a semiconductor device so structured that a semiconductor chip CPH is sandwiched between two lead frames LF1, LF2. In this case, the semiconductor chip CPL and the lead frame LF3 are omitted and Steps S1 to S4 are carried out and then Steps S7 to S12 are carried out without carrying out Step S5 or S6. In the assembly jig 41 and die MD2 used at this time, the supporting faces SF1c, SF2c are unnecessary. Therefore, the supporting faces SF1c, SF2c can be formed as faces at the same height as the supporting faces SF1a, SF2a or the supporting faces SF1b, SF2b. The semiconductor device manufactured in this case is equivalent to the semiconductor device SM1 so structured that: the semiconductor chip CPL, gate terminal TGL, and source terminal TSL (in addition, the solder SLD in areas where the semiconductor chip CPL and the source-drain terminal TSD are joined together) are omitted. In conjunction with the omission of these elements, the thickness of the encapsulation resin portion MR is reduced. That is, when a semiconductor device so structured that a semiconductor chip CPH is sandwiched between two lead frames LF1, LF2 is manufactured, the problem described with reference to FIG. 97 can be solved by applying major features described in relation to this embodiment.

The numbers of stacked lead frames and semiconductor chips are larger in cases where a semiconductor device SM1 so structured that semiconductor chips CPH, CPL are sandwiched between three lead frames LF1, LF2, LF3 as in this embodiment than in the following cases: cases where a semiconductor device so structured that a semiconductor chip CPH is sandwiched between two lead frames LF1, LF2 is manufactured. In cases like this embodiment, the spacing between lead frames (equivalent to the spacing T31, T32) is accordingly prone to fluctuate. For this reason, the effect of applying the major features described in relation to this embodiment to manufacture a semiconductor device so structured that semiconductor chips CPH, CPL are sandwiched between three lead frames LF1, LF2, LF3 is very great. Thus the major features described in relation to this embodiment brings greater effect in the following structure: a structure in which the numbers of stacked lead frames and semiconductor chips are large and the error in spacing between lead frames becomes large (accumulated) when these elements are stacked.

In the description of the above embodiment, a case where the invention made mainly by the present inventors is applied to a semiconductor device used in a DC-DC converter, which is the field of utilization underlying the invention, has been taken as an example. However, the invention is not limited to this and is applicable to various semiconductor devices manufactured with a semiconductor chip placed between multiple lead frames.

The invention is effectively applicable to a semiconductor device and a manufacturing technology therefor.

What is claimed is:

1. A manufacturing method for semiconductor devices comprising the steps of:
   (a) preparing a first frame having a chip mounting portion, a second frame having a first lead terminal portion, and a first semiconductor chip having a power MOSFET, a first obverse surface, and a first reverse surface opposite to the first obverse surface, first source and gate electrodes of the power MOSFET being formed on the first obverse surface, a drain electrode of the power MOSFET being formed on the first reverse surface;
   (b) setting the first frame over an assembly jig;
   (c) setting the first semiconductor chip over the chip mounting portion of the first frame so that a first solder is disposed between the first drain electrode of the first semiconductor chip and the chip mounting portion of the first frame;
   (d) setting the second frame over the assembly jig so that a second solder is disposed between the first source and gate electrodes of the first semiconductor chip and the first lead terminal portion of the second frame respectively;
   (e) after the steps (a), (b), (c), and (d), carrying out solder reflow heat treatment with the first and second frames set over the assembly jig to connect the drain electrode of the first semiconductor chip and the chip mounting portion of the first frame through the first solder and to connect the first source and gate electrodes of the first semiconductor chip and the first lead terminal portion of the second frame through the second solder; and
   (f) after the step (e), using a lower die and an upper die to form an encapsulation resin portion sealing the first semiconductor chip, the chip mounting portion of the first frame, and the first lead terminal portion of the second frame,
   wherein the lower die includes a first face for setting the chip mounting portion of the first frame and a second face for setting part of the second frame, located in a position adjacent to a cavity formed by the lower die and the upper die and protruded beyond the first face,
   wherein at the step (f), the chip mounting portion of the first frame is set over the first face of the lower die, part of the second frame is sandwiched between the second face of the lower die and the upper die, and in this state, resin material for the formation of the encapsulation resin portion is injected into the cavity formed by the lower die and the upper die, the encapsulation resin portion being thereby formed, wherein the assembly jig includes a first supporting face over which the chip mounting portion of the first frame is set and a second supporting face for supporting the second frame set over the assembly jig, protruded beyond the first supporting face, wherein a height of the second face relative to the first face in the lower die and a height of the second supporting face relative to the first supporting face in the assembly jig are identical with each other; and wherein a portion of the second frame sandwiched between the second face of the lower die and the upper die at the step (f) is set over the second supporting face of the assembly jig at the step (d).

2. The manufacturing method for semiconductor devices according to claim 1, wherein the first frame and the second frame are each comprised of metal material.

3. The manufacturing method for semiconductor devices according to claim 1, further comprising the step of:

(g) after the step (f), separating the chip mounting portion and the first lead terminal portion from the first and second frames.

4. The manufacturing method for semiconductor devices according to claim 3, further comprising the step of:

(h) after the step (g), bending an outer lead portion of the first lead terminal portion protruded outward from the encapsulation resin portion.

5. The manufacturing method for semiconductor devices according to claim 4, wherein before the step (h), the chip mounting portion and the first lead terminal portion are flat.

6. The manufacturing method for semiconductor devices according to claim 1, wherein at the step (f), the encapsulation resin portion is formed with the chip mounting portion of the first frame in contact with the first face of the lower die, and wherein the lower surface of the chip mounting portion is exposed from the encapsulation resin portion.

7. The manufacturing method for semiconductor devices according to claim 6, wherein an outer lead portion of the first lead terminal portion of the second frame is sandwiched between the second face of the lower die and the upper die at the step (f) and is set over the second supporting face of the assembly jig at the step (d).

8. The manufacturing method for semiconductor devices according to claim 1, wherein each of the first and second frames is a multiple lead frame in which multiple unit regions for manufacturing the semiconductor device are coupled in a first direction.

9. The manufacturing method for semiconductor devices according to claim 1, wherein each of the first and second frames has a positioning hole formed in proximity to a center in the first direction, wherein the assembly jig has a first projection for positioning formed in a position corresponding to the positioning holes in the first and second frames, wherein at the step (b), the first frame is set over the assembly jig so that the first projection of the assembly jig is inserted into the positioning hole in the first frame, and wherein at the step (d), the second frame is set over the assembly jig so that the first projection of the assembly jig is inserted into the positioning hole in the second frame.

10. The manufacturing method for semiconductor devices according to claim 9, wherein the assembly jig further includes a second projection, wherein the second projection is positioned in proximity to both ends of the first and second frames set over the assembly jig in the first direction and arrests the movement of the first and second frames in a second direction intersecting with the first direction.

11. The manufacturing method for semiconductor devices according to claim 10, wherein the second projection does not arrest elongation or contraction of the first and second frames in the first direction.

* * * * *